US012787320B2

(12) United States Patent
Atanackovic

(10) Patent No.: US 12,787,320 B2
(45) Date of Patent: Nov. 3, 2026

(54) SEMICONDUCTOR DEVICE

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

( * ) Notice: Subject to any disclaimer, the term of this patent is extended or adjusted under 35 U.S.C. 154(b) by 244 days.

(21) Appl. No.: 18/628,178

(22) Filed: Apr. 5, 2024

(65) Prior Publication Data

US 2025/0107118 A1 Mar. 27, 2025

Related U.S. Application Data

(63) Continuation-in-part of application No. 18/394,688, filed on Dec. 22, 2023, now Pat. No. 12,074,195.

(Continued)

(51) Int. Cl.
*H10D 8/60* (2025.01)
*H10D 62/80* (2025.01)

(Continued)

(52) U.S. Cl.
CPC ............... *H10D 8/60* (2025.01); *H10D 62/80* (2025.01); *H10D 99/00* (2025.01); *H10P 14/2904* (2026.01); *H10P 14/3434* (2026.01)

(58) Field of Classification Search
CPC .......... H10D 8/60; H10D 99/00; H10D 62/80; H10P 14/3434

(Continued)

(56) References Cited

U.S. PATENT DOCUMENTS

| | | | |
|---|---|---|---|
| 5,637,889 | A | 6/1997 | Groover et al. |
| 11,329,154 | B2 | 5/2022 | Takeuchi et al. |

(Continued)

FOREIGN PATENT DOCUMENTS

| | | | |
|---|---|---|---|
| CN | 107507861 | A | 12/2017 |
| CN | 107978661 | A | 5/2018 |

(Continued)

OTHER PUBLICATIONS

International Search Report and Written Opinion dated Apr. 16, 2025 for PCT Patent Application No. PCT/IB2024/059075.

(Continued)

*Primary Examiner* — Igwe U Anya

(74) *Attorney, Agent, or Firm* — MLO, a professional corp.

(57) ABSTRACT

In some embodiments, the techniques described herein relate to a multilayered semiconductor diode device including: a substrate including silicon carbide (SiC); an epitaxial drift layer including a first semiconductor oxide material or SiC on the substrate; an epitaxial channel layer including a second semiconductor oxide material on the epitaxial drift layer; and a metal layer above the epitaxial drift layer to form a Schottky barrier junction. The epitaxial channel layer and the Schottky metal layer form a mesa structure contacting a sidewall layer. In some embodiments, a method of forming a multilayered semiconductor diode device includes: providing a substrate including silicon carbide (SiC); forming an epitaxial drift layer; forming an epitaxial channel layer; forming a metal layer to form a Schottky barrier junction; etching the epitaxial channel layer and the metal layer to form a mesa structure; and forming a sidewall layer contacting a wall of the mesa structure.

38 Claims, 107 Drawing Sheets

Related U.S. Application Data

(60) Provisional application No. 63/584,661, filed on Sep. 22, 2023.

(51) Int. Cl.
*H10D 99/00* (2025.01)
*H10P 14/20* (2026.01)

(58) Field of Classification Search
USPC ............................................................ 257/43
See application file for complete search history.

(56) References Cited

U.S. PATENT DOCUMENTS

| | | | |
|---|---|---|---|
| 11,456,361 B1 * | 9/2022 | Atanackovic .......... | H10D 62/80 |
| 11,502,223 B1 | 11/2022 | Atanackovic | |
| 2008/0121927 A1 | 5/2008 | Matocha et al. | |
| 2013/0043468 A1 | 2/2013 | Adekore | |
| 2017/0033011 A1 | 2/2017 | Rupp et al. | |
| 2017/0125574 A1 | 5/2017 | Chowdhury et al. | |
| 2018/0254355 A1 | 9/2018 | Sasaki et al. | |
| 2020/0227541 A1 * | 7/2020 | Yu ........................ | H10D 48/362 |
| 2020/0388489 A1 | 12/2020 | Pelzel et al. | |
| 2021/0184054 A1 | 6/2021 | Miyamoto et al. | |
| 2021/0351321 A1 | 11/2021 | Atanackovic | |
| 2022/0045189 A1 | 2/2022 | Moore et al. | |
| 2022/0157943 A1 | 5/2022 | Maekawa et al. | |
| 2023/0143766 A1 | 5/2023 | Atanackovic | |
| 2023/0147475 A1 | 5/2023 | Atanackovic | |
| 2023/0187506 A1 | 6/2023 | Atanackovic | |
| 2023/0197794 A1 | 6/2023 | Atanackovic | |

FOREIGN PATENT DOCUMENTS

| | | |
|---|---|---|
| CN | 110197854 A | 9/2019 |
| CN | 114823998 A | 7/2022 |
| CN | 115053355 A1 | 9/2022 |
| CN | 112599588 A | 8/2023 |
| CN | 116581151 A | 8/2023 |
| JP | H07302928 A | 11/1995 |
| JP | 2016162786 A | 9/2016 |
| JP | 2018170509 A | 11/2018 |
| JP | 2022186426 A | 12/2022 |
| KR | 20210152310 A | 12/2021 |
| WO | 2005014895 A1 | 2/2005 |
| WO | 2006060054 A1 | 6/2006 |
| WO | 2022158085 A1 | 7/2022 |

OTHER PUBLICATIONS

International Search Report and Written Opinion dated Apr. 2, 2025 for PCT Patent Application No. PCT/IB2024/058797.

Jadhav Aakash et al: "Role of Interface Induced Gap States in Polar AlxGaI-xN (0<=x<=1) Schottky Diodes", Journal of Electronic Materials, Springer US , New York, vol. 50, No. 6, Apr. 15, 2021 (Apr. 15, 2021) , pp. 3731-3738, XP037458718, ISSN: 0361-5235, DOI: 10.1007/S11664-021-08890-Z [retrieved on Apr. 15, 2021].

Nandi Arpit et al: "Design and Analysis of P-GaN/N-Ga2O3 Based Junction Barrier Schottky Diodes", IEEE Transactions on Electron Devices, IEEE, USA, vol. 68, No. 12, Oct. 20, 2021 (Oct. 20, 2021), pp. 6052-6058, XP011890342, ISSN: 0018-9383, DOI: 10.1109/TED.2021.3119261 [retrieved on Nov. 30, 2021].

Yi Lu et al: "AIN/beta-Ga2O3 based HEMT: a potential pathway to ultimate high power device", arxiv.org, Cornell University Library, 201 Olin Library Cornell University Ithaca, NY 14853, Jan. 16, 2019 (Jan. 16, 2019), XP081002968.

Zhang Yuhao et al: "(Ultra) Wide-Bandgap Vertical Power FinFETs", IEEE Transactions on Electron Devices, IEEE, USA, vol. 67, No. 10, Jun. 24, 2020 (Jun. 24, 2020), pp. 3960-3971, XP011811090, ISSN: 0018-9383, DOI: 10.1109/TED.2020.3002880 [retrieved on Sep. 22, 2020].

Office Action dated Feb. 16, 2024 for U.S. Appl. No. 18/394,688.

International Search Report and Written Opinion dated Jan. 31, 2025 for PCT Patent Application No. PCT/IB2024/059043.

Roy Saurav et al: "Design of a [beta]-Ga2O3 Schottky Barrier Diode With p-Type III-Nitride Guard Ring for Enhanced Breakdown", IEEE Transactions on Electron Devices, IEEE, USA, vol. 67, No. 11, Nov. 1, 2020 (Nov. 1, 2020), pp. 4842-4848, XP011815960, ISSN: 0018-9383, DOI: 10.1109/TED.2020.3025268 [retrieved on Oct. 22, 2020] Figure 1 and the correlated passages.

Notice of Allowance and Fees dated Aug. 4, 2025 for U.S. Appl. No. 18/830,089.

Notice of Allowance and Fees dated Jan. 15, 2025 for U.S. Appl. No. 18/893,715.

Office Action dated Dec. 17, 2024 for U.S. Appl. No. 18/893,715.

Office Action dated Sep. 11, 2026 for U.S. Appl. No. 18/888,753.

* cited by examiner

12200

12300

DIELECTRIC CONSTANT UWBG OXIDES

| material | Eg | eps_static | eps_inf |
|---|---|---|---|
| b-Ga2O3(100) | 4.9 | 3.969 | 10.2 |
| b-Ga2O3(010) | 4.9 | 4.062 | 10.21 |
| b-Ga2O3(001) | 4.9 | 4.06 | 13.12 |
| a-Ga2O3_x | 5.1195 | 4.62 | 12.9816 |
| a-Ga2O3_y | 5.1195 | 4.62 | 12.9816 |
| a-Ga2O3_z | 5.1195 | 4.465 | 18.6645 |
| AlGaO3_x | 5.8799 | 3.703 | 14.23 |
| AlGaO3_y | 5.8799 | 3.73 | 15.5 |
| AlGaO3_z | 5.8799 | 4 | 15.78 |
| MgO | 7.6865 | 3.208 | 10.77 |
| MgAl2O4 | 8.6054 | 3.079 | 8.476 |
| MgF2_x | 11.9118 | 2.079 | 4.474 |
| MgF2_y | 11.9118 | 2.04 | 5.418 |
| MgF2_z | 11.9118 | 2.04 | 5.418 |
| a-Al2O3_x | 8.9082 | 3.232 | 9.092 |
| a-Al2O3_y | 8.9082 | 3.232 | 9.092 |
| a-Al2O3_z | 8.9082 | 3.191 | 10.93 |
| t-Al2O3_x | 7.24 | 3.158 | 8.641 |
| t-Al2O3_y | 7.24 | 3.182 | 9.206 |
| t-Al2O3_z | 7.24 | 3.152 | 9.091 |
| 4H-SiC_x | 3.3603 | 6.988 | 10.28 |
| 4H-SiC_y | 3.3603 | 6.988 | 10.28 |
| 4H-SiC_z | 3.3603 | 7.22 | 10.77 |
| b-SiO2_x | 9.8 | 2.184 | 3.828 |
| b-SiO2_y | 9.8 | 2.184 | 3.828 |
| b-SiO2_z | 9.8 | 2.187 | 3.991 |
| a-SiO2_x | 10 | 2.243 | 4.103 |
| a-SiO2_y | 10 | 2.243 | 4.103 |
| a-SiO2_z | 10 | 2.23 | 3.905 |
| LiGaO2_x | 6.2705 | 3.339 | 7.168 |
| LiGaO2_y | 6.2705 | 3.207 | 6.553 |
| LiGaO2_z | 6.2705 | 3.332 | 7.681 |
| LiAlO2_x | 8.5273 | 2.753 | 6.712 |
| LiAlO2_y | 8.5273 | 2.753 | 6.712 |
| LiAlO2_z | 8.5273 | 2.69 | 5.142 |
| ZnGeO3_x | 4.7671 | 4.044 | 10.66 |
| ZnGeO3_y | 4.7671 | 4.044 | 10.66 |
| ZnGeO3_z | 4.7671 | 4.044 | 10.66 |
| MgGeO3_x | 5.8052 | 3.374 | 9.45 |
| MgGeO3_y | 5.8052 | 3.331 | 8.435 |
| MgGeO3_z | 5.8052 | 3.46 | 8.54 |
| NiO | 1.96 | 5.074 | 14.41 |

FIG. 78A

SEMICONDUCTOR DEVICE

RELATED APPLICATIONS

This application is a continuation-in-part of U.S. application Ser. No. 18/394,688 filed on Dec. 22, 2023 and entitled "SEMICONDUCTOR DEVICE"; which claims the benefit of U.S. Provisional Patent Application No. 63/584,661 filed on Sep. 22, 2023, and entitled "SEMICONDUCTOR DEVICE"; all of which are hereby incorporated by reference for all purposes.

BACKGROUND

High power semiconductor devices operating at high voltages (e.g., greater than 1.3 kV) have been made using different types of semiconductor materials. For example, Schottky diodes using Silicon Carbide (SiC) materials have replaced Silicon (Si) for high power applications, such as in power conversion and automotive electronics. Recently, beta-phase Gallium Oxide ($\beta$-$Ga_2O_3$) has been offered as a standalone technology and used to form high power Schottky diodes as an alternative to comparable SiC—with potentially improved performance and lower cost. SiC is a wide bandgap (WBG) semiconductor compared to Si. Improved high power performance can be engineered by utilizing the fundamental advantages afforded by virtue of the WBG. In the same manner, an even larger bandgap semiconductor may potentially further improve device performance beyond SiC. Gallium Oxide ($Ga_2O_3$) semiconductors in various polytopes exhibit bandgaps ($E_g$) from 4.5 eV to 5.0 eV, compared to the bandgap of SiC (about 3.2 eV) and for Si (about 1.1 eV). This increased bandgap can be used advantageously to improve the diode ON-state resistance (i.e., reduce loss) and increase blocking voltage capability (i.e., improve isolation).

Despite intense development of high voltage $\beta$-$Ga_2O_3$ diodes and transistors, there still exist fundamental limitations toward the widespread acceptance for high power applications.

SUMMARY

In some embodiments, the techniques described herein relate to a multilayered semiconductor diode device including: a substrate including silicon carbide (SiC); an epitaxial transition layer including a first semiconductor oxide material or SiC, wherein the epitaxial transition layer is on the substrate; an epitaxial drift layer including a second semiconductor oxide material, wherein the epitaxial drift layer is on the epitaxial transition layer; and a metal layer above the epitaxial drift layer, wherein the metal layer and the epitaxial drift layer form a Schottky barrier junction.

In some embodiments, a method of forming a multilayered semiconductor diode device includes: providing a substrate including silicon carbide (SiC); forming, on the substrate, an epitaxial transition layer including a first semiconductor oxide material or SiC; forming, on the epitaxial transition layer, an epitaxial drift layer including a second semiconductor oxide material; and forming a metal layer above the epitaxial drift layer, wherein the metal layer and the epitaxial drift layer form a Schottky barrier junction.

In some embodiments, the techniques described herein relate to a multilayered semiconductor diode device including: a substrate including silicon carbide (SiC); an epitaxial drift layer including a first semiconductor oxide material, wherein the epitaxial drift layer is on the substrate; an epitaxial channel layer including a second semiconductor oxide material, wherein the epitaxial channel layer is on the epitaxial drift layer; a Schottky metal layer above the epitaxial channel layer, wherein the Schottky metal layer and the epitaxial channel layer form a Schottky barrier junction, and wherein the epitaxial channel layer and the Schottky metal layer are formed into a first mesa structure; and a sidewall layer including a dielectric material, wherein the sidewall layer is on the epitaxial drift layer and contacts a wall of the first mesa structure.

In some embodiments, the techniques described herein relate to a method of forming a multilayered semiconductor diode device including: providing a substrate including silicon carbide (SiC); forming, on the substrate, an epitaxial drift layer including a first semiconductor oxide material; forming, on the epitaxial drift layer, an epitaxial channel layer including a first semiconductor oxide material; forming a metal layer on the epitaxial drift layer, wherein the metal layer and the epitaxial drift layer form a Schottky barrier junction; etching the epitaxial channel layer and the metal layer to form a mesa structure; forming a sidewall layer including a dielectric material, wherein the sidewall layer is on the epitaxial drift layer and contacts a wall of the mesa structure.

BRIEF DESCRIPTION OF THE DRAWINGS

Embodiments of the present disclosure will be discussed with reference to the accompanying drawings.

FIG. 78A is a table of calculated dielectric constants for a series of example oxide and fluoride materials that are compatible with the vertical multilayered device structures disclosed herein, in accordance with some embodiments.

FIG. 78B shows the symmetric equipotential lines distributed between the +Q and −Q charges for the case of equal dielectric constant material slabs. FIG. 78C shows the asymmetric equipotential lines distributed between the +Q and −Q charges for the case of dissimilar dielectric constant material slabs.

FIG. 78D shows the symmetric distribution of the magnitude of the electric-field as lines distributed between the +Q and −Q charges for the case of equal dielectric constant material slabs. FIG. 78E shows the asymmetric distribution of the magnitude of the electric-field as lines distributed between the +Q and −Q charges for the case of dissimilar dielectric constant material slabs. The concept of dielectric screening is demonstrated for the present disclosure utilizing UWBG materials with dissimilar dielectric constants.

FIG. 79 represents a field-plate separated from the drift region with a thick isolation layer dielectric. FIG. 80 represents a field-plate separated from the drift region with a thin isolation layer dielectric.

FIG. 87 is for the case of a low-k dielectric and FIG. 88 is for a high-k dielectric isolation layer.

FIG. 89 is for the case of a low-k dielectric and FIG. 90 is for a high-k dielectric isolation layer.

FIG. 94 is plot of the maximum surface electric-field at the heterointerface between the isolation layer (or top metal) and the drift layer surface as a function of the isolation layer dielectric constant, where the high-k dielectric isolation layer electric field screening effect is demonstrated, in accordance with some embodiments.

FIG. 95 is a photograph of a fabricated wafer comprising a plurality of vertical device structures showing a Ni Schottky barrier metal pattern utilized for an example design, in accordance with some embodiments. The rear contact was not processed at this stage, showing the transparent nature of the materials.

FIG. 96A shows an alternative device design referred to as a "T-Channel" design herein, in accordance with some embodiments.

FIGS. 96B-96H show modeled (or calculated) spatial electric fields within devices having structures like that shown in FIG. 96A, in accordance with some embodiments.

FIG. 97 shows an example device configuration, wherein the device configuration shown in FIG. 96A is repeated to form an array of devices on a common SiC substrate, in accordance with some embodiments.

FIGS. 98A, 98B and 98C show examples of devices with a "T-Channel" design as described with respect to FIG. 96A, and additionally with a transition layer, an intermediate layer, or both, in accordance with some embodiments.

In the following description, like reference characters designate like or corresponding parts throughout the FIGURES.

DETAILED DESCRIPTION

Figure 1:
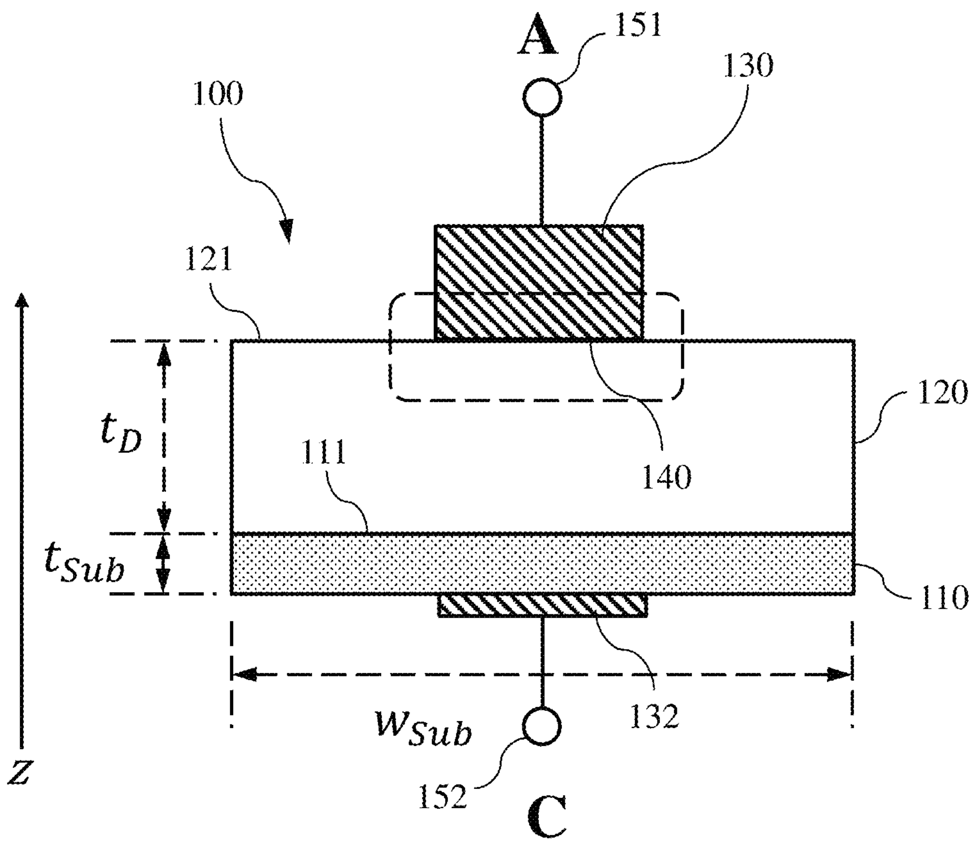
FIG. 1 is a figurative sectional view of a vertical multilayered semiconductor diode device in accordance with an illustrative embodiment.

This disclosure describes semiconductor diode devices including at least one type of epitaxial oxide material deposited directly upon a silicon carbide (SiC) substrate, where the epitaxial oxide material forms an epitaxial oxide layer (or drift layer), and a metal layer (e.g., an epitaxial metal layer) on the epitaxial oxide layer. The materials of the metal layer and the epitaxial oxide layer are chosen to form a Schottky junction. The epitaxial oxide material comprises a wide bandgap (e.g., from about 2.5 eV to about 10 eV, or from about 3 eV to about 10 eV, or from about 4.5 eV to about 7 eV).

In some embodiments, the semiconductor diode devices described herein include layers in addition to the epitaxial oxide layer (or drift layer) on the SiC substrate. For example, an epitaxial transition layer can be formed between the SiC substrate and the epitaxial oxide layer. In some cases, the transition layer can provide an intermediate level of doping between the substrate and epitaxial oxide layer and/or manage interfacial strain, and can thereby impact the electronic and structural properties of the semiconductor diode device, as described further herein. In another example, an intermediate layer can be formed between the epitaxial oxide layer and the metal layer. The intermediate layer can alter the Schottky barrier properties and can thereby impact the electronic properties of the semiconductor diode device such as the turn-on voltage and/or the reverse breakdown voltage, as described further herein. In some cases, a structure can include both a transition layer and an intermediate layer. The intermediate layer and the transition layer can each be a single layer, or can include multiple layers of materials such as in a superlattice layer or a chirp layer.

Furthermore, in some cases, the semiconductor diode devices described herein can include an isolation layer surrounding the metal layer. The isolation layer can be advantageous to mitigate surface currents and manage the electrostatic vector fields of the devices described herein. The isolation layer can include a material with a higher bandgap than the materials of the epitaxial oxide layer (or drift layer), and can be crystalline (e.g., epitaxial materials) or can be amorphous, or polycrystalline materials. The dielectric constant of the materials of the isolation layer can be lower or higher than that of the epitaxial oxide layer (or drift layer). In some cases, the isolation layer is an oxide. In some cases, the isolation layer is an epitaxial layer formed on the epitaxial oxide layer (or drift layer).

The materials, structures and methods described herein can be used in two-terminal or 3-terminal semiconductor devices, such as Schottky barrier (SB) diodes, p/n junction diodes, p-i-n diodes, transistors, switches, high-power switches, RF-switches, varactors, light emitting devices, semiconductor devices with quantum wells or superlattices, semiconductor devices with compositional (or doping density) gradients, and others.

Vertical semiconductor diode devices described herein enable high dielectric breakdown voltages in the off-state or blocking state (i.e., high breakdown voltages may be greater than 50 V, greater than 100 V, or from 50 V to 10,000 V). Fundamentally, electrical power P is the product of voltage (V) and current (I). It follows that for a given operating power, a higher voltage can be utilized with a commensurate decrease in current. Generally, current scales as the cross-sectional area of the device or conductor, therefore higher operating voltages enables smaller devices with lower ohmic heating losses ($I^2 R_{on}$). Reducing the ON-resistance ($R_{on}$) further reduces losses.

Increasing stringent requirements for high power semiconductor devices operating at greater than 1.3 kV address improvements in the simultaneous metric of Size-Weight and Power (SWaP). Compact high power density SWaP power conversion configurations present a problem for conventional technologies. Semiconductor devices comprising $Ga_2O_3$ have been proposed, but this material suffers from poor thermal conductivity and the resultant generation of heat often must be dissipated using complicated thermo-mechanical arrangements. On the other hand, currently available all-SiC devices offer lower breakdown voltages compared with that of comparable devices comprising $Ga_2O_3$ for the same thickness and doping concentration (or conductivity). The terms "doping concentration" and "doping density" are used interchangeably herein.

In the present disclosure, a solution to the above problem and avenue toward dramatic improvements includes a hybrid approach involving a silicon carbide (SiC) substrate which has good thermal and electrical conductivity in combination with layers of a semiconducting device formed of epitaxially deposited oxide materials (e.g., $Ga_2O_3$) which have an increased breakdown voltage, $V_{br}$, for a given vertical thickness and doping concentration (or conductivity) as compared to devices with SiC epitaxial layers on SiC substrates. A further advantage of coupling an oxide semiconducting active region to SiC is the improved flexibility of device configurations possible (i.e., heterojunction engineering). The structures and methods described herein can also potentially enable reduced manufacturing cost.

In some examples of vertical semiconductor diode devices including an epitaxial oxide layer on a silicon carbide (SiC) substrate, the SiC substrate can be made from crystal polytopes of 4H—SiC, 2H—SiC, 6H—SiC, or 3C—SiC. The orientation of the SiC substrate can be C-plane SiC(0001), A-plane SiC(11-20), R-plane SiC(10-12) or M-plane SiC(1-100). Single crystal SiC has a thermal conductivity of about 300-500 W/(m-K), which is significantly higher than other semiconductor substrate materials such as $Ga_2O_3$ (about 20-30 W/(m-K)) or Si (about 100-150 W/(m-K)). The high thermal conductivity of SiC is advantageous for high-power electronic device structures epitaxially formed on SiC substrates, since it improves heat dissipation through the substrate.

In some examples of vertical semiconductor diode devices on a silicon carbide (SiC) substrate, the epitaxial oxide layer (or drift layer), the transition layer, the intermediate layer, and/or the isolation layer can include one or more of: $Ga_2O_3$ (e.g., α-phase or β-phase); $(Al_xGa_{1-x})_2O_3$ (e.g., α-phase or β-phase) where 0≤x≤1; $Mg_xGa_{2(1-x)}O_{3-2x}$ where 0≤x≤1; $Mg_xAl_{2(1-x)}O_{3-2x}$ where 0≤x≤1; $(Mg_xZn_{1-x})_z(Al_yGa_{1-y})_{2(1-z)}O_{3-2z}$ where 0≤x≤1, 0≤y≤1, and 0≤z≤1; $Zn_xGa_yO_z$ where 0≤x≤1, 0≤y≤1, and 0≤z≤1; $Zn_xAl_yO_z$ where 0≤x≤1, 0≤y≤1, and 0≤z≤1; $Mg_xGa_yO_z$ where 0≤x≤1, 0≤y≤1, and 0≤z≤1; $Mg_xAl_yO_z$ where 0≤x≤1, 0≤y≤1, and 0≤z≤1; $Ni_xGa_yO_z$ where 0≤x≤1, 0≤y≤1, and 0≤z≤1; $Ni_xAl_yO_z$ where 0≤x≤1, 0≤y≤1, and 0≤z≤1; $(Ni_xMg_{1-x})_yGa_{2(1-y)}O_{3-2y}$ where 0<x<1 and 0<y<1; or $(Mg_xNi_{1-x})_z(Al_yGa_{1-y})_{2(1-z)}O_{3-2z}$, where 0≤x≤1, 0≤y≤1, and 0≤z≤1, or $(Ni_zMg_xZn_{1-x-z})(Al_yGa_{1-y})_2O_4$ where 0≤(x,y,z)≤1, or $(Zn_pMg_xNi_{1-x-p})_z(Al_yGa_{1-y})_{2(1-z)}O_{3-2z}$, where 0≤(p, x, y, z)≤1.

The oxygen content of the epitaxial oxide materials described herein (e.g., the aforementioned epitaxial oxide materials) can vary, in some embodiments. For example, different crystal symmetries of the aforementioned epitaxial oxide materials can have compositions with oxygen contents that vary compared to the compositions listed (e.g., have smaller or larger oxygen fractions). In some cases, the ratio of metal to oxygen atoms can be smaller or larger than those in the compounds described herein due to defects (e.g., oxygen or metal vacancies and/or interstitial atoms) in the materials.

The epitaxial oxide materials described herein (e.g., the epitaxial oxide layer (or drift layer), the transition layer, the intermediate layer, and/or the isolation layer) can be doped p-type or n-type. For example, an epitaxial oxide such as $(Al_xGa_{1-x})_2O_3$ can be doped n-type using an extrinsic dopant such as Si, Ge, or Sn. In various examples, dopants may be spatially confined (e.g., two one or more doped layers within a given region). In one example, a dopant may be confined to two or more spatially separated doped layers in a region (e.g., two spatially separated doped layers in the transition layer) or in other examples the doped layer may span the region or a portion of the region.

In some embodiments, any of the epitaxial layers of the structures and devices described herein (e.g., the epitaxial oxide layer (or drift layer), the transition layer, the intermediate layer, and/or the isolation layer) can include:

$$(A_2O_3)_x(BO)_{1-x} \equiv A_{2x}B_{1-x}O_{2x+1} \quad \text{(Material 1)}$$

In Material 1, 0≤x≤1, 0<x≤1, 0≤x<1, or 0<x<1. These ranges are distinct from each other, for example, since some embodiments of Material 1 (as described by the formula above) include binary materials, and others include binary or ternary materials. In other cases herein, the subscripts of formulas for materials can include or exclude zero and/or one to distinguish between binary, ternary, quaternary, or other materials. The atomic species of Material 1 can be selected from: trivalent A={Al, Ga, RE, Bi, B', In}; and bivalent B={Ni, Mg, Zn}, where O=Oxygen, Al=Aluminum, Ga=Gallium, RE=at least one Rare-earth (e.g., Lanthanide), Bi=Bismuth, B'=Boron, In=Indium, Zn=Zinc, Mg=Magnesium, and Ni=Nickel.

For example, when x=½ in the above formula for Material 1, an epitaxial layer of a structure or device described herein can include $Al_2B_1O_4$. Some examples of such materials are $Al_2Mg_1O_4$, $Ga_2Mg_1O_4$, $Al_2Zn_1O_4$, $Ga_2Zn_1O_4$, $Al_2Ni_1O_4$, $Ga_2Ni_1O_4$, and $RE_2Zn_1O_4$.

In another example, when x=⅓ in the above formula for Material 1, an epitaxial layer of a structure or device described herein can include $A_2B_2O_5$. Some examples of such materials are $Al_2Mg_2O_5$, $Ga_2Mg_2O_5$, $Al_2Zn_2O_5$, $Ga_2Zn_2O_5$, $Al_2Ni_2O_5$, and $Ga_2Ni_2O_5$.

In another example, when x=¼ in the above formula for Material 1, an epitaxial layer of a structure or device described herein can include $A_2B_3O_6$. Some examples of such materials are $Al_2Mg_3O_6$, $Ga_2Mg_3O_6$, $Al_2Zn_3O_6$, $Ga_2Zn_3O_6$, $Al_2Ni_3O_6$, and $Ga_2Ni_3O_6$.

In another example, when x=⅕ in the above formula for Material 1, an epitaxial layer of a structure or device described herein can include $A_2B_4O_7$. Some examples of such materials are $Al_2Mg_4O_7$, $Ga_2Mg_4O_7$, $Al_2Zn_4O_7$, $Ga_2Zn_4O_7$, $Al_2Ni_4O_7$, and $Ga_2Ni_4O_7$.

In another example, when x=¾ in the above formula, an epitaxial layer of a structure or device described herein can include $A_6B_1O_{10}$. Some examples of such materials are $Al_6Mg_1O_{10}$, $Ga_6Mg_1O_{10}$, $Al_6Zn_1O_{10}$, $Ga_6Zn_1O_{10}$, $Al_6Ni_1O_{10}$, $Ga_6Ni_1O_{10}$, and $RE_6Zn_1O_{10}$.

In other examples, x in the above formula for Material 1 can be any of the values $0 \le x \le 1$, $0 < x \le 1$, $0 \le x < 1$, and $0 < x < 1$. For example, more dilute composition cases are also possible, such as when $0 \le x \le 0.1$, or $0.9 \le x \le 1.0$.

In some embodiments, any of the epitaxial layers of the structures and devices described herein (e.g., the epitaxial oxide layer (or drift layer), the transition layer, the intermediate layer, and/or the isolation layer) can include:

$$((A_yC_{1-y})_2O_3)_x(BO)_{1-x} \equiv (A_yC_{1-y})_{2x}B_{1-x}O_{2x+1} \quad \text{(Material 2)}$$

In Material 2, $0 \le x \le 1$, $0 < x < 1$, $0 \le x < 1$, or $0 < x < 1$; and $0 \le y \le 1$, $0 < y \le 1$, $0 \le y < 1$, or $0 < y < 1$. The atomic species of Material 2 can be selected from: trivalent A and C selected from two of {Al, Ga, RE, Bi, B', In}; and bivalent B={Ni, Mg, Zn}, where O=Oxygen.

For example, when x=½ and y=1/10 in the above formula for Material 2, an epitaxial layer of a structure or device described herein can include $(A_{0.1}C_{0.9})_2B_1O_4$. Some examples of such materials are $(Al_{0.1}Ga_{0.9})_2Mg_1O_4$, $(Al_{0.1}Ga_{0.9})_2Ni_1O_4$, $(Bi_{0.1}Ga_{0.9})_2Mg_1O_4$, $(RE_{0.1}Ga_{0.9})_2Zn_1O_4$, and $(RE_{0.1}Al_{0.9})_2Zn_1O_4$.

In some embodiments, any of the epitaxial layers of the structures and devices described herein (e.g., the epitaxial oxide layer (or drift layer), the transition layer, the intermediate layer, and/or the isolation layer) can include:

$$((A_yD_zC_{1-y-z})_2O_3)_x(BO)_{1-x} \equiv (A_yD_zC_{1-y-z})_{2x}B_{1-x}O_{2x+1} \quad \text{(Material 3)}$$

In Material 3, $0 \le x \le 1$, $0 < x \le 1$, $0 \le x < 1$, or $0 < x < 1$; $0 \le y \le 1$, $0 < y \le 1$, $0 \le y < 1$, or $0 < y < 1$; and $0 \le z \le 1$, $0 < z \le 1$, $0 \le z < 1$, or $0 < z < 1$. The above formula for Material 3 is also constrained such that the sum $y+z \le 1$. The atomic species of Material 3 can be selected from: trivalent A, D and C selected from three of {Al, Ga, RE, Bi, B', In}; and bivalent B={Ni, Mg, Zn}, where O=Oxygen.

For example, when x=½, y=18/20, and z=1/20 in the above formula for Material 3, an epitaxial layer of a structure or device described herein can include $(A_{0.9}D_{0.05}C_{0.05})_2B_1O_4$. Some examples of such materials are $(Ga_{0.9}Al_{0.05}In_{0.05})_2Mg_1O_4$, $(Ga_{0.9}Al_{0.05}In_{0.05})_2Ni_1O_4$, $(B'_{0.05}Bi_{0.05}Ga_{0.9})_2Mg_1O_4$, $(RE_{0.05}In_{0.05}Ga_{0.9})_2Zn_1O_4$, and $(RE_{0.05}Ga_{0.9}Al_{0.05})_2Zn_1O_4$.

In some embodiments, any of the epitaxial layers of the structures and devices described herein (e.g., the epitaxial oxide layer (or drift layer), the transition layer, the intermediate layer, and/or the isolation layer) can include:

$$(A_2O_3)_{1-x}(B_yC_{1-y}O)_x \equiv A_{2(1-x)}B_{xy}C_{x(1-y)}O_{3-2x} \quad \text{(Material 4)}$$

In Material 4, $0 \le x \le 1$, $0 < x \le 1$, $0 \le x < 1$, or $0 < x < 1$; and $0 \le y \le 1$, $0 < y \le 1$, $0 \le y < 1$, or $0 < y < 1$. The atomic species of Material 4 can be selected from: trivalent A={Al, Ga, RE, Bi, B', In}; and bivalent B and C selected from at least two of {Ni, Mg, Zn}, where O=Oxygen.

For example, when x=½ and y=¼ in the above formula for Material 4, an epitaxial layer of a structure or device described herein can include $A_2B_{0.25}C_{0.75}O_4$. Some examples of such materials are $Ga_2Mg_{0.25}Zn_{0.75}O_4$, $Al_2Mg_{0.25}Zn_{0.75}O_4$, $Ga_2Mg_{0.25}Ni_{0.75}O_4$, and $Ga_2Zn_{0.25}Mg_{0.75}O_4$.

In some embodiments, any of the epitaxial layers of the structures and devices described herein (e.g., the epitaxial oxide layer (or drift layer), the transition layer, the intermediate layer, and/or the isolation layer) can include:

$$((A_zD_{1-z})_2O_3)_{1-x}(B_yC_{1-y}O)_x \equiv A_{2z(1-x)}D_{2(1-z)(1-x)}B_{xy}C_{x(1-y)}O_{3-2x} \quad \text{(Material 5)}$$

In Material 5, $0 \le x \le 1$, $0 < x \le 1$, $0 \le x < 1$, or $0 < x < 1$; $0 \le y \le 1$, $0 < y \le 1$, $0 \le y < 1$, or $0 < y < 1$; and $0 \le z \le 1$, $0 < z \le 1$, $0 \le z < 1$, and $0 < z < 1$. The atomic species of Material 5 can be selected from: trivalent A or D selected from at least two of {Al, Ga, RE, Bi, B', In}; and bivalent B and C selected from at least two of {Ni, Mg, Zn}, where O=Oxygen.

For example, when x=½, y=½, and z=½ in the above formula for Material 5, an epitaxial layer of a structure or device described herein can include $A_1D_1B_{0.5}C_{0.5}O_4$. Some examples of such materials are $Al_1Ga_1Ni_{0.5}Mg_{0.5}O_4$, $In_1Ga_1Zn_{0.5}Mg_{0.5}O_4$, and $RE_1Al_1Zn_{0.5}Ni_{0.5}O_4$.

In some embodiments, any of the epitaxial layers of the structures and devices described herein (e.g., the epitaxial oxide layer (or drift layer), the transition layer, the intermediate layer, and/or the isolation layer) can include:

$$(A_2O_3)_x(BO_2)_{1-x} \equiv A_{2x}B_{1-x}O_{x+2} \quad \text{(Material 6)}$$

In Material 6, $0 \le x \le 1$, $0 < x \le 1$, $0 \le x < 1$, or $0 < x < 1$. The atomic species of Material 6 can be selected from: trivalent A={Al, Ga, RE, Bi, B', In}; and bivalent B={Ge, Si, Sn}, where O=Oxygen, Al=Aluminum, Ga=Gallium, RE=at least one Rare-earth (e.g., Lanthanide), Bi=Bismuth, B'=Boron, Ge-Germanium, Si=Silicon, and Sn=Tin.

For example, when x=½ in the above formula for Material 6, an epitaxial layer of a structure or device described herein can include $A_2B_1O_5$. Some examples of such materials are $Al_2Si_1O_5$, $Ga_2Ge_1O_5$, $Al_2Ge_1O_5$, $RE_2Sn_1O_5$, $B'_2Ge_1O_5$, and $In_2Ge_1O_5$.

For example, when x=¾ in the above formula for Material 6, an epitaxial layer of a structure or device described herein can include $A_6B_1O_{11}$. Some examples of such materials are $Al_6Ge_1O_{11}$, $RE_6Ge_1O_{11}$, and $B'_6Si_1O_{11}$.

In some embodiments, any of the epitaxial layers of the structures and devices described herein (e.g., the epitaxial oxide layer (or drift layer), the transition layer, the intermediate layer, and/or the isolation layer) can include:

$$(AO)_x(BO_2)_{1-x} \equiv A_xB_{1-x}O_{2-x} \quad \text{(Material 7)}$$

In Material 7, $0 \le x \le 1$, $0 < x \le 1$, $0 \le x < 1$, or $0 < x < 1$. The atomic species of Material 7 can be selected from: trivalent A={Mg, Ni, Zn}; and bivalent B={Ge, Si, Sn}, where O=Oxygen, Mg=Magnesium, Ni=Nickel, Zn=Zinc, Ge-Germanium, Si=Silicon, and Sn=Tin.

For example, when x=½ in the above formula for Material 7, an epitaxial layer of a structure or device described herein can include $A_1B_1O_3$. Some examples of such materials are $Zn_1Si_1O_3$, $Zn_1Ge_1O_3$, $Ni_1Ge_1O_3$, $Mg_1Sn_1O_3$, $Mg_1Zn_1O_3$, and $Ni_1Sn_1O_3$.

For example, when x=⅔ in the above formula for Material 7, an epitaxial layer of a structure or device described herein can include $A_2B_1O_4$. Some examples of such materials are $Zn_2Si_1O_4$, $Mg_2Ge_1O_4$, $Ni_2Ge_1O_4$, $Mg_2Sn_1O_4$, $Mg_2Si_1O_4$, and $Ni_2Si_1O_4$.

It is to be understood that, for any of the epitaxial layers of the structures and devices described herein (e.g., the epitaxial oxide layer (or drift layer), the transition layer, the intermediate layer, and/or the isolation layer), the composition fractions (e.g., x, y and/or z) of any of the formulas for materials described herein (e.g., Materials 1-7 described above) may vary within the layer from the exact amount. For example, the composition fraction may vary due to crystalline lattice defects (e.g., vacancies, antisite defects, and/or interstitial species) and random fluctuations within physical compositions. Therefore, the composition fractions of the formulas for materials described herein can be considered average compositions of the layer in some cases.

It is further to be understood that any of the epitaxial layers of the structures and devices described herein (e.g., the epitaxial oxide layer (or drift layer), the transition layer, the intermediate layer, and/or the isolation layer) can include stoichiometric compositions of the materials described herein (e.g., Materials 1-7 above), such as, $Ga_2O_3$, or non-stoichiometric compositions such as, $Ga_2O_{3-p}$, where $0<p<2$ represents an oxygen-deficient or gallium-rich composition. Another example of a non-stoichiometric composition is $Ga_{2-q}O_3$, where $0<q<1$ represents compositions that are oxygen-rich and/or gallium-deficient. Any of the oxide compositions described herein (e.g., Materials 1-7) can be stoichiometric or non-stoichiometric in the present structures and devices.

Additionally, any of the epitaxial layers of the structures and devices described herein (e.g., the epitaxial oxide layer (or drift layer), the transition layer, the intermediate layer, and/or the isolation layer) can include a dilute alloy composition of any of the oxide compositions described herein (e.g., Materials 1-7). A dilute alloy composition is one in which a dilute component of the material is present in a concentration of less than 0.1. For example, one of Materials 1-7 can include a value of x, y and/or z that is less than 0.1, or less than 0.05, or less than 0.01. In some cases, a dopant species (e.g., Si, Ge or Sn) can be incorporated into a material described herein (e.g., into one of Materials 1-7 formed in an epitaxial layer) with a composition less than 0.1, or less than 0.05, or less than 0.01.

The epitaxial oxide layer can also have a crystal symmetry and orientation to enable epitaxial layer formation on the SiC substrate. In some examples, the epitaxial oxide material is chosen to have a lattice mismatch that is less than 10%, or less than 8%, or less than 6%, or less than 5%, or less than 2% with the SiC substrate. The thickness of the epitaxial oxide layer can be less than a critical layer thickness of the material (below which the epitaxial oxide layer may be elastically strained and is substantially coherent with the substrate, and above which the epitaxial oxide layer is relaxed or partially relaxed). For example, the thickness of the epitaxial oxide layer can be from 1 nm to 100 microns, or from 100 nm to 10 microns, or from 1 nm to 1 micron, or from 5 nm to 500 nm.

In some examples, vertical semiconductor diode devices comprise a short-period superlattice (SPSL). The epitaxial oxide layer can comprise an SPSL, and/or other layers of the device (e.g., a transition layer, or intermediate layer) can comprise an SPSL. In some cases, the SPSL contains alternating sub-layers of wider and narrower bandgap materials (barrier layers and well layers, respectively). The thickness of the barrier or well sub-layers in an SPSL can be from less than 1 monolayer (ML) to 5 MLs, or from less than 1 ML to 10 MLs, or from less than 1 ML to 20 MLs. Barrier and/or well sub-layers with a thickness of less than 1 ML or 1 unit cell along a growth direction may be discontinuous laterally (i.e., in a direction parallel with a major surface of the layer).

In some examples, vertical semiconductor diode devices comprise a chirp layer. The epitaxial oxide layer can comprise a chirp layer, and/or other layers of the device (e.g., a transition layer, or intermediate layer) can comprise a chirp layer. A chirp layer is similar to an SPSL in that it also contains alternating sub-layers of wider and narrower bandgap materials (barrier layers and well layers, respectively), however, chirp layers have sub-layer properties that change throughout the chirp layer. For example, a chirp layer can contain alternating sub-layers of $(Al_xGa_{1-x})_2O_3$ with two different compositions (i.e., two different values of x) to form barrier layers and well sub-layers, where the barrier sub-layers and/or the well sub-layers change thickness through the chirp layer. In another example, a chirp layer can contain alternating sub-layers of $(Al_xGa_{1-x})_2O_3$ to form barrier sub-layers and well sub-layers, where the barrier sub-layers and/or the well sub-layers change composition through the chirp layer. In another example, a chirp layer can contain alternating sub-layers of $(Al_xGa_{1-x})_2O_3$ to form barrier sub-layers and well sub-layers, where the barrier sub-layers and/or the well sub-layers change thickness and/or composition through the chirp layer.

In yet another example, a bulk-like graded bandgap may be incorporated within the device that has a bandgap energy $E_g(z)$ varying along a growth direction, z. The variation can be linear or non-linear, monotonic or non-monotonic, along a growth direction. For example, a graded layer of $(Al_xGa_{1-x})_2O_3$ may be formed such that the alloy composition x is a function of the growth direction z, such that, x(z).

A digital alloy formed using a SPSL or a bulk-like alloy is possible, and further variation of the effective material properties can be imparted along a growth direction.

Methods of forming the vertical semiconductor diode devices, including an epitaxial oxide layer on a silicon carbide (SiC) substrate and a metal layer (such as an epitaxial metal layer) on the epitaxial oxide layer, are also described herein. Such methods can include forming highly crystalline and epitaxial oxide layers on SiC substrates using an epitaxial layer growth technique, such as molecular beam epitaxy (MBE), gas source molecular beam epitaxy (GS-MBE), plasma-source MBE (P-MBE), metal-organic chemical vapor deposition (MOCVD), atomic layer deposition (ALD), vacuum-based laser ablation sources, vapor phase epitaxy (VPE), gas source, sputter source, electron beam evaporation source, and plasma-based deposition methods. Other epitaxial layer growth techniques are also applicable eventuating in a high crystal quality oxide film formed on the surface of a substrate.

In general embodiments, ex-situ metal layers can be formed (or deposited) on the epitaxial oxide layer. In another embodiment, in-situ metal layers may be directly formed on a pristine final surface of an epitaxial oxide. Yet further, an in-situ metal layer may be formed on an intentionally prepared final epitaxial oxide surface. Yet even further, a metal layer may be formed on an intentionally prepared final epitaxial oxide surface wherein the process does not expose the structure or surface to a contaminating environment. Metal layers, such as elemental Ni, Cu, Al, Ti, Pd, Pt, Ir, Er, Gd, Mo, W, Os and alloys thereof, can be deposited using physical vapor deposition techniques, such as MBE, sputtering, pulsed laser deposition, or thermal evaporation of a metal, to form non-epitaxial metal layers. Alternatively, or additionally, epitaxial metal layers can be formed on the epitaxial oxide layers using an epitaxial layer growth technique (e.g., using MBE, MOCVD, or another epitaxial layer growth technique) to form a substantially crystalline first metal layer in direct contact with the epitaxial oxide layer to form a metal-oxide heterojunction. Further metal or conductive layers may be formed on the final surface of the first metal crystalline metal layer forming the metal-oxide heterojunction. In some cases, multiple epitaxial and/or non-epitaxial metal layers can be deposited. For example, epitaxial and/or non-epitaxial metal layers can be deposited in different areas of the device to perform different functions. A metal layer can also contain multiple epitaxial and/or non-epitaxial metal layers in the same region of the device, for example, where a first layer is a sticking layer, and subsequent layers adhere to the sticking layer. In some cases, a metal layer can contain a first epitaxial layer to form a low defect interface with a semiconductor layer below it, and a non-epitaxial metal layer can be deposited on top of the epitaxial metal layer.

Metal-induced-gap states (MIGS) are known in the prior-art for metal contacts to semiconductor surfaces. Simplistically, the MIGS arise from mismatch of dissimilar crystal structures comprising the metal and oxide semiconductor interface, resulting in disadvantageous bonding arrangements at the metal-oxide heterointerface. Passivation of the aforementioned interfacial dangling bonds may be used to reduce the effect of MIGS on the Schottky barrier lowering effect.

The present disclosure describes an optional method for direct and connective arrangement of bonds across the metal-oxide heterointerface wherein a substantially epitaxial (i.e., crystalline) first metal layer is formed on an anion- or cation-terminated oxide surface.

In some cases, an isolation layer can be formed between the epitaxial oxide layer and the metal layer (e.g., an epitaxial metal layer) using an epitaxial layer growth technique (e.g., using MBE, MOCVD, or another epitaxial layer growth technique). In some cases, a passivation layer can be formed on the device. The passivation layer can include, for example, aluminum oxide $Al_2O_3$, magnesium oxide MgO, zinc-magnesium-gallium-oxide $(Zn_xMg_{1-x})Ga_2O_4$, aluminum-gallium oxide $(Al_xGa_{1-x})_2O_3$, nickel-zinc-magnesium-gallium-aluminum oxide $(Ni_xZn_yMg_{1-x-y})(Ga_pAl_{1-p})O_q$, magnesium-germanium-oxide $Mg_xGe_yO_z$ or silicon dioxide $SiO_2$, wherein subscripts x, y, z, p, q represent atomic fractions representing various crystalline, polycrystalline or amorphous forms.

In some cases, one or more layers (e.g., the epitaxial oxide layer, the epitaxial metal layer or metal layer, the isolation layer, and/or the passivation layer) can be patterned to form the devices, such as using photolithography and etching techniques (e.g., using photoresist, plasma etching, and/or metal lift-off processes). In other methods a damascene metal patterning can be utilized, wherein the oxide is used as the trench and subsequently chemical mechanical polished if required.

FIG. 1 shows a figurative sectional view of a vertical multilayered semiconductor diode device 100 according to an illustrative embodiment.

In this example, device 100 comprises a substrate 110 comprising silicon carbide (SiC) and having a width, $w_{sub}$, and thickness, $t_{sub}$. In an example, the substrate 110 is formed from the 4H—SiC polytope of SiC. In another example, the substrate 110 is formed from 2H—SiC or 6H—SiC or 3C—SiC.

The vertical direction of the multilayered device 100 is defined to be approximately perpendicular to a top surface 111 of substrate 110 as indicated by the arrow with the dimension "z" increasing in the vertical upwards direction. Formed above the SiC substrate 110, and in this example on the top surface 111 of substrate 110, is an epitaxial drift layer 120 comprising a semiconductor oxide material having a layer thickness $t_D$ and itself having a top surface 121. Formed above the epitaxial drift layer 120, and in this case on the top surface 121 of epitaxial drift layer 120, is a metal layer 130 where the material properties of the drift layer 120 and metal layer 130 are selected to form a Schottky potential barrier at an interface region 140 between the metal layer 130 and epitaxial drift layer 120. Metal layer 130 can be either an epitaxial metal layer, or a metal layer that is not epitaxial with the drift layer below it. In some cases, the metal layer 130 is an epitaxial metal layer that forms a low defect interface with the epitaxial oxide layer 120 (compared to an interface formed between the epitaxial oxide layer 120 and a non-epitaxial metal layer), to form the Schottky barrier junction. A second metal layer 132 forms an ohmic (or approximately ohmic) electrical contact with substrate 110, at a back surface opposite the top surface 121.

The thicknesses of the layers are not shown to scale in FIG. 1, or in any figures showing a figurative sectional view of a vertical multilayered semiconductor diode device herein. For example, the substrate thickness $t_{sub}$ can be much thicker than the drift layer 120 thickness $t_D$. In some cases, the substrate thickness $t_{sub}$ can be from 1 mm to 3 mm, or from 100 microns to 1 mm, or from 10 microns to 500 microns. The drift layer 120 thickness $t_D$ can be from 10 nm to 100 microns, or from 1 micron to 100 microns.

As depicted in FIG. 1, device 100 may include an ohmic anode contact region 151 ("A) and an ohmic cathode contact region 152 ("C") which may be formed on or in the metal layer 130 and on or in the metal layer 132 respectively. In an example, the ohmic anode contact region 151 comprises the metal layer 130. In an example, the ohmic cathode contact region 152 comprises the metal layer 132.

In an example, the SiC substrate 110 may be doped n-type or p-type, imparting a conductivity type governed by charge carriers of electrons or holes, respectively.

In some cases, epitaxial drift layer 120 comprises a semiconductor oxide material. Epitaxial drift layer 120 can include any of the oxide materials described herein, for example, any of the compositions of Materials 1-7.

In various examples, the epitaxial drift layer 120 is a semiconductor oxide material in the form of $Ga_2O_3$ or $(Al_xGa_{1-x})_2O_3$ where $0 \le x \le 1$, In another form, the epitaxial drift layer 120 is a semiconductor oxide material in the form of a ternary oxide including, but not limited to $Mg_xGa_{2(1-x)}O_{3-2x}$ where $0 \le x \le 1$, or $Mg_xAl_{2(1-x)}O_{3-2x}$ where $0 \le x \le 1$.

In another form, the epitaxial drift layer 120 is a semiconductor oxide material in the form of $(Mg_xZn_{1-x})_z(Al_yGa_{1-y})_{2(1-z)}O_{3-2z}$, where $0 \le x \le 1$, $0 \le y \le 1$, and $0 \le z \le 1$.

In another form, the epitaxial drift layer 120 is a semiconductor oxide material in the form of $(Mg_xZn_{1-x})_z(Al_yGa_{1-y})_{2(1-z)}O_{3-2z}$, where 0≤x≤1, 0≤y≤1, and 0≤z<1.

In another form, the epitaxial drift layer 120 is a semiconductor oxide material in the form of $(Mg_xZn_{1-x})_z(Al_yGa_{1-y})_{2(1-z)}O_{3-2z}$, where 0<x<1, 0≤y≤1, and 0≤z<1.

In some examples epitaxial drift layer 120 can include one or more of: $Ga_2O_3$ (e.g., α-phase or β-phase); $(Al_xGa_{1-x})_2O_3$ (e.g., α-phase or β-phase) where 0≤x≤1; $Mg_xGa_{2(1-x)}O_{3-2x}$ where 0≤x≤1; $Mg_xAl_{2(1-x)}O_{3-2x}$ where 0≤x≤1; $(Mg_xZn_{1-x})_z(Al_yGa_{1-y})_{2(1-z)}O_{3-2z}$ where 0≤x≤1, 0≤y≤1, and 0≤z≤1, $Zn_xGa_yO_z$ where 0≤x≤1, 0≤y≤1, and 0≤ z≤1; $Zn_xAl_yO_z$ where 0≤x≤1, 0≤y≤1, and 0≤z≤1; $Mg_xGa_yO_z$ where 0≤x≤1, 0≤y≤ 1, and 0≤z≤1; $Mg_xAl_yO_z$ where 0≤x≤1, 0≤y≤1, and 0≤z≤1; $Ni_xGa_yO_z$ where 0≤x≤ 1, 0≤y≤1, and 0≤z≤1; $Ni_xAl_yO_z$ where 0≤x≤1, 0≤y≤1, and 0≤z≤1; $(Ni_xMg_{1-x})_yGa_{2(1-y)}O_{3-2y}$ where 0<x<1 and 0<y<1; or $(Mg_xNi_{1-x})_z(Al_yGa_{1-y})_{2(1-z)}O_{3-2z}$, where 0≤x≤1, 0≤y≤1, and 0≤z≤1, or $(Ni_zMg_xZn_{1-x}\text{-}z)(Al_yGa_{1-y})_2O_4$ where 0≤(x,y,z)≤1, or $(Zn_pMg_xNi_{1-x-p})_z(Al_yGa_{1-y})_{2(1-z)}O_{3-2z}$, where 0≤(p, x, y, z)≤1.

In other examples, the epitaxial drift layer 120 is doped n-type or p-type. In some cases, one or more impurity species can be added to the epitaxial drift layer 120 to extrinsically dope the layer. In some cases, epitaxial drift layer 120 can be a polar material that is doped via polarization doping.

In another example, the epitaxial drift layer 120 is formed from β-$Ga_2O_3$ (−201) and the substrate 110 is formed from C-plane SiC(0001).

In yet another example, the epitaxial drift layer 120 is formed from β-$Ga_2O_3$ (−201) and the substrate 110 is formed from C-plane SiC(0001) wherein the oxide is formed on a Silicon-polar (Si-polar) SiC surface.

Another example has the epitaxial drift layer 120 that is formed from β-$Ga_2O_3$ (−201) and the substrate 110 is formed from C-plane SiC(0001) wherein the oxide is formed on a Carbon-polar (C-polar) SiC surface.

In an example, the epitaxial drift layer 120 is formed in whole or part from alpha-phase α-$Ga_2O_3$ having crystal symmetry group R3m and the substrate 110 is formed from 4H—SiC. The epitaxial oxide α-$Ga_2O_3$ formed primarily as an A-plane oriented epitaxial film on an A-plane oriented 4H—SiC (11-20), R-plane 4H—SiC (10-12) or M-plane 4H—SiC (10-10) surface. That is, A-plane α-$Ga_2O_3$ oriented epitaxial films are possible on A-, R- and M-plane 4H—SiC surfaces. The SiC surface can be selected from a silicon-polar or carbon-polar orientation. The polarity of the surface directly affects the heterojunction formed with an epitaxial oxide which can be used as a form of polarization control at the interface and can also facilitate polarization doping. The epitaxial oxide of the epitaxial drift layer 120 may be non-polar, semi-polar or polar depending upon the oxide crystal symmetry group and film orientation with respect to the substrate surface.

In an example, the epitaxial drift layer 120 is formed from β-$(Al_xGa_{1-x})_2O_3$ with 0≤x≤1. In another example, the epitaxial drift layer 120 is formed from β-$(Al_xGa_{1-x})_2O_3$ with 0≤ x≤0.3, and the substrate 110 is formed from C-plane SiC (0001). The SiC substrates described herein can be silicon polar, or carbon polar.

Furthermore, SiC substrates may be prepared with an intentional miscut in the surface, exposing a plurality of atomic steps and terraces. For example, a miscut C-plane 4H—SiC(0001) oriented surface can be prepared to form a miscut of 0-6 degrees directed toward the A-plane (11-20). A 4-degree miscut is a standard type of substrate used in the prior-art of growing epitaxial SiC film on the n-doped 4H—SiC substrate. In some examples of the present disclosure, insight is provided in which a 4 deg miscut 4H—SiC can be advantageous for improving the crystallographic quality of epitaxial oxides.

In an example, the epitaxial drift layer 120 is formed from α-$(Al_xGa_{1-x})_2O_3$ with 0≤x≤1 and the substrate 110 is formed from A-plane SiC (1-100) or R-plane SiC (2100) or M-plane SiC (1-100). The surface orientation of SiC substrates with these orientations may also be miscut by about 0-to-6 degrees, or 0-to-1 degree for improving the crystal property of the epitaxial oxide.

In some examples, the composition of the epitaxial drift layer 120 varies in the vertical direction. Similarly, the doping concentration may also vary in the vertical direction. In various examples, the drift layer 120 may have a combination of: (i) constant doping concentration and constant composition in the vertical direction; (ii) graded doping concentration and constant composition in the vertical direction; (iii) constant doping concentration and graded composition in the vertical direction; or (iv) graded doping concentration and graded composition in the vertical direction.

In some embodiments, the epitaxial drift layer 120 may be formed as a superlattice comprising a plurality of different or dissimilar oxide materials. In some embodiments, the drift layer 120 may be formed as a chirp layer comprising multiple oxide materials, where a chirp layer is similar to a superlattice with layers that change thickness through the drift layer 120. The superlattice or chirp layer can contain wider and narrower bandgap materials forming potential energy barrier and well layers, respectively. In some cases, the superlattice or chirp layer of the drift layer 120 may have, in the vertical direction, a combination of: (i) constant doping concentration and constant composition: (ii) graded doping concentration and constant composition; (iii) constant doping concentration and graded composition; or (iv) graded doping concentration and graded composition. In cases, where the doping and/or composition are graded, the change in doping and/or composition may be formed by varying the barrier and/or well layers through the drift layer 120. For example, the thicknesses of the barrier and/or well layers can be varied to form a graded composition through the drift layer 120. In another example, the doping concentration of the barrier and/or well layers can be varied to form a graded doping profile through the drift layer 120. In some cases, the doping concentration, thickness, and/or composition can be varied within one or more barrier and/or well layers of a superlattice or chirp layer of the drift layer 120 to form the graded doping concentration and/or graded composition.

In some examples, one or more layers formed from a non-semiconductor oxide material or a non-SiC material may be formed between the substrate 110 and the drift layer 120 while still maintaining the configuration that the epitaxial drift layer 120 is formed above the substrate 110. For example, a single crystal metallic layer, a semi-metallic layer, or an insulating layer can be formed between the substrate 110 and the drift layer 120. Such a layer can be useful for improving the contact resistance or providing a tunnel barrier within a low resistance (or ohmic) contact between the substrate 110 and the drift layer 120.

Figure 2A:
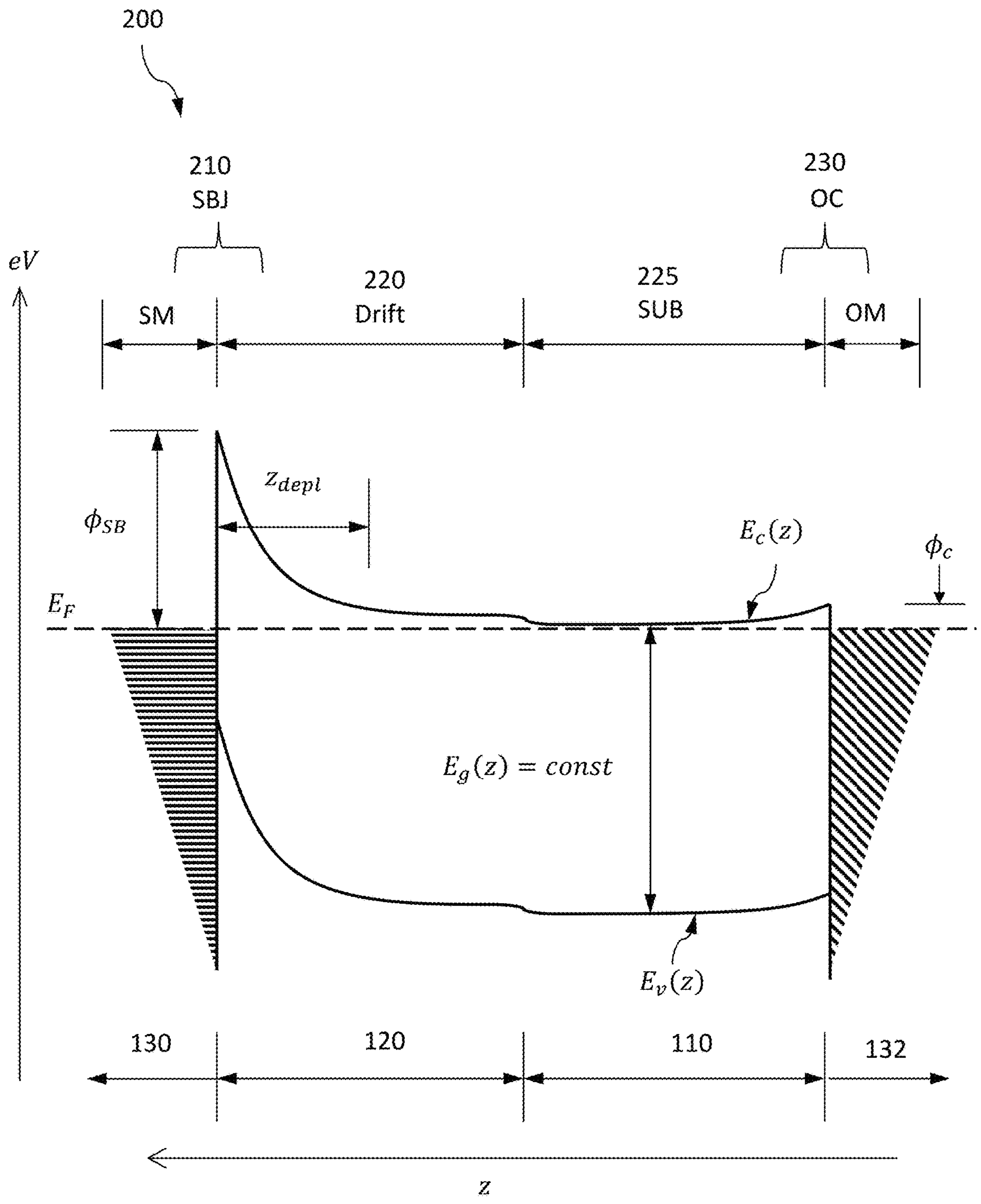
FIG. 2A is a simplified band diagram of a vertical multilayered semiconductor diode device, in accordance with some embodiments.

FIG. 2A shows a simplified electronic energy band diagram 200 of a vertical multilayered semiconductor diode device where the direction of increasing "z" corresponds to moving vertically upwards as shown in FIG. 1. In this example, band diagram 200 depicts the Schottky barrier junction (SBJ) region 210, the drift region 220, the n-doped substrate 225 and an ohmic junction region 230 corresponding to an ohmic contact (OC) region for diode device 100 where the drift layer is an n-doped semiconductor oxide material. A Schottky metal (SM) and Ohmic metal (OM) are selected to achieve a high potential energy barrier $\phi_{SB}$ and low energy barrier $\phi_C$, respectively. SM and OM may be dissimilar metals or the same. The energy of the valence band, $E_v(z)$ and conduction band, $E_c(z)$ as a function of vertical distance z are shown with the band gap energy $E_g$ also indicated.

As can be seen by inspection, at the interface between the epitaxial metal layer 130 and the epitaxial drift layer 120 at equilibrium, the Fermi energy level, $E_F$, matches across the interface and a Schottky potential barrier $\phi_{SB}$ is formed with a depletion zone extending downwardly into the epitaxial drift layer a distance of $Z_{depl}$.

Figure 2B:
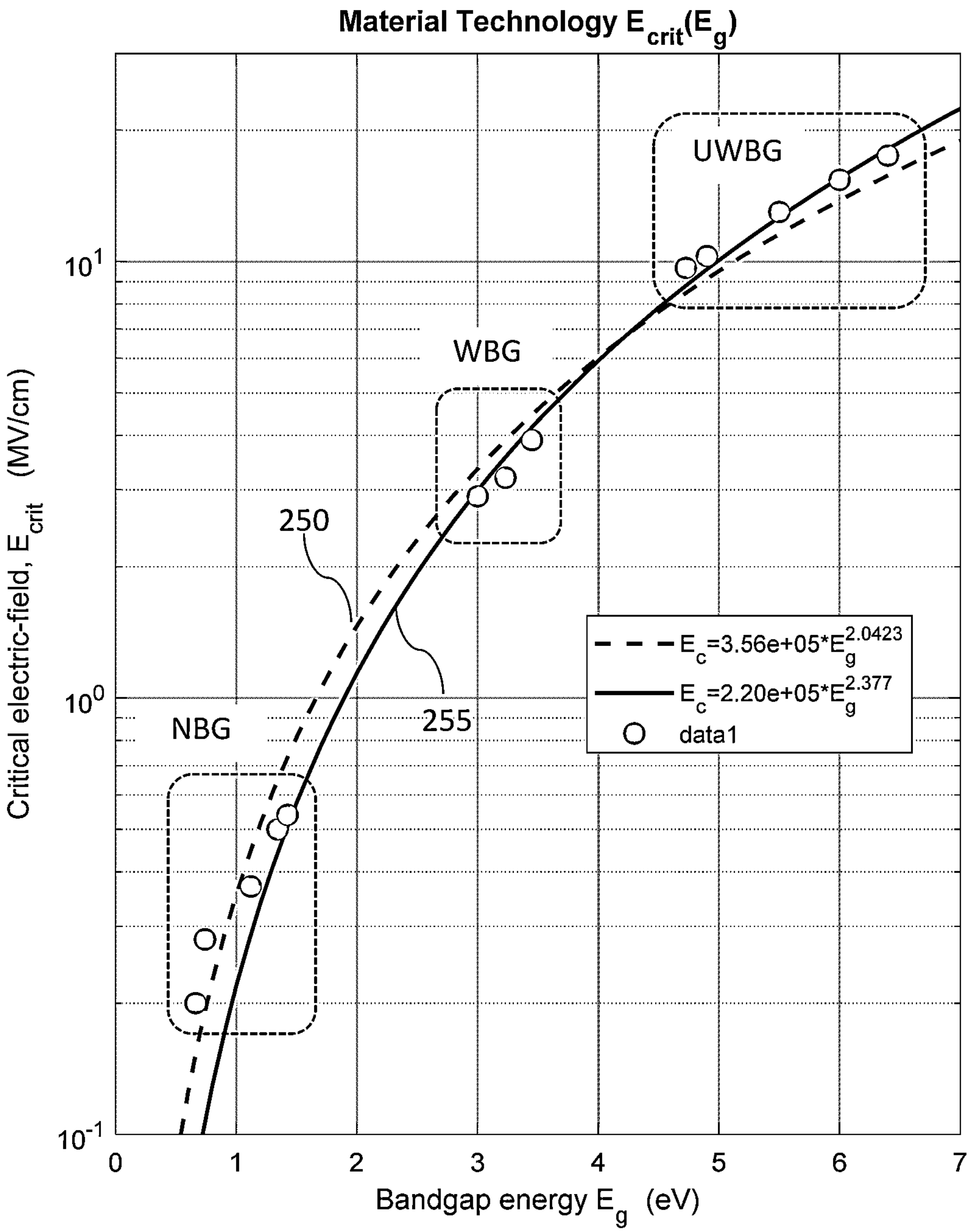
FIG. 2B is a plot of the trends for the critical electric-field that can be supported versus a semiconductor bandgap energy.

FIG. 2B shows the empirically derived relationship between the critical electric field $E_{crit}$ that can be supported by various semiconductors possessing an electronic energy bandgap $E_g$. Avalanche breakdown process due to energetic carrier-induced impact ionization governs the maximum sustainable electric field that can be supported by the host semiconductor (i.e., the critical or breakdown voltage across a finite thickness of a semiconductor is defined as $V_{br}$). The maximum electric-field at breakdown (also called the critical electric field, $E_{crit}$) is known to increase with wider semiconductor bandgap $E_g$. FIG. 2B shows selected data and fitted relationships for not-intentionally-doped (NID) semiconductors ranging from small ("NBG", e.g., InAs, InP, GaAs, InGaP), wide ("WBG", e.g., GaN, ZnO, SiC) and ultrawide bandgaps ("UWBG", e.g., diamond, $Ga_2O_3$, AlN, ZnGaO). The dashed line 250 is a fit to the data, resulting in a power law as shown. The solid line 255 is a preferential fit to WBG and UWBG data, resulting in a power law as shown. This dependence (solid line 255) provides the major impetus for the adoption of wide bandgap (WBG) and, in the present disclosure, ultrawide bandgap (UWBG) semiconductors for high power electronics.

Figure 2C:
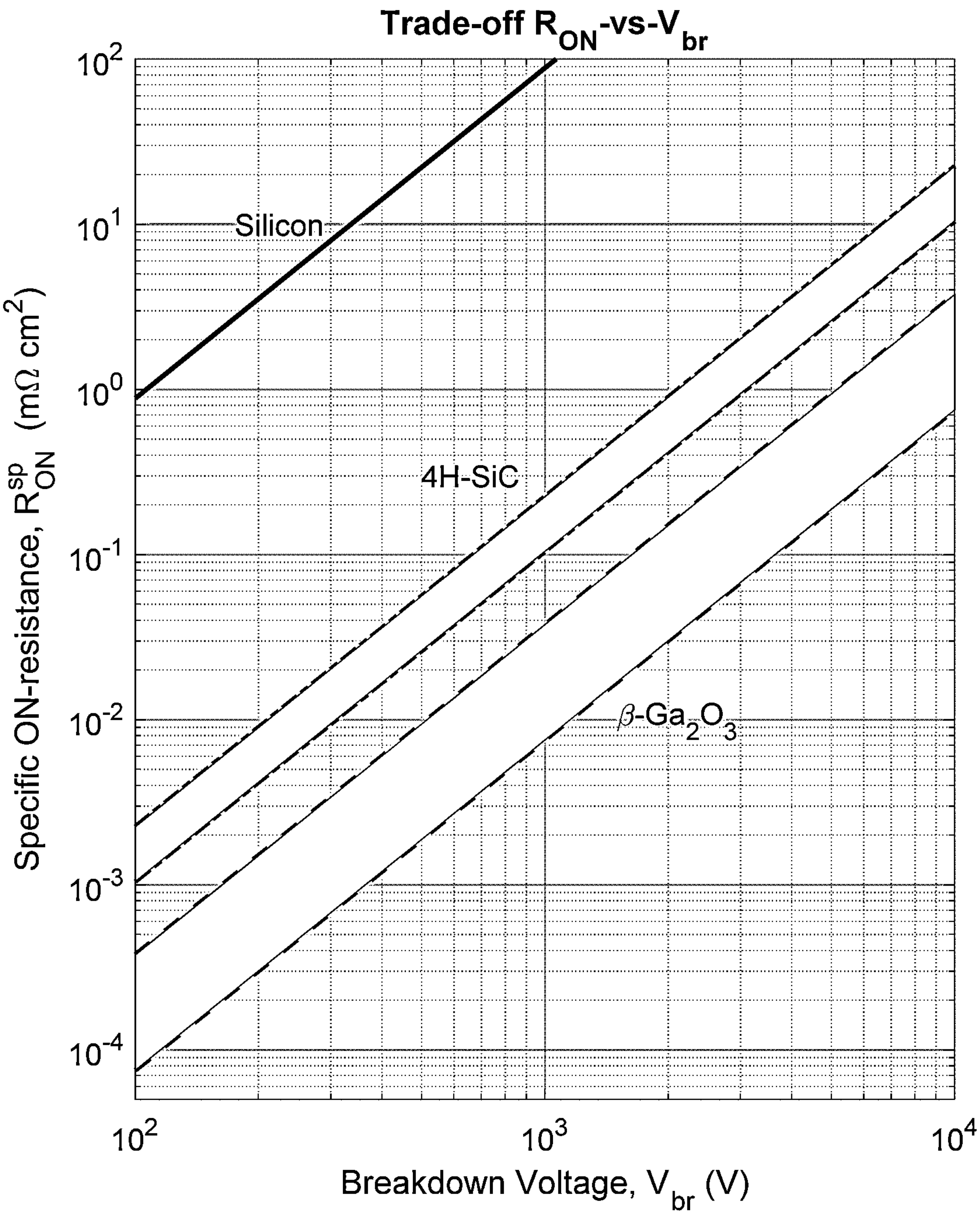
FIG. 2C is a plot of the specific ON-resistance versus the breakdown voltage for Silicon, Silicon-Carbide and Gallium Oxide semiconductors.

FIG. 2C plots the important relationship between FIGURES of merit describing a given semiconductor. The specific ON-resistance per unit thickness of material $$R_{ON}^{sp}$$

governs efficiency or loss of diode when in the conducting state. Plotting $$R_{ON}^{sp}\ vs\ V_{br}$$

shows the fundamental trends for a given semiconductor technology. The plot shows that both WBG 4H—SiC and UWBG $\beta$-$Ga_2O_3$ provide significant advantages over bulk Si, with 3 to 4 orders of magnitude reduction ON-resistance for a given maximum operating voltage. In particular, the devices of the present disclosure utilize the benefits of UWBG $Ga_2O_3$ to further extend the improvements possible for high power devices designs over WBG SiC. The shaded bands represent the variation in possible material properties such as crystallinity, defects, carrier mobility and the like. FIG. 2C can be used as a guide for designing high power diode operation and shows the trade-off between low loss and high voltage operation.

Figure 3:
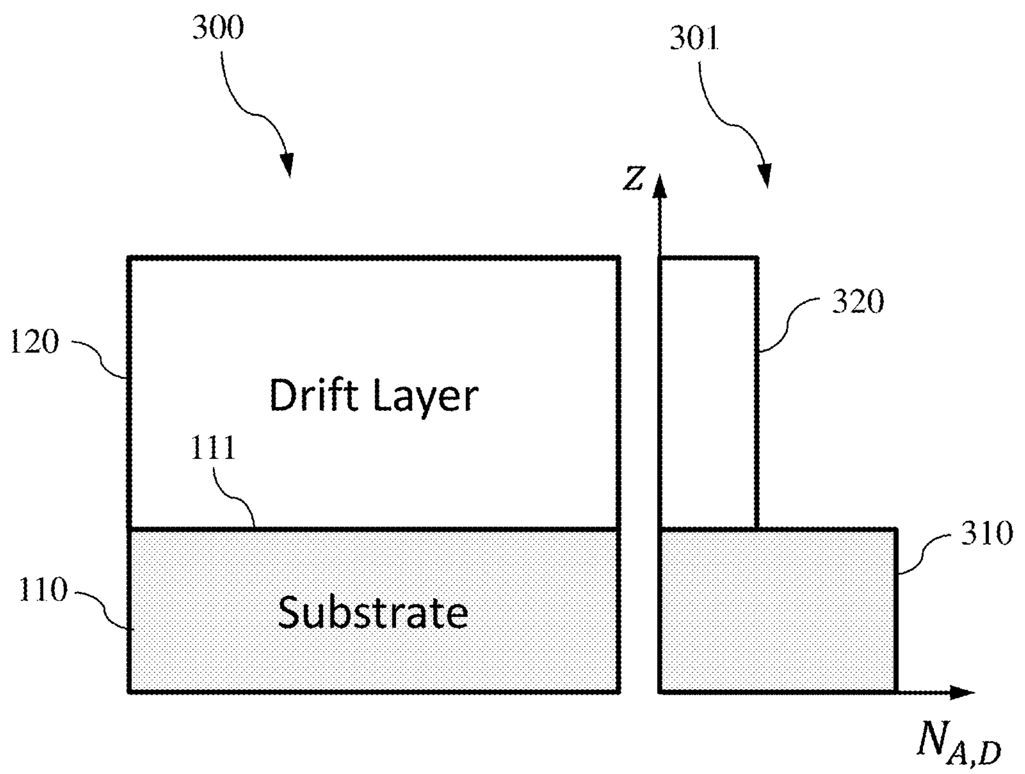
FIG. 3 is a figurative view of the substrate and drift layer of a vertical multilayered semiconductor diode device such as shown in FIG. 1 and an associated plot of an example variation in doping concentration (i.e., doping density) as a function of vertical height, in accordance with some embodiments.

FIG. 3 shows a figurative view 300 of the substrate 110 and drift layer 120 of a vertical multilayered semiconductor diode device such as shown in FIG. 1, and an associated plot 301 of an example variation in doping concentration, $N_{A,D}$, (A and D referring to donor and acceptor sites respectively) as a function of vertical height z. For example, a highly doped n-type (e.g., $n^+$ doped) substrate 110 would have a large $N_D$ concentration (e.g., from $10^{18}$ $cm^{-3}$ to $10^{20}$ $cm^{-3}$, or from $10^{19}$ $cm^{-3}$ to $10^{20}$ $cm^{-3}$), and a highly doped p-type (e.g., $p^+$ doped) substrate 110 would have a large $N_A$ concentration (e.g., from $10^{18}$ $cm^{-3}$ to $10^{20}$ $cm^{-3}$, or from $10^{19}$ $cm^{-3}$ to $10^{20}$ $cm^{-3}$). In this example, there is a discrete change in the drift layer doping concentration 320 and the substrate doping concentration 310 that occurs at the interface 111 between substrate layer 110 and drift layer 120. In this example, the drift layer 120 has a smaller dopant concentration than the substrate 110. For example, a doped n-type drift layer 120 could have an $N_D$ concentration from $10^{15}$ $cm^{-3}$ to $10^{18}$ $cm^{-3}$, and a doped p-type drift layer 120 could have an $N_A$ concentration from $10^{15}$ $cm^{-3}$ to $10^{18}$ $cm^{-3}$. In some embodiments, the substrate 110 and the drift layer 120 are both doped n-type, or are both doped p-type.

Figure 4:
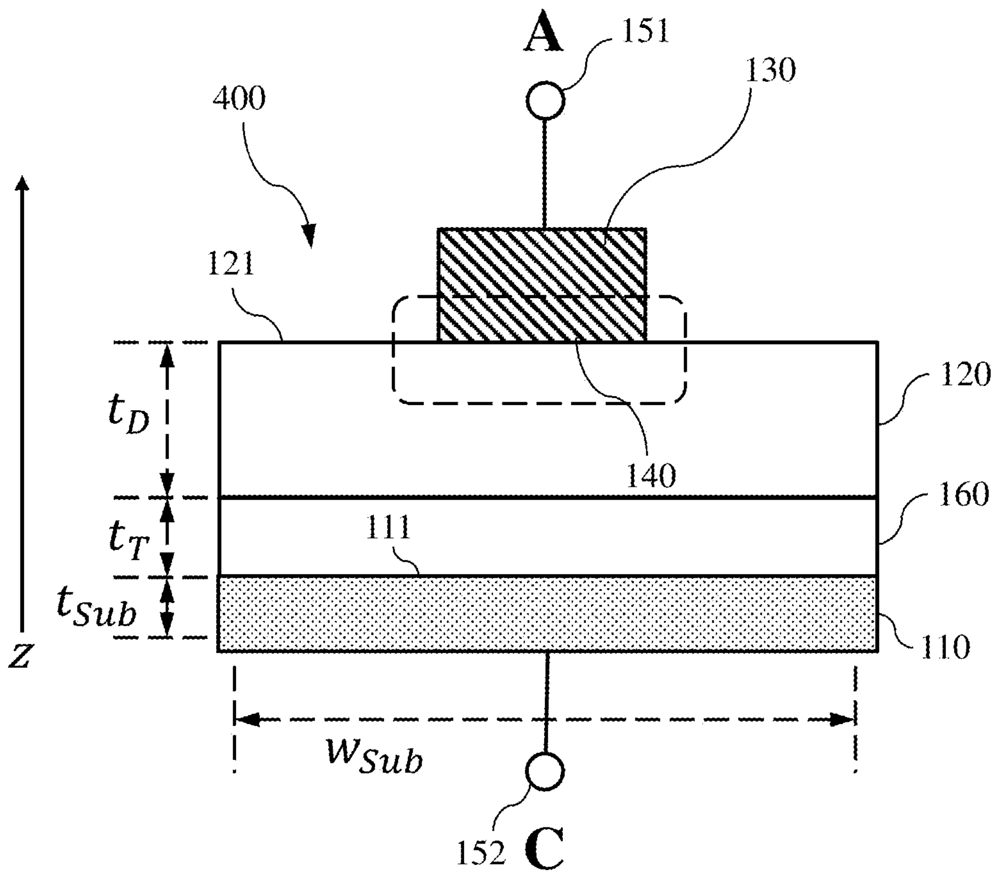
FIG. 4 is a figurative sectional view of a vertical multilayered semiconductor diode device in accordance with another illustrative embodiment.

FIG. 4 shows a figurative sectional view of a vertical multilayered semiconductor diode device 400 according to an illustrative embodiment. Device 400 in this example is similar to device 100 in FIG. 1, however, device 400 further comprises a transition layer 160 disposed between substrate 110 and drift layer 120. In various examples, intermediate transition layer 160 may be formed of SiC or a semiconductor oxide material or combination of both these materials. The transition layer 160 has a layer thickness tr.

In some cases, transition layer 160 comprises a semiconductor oxide material. Transition layer 160 can include any of the oxide materials described herein, for example, any of the compositions of Materials 1-7. Transition layer 160 can contain a single semiconductor oxide composition, or more than one sub-layer with different semiconductor oxide composition (e.g., the sub-layers can form a bilayer, a multilayered structure, a superlattice, or a chirp layer), any of which can be chosen from Materials 1-7. In some cases, transition layer 160 comprises a graded composition (e.g., a linear, a step-wise, or a chirped composition gradient) comprising one or more of Materials 1-7. In some cases, transition layer 160 comprises one or more of Materials 1-7 that is doped with a single dopant concentration, or with a dopant concentration that varies in depth in the transition layer 160.

In some examples, transition layer 160 can include one or more of: $Ga_2O_3$ (e.g., $\alpha$-phase or $\beta$-phase); $(Al_xGa_{1-x})_2O_3$ (e.g., $\alpha$-phase or $\beta$-phase) where $0\le x\le 1$; $Mg_xGa_{2(1-x)}O_{3-2x}$ where $0\le x\le 1$; $Mg_xAl_{2(1-x)}O_{3-2x}$ where $0\le x\le 1$; $(Mg_xZn_{1-x})_z(Al_yGa_{1-y})_{2(1-z)}O_{3-2z}$ where $0\le x\le 1$, $0\le y\le 1$, and $0\le z\le 1$, $Zn_xGa_yO_z$ where $0\le x\le 1$, $0\le y\le 1$, and $0\le z\le 1$; $Zn_xAl_yO_z$ where $0\le x\le 1$, $0\le y\le 1$, and $0\le z\le 1$; $Mg_xGa_yO_z$ where $0\le x\le 1$, $0\le y\le 1$, and $0\le z\le 1$; $Mg_xAl_yO_z$ where $0\le x\le 1$, $0\le y\le 1$, and $0\le z\le 1$; $Ni_xGa_yO_z$ where $0\le x\le 1$, $0\le y\le 1$, and $0\le z\le 1$; $Ni_xAl_yO_z$ where $0\le x\le 1$, $0\le y\le 1$, and $0\le z\le 1$; $(Ni_xMg_{1-x})_yGa_{2(1-y)}O_{3-2y}$ where $0<x<1$ and $0<y<1$; or $(Mg_xNi_{1-x})_z(Al_yGa_{1-y})_{2(1-z)}O_{3-2z}$, where $0\le x\le 1$, $0\le y\le 1$, and $0\le z\le 1$, or $(Ni_zMg_xZn_{1-x}$-z$)(Al_yGa_{1-y})_2O_4$ where $0\le(x,y,z)\le 1$, or $(Zn_pMg_xNi_{1-x-p})_z(Al_yGa_{1-y})_{2(1-z)}O_{3-2z}$, where $0\le(p, x, y, z)\le 1$.

Figure 5:
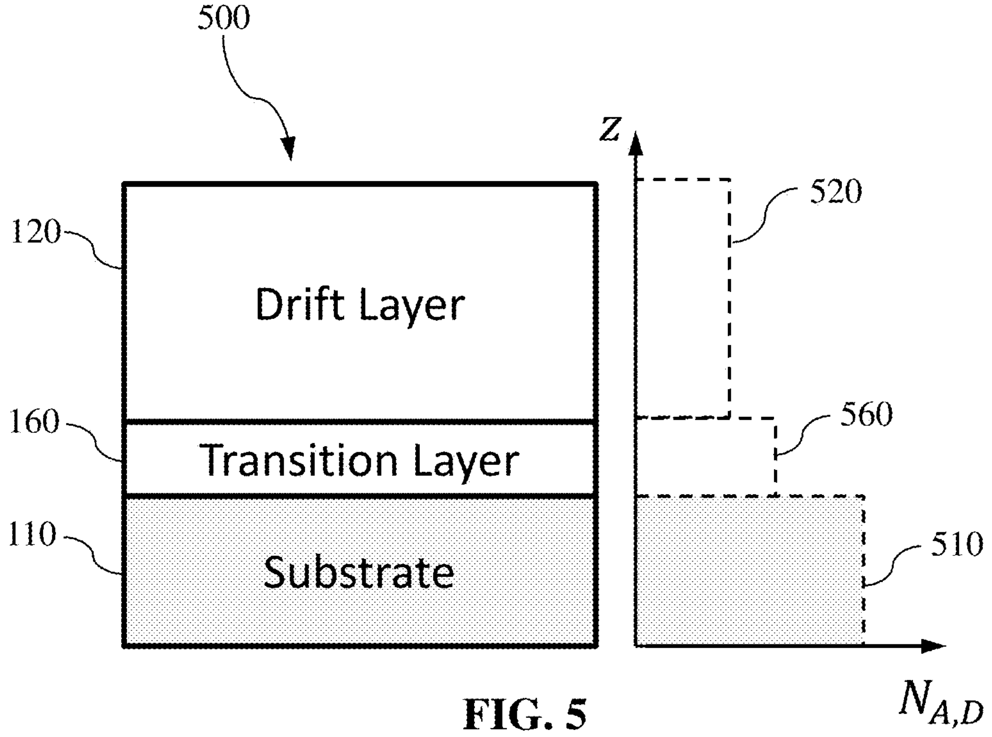
FIG. 5 is a figurative view of the substrate, transition layer and drift layer of a vertical multilayered semiconductor diode device such as shown in FIG. 4 and an associated plot of an example variation in doping concentration as a function of vertical height, in accordance with some embodiments.

FIG. 5 shows a figurative view 500 of the substrate 110, transition layer 160 and drift layer 120 of a vertical multilayered semiconductor diode device such as shown in FIG. 4 and an associated plot of an example variation in doping concentration, $N_{A,D}$, as a function of vertical height z.

In this example, the transition layer doping concentration 560 may have a doping concentration between that of the substrate doping concentration 510 and the drift layer doping concentration 520 with a discrete change in doping concentration between the substrate 110 and transition layer 160, and between the transition layer 160 and the drift layer 120. In an example, the substrate 110 may be n+ doped (i.e., having a doping concentration of from $10^{19}$ to $10^{20}$ $cm^{-3}$), the transition layer 160 may be n' doped (i.e., having a doping concentration of approximately $10^{18}$ $cm^{-3}$, or from $10^{17}$ $cm^{-3}$ to $10^{18}$ $cm^{-3}$) and the drift layer 120 may be $n^{--}$ doped (i.e., having a doping concentration from $10^{15}$ $cm^{-3}$ to $10^{17}$ $cm^{-3}$) as a result providing a transition between a $n^+$ doped region to a n-doped region moving vertically upwards from the substrate 110 to the drift layer 120. Similarly, a p-type device can be formed wherein the substrate 110 is $p^+$ doped, the transition layer 160 is p doped, and the drift layer 120 is $p^{--}$ doped, where the layers have the doping concentrations described above of acceptors rather than donors. In other cases, the substrate 110 can be $n^+$ or $p^+$ doped, the drift layer 120 can be $n^-$ or $p^-$ doped, respectively (to form the Schottky barrier junction), and the transition layer 160 can have a doping concentration between that of the substrate 110 and the drift layer 120. For example, the transition layer 160 may be formed from SiC and the drift layer 120 may be formed of a semiconductor oxide material. In another example, the transition layer 160 (TL) may be formed of a semiconductor oxide material, and the drift layer 120 may be formed of the same semiconductor oxide material or a different oxide material as the TL. In an example, the transition layer 160 may be formed of a material chosen to provide a structural matching region between the substrate 110 and the drift layer 120. For example, a transition layer 160, comprising a semiconductor oxide material of the form of $Mg_xZn_yNi_z(Al_p,Ga_{1-p})O_q$ can be formed between an SiC substrate 110 and a drift layer 120, where the drift layer 120 comprises $Ga_2O_3$ or compositionally graded $Al_xGa_{1-x}O_3$. Another example of a semiconductor oxide material is of the form of a silicon oxy-carbide $Si_xC_yO_z$, which can be comprised in the transition layer 160 and can be formed between an SiC substrate 110 and a drift layer 120, where the drift layer 120 comprises $Ga_2O_3$ or compositionally graded $Al_xGa_{1-x}O_3$. Yet another example of a semiconductor oxide material is of the form of a silicon oxy-nitride $Si_xN_yO_z$ which can be comprised in the transition layer 160 and can be formed between an SiC substrate 110 and a drift layer 120, where the drift layer 120 comprises $Ga_2O_3$ or compositionally graded $Al_xGa_{1-x}O_3$. Another example of a TL is one comprising a material of the form of a silicon-germanium-carbide $Si_xGe_yC_z$ such that the transition layer 160 can be used to manage the interfacial strain formed between an SiC substrate 110 and a drift layer 120, where the drift layer 120 comprises $Ga_2O_3$ or compositionally graded $Al_xGa_{1-x}O_3$.

The surface of an SiC substrate or layer can be intentionally terminated with one or more species. For example, an intentional surface termination of an SiC surface can comprise a substantially Silicon-(Si) or Carbon-(C) or Oxygen-(O) or Nitrogen-(N) terminated species. Termination (e.g., uniform termination) with a single species may be used advantageously for seeding the epitaxial deposition of semiconductor oxide (or metal oxide film), such that, the interfacial bonds arrange with low lattice mismatch (or with reduced mismatch, or with an acceptable amount of mismatch) compared to not terminating the surface with a single species. For example, in vacuo, the SiC surface may be prepared such that a Si-terminated surface is configured. The Si-terminated surface can then be preferentially reacted with active oxygen species to form α-C—Si—O-bond sequence. Conversely, a C-terminated surface can be configured such that reaction with active oxygen produces Si—C—O-sequence at the immediate interface. The oxygen can then readily bond with Ga (or another cation atom) to subsequently form a $Ga_2O_3$ single crystal epilayer.

Other possible interfacial layers can also be used advantageously. For example, an interfacial surface comprising silicon oxy-carbide $Si_xC_yO_z$ comprising the transition layer can also be formed between a SiC substrate 110 and a drift layer 120, where the drift layer 120 comprises $Ga_2O_3$ or compositionally graded $Al_xGa_{1-x}O_3$.

Alternately, an interfacial surface comprising silicon-carbon-nitride $Si_xC_yN_z$, which can be comprised in the transition layer can also be formed between a SiC substrate 110 and a drift layer 120, where the drift layer 120 comprises $Ga_2O_3$ or compositionally graded $Al_xGa_{1-x}O_3$.

An interfacial surface comprising germanium-nitride $Ge_xN_y$, which can be comprised in the transition layer 160 can also be formed between a SiC substrate 110 and a drift layer 120, where the drift layer 120 comprises $Ga_2O_3$ or compositionally graded $Al_xGa_{1-x}O_3$.

Another example of a transition layer oxide is of the form of magnesium oxide (MgO), which can be comprised in transition layer 160, and can be formed between an SiC substrate 110 and a drift layer 120, where the drift layer 120 comprises $Ga_2O_3$ or compositionally graded $Al_xGa_{1-x}O_3$. For 4H—SiC(0001) surface a MgO(111) oriented transition layer may be of only a few unit cells in thickness.

Yet another example of a transition layer oxide is of the form of zinc gallium oxide (e.g., spinel crystal symmetry $ZnGa_2O_4$, for example with a Fd3m space group), which can be comprised in transition layer 160, and can be formed between an SiC substrate 110 and a drift layer 120, where the drift layer 120 comprises $Ga_2O_3$ or compositionally graded $Al_xGa_{1-x}O_3$. For 4H—SiC(0001) surface a $ZnGa_2O_4$ (111) oriented transition layer may be of one or only a few unit cells in thickness or more.

In other examples, one or more layers formed from a non-semiconductor oxide material or a non-SiC material may be formed between the substrate 110 and the transition layer 160 and/or between the transition layer 160 and the drift layer 120. For example, a single crystal metallic layer, a semi-metallic layer, or an insulating layer can be formed between the substrate 110 and the transition layer 160. Such a layer can be useful for improving the contact resistance or providing a tunnel barrier to form a low resistance (or ohmic) contact between the substrate 110 and the transition layer 160.

Figure 6:
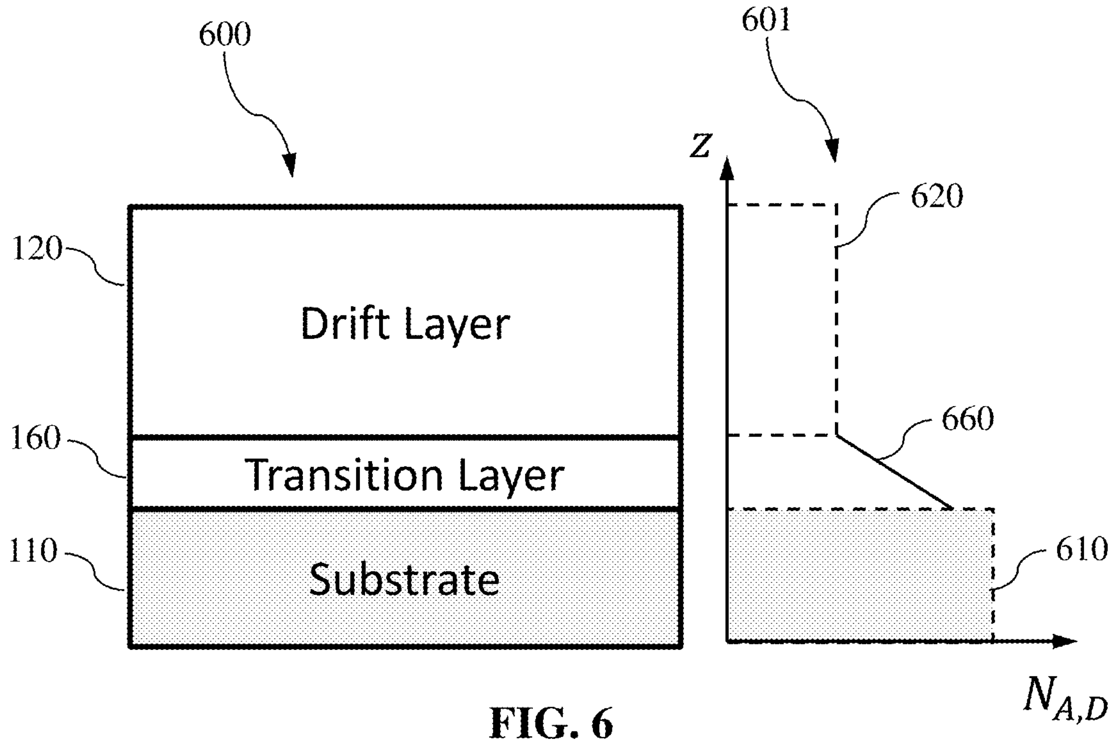
FIG. 6 is a figurative view of the substrate, transition layer and drift layer of a vertical multilayered semiconductor diode device such as shown in FIG. 4 and an associated plot of another example variation in doping concentration as a function of vertical height, in accordance with some embodiments.

FIG. 6 shows a figurative view 600 of the substrate 110, transition layer 160 and drift layer 120 of a vertical multi-layered semiconductor diode device such as shown in FIG. 4 and an associated plot 601 of another example variation in doping concentration, $N_{A,D}$, as a function of vertical height z. FIG. 6 shows an example wherein the transition layer 160 has a varying doping density (i.e., doping concentration). The transition layer 160 can have a variable doping density that varies in a vertical direction that is perpendicular to a top surface of the substrate. In some cases, the variable doping density of the transition layer 160 includes a doping density (e.g., an average doping density of the layer) that is between a doping density of the substrate and a doping density of the drift layer.

In this example, the transition layer doping concentration 660 has a monotonic gradient in the z direction, starting at a doping concentration below (i.e., less than) that of the substrate 110, and ending at a doping concentration approximately equal to that of the drift layer 120. In some cases, the transition layer doping concentration 660 has a doping concentration that monotonically varies starting at a doping concentration that is either approximately equal to that of the substrate or is between the substrate doping concentration 610 and the drift layer doping concentration 620, and ending at a doping concentration that is either approximately equal to that of the drift layer or is between the substrate doping concentration 610 and the drift layer doping concentration 620. In an example, the transition layer doping concentration 660 may match the substrate doping concentration 610 at the interface between the substrate 110 and the transition layer 160 and then continuously change to match the drift layer doping concentration 620 at the interface between the transition layer 160 and the drift layer 120. In an example, the change in the transition layer doping concentration 660 may be substantially linear as a function of vertical height z (e.g., such as shown in FIG. 6). In another example, the transition layer concentration 660 may change continuously (i.e., without significant step changes, and monotonically, or non-linearly, for example) as a function of vertical height z. In another example, the transition layer concentration 660 may change in a stepwise manner as a function of vertical height z. Transition layer 160 in FIG. 6 can have any of the attributes of transition layer 160 as described above (e.g., with respect to transition layer 160 in FIG. 4).

In an example, the initial transition layer doping concentration 660 at the interface between the substrate 110 and transition layer 160 may be different from the substrate doping concentration 610 (e.g., such as shown in FIG. 6). Similarly, and in another example, the final transition layer doping concentration 660 (moving upwards in the z direction) at the interface between the transition layer 160 and the drift layer 120 may be different from the drift layer doping concentration 620.

Referring back to FIG. 1, discrete changes in composition such as would occur with a SiC substrate 110 and an oxide based drift layer 120 (e.g., $Ga_2O_3$) may cause defects at the interface surface 111 which can affect the carrier transport across the heterointerface between the substrate 110 and the drift layer 120 (e.g., the conduction and valence band discontinuities providing potential energy confinement or barriers and/or electrically active defects and/or crystallographic defects). In some cases, threading dislocations can also form in the drift layer 120 due to differences between the materials properties (e.g., lattice constants, crystal symmetries and/or orientations) of the substrate 110 and drift layer 120, which can cause defects at the interface 121 between the drift layer and a layer above (e.g., the metal layer 130). Defects at the interface 121 can affect the carrier transport across the heterointerface between the drift layer 120 and a layer above (e.g., the metal layer 130), which can, for example, affect the Schottky barrier diode properties.

Figure 7:
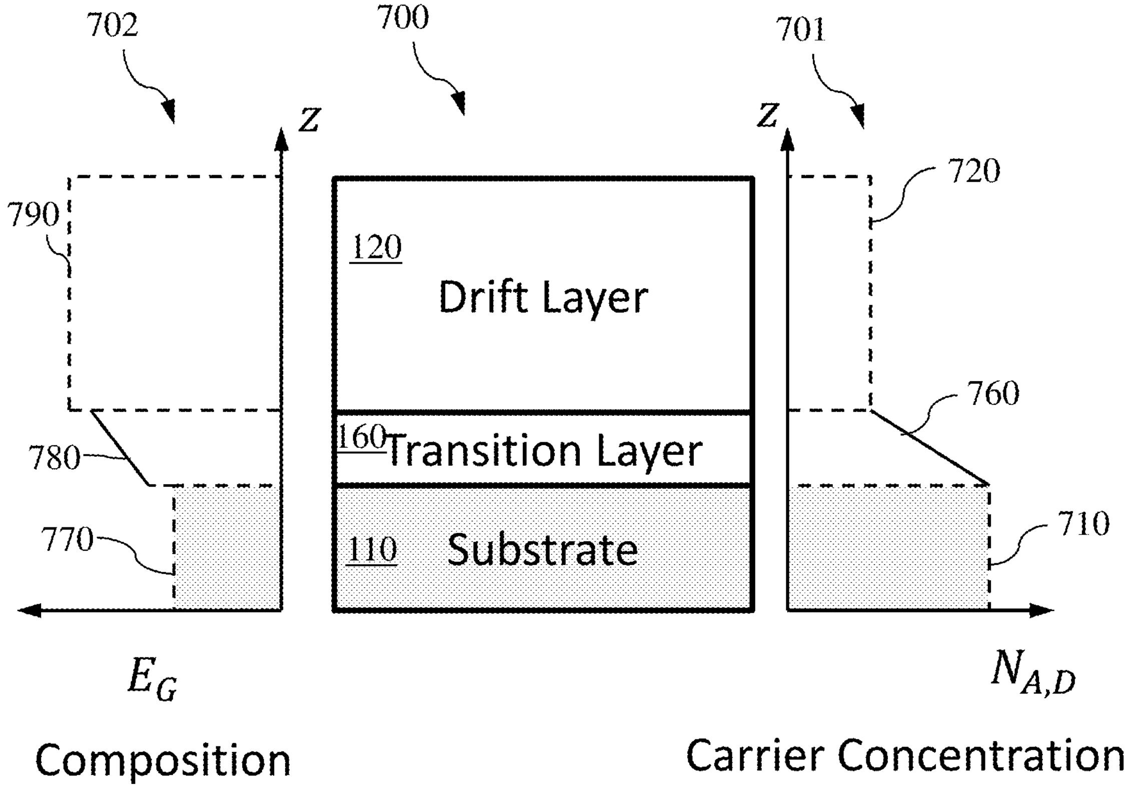
FIG. 7 is a figurative view of the substrate, transition layer and drift layer of a vertical multilayered semiconductor diode device such as shown in FIG. 4 and an associated plot of another example variation in doping concentration as a function of vertical height, as well as an associated plot of an example variation in composition as a function of vertical height, in accordance with some embodiments.

FIG. 7 shows a figurative view 700 of the substrate 110, transition layer 160 and drift layer 120 of a vertical multilayered semiconductor diode device such as shown in FIG. 4. FIG. 7 also shows an associated plot 701 of another example variation in doping concentration, $N_{A,D}$, as a function of vertical height z, as well as an associated plot 702 of an example variation band gap energy $E_G$ such as would occur by varying the composition as a function of vertical height z. In this example, the SiC substrate would have a first band gap energy 770 of approximately 3.2 eV. As can be seen in this example, the band gap energy 780 $E_G$ of transition layer 160 increases substantially linearly as a function of vertical height from a value close to the first band gap energy 770 of the substrate 110, to a value that is close to the band gap energy 790 $E_G$ of the drift layer 120. In other examples, the changing composition of the transition layer 160 may be selected to cause a stepwise increase in band gap energy 790 $E_G$ from the band gap energy of the substrate 110 to the drift layer 120.

The transition layer doping concentration 760 in this example is similar to transition layer doping concentration 660 in FIG. 6, and can have all of the same characteristics as described above. FIG. 7 shows an example where the transition layer doping concentration 760 starts at a doping concentration that is approximately equal to that of the substrate 110 (substrate doping concentration 710), and ends at a doping concentration that is approximately equal to that of the drift layer 120 (substrate doping concentration 720).

Figure 8A:
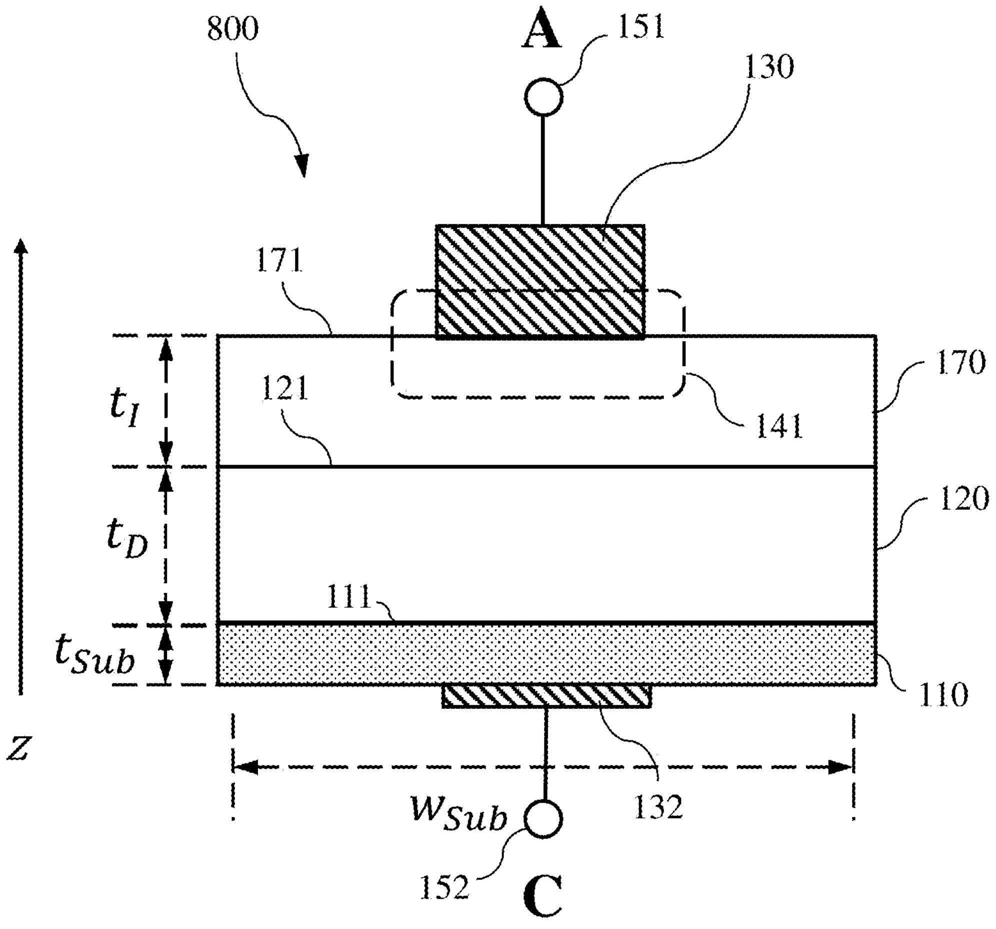
FIG. 8A is a figurative sectional view of a vertical multilayered semiconductor diode device in accordance with another illustrative embodiment.

FIG. 8A is a figurative sectional view of a vertical multilayered semiconductor device 800 in accordance with an illustrative embodiment comprising a substrate 110, a drift layer 120, an intermediate layer 170, and a metal layer 130. In this example, device 800 is similar to device 100 of FIG. 1 but further comprises an intermediate layer 170 formed of a semiconductor oxide disposed between drift layer 120 and metal layer 130. The intermediate layer 170 has a layer thickness $t_1$. In this example, intermediate layer 170 is formed directly on the top surface 121 of drift layer 120, and metal layer 130 is formed on a top surface 171 of the intermediate layer 170.

Figure 8B:
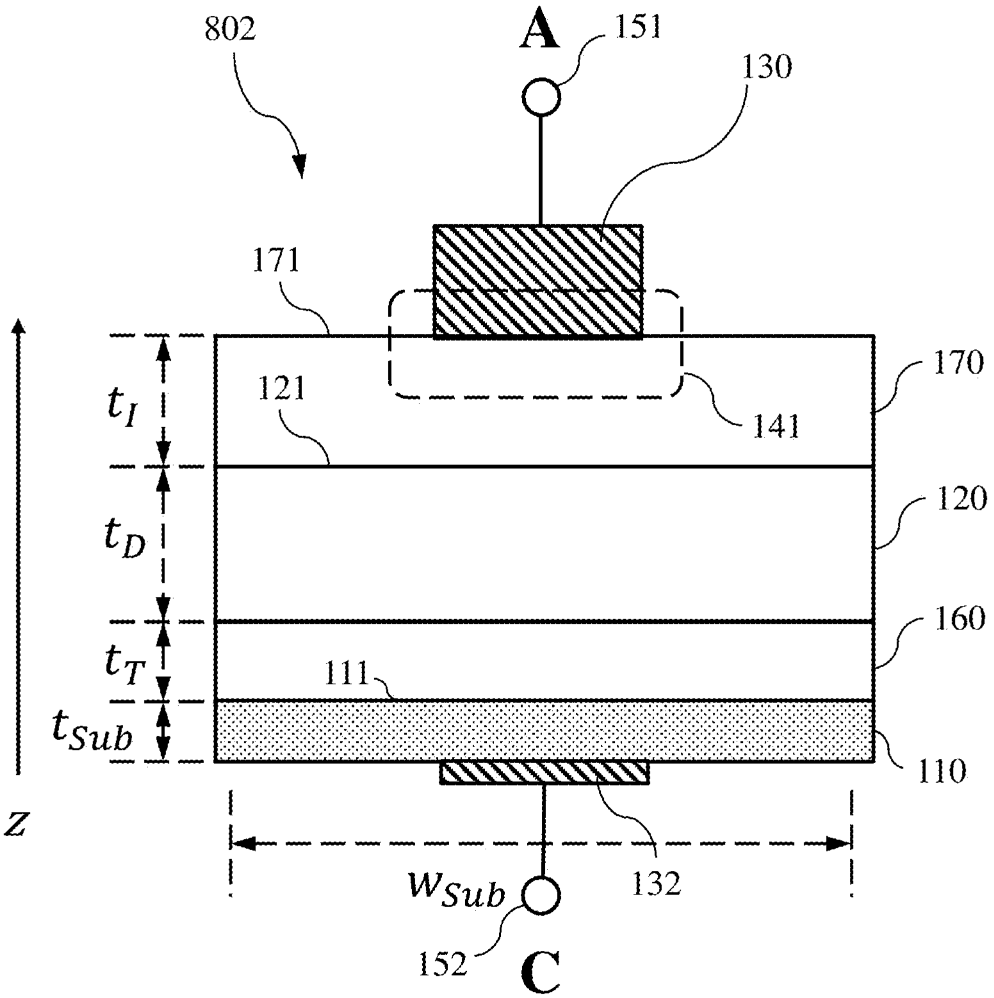
FIG. 8B is a figurative sectional view of a vertical multilayered semiconductor diode device in accordance with another illustrative embodiment.

FIG. 8B shows a figurative sectional view of a vertical multilayered semiconductor diode device 802 according to an illustrative embodiment. In this example, device 802 is similar to device 800 but further comprises a transition layer 160 disposed between substrate 110 and drift layer 120, similar to device 400 in FIG. 4.

In an example, intermediate layer 170 is formed of a different semiconductor oxide having a wider band gap $E_G$ than that of the semiconductor oxide material that the drift layer 120 is formed from. In an example, oxide material for the intermediate layer 170 is chosen to improve diode performance characteristics such as the turn-on voltage and/or the reverse breakdown voltage. In some cases, the intermediate layer 170 changes the Schottky potential barrier $\phi_S$, which in turn changes the diode performance characteristics such as the turn-on voltage and/or the reverse breakdown voltage. In some cases, intermediate layer 170 can be formed of a graded semiconductor oxide composition with a correspondingly varying band gap $E_G$. In another example, the intermediate layer has a multilayer, superlattice, or chirp layer configuration comprising two or more different semiconductor oxide materials, for example, selected to improve reverse breakdown voltage performance (e.g., by changing the Schottky potential barrier $\phi_S$).

In another example, intermediate layer 170 is formed of a different semiconductor oxide having a narrower or smaller band gap $E_G$ than that of the semiconductor oxide material that the drift layer 120 is formed from. In an example, the intermediate layer 170 is chosen to improve diode performance characteristics such as the turn-on voltage and/or the reverse breakdown voltage. For example, a narrower bandgap material may advantageously present opposite conductivity type charge carriers thereby forming an improved depletion region between drift layer 120 and intermediate layer 170. For example, Nickel oxide (NiO), copper oxide ($Cu_2O$) and lithium oxide ($Li_2O$) provide p-type character which can be used advantageously within a heterojunction formed with an n-type $(Al_xGa_{1-x})_2O_3$UWBG drift layer 120. Furthermore, ternary or spinel oxides of the form of, for example, $NiGa_2O_4$, $Cu_2GaO_4$ and $LiGaO_2$ may also be utilized in intermediate layer 170. In some cases, intermediate layer 170 has a smaller band gap than the drift layer 120, and, due to band alignment, there is a conduction band offset at the interface between the intermediate layer 170 and the drift layer 120. In such a case, the intermediate layer 170 can form a tunnel barrier for electrons between the drift layer 120 and the Schottky metal layer 130, even though intermediate layer 170 has a smaller band gap than the drift layer 120.

Yet a further possible utility of intermediate layer 170 is the advantageous reaction of Schottky metal 130 with selective region 141 which may form an alloy. The selectively alloyed region 141 may be formed via rapid thermal anneal or diffusion process.

Any of drift layer 120, transition layer 160, and/or intermediate layer 170 (e.g., of devices 100, 400, 800, or 802 in FIGS. 1, 4, 8A and 8B respectively) can include single epitaxial oxide layers, or can include multiple layers of epitaxial oxide materials (e.g., bilayers, tri-layers, superlattices, and/or chirp layers). Bilayers, tri-layers and other multiple layer structures of layers 120, 160 and/or 170 can include different compositions and/or different doping densities. The total number of layers within any of drift layer 120, transition layer 160, and/or intermediate layer 170 can be from 1 to 100, or from 1 to 20, or from 1 to 10, in different examples.

Any of drift layer 120, transition layer 160, and/or intermediate layer 170 (e.g., of devices 100, 400, 800, or 802 in FIGS. 1, 4, 8A and 8B respectively) can include a superlattice and/or a chirp layer including epitaxial oxide semiconductor materials. Superlattices, such as short-period superlattices, contain alternating layers (i.e., barrier layers and well layers) forming a unit cell, and the unit cell is repeated to form the superlattice. A chirp layer is similar to a superlattice in that it also contains alternating layers, however, the layer thicknesses and/or compositions of the layers change monotonically along a thickness (or growth direction) a chirp layer. The thickness of each of the barrier layers, well layers, and/or unit cells within a superlattice or chirp layer can be from less than 1 monolayer (ML) to 100 MLs, or from less than 1 ML to 20 MLs, or from less than 1 ML to 10 MLs, or from less than 1 ML to 5 MLs, or from 1 ML to 20 MLs, or 1 ML to 10 MLs, or 1 ML to 5 MLs. A layer with a thickness less than 1 ML may be discontinuous laterally (i.e., in a direction parallel with the surface of the substrate upon which the layer is grown).

Superlattices can be used to form digital alloys whereby barrier layers and well layers of the superlattice have materials properties such that the superlattice has overall materials properties (i.e., composite materials properties) that are different from the materials properties of the barrier layers and that are different from the materials properties of the well layers. Superlattices can also be used to modify the effects of the electrons and/or holes within a device, for example, by causing a barrier to electron and/or hole flow across the superlattice.

Chirp layers can also be used to form digital alloys and impact the electrons and/or holes within a device as described herein. Additionally, chirp layers introduce a changing materials parameter, such as a changing average lattice constant, a changing average bandgap, and/or a changing average doping density, within the chirp layer. For example, chirp layers can be used to form electron blocking layers (EBLs). Chirp layers can also be used to change the lattice constant within a structure, for example to form a drift layer on an SiC substrate, where the drift layer has a different lattice constant than SiC.

Figure 9A:
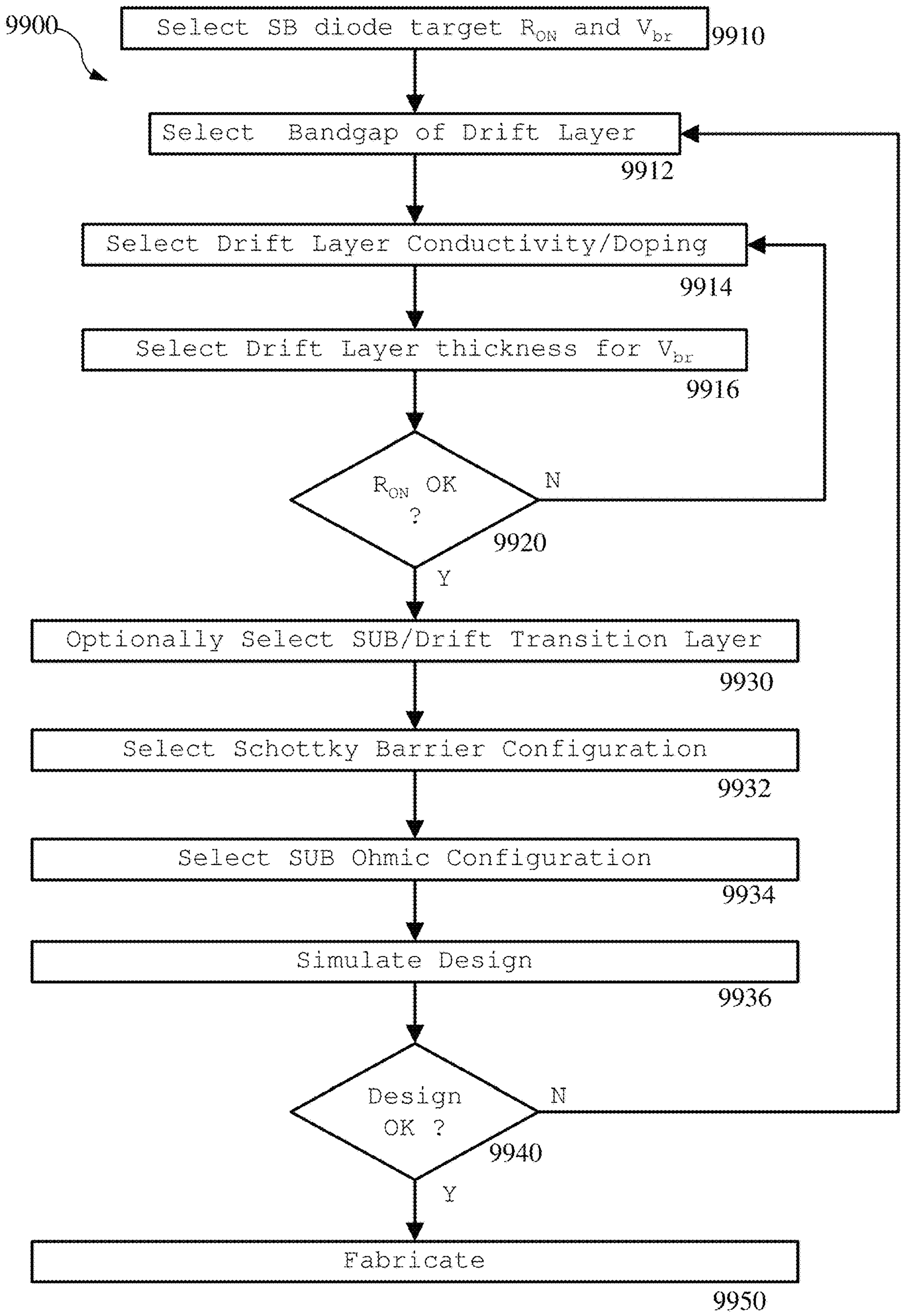
FIG. 9A is an illustrative process flow for the design of a vertical multilayered semiconductor diode device in accordance with some embodiments.

FIG. 9A discloses a design flow 9900 for achieving target performance for UWBG power device based on the desired $R_{ON}$ and $V_{br}$ specification. In practice, a device simulator utilizing Poisson solver and quantum mechanical models for the specific semiconductors is used to model the performance. This modeling may include block 9910 (select Schottky Barrier "SB" diode target $R_{ON}$ and $V_{br}$), block 9912 (select bandgap of drift layer), block 9914 (select drift layer conductivity/doping), and block 9916 (select drift layer thickness for $V_{br}$). Flow 9900 may include a decision point 9920 to check if the target $R_{ON}$ is acceptable before proceeding further. If $R_{ON}$ is not acceptable, the flow returns to block 9914 to reselect drift layer parameters. If $R_{ON}$ is acceptable, the flow 9900 continues with block 9930 (optionally select substrate/drift transition layer), block 9932 (select Schottky barrier configuration), block 9934 (select substrate ohmic configuration), and block 9936 (simulate design). If the design is within the specification at block 9940, then the device is fabricated in block 9950. If the design does not meet specifications, the flow returns to block 9912 to reselect parameters for the various layers of the device. Simulation tools for 1D, 2D and 3D may be utilized in conjunction with finite element electrostatic solvers to detail the electric field distribution within the device structure.

Figure 9B:
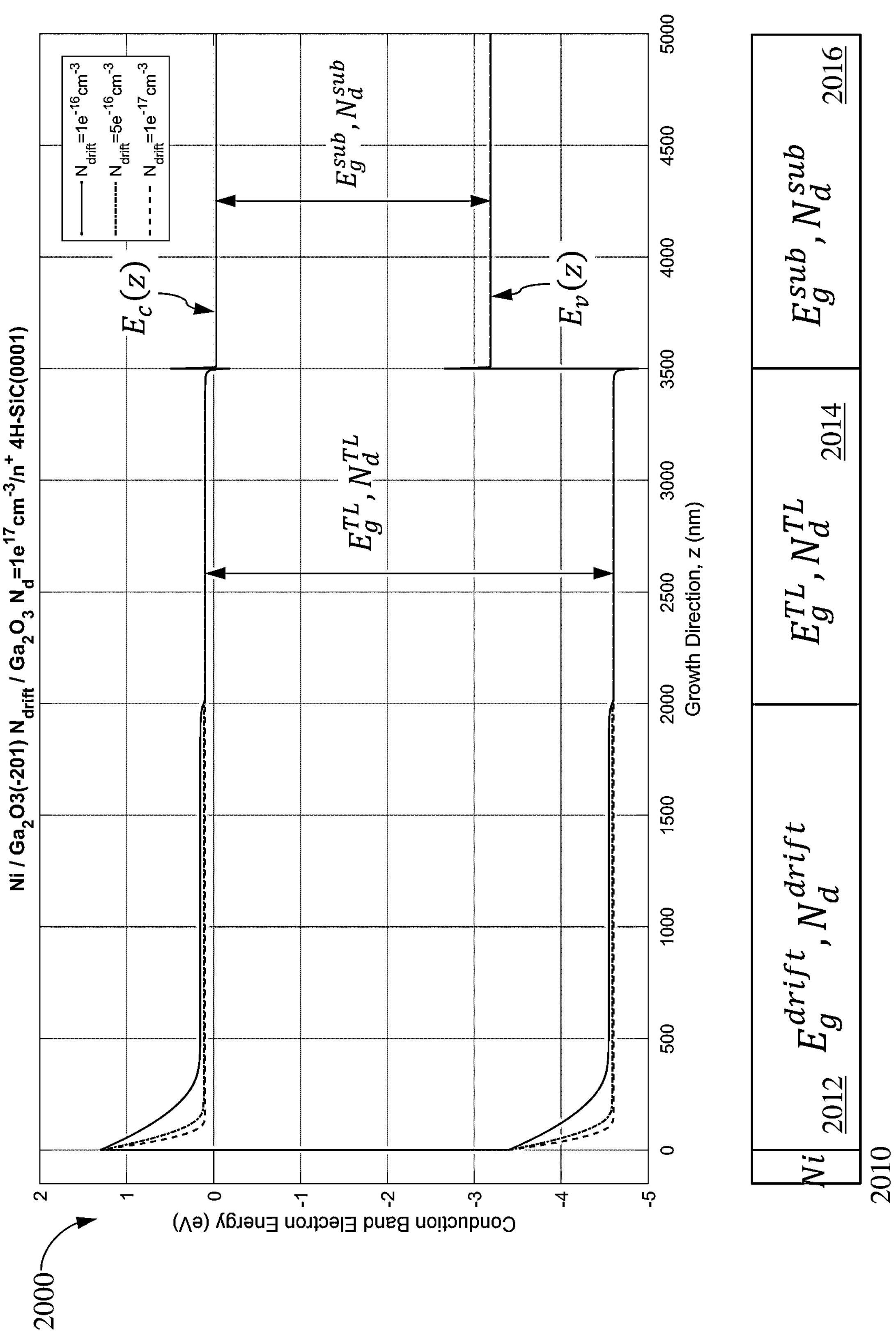
FIG. 9B is the spatial variation of the conduction and valence band edge energy diagram of a vertical multilayered semiconductor device directed along a growth direction in accordance with an illustrative embodiment.

FIG. 9B is a detailed simulated energy band diagram 2000 of the conduction band and valence band edges of the vertical multilayered semiconductor device illustrated in FIG. 4, showing the following regions comprising (moving from left to right): a Schottky barrier metal 2010 (in this example Ni), forming a rectifying junction with a drift layer 2012 and transition layer 2014 (in this example $\beta$-$Ga_2O_3$ (−201)), and a substrate 2016 (in this example Si-polar 4H—SiC(0001)). The band diagram was constructed from detailed knowledge of the bandstructure of each material and the absolute electron affinity, enabling accurate heterojunction offsets to be determined. The substrate is an n-type doped 4H—SiC, such that $$\left(E_g^{sub} = 3.23 \text{ eV}, N_d^{sub} = 1\times10^{19} \text{ cm}^{-3}\right),$$

the transition layer an n-type $\beta$-$Ga_2O_3$ $$\left(E_g^{TL} = 4.7 \text{ eV}, N_d^{TL} = 1\times10^{17} \text{ cm}^{-3}\right),$$

and a drift region $$\left(E_g^{drift} = 4.7 \text{ eV}, 1\times10^{16} \le N_d^{drift} \le 1\times10^{17} \text{ cm}^{-3}\right).$$

The idealized case of a Nickel Schottky metal having a barrier height of $$\phi_{SB} = 1.3 \text{ eV} \text{ @ } N_d^{drift} = 5\times10^{16} \text{ cm}^{-3}$$

is shown, and the Fermi energy is selected as the zero energy reference. The diode is a substantially unipolar device, wherein the majority carriers are electrons. The holes in the valence band can be neglected to first order. Furthermore, the detailed band structure of $\beta$-$Ga_2O_3$ reveals substantially heavier hole masses as compared to 4H—SiC. The mobility of holes in the valence band is also limited by virtue of the flat valence band energy dispersion in crystal momentum space.

Figure 9C:
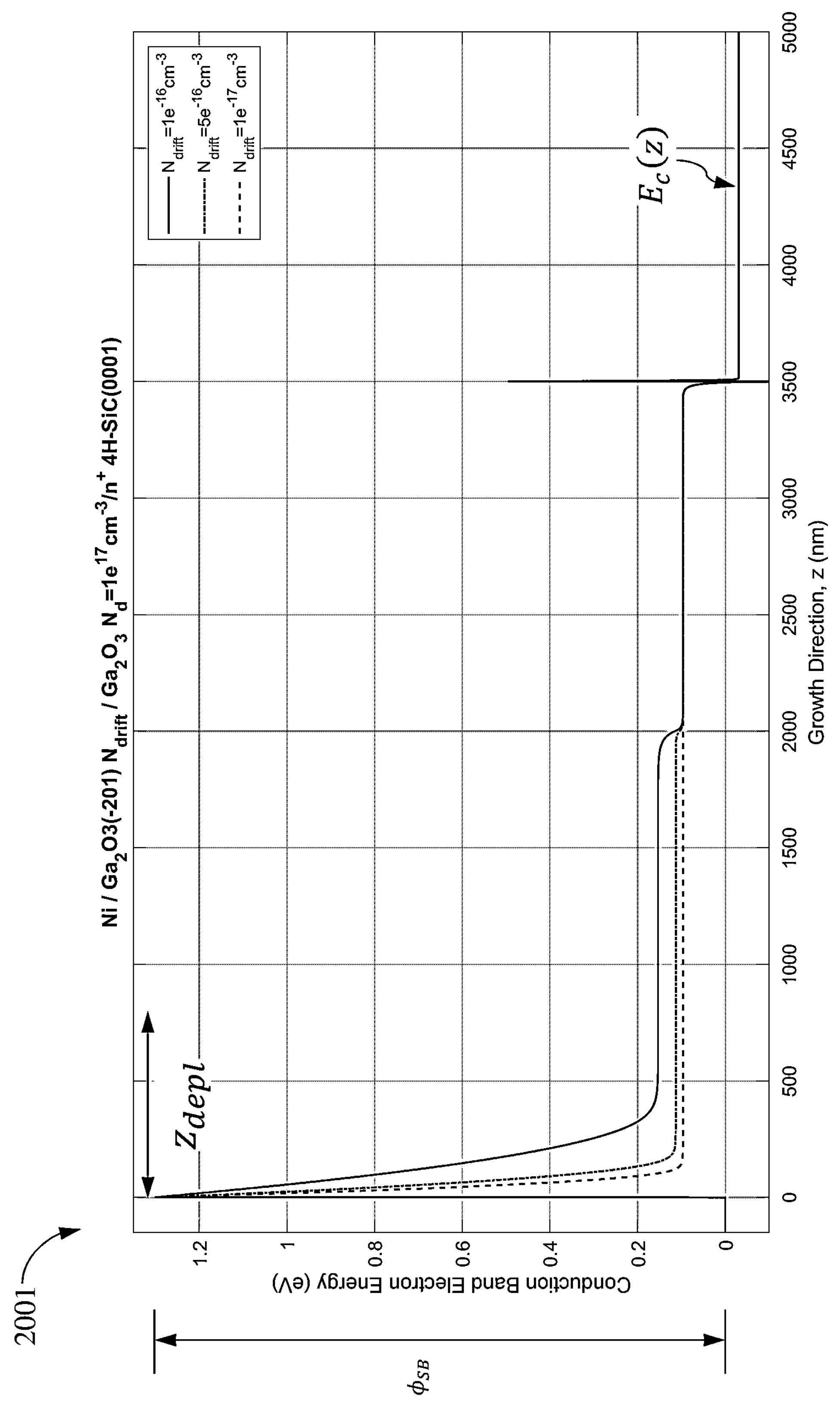
FIG. 9C is the spatial variation of the conduction band edge energy diagram of a vertical multilayered semiconductor device directed along a growth direction in accordance with an illustrative embodiment.

Referring to band diagram 2001 of FIG. 9C, the effective n-type doping of the drift layer is found to have a strong influence on the depletion width of Schottky potential penetrating into the drift region. Band diagram 2001 is a close-up view of energy band values (y-axis) of 0 eV to 1.4 eV from energy band diagram 2000. The width of the depletion potential $Z_{depl}$ influences the reverse bias leakage behavior, whereas $\phi_{SB}$ determines the thermionic emission process in forward bias. As would be expected, as the doping concentration increases the size or extent of the depletion region will reduce. Not shown in the band diagram 2001 is the ohmic contact layer (e.g., ohmic cathode contact region 152 in FIG. 4) that would be located beneath the substrate. Energy band diagram 2001 also illustrates an ideal Schottky barrier potential $\phi_{SB}$ resulting from the metal-semiconductor junction. Not shown are Schottky barrier energy lowering effects due to image forces and the like—which while important, do not detract from the main conclusion discussed above.

In this example of FIGS. 9B-9C, the doping concentration of the SiC substrate is highly n-type (i.e., n+), e.g., from about $10^{19}$ to about $10^{20}$ $cm^{-3}$ and is therefore highly electrically conductive. The backside of the substrate is substantially C-polar if the epilayer is deposited on the Si-polar surface. Ohmic contact to the C-polar surface of SiC substrate can be formed using Ti, Ti/Al or Nickel. Nickel-silicides can be formed by high temperature annealing wherein a portion of the deposited Ni and Si from the SiC surface region react to form $Ni_xSi_{1-x}$. In some cases, high temperature processing may also carbonize the SiC surface which is disadvantageous for creating Ohmic contacts. In an example, a thin Si-based layer (~1-3 nm) can be deposited on the SiC surface followed by the deposition of Ni. This prevents Si loss from the SiC surface and enhances the $Ni_xSi_{1-x}$ formation. That is, a n+SiC/Si/Ni stack can be thermally treated post deposition to form n+SiC/$Ni_xSi_{1-x}$/Ni. Alternatively, the Ni and or Si can be deposited in-situ at elevated temperature. In order to increase the Schottky barrier potential $\phi_{SB}$ beyond that possible with a simple metal-semiconductor junction, it is further possible to insert an intermediate layer (e.g., intermediate layer 170 in FIG. 8A or 8B), as discussed further herein.

Figure 10:
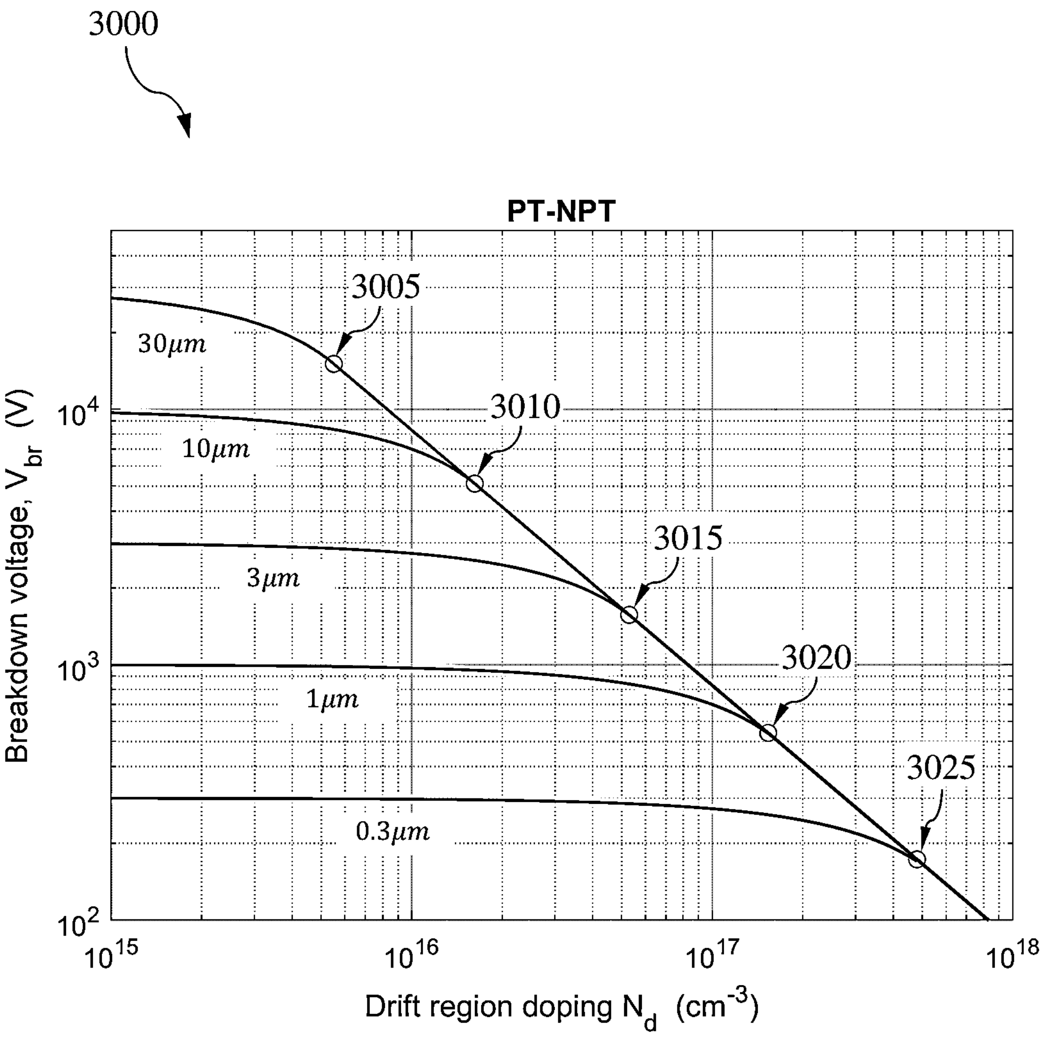
FIG. 10 is a plot of the variation of breakdown voltage versus drift region donor doping concentration for $\beta$-$Ga_2O_3$ for several film thicknesses, in accordance with some embodiments.

FIG. 10 is a plot 3000 showing the breakdown voltage $V_{br}$ of β-$Ga_2O_3$ as a function of n-type doping concentration for selected thicknesses of $L_{drift}$=0.3, 1, 3, 10, 30 μm. For a given slab thickness the breakdown voltage decreases with increasing doping density, with inflection points 3005, 3010, 3015, 3020 and 3025 indicating the optimal choice of ($L_{drift}$, $V_{br}$, $N_d$). For example, selecting $L_{drift}$=3 μm an optimal configuration is $N_d$=5×$10^{16}$ $cm^{-3}$ capable of $V_{br}$=1.2 kV.

In general terms, the ON-resistance of the vertical multilayered semiconductor device in forward bias will be determined primarily by $N_d$ whereas the breakdown voltage $V_{br}$ will be determined by $N_d$ and the thickness of the drift region in reverse bias.

Figure 11A:
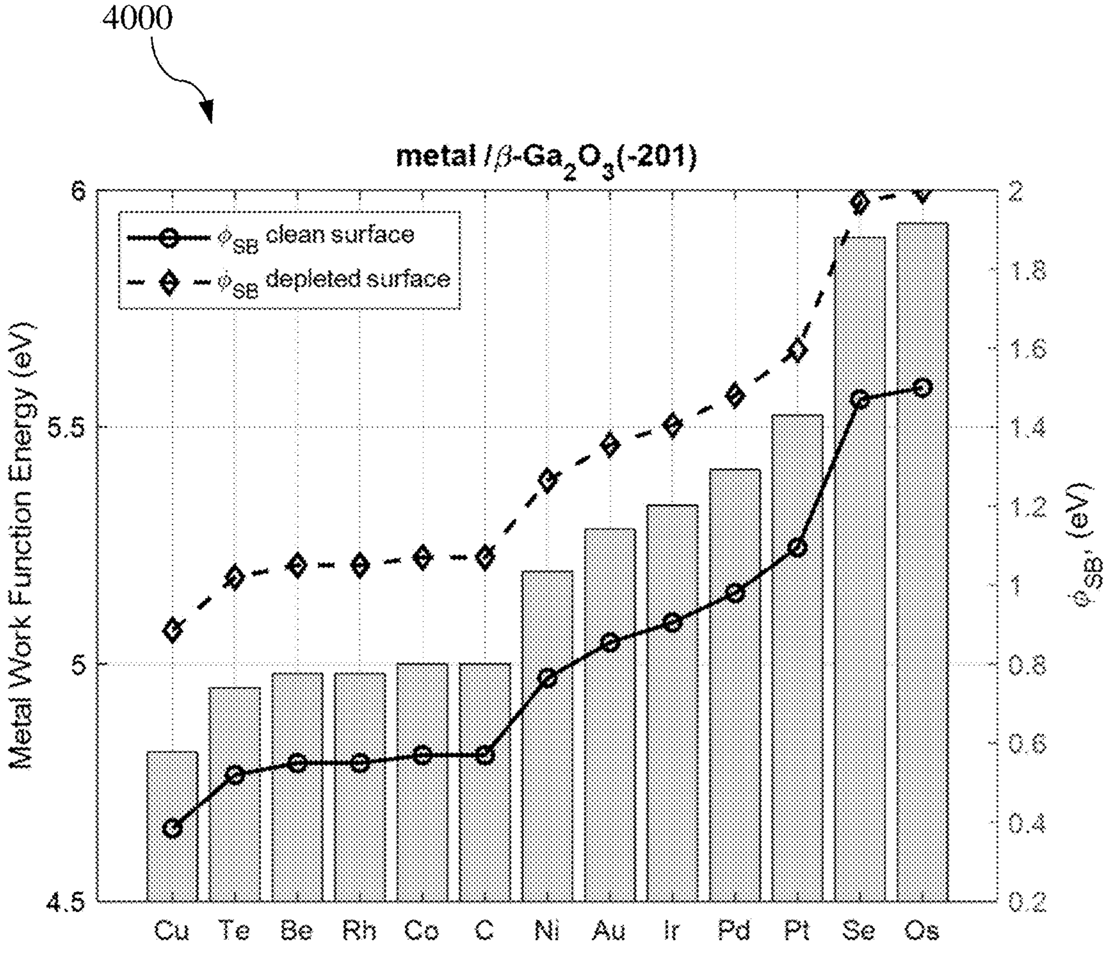
FIG. 11A is a plot of metal work function energies for a selection of metals and the corresponding Schottky barrier energy with respect to (−201) oriented surface of $\beta$-$Ga_2O_3$, in accordance with some embodiments.

FIG. 11A is a plot 4000 of the experimental work functions for various high work function metals (shown on the x-axis) favorable for forming Schottky barrier junctions to a ultrawide bandgap semiconductor oxide material, as determined in the present disclosure. A selection of metal work function energies are plotted on the left-hand y-axis, where Cu has the lowest value and Osmium the highest. Defining the vacuum energy $E_{vac}$ as zero, then the work function energy WF of a metal is understood as having values WF<0. Relative to $E_{vac}$ the electron affinity $X_A$ of the conduction band edge for a given semiconductor can be used to compare the metal-semiconductor absolute energy alignment. The ideal Schottky barrier height (¢SB) for various metals in FIG. 11A for the case of metal/β-$Ga_2O_3$ (−201) oriented clean surface is plotted on the right-hand y-axis as open circle data points. Selenium (Se) and Osmium (Os) provide the highest $\phi_{SB}$~1.4 eV. In practice, all of the metals listed in this figure can be used to form SB diodes, in particular Ni, Pt and Pd are relatively stable.

A unique feature described in the present disclosure is the β-$Ga_2O_3$ (−201) oriented surface. As discussed later, the surface can be advantageously modified, such that, a surface depletion charge can be engineered to produce improved Schottky barrier diodes. By depleting a small depth of the n-doped β-$Ga_2O_3$ (−201) surface, a large increase in relative $\phi_{SB}$ can be achieved for all the metals as shown by the diamond data points. By careful inspection of FIG. 11A it can be seen that Cu-metal/depleted β-$Ga_2O_3$ (−201) may achieve a similar $\phi_{SB}$ as Ir-metal/clean β-$Ga_2O_3$ (−201). Clean and depleted surfaces are discussed later in this disclosure. Any of the metals in FIG. 11A can be used to form an oxide layer between the Schottky metal contact layer and the drift layer, as described further herein. For example, the Schottky metal can include platinum, the drift layer can include $Ga_2O_3$ (or a different epitaxial oxide, as described herein) and an intermediate layer including $PtO_2$ can be formed between the Schottky metal contact layer and the drift layer. A metal oxide (e.g., $PtO_2$, or a metal oxide containing any of the metals in FIG. 11A) for an intermediate layer can be deposited as an oxide (e.g., using MBE, ALD, MOCVD, or another epitaxial or non-epitaxial growth method), or as a metal that is subsequently oxidized to form the metal oxide.

Figure 11B:
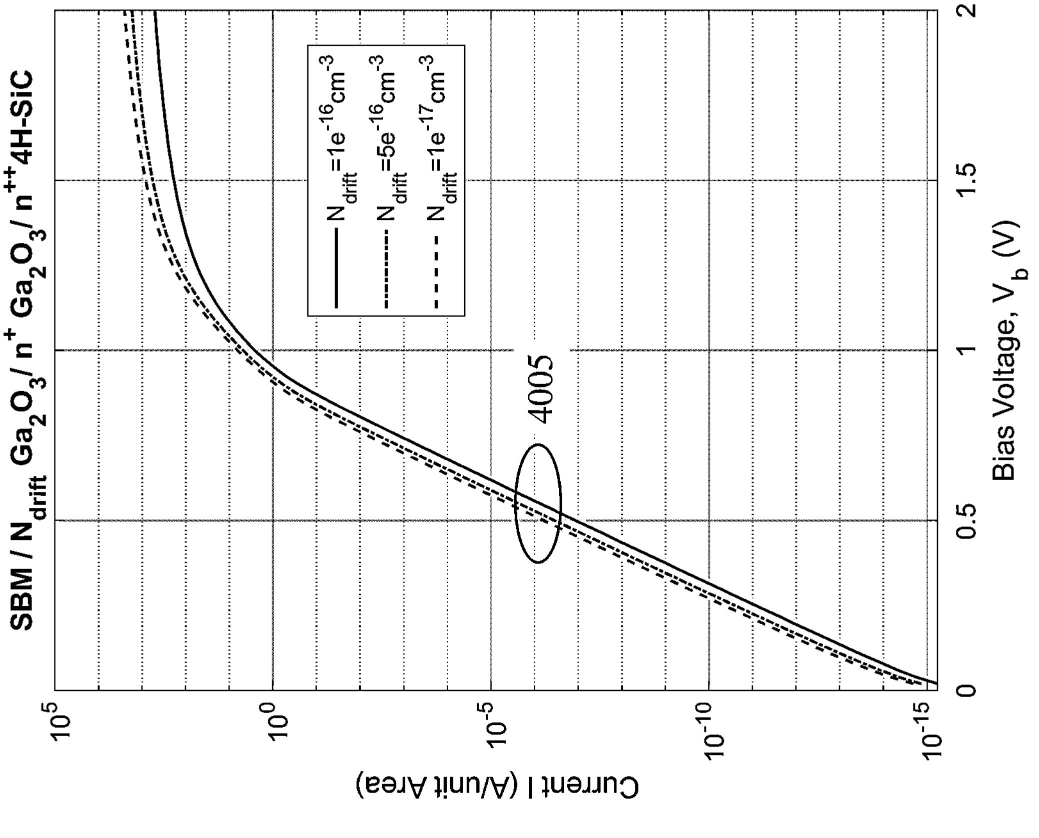
FIG. 11B is a forward bias semilog-linear current-voltage for a Schottky barrier diode in accordance with some embodiments.
Figure 11C:
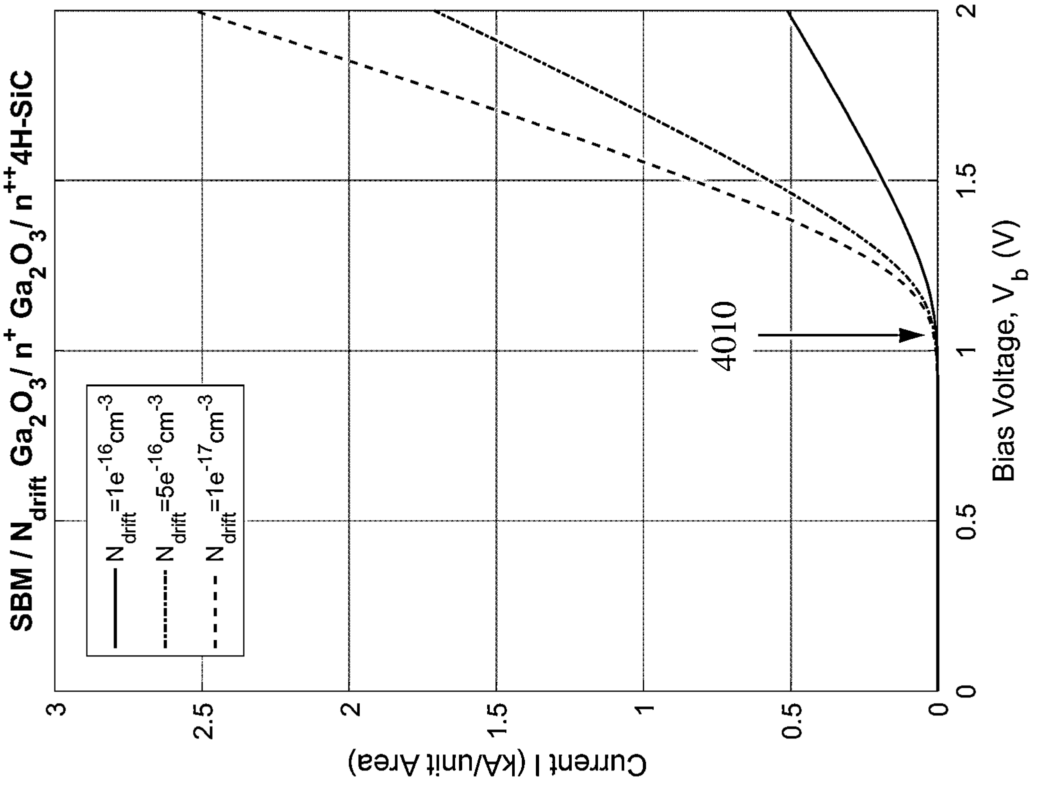
FIG. 11C is a linear-linear forward bias current-voltage for a Schottky barrier diode in accordance with some embodiments.

FIGS. 11B and 11C plot the forward bias current-voltage (I-V) behavior of a diode formed as shown in FIGS. 9B and 9C using a Schottky barrier metal (SBM)=Ni, deposited on a depleted surface of β-$Ga_2O_3$ (−201) n-type drift layer having various doping concentrations $N_{drift}$ and thickness of 2 μm. The structure is deposited upon a Si-polar 4H—SiC n-type substrate. Referring to FIG. 11B in which the room temperature T=25C, the semilog I-V plot shows the subthreshold current increasing with forward bias voltage $V_F$ until turn-on at ~$V_F$=1V. Thermionic emission (TE) transport of electrons across $\phi_{SB}$ dominates the forward conduction current density $J_{TE}$ with respect to the applied forward bias voltage $V_F$ and follows the equation:

$$J_{TE} = A^* T^2 \exp\left(\frac{q\phi_{SB}}{k_B T}\right)\left[\exp\left(\frac{qV_F}{nk_B T}\right) - 1\right] = J_{sat}\left[\exp\left(\frac{qV_F}{nk_B T}\right) - 1\right] \quad \text{(Eqtn 1)}$$

where the Richardsons constant can be calculated explicitly as $$A^* = 4\pi m_r^* k_B^2 q/h^3,\ m_r^*$$

is the electron effective mass, n ideality constant, q electron charge and kg Boltzmann constant. It follows that a strong temperature dependence is expected for TE dominated conduction. For the example of FIGS. 11B-11C involving Ni/clean β-$Ga_2O_3$, the drift layer electron effective mass is $m_r$*=0.30 $m_o$ and results in A*=36 A/$cm^2$. In practice, the ideality factor n can be extracted from fabricated diodes and fitted to the subthreshold slope 4005 in FIG. 11B using Equation 1 above. Ideality factors ranging from 1≤n≤3 are possible, such as 1≤n≤2 in some examples, and are dependent upon $N_{drift}$.

FIG. 11C shows the linear I-V plot for the example of FIG. 11B, wherein the ON-resistance decreases with increasing n-type doping $N_{drift}$ as shown by the differential resistance after the turn-on voltage $$4010(dI/dV)^{-1}.$$

Figure 12:
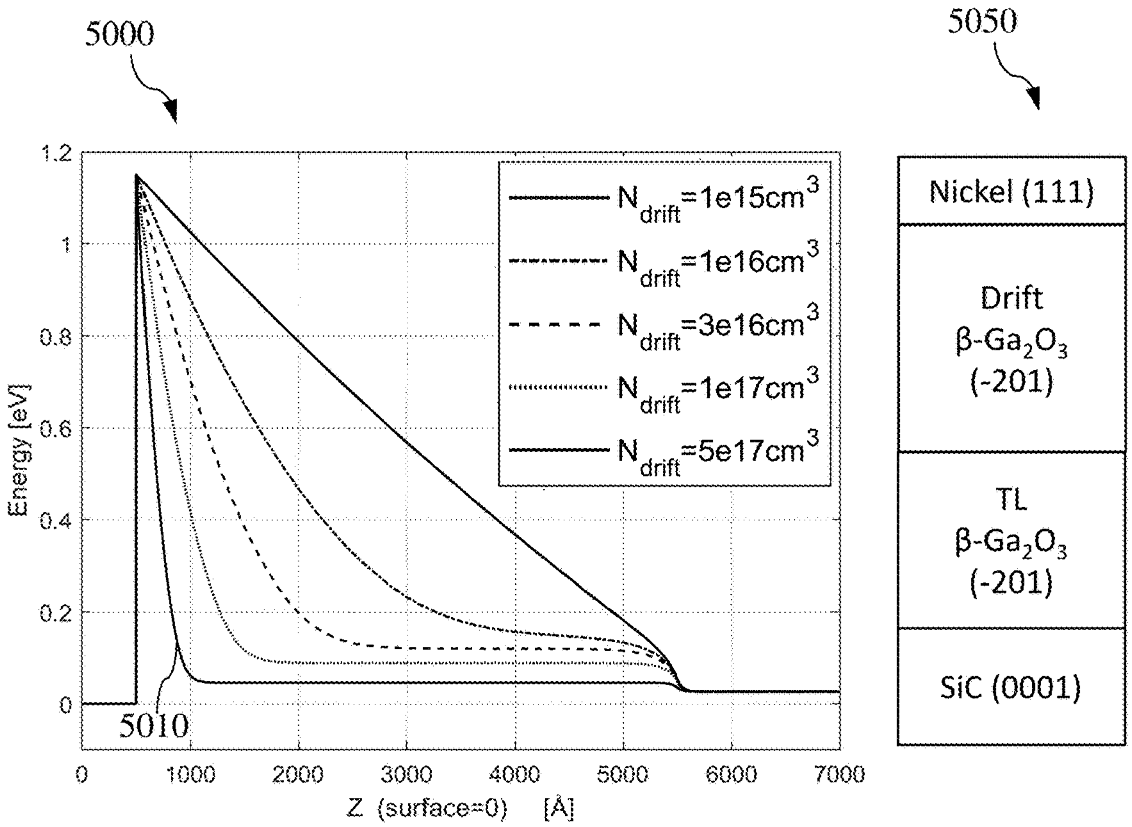
FIG. 12 is a plot of the spatial variation of the conduction band energy for the Schottky barrier formed between nickel and a (−201) oriented surface of $\beta$-$Ga_2O_3$ as a function of the drift donor carrier concentration in accordance with some embodiments.

FIG. 12 is a simulated energy band diagram 5000 of the conduction band edge of the vertical multilayered semiconductor device having the configuration 5050 that comprises a substrate layer of SiC(0001) (i.e., SiC with a (0001) orientation), a TL of n+β-$Ga_2O_3$ (−201), a drift layer formed from β-$Ga_2O_3$ (−201) (i.e., β-phase $Ga_2O_3$, with a (−201) orientation) and a metal layer formed of Ni (111) (i.e., Ni with a (111) orientation). In this example, the Schottky potential barrier has a value of approximately 1.15 eV and the drift layer doping is varied in the range of $1\times10^{15}<N_{drift}\leq5\times10^{17}$ $cm^{-3}$ as shown by the five curves plotted in energy band diagram 5000. The depletion layer width is strongly controlled by $N_{drift}$ as shown, resulting in a quantum mechanically thin barrier for $N_{drift}=5\times10^{17}$ $cm^{-3}$ (curve 5010) wherein the carrier transport will be a combination of TE and quantum mechanical tunneling. That is, the total current density across the barrier $J_{tot}$ will have two components, a temperature and peak energy barrier dependent thermionic current $J_{TE}$ and a quantum mechanical tunneling component $J_{tun}$, such that $J_{tot}=J_{TE}+J_{tun}$. For lower values of $N_{drift}\rightarrow1\times10^{15}$ $cm^{-3}$ the width of the depletion barrier reduces $J_{tun}\rightarrow0$. Conversely, quantum tunneling through the potential barrier becomes particularly important for designing high voltage reverse bias operation.

Figure 13:
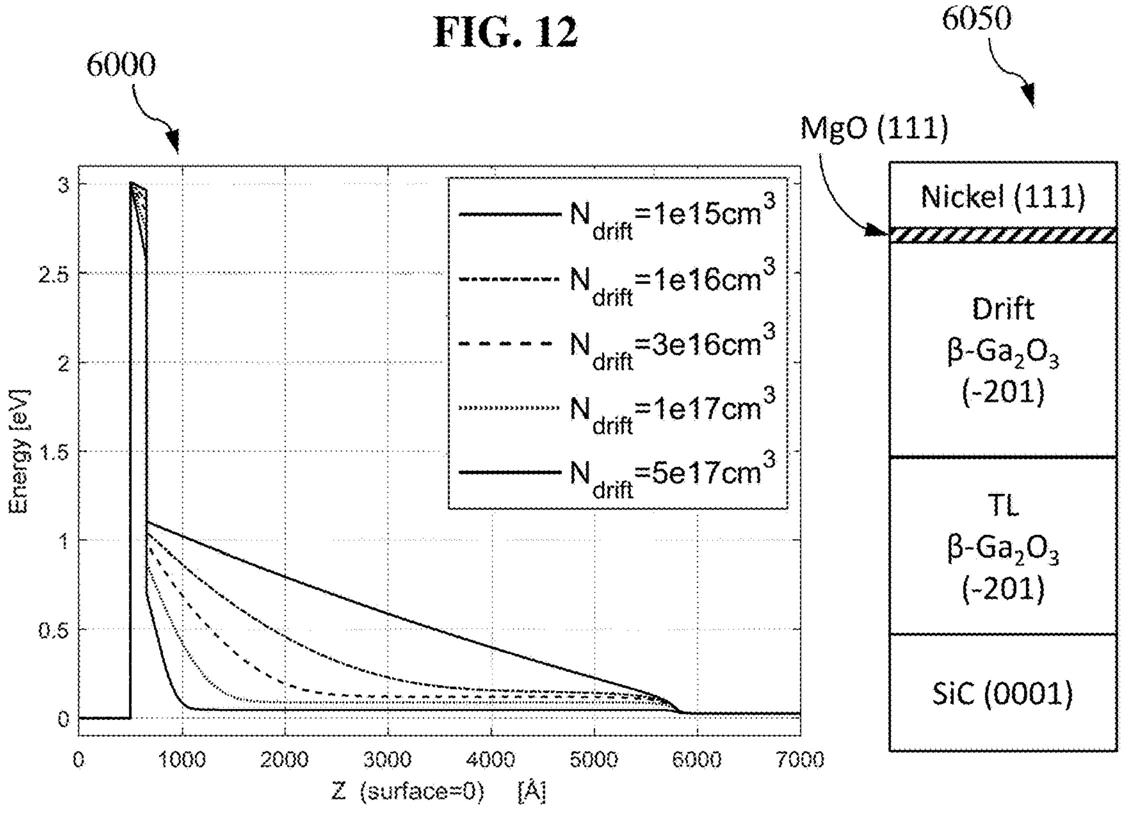
FIG. 13 is a plot of the spatial variation of the conduction band energy for the Schottky barrier formed between nickel and a MgO intermediate layer and a (−201) oriented surface of $\beta$-$Ga_2O_3$ as a function of the drift donor carrier concentration in accordance with some embodiments.

FIG. 13 is a simulated energy band diagram 6000 of the conduction band edge of the vertical multilayered semiconductor device having configuration 6050 which is similar to that depicted in FIG. 12 except that it includes an additional intermediate layer (IL) having a thickness of 100 Angstroms and formed of single crystal MgO (111) (i.e., MgO with a (111) orientation). The simulation shows that the inclusion of the intermediate layer in this example increased the Schottky potential barrier to a value of approximately 3.1 eV. Of particular interest is MgO which exhibits a small electron affinity when compared to $Ga_2O_3$ and SiC. As expected, when the drift layer doping is varied between $1\times10^{15}\leq N_{drift}\leq5\times10^{17}$ $cm^{-3}$ the depletion layer width is strongly controlled, however unlike the device of FIG. 12, the IL presents a fixed quantum mechanical tunnel barrier for electron transport. The increased barrier potential of the device in FIG. 13 further can be used to tune the turn-on voltage (or threshold voltage) of the diode. For example, selecting an IL oxide having a large bandgap and small electron affinity creates a large SB potential and thus can be used to engineer the turn-on voltage for the diode. This is particularly advantageous for creating high voltage diodes that are less susceptible to low voltage noise. Large barrier potentials are also advantageous for decreasing the reverse leakage currents at high reverse electric bias and high electric fields.

Intermediate layer 170 can comprise an epitaxial semiconductor oxide material formed on the epitaxial drift layer. In some cases, intermediate layer 170 comprises an epitaxial oxide material, and the structure further includes an epitaxial metal layer (e.g., metal layer 130 in FIG. 8B) formed on the epitaxial intermediate layer 170. Intermediate layer 170 can include any of the oxide materials described herein, for example, any of the compositions of Materials 1-7. Intermediate layer 170 can contain a single semiconductor oxide composition, or more than one sub-layer with different semiconductor oxide composition (e.g., the sub-layers can form a bilayer, a multilayered structure, a superlattice, or a chirp layer), any of which can be chosen from Materials 1-7. In some cases, intermediate layer 170 comprises a graded composition (e.g., a linear, a step-wise, or a chirped composition gradient) comprising one or more of Materials 1-7. In some cases, intermediate layer 170 comprises one or more of Materials 1-7 that is doped with a single dopant concentration, or with a dopant concentration that varies in depth in intermediate layer 170.

In some examples, the intermediate layer (e.g., intermediate layer 170 in FIG. 8A or 8B) may be formed from or comprise a material chosen from one or more of the following materials:

epitaxial single crystal, polycrystalline or amorphous $Al_2O_3$ epitaxial single crystal, polycrystalline or amorphous NiO epitaxial β-$(Al_xGa_{1-x})_2O_3$ with $0\leq x\leq0.3$ (see FIG. 8)

epitaxial α-$(Al_xGa_{1-x})_2O_3$ with $0\leq x\leq1$ (see FIG. 7)

epitaxial $(Mg_xZn_{1-x})_z(Al_yGa_{1-y})_{2(1-z)}O_{3-2z}$, where $0\leq x$, y, $z\leq1$ epitaxial $Zn_xGa_yO_z$ where $0\leq x$, y, $z\leq1$ epitaxial $Zn_xAl_yO_z$ where $0\leq x$, y, $z\leq1$ epitaxial $Mg_xGa_yO_z$ where $0\leq x$, y, $z\leq1$ epitaxial $Mg_xAl_yO_z$ where $0\leq x$, y, $z\leq1$ epitaxial $Ni_xGa_yO_z$ where $0\leq x$, y, $z\leq1$ epitaxial $Ni_xAl_yO_z$ where $0\leq x$, y, $z\leq1$ epitaxial $(Ni_xMg_{1-x})_yGa_{2(1-y)}O_{3-2y}$ where $0<x<1$ and $0<y<1$ epitaxial $(Mg_xNi_{1-x})_z(Al_yGa_{1-y})_{2(1-z)}O_{3-2z}$, where $0\leq x$, y, $z\leq1$.

In some examples, the drift layer may have the same compositional makeup as the intermediate layer but with a different doping concentration. In some examples, the drift layer may have a different compositional makeup as the intermediate layer and have a different doping concentration.

Other crystal face orientations of SiC(e.g., in particular 4H—SiC) may also be used advantageously for the epitaxial growth of other oxide compositions and polytopes for the devices, structures and methods described herein. For example, A-plane, R-plane and M-plane 4H—SiC substrates can be prepared from bulk grown single crystal material by preferential dicing along specific crystal planes followed by chemical mechanical polishing (CMP) to form an epitaxy ready surface. Furthermore, some examples may include epitaxially depositing alpha-phase $Ga_2O_3$ films on the aforementioned vicinal SiC substrate surfaces. The ability to form α-$Ga_2O_3$ provides at least two improvements applied to the present disclosure. Firstly, at room temperature, α-$Ga_2O_3$ exhibits a larger fundamental bandgap energy than β-$Ga_2O_3$ ($E_g$ (α$Ga_2O_3$)=5.4 eV>$E_g$(β$Ga_2O_3$)=4.7 eV) which can advantageously increase the critical electric field possible and thus improve diode performance. Second, α-$Ga_2O_3$ grown on the A-, R- and M-planes enables a full alloy range to be realized when alloyed with Al, such that, a $(Al_xGa_{1-x})_2O_3$ for all alloy ranges $0\leq x\leq1$ are possible, including $E_g$ (α$Al_2O_3$)=8.6 eV. Such a large bandgap engineering range for creating heterojunctions dramatically improves the performance of diodes (and other devices, such as p/n junction diodes, transistors, switches, varactors, or light emitting devices) that are possible, compared to conventional devices.

Figure 14:
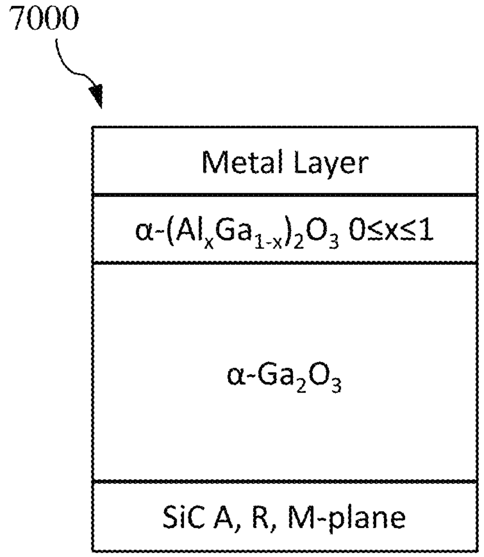
FIG. 14 is a schematic cross-section of a vertical multi-layered semiconductor structure forming a Schottky barrier diode comprising alpha-phase $Ga_2O_3$ and alpha-phase $(Al_xGa_{1-x})_2O_3$ epitaxially formed on A-plane, R-plane and M-plane SiC substrate in accordance with some embodiments.
Figure 15:
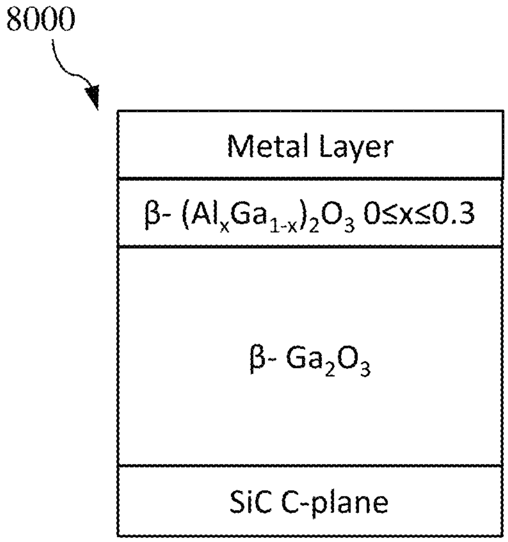
FIG. 15 is a schematic cross-section of a vertical multi-layered semiconductor structure forming a Schottky barrier diode comprising beta-phase $Ga_2O_3$ and beta-phase $(Al_xGa_{1-x})_2O_3$ epitaxially formed on C-plane SiC substrate in accordance with some embodiments.

FIGS. 14 and 15 are examples of other vertical multilayered semiconductor device configurations including an intermediate layer in accordance with the present disclosure. FIG. 14 shows an example of a structure 7000 with an SiC substrate oriented in the A-, R-, or M-plane, an α-$Ga_2O_3$ drift layer, an α-$(Al_xGa_{1-x})_2O_3$ intermediate layer with $0 \leq x \leq 1$, and a metal layer that forms a Schottky barrier. A graded alloy of α-$(Al_xGa_{1-x})_2O_3$ possessing a growth direction dependent alloy content x(z) is also possible for the intermediate layer. FIG. 15 shows an example of a structure 8000 with an SiC substrate oriented in the C-plane, a β-$Ga_2O_3$ drift layer, a β-$(Al_xGa_{1-x})_2O_3$ intermediate layer with $0 \leq x \leq 0.3$, and a metal layer that forms a Schottky barrier. In practice, the highest Al content possible to preserve single crystal beta-phase is x~0.3 or in some cases x=0.4, which represents the largest bandgap that can be implemented as a heterojunction to x=0, i.e., β-$Ga_2O_3$/β-$(Al_xGa_{1-x})_2O_3$.

Figure 16:
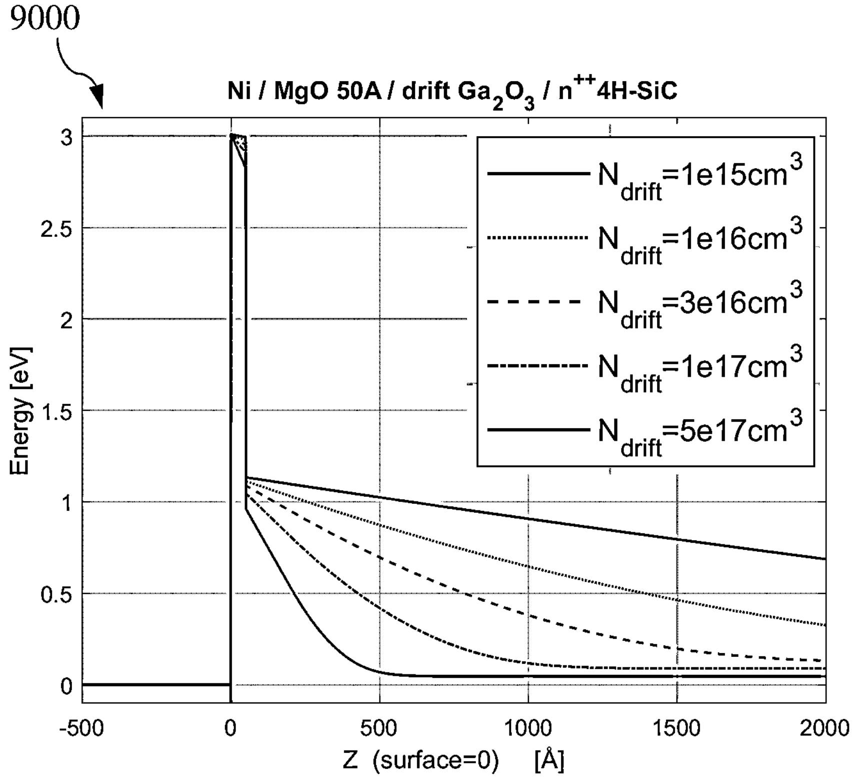
FIG. 16 is a plot of the spatial variation of the conduction band energy for the Schottky barrier formed between nickel and a 5 nm thick MgO intermediate layer and a (−201) oriented surface of $\beta$-$Ga_2O_3$ as a function of the drift donor carrier concentration in accordance with some embodiments.
Figure 17:
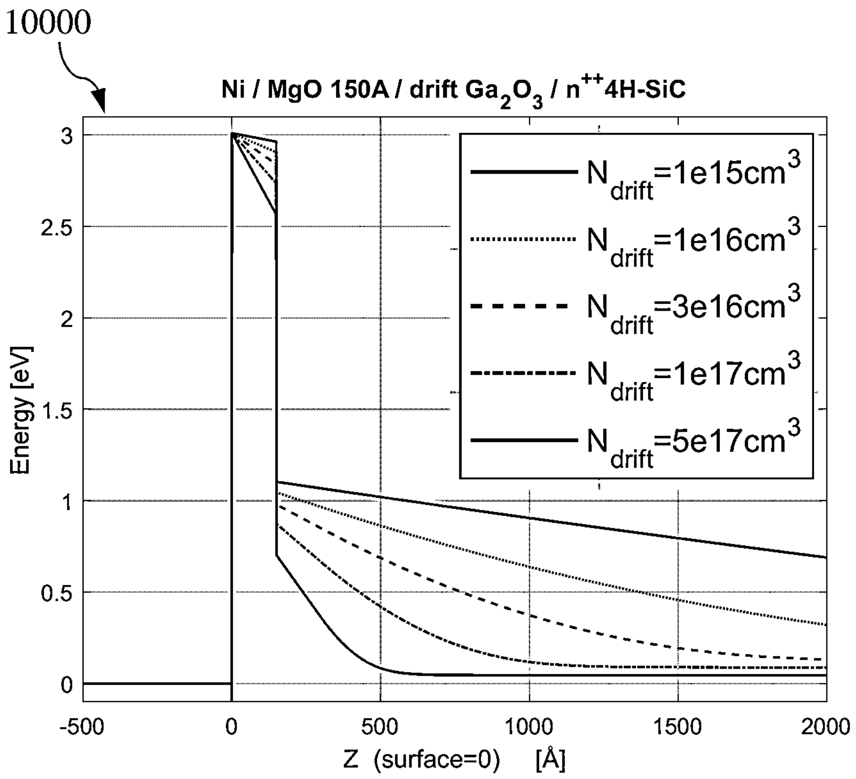
FIG. 17 is a plot of the spatial variation of the conduction band energy for the Schottky barrier formed between nickel and a 15 nm thick MgO intermediate layer and a (−201) oriented surface of $\beta$-$Ga_2O_3$ as a function of the drift donor carrier concentration in accordance with some embodiments.

FIGS. 16 and 17 are simulated energy band diagrams of two example vertical multilayered semiconductor device configurations having intermediate layer (IL) thicknesses of approximately 50 Å and 150 Å, respectively. Both devices comprise a 4H—SiC substrate, a $Ga_2O_3$ drift layer, an MgO intermediate layer, and a Ni metal layer. The drift layer doping is varied in the range of $1 \times 10^{15} \leq N_{drift} \leq 5 \times 10^{17}$ cm$^{-3}$ as shown by the five curves plotted in energy band diagrams 9000 and 10000. In some examples, the thickness of the intermediate layer may be configured to control the quantum mechanical tunnelling current, for example, to control the quantum mechanical tunnelling current in reverse bias near the reverse breakdown voltage. In some examples, the thickness of the intermediate layer may be configured to mitigate the Schottky barrier height reduction arising from metal induced gap states at the metal and intermediate layer interface. In these examples of FIGS. 16 and 17, the IL is selected as an UWBG MgO, showing the band bending of the conduction band edge with various drift region doping for the two examples of MgO thicknesses (50 Å in FIG. 16 and 150 Å in FIG. 17). FIG. 16 represents a thin quantum mechanical tunneling barrier, while the thicker barrier of FIG. 17 reduces or inhibits quantum mechanical tunneling. This design option is advantageous for managing the reverse leakage at high voltages and electric fields.

Figure 18:
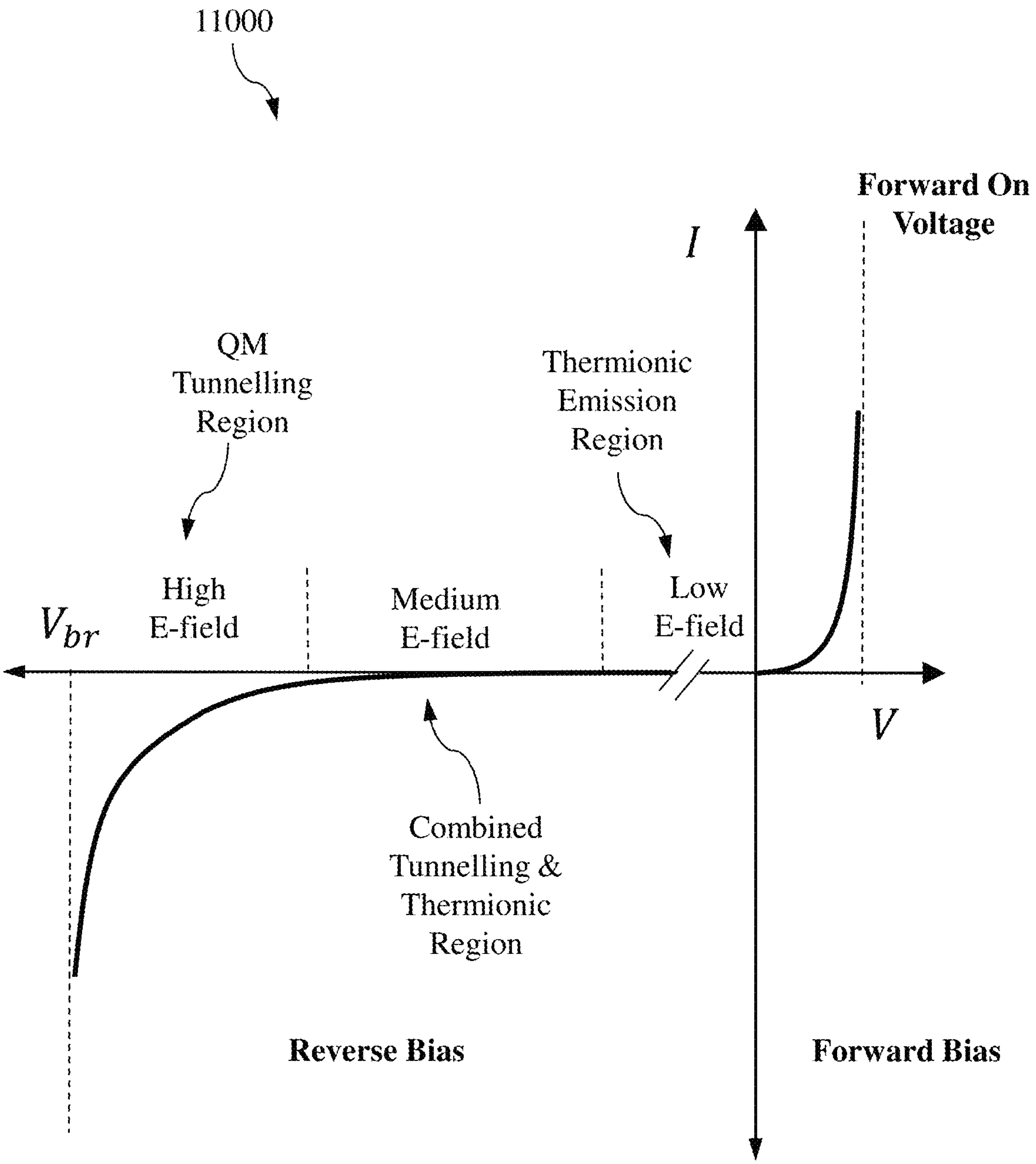
FIG. 18 is a schematic current-voltage plot of a vertical multilayered semiconductor Schottky barrier diode representing features associated with the reverse and forward bias operation, in accordance with some embodiments.

FIG. 18 shows a simplified example of a representative current-voltage characteristic curve 11000 for a vertical multilayered semiconductor device in accordance with the present disclosure. In reverse bias, the leakage current region before the voltage breakdown ($V_{br}$) will itself comprise three regions:

- thermionic emission region ("Thermionic Emission Region") occurring at low to medium electric fields where the current will arise from charge carriers having enough energy to overcome the potential barrier;
- combined quantum tunnelling and thermionic emission region ("Combined Tunnelling & Thermionic Region") occurring at medium electric fields where the current will arise from a combination of charge carriers having enough energy to overcome the potential barrier (i.e., thermionic emission) and charge carriers tunnelling through the potential barrier; and
- quantum tunnelling region ("QM Tunnelling Region") occurring at high electric fields where the current will arise from charge carriers tunnelling through the potential barrier.

In conventional devices the practical reverse bias breakdown voltage ($V_{br}$) is not solely determined by the breakdown strength of the drift region but also by the device structure, specific material properties utilized and possible alternate current leakage paths when subjected to extreme electric fields.

For example, a simple metal semiconductor Schottky barrier presents only a limited quantum mechanical barrier height and an asymmetric width potential. In some cases, tunnelling currents may cause devices with Schottky barrier junctions at extreme high electric fields to exhibit lower reverse breakdown voltage than expected due to barrier lowering effects (BLE).

The electric field values of the breakdown voltage, and the values of the low, medium and high electric fields in FIG. 18 can also vary due to the materials used and device structures. For example, the low electric fields can be less than 100 V/cm, or less than 1000 V/cm, the medium electric fields can be between 100 V/cm and 1000 V/cm, or between 1000 V/cm and 10,000 V/cm, and the high electric fields can be greater than 1000 V/cm, or greater than 10,000 V/cm.

The reverse-bias current comprises a superposition of the thermionic $J_{TE}$ and quantum mechanical tunneling $J_{tun}$ current components, such that:

$$J_{tun} = \frac{A^*T}{k_B}\int_{E_c^{min}}^{E_c^{max}} T(E) \times \ln\left[1 + \exp\left(\frac{E - E_f}{k_B T}\right)\right] dE \qquad \text{(Eqtn 2)}$$

where T(E) is the quantum mechanical (QM) transmission probability as a function of incident electron energy relative to the potential barrier, and $E_f$ is the Fermi energy reference for the conduction band energy. The integration limits $E_c^{min,max}$ span the range over incident quasi-ballistic electron injection into the structure.

Figure 19A:
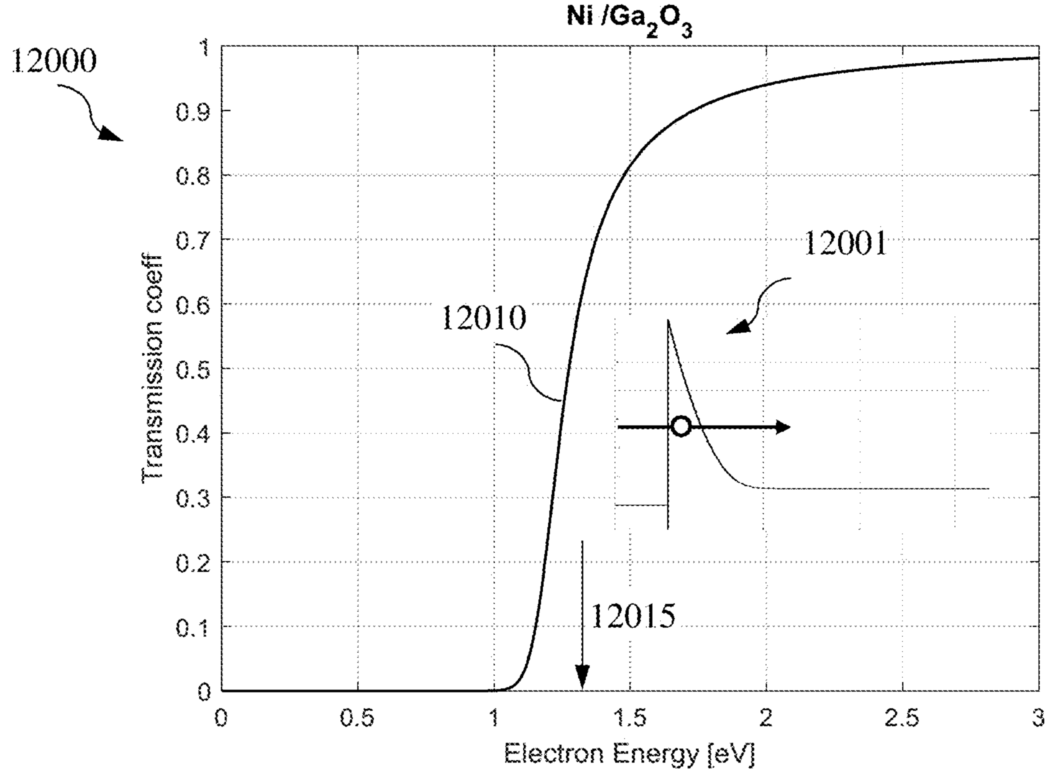
FIG. 19A is a plot of the quantum mechanical tunnelling probability (coefficient) for electron transport in the conduction band calculated for Schottky barrier of a [Ni/$\beta$-$Ga_2O_3$] multilayered structure as a function of the incident electron energy, in accordance with some embodiments.
Figure 19B:
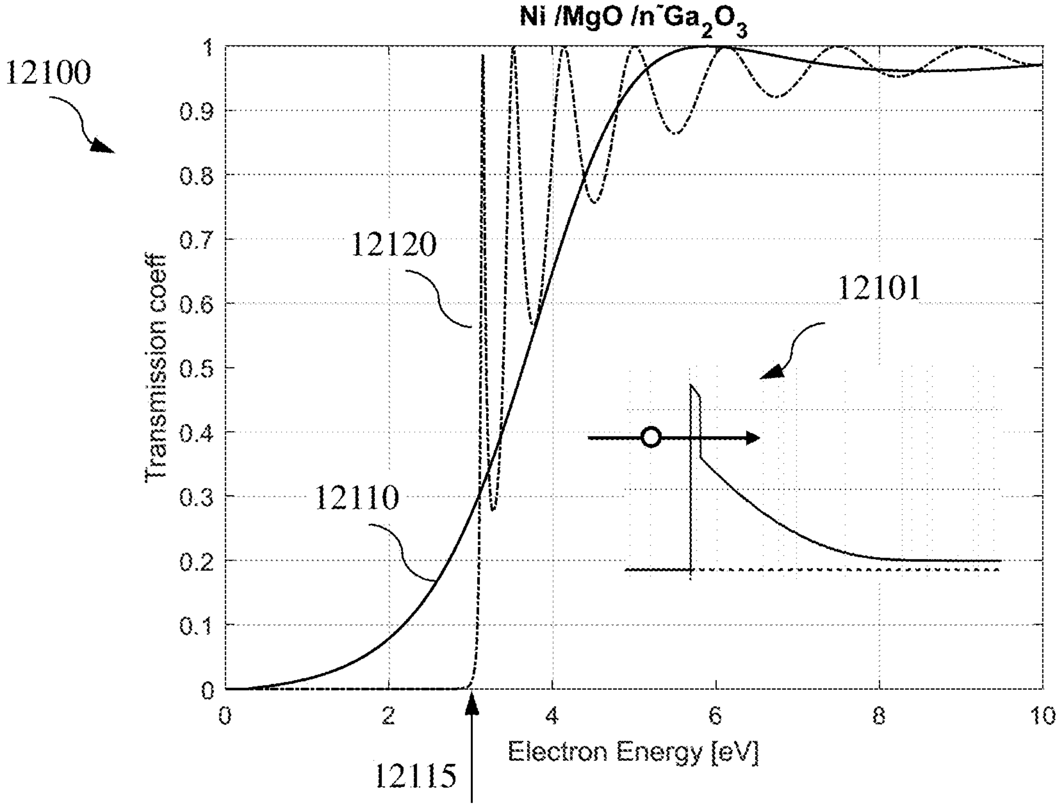
FIG. 19B is a plot of the quantum mechanical tunnelling probability (coefficient) for electron transport in the conduction band calculated for Schottky barrier of a [Ni/MgO/$\beta$-$Ga_2O_3$] multilayered structure as a function of the incident electron energy, in accordance with some embodiments.

FIGS. 19A and 19B are plots 12000 and 12100, respectively, of the QM tunnelling current transmission coefficient/probability T(E) as a function of injected electron energy relative to the Fermi level ($E_F$=0). The insets 12001 and 12101 show the respective energy barriers in the conduction band edges in these examples, and an electron tunneling through each of the barriers. The curves are calculated using a finite-element-method for piecewise approximation of the spatial potential coupled to a complex transfer matrix for each subregion, taking into account the real and imaginary parts of the reflected and transmitted wavefunctions. FIG. 19A corresponds to T(E) 12010 for the specific band structure shown in FIG. 9C for the case of $N_{drift}$=5e16 cm$^{-3}$, showing significant SB penetration below the potential barrier maximum (indicated by the arrow 12015), and approaching unity above the barrier. Note T(E)<1 even for incident energy above the potential maximum. The triangular potential presents an asymmetric barrier which suppresses QM interference between reflected and transmitted electron wavefunctions. Arrow 12015 corresponds to the height of the Schottky barrier in this example.

Introducing a wider bandgap IL between the Schottky metal and $Ga_2O_3$ drift layer can be used to effectively increase the potential barrier of the rectifying contact. In FIG. 19B, the IL is selected from MgO ($E_g$=7.8 eV) having an electron affinity of $X_A$ (MgO)=−1.0 eV providing a maximum potential barrier 12115 of 3.0 eV. The drift layer doping is found to have small effect on the T(E) features, whereas the MgO thickness has dramatic influence on the oscillatory behavior observed in FIG. 19B. The 'soft turn-on' T(E) curve 12110 is for the thin MgO layer $L_{IL}$(MgO)=5 nm, whereas the sharp 'turn-on' and narrow resonances T(E) curve 12120 is for the case of thicker $L_{IL}$ (MgO)=10 nm. Referring again to Eqtn (2) the T(E) can be used to calculate the reverse leakage current with respect to the surface electric field. It is found the reverse leakage current reduces significantly with the introduction of an UWBG IL and is therefore advantageous for application to high voltage diodes, for example to increase the forward-reverse (ON-OFF) ratio.

Figure 19C:
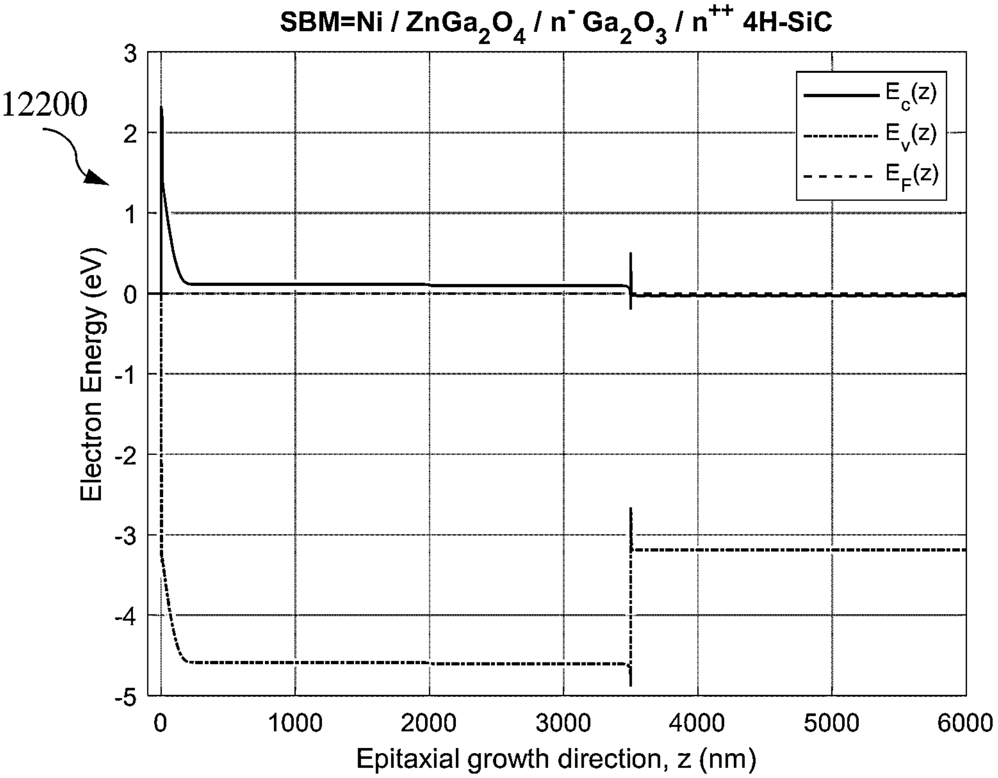
FIG. 19C is a plot of the spatial variation in the conduction and valence band edges along a growth direction for the multilayered diode structure comprising [Ni/$ZnGa_2O_4$ intermediate layer/$\beta$-$Ga_2O_3$ drift-layer/4H—SiC substrate], in accordance with some embodiments.
Figure 19D:
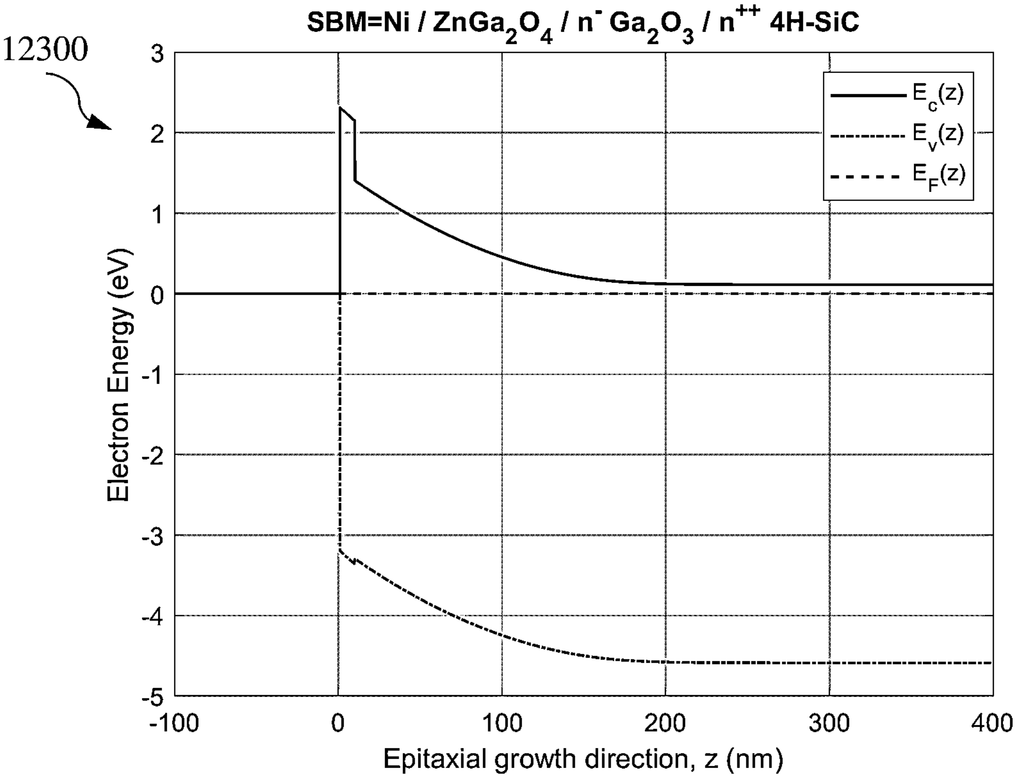
FIG. 19D is a plot of the spatial variation in the conduction and valence band edges along a growth direction for the multilayered diode structure comprising [Ni/$ZnGa_2O_4$ intermediate layer/$\beta$-$Ga_2O_3$ drift-layer/4H—SiC substrate], shown in the vicinity of the depletion region formed by the Schottky barrier, in accordance with some embodiments.
Figure 19F:
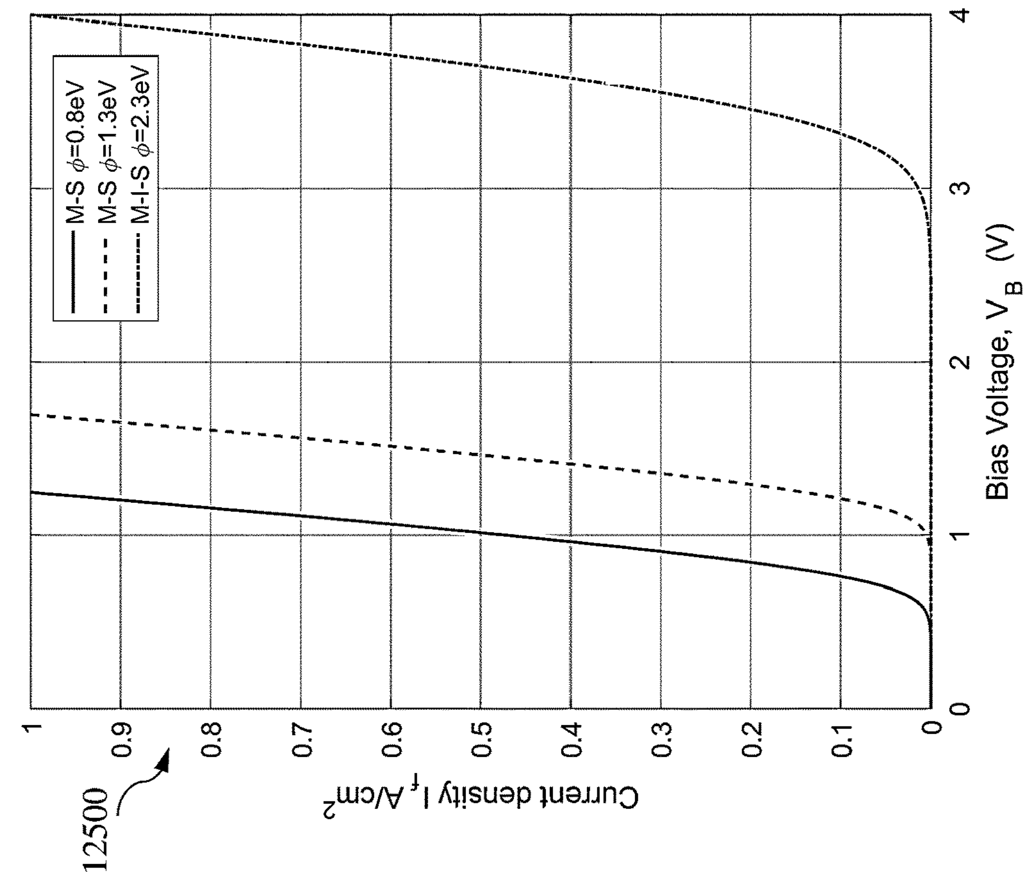
FIGS. 19E and 19F are simulated I-V plots of the multilayered semiconductor Schottky barrier diode in forward bias conditions, in accordance with some embodiments.
Figure 19E:
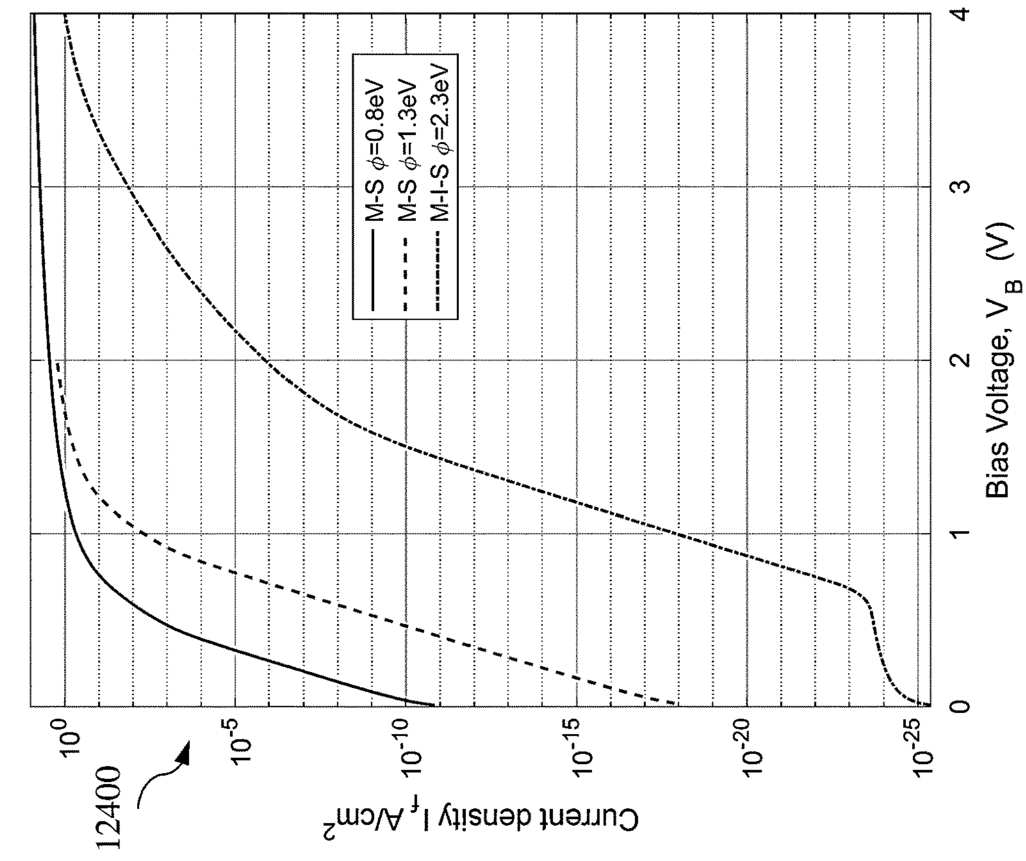

Yet a further example of an IL comprising a $ZnGa_2O_4$ (111) oriented layer is shown in FIGS. 19C and 19D inserted into the device of: Ni metal/IL=$ZnGa_2O_4$NID 10 nm/Ge: β-$Ga_2O_3$ 5e16 $cm^{-3}$/TL=Ge: β-$Ga_2O_3$ 1e17 $cm^{-3}$/1e19 $cm^{-3}$ 4H—SiC Si-polar substrate. FIG. 19C shows the band diagram 12200 along a growth direction, z, and a close up diagram 12300 of the conduction band near the Schottky barrier (at z=0 nm) in FIG. 19D. The IL effectively increases the Schottky barrier potential which directly influences the diode performance as shown in FIGS. 19E and 19F. The semilog forward bias I-V curve of plot 12400 in FIG. 19E shows the shift of the subthreshold slope to higher voltage for the metal-intermediate-substrate structure (MIS) (IL=$Zn_2Ga_2O_4$) when compared to the Ni/β-$Ga_2O_3$ diodes (M-S curves) for the case of a clean and depleted β-$Ga_2O_3$ (−201) surface. The plot 12500 of FIG. 19F shows the linear I-V forward bias comparison of the 3 cases from FIG. 19E. Introducing the IL also has the effect of increasing the impedance of the device when in the conducting mode.

The inclusion of an intermediate layer in various embodiments provides a number of advantages including:

- Improving the turn-on voltage to higher values if the bandgap of the intermediate layer is greater than that of the drift region;
- Reducing the prevalence of defects and/or metal induced gap states (MIGS) between the metal and drift layers which reduce the height of the Schottky potential barrier from its theoretically expected value. While there may be MIGS between the intermediate layer and the metal layer, the effect on the barrier height is reduced since this interface is separated from the semiconductor/metal Schottky junction interface;
- Increasing the reverse breakdown voltage due to both thermionic emission and quantum tunnelling; and
- The wider bandgap intermediate layer spatially separates the metal induced gap states (MIGS) from the active semiconductor oxide material of the surface of the drift region which assists in maintaining Schottky barrier potential and reducing reverse leakage currents.

Devices and methods of the present disclosure utilize a unique insight identifying that the high field region performance may be improved under reverse bias by configuring the intermediate layer to present further limitations to the tunnelling current, as a result further improving the reverse breakdown voltage of a device.

In any of the examples described in the present disclosure, the intermediate layer can include a repeating characteristic. The repeating characteristic can be a repeating compositional variation (e.g., as in a superlattice structure), or a repeating doping concentration variation (e.g., in the concentration of extrinsic dopant species, or defects or vacancies within a crystalline layer).

Figure 20:
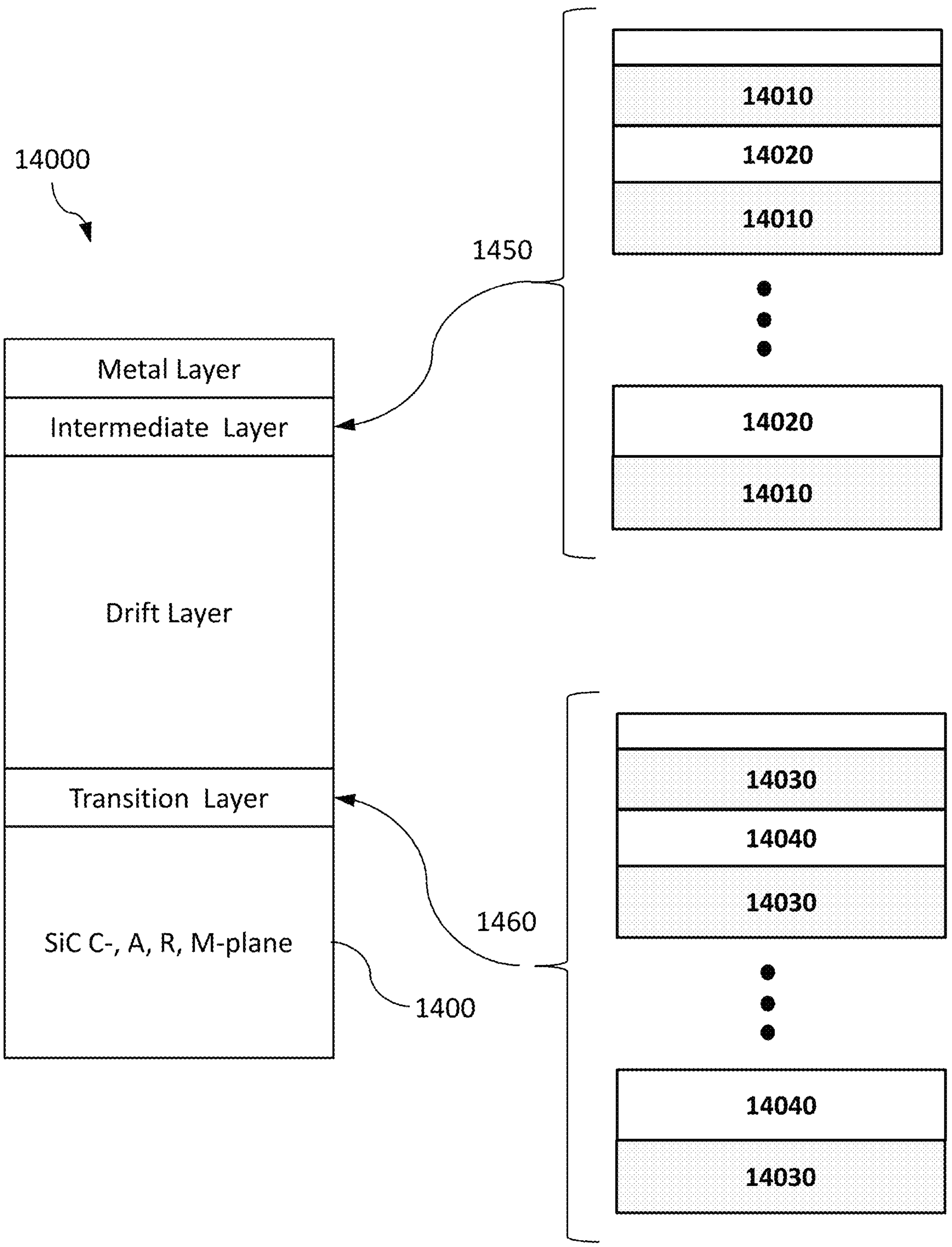
FIG. 20 schematically shows the distinct functional regions of a vertical multilayered semiconductor device comprising a Schottky metal, an intermediate region, a drift region, a transition region, a substrate and a rear contact (not shown), where the intermediate and transition regions are formed as a plurality of semiconductor layers, in accordance with some embodiments.

FIG. 20 is a figurative sectional view of a vertical multilayered semiconductor device 14000 where a repeating characteristic of the intermediate layer (IL) 1450 or a transition layer (TL) 1460 is configured by forming the IL and or TL as a superlattice or multilayered epitaxial stack. The substrate 1400 is SiC such as the 4H polytope. The substrate can have a specific vicinal surface orientation, namely, C-, A-, R- or M-plane as known in the literature. The vicinal plane may be on-axis or intentionally miscut toward a particular crystal plane. For example, the miscut angle for C-plane may range from 0 to 6 degrees. The transition layer may be a semiconducting oxide or non-oxide or a combination. For example, the TL may comprise Silicon-Germanium-Carbide ($Si_xGe_y\ C_{1-x-y}$) enabling in-plane lattice constant and strain tuning for the drift region composition. Other optional TL and IL compositions may include a polar or non-polar semiconductor. For example, nitrogen-polar or metal-polar Aluminum-nitride (AlN) may be formed.

In the example of FIG. 20, the superlattice within at least a portion of the IL (or TL) is formed from two repeating sublayers 14010 and 14020 (or sublayers 14030 and 14040 for the TL) that vary in thickness traversing through the intermediate layer. In another example, the superlattice may form a digital alloy. In another example, the superlattice may be formed from three or more repeating sublayers of either constant or varying thickness. In various examples, the superlattice may be periodic or aperiodic.

The use of A-, R- and M-plane 4H—SiC enables the epitaxial and selective growth of alpha-phase α-$(Al_xGa_{1-x})_2O_3$ with space group R3c. Furthermore, the epitaxial growth of α-$(Al_xGa_{1-x})_2O_3$ is possible over the complete alloy range 0≤x≤1. The TL or IL may therefore comprise a superlattice of α-$(Al_xGa_{1-x})_2O_3$/α-$(Al_yGa_{1-y})_2O_3$ 0≤x≤1 and 0≤y≤1, such that x+y. This enables the bandgap to be tuned from 4.7 eV (x=0) to 8.6 eV (x=1) with approximately 4 eV of conduction band discontinuity to be imposed in electron confinement and transport designs. The lattice constant mismatch between the $(Al_xGa_{1-x})_2O_3$/α-$(Al_yGa_{1-y})_2O_3$ creates biaxial strain at the heterointerface(s) which can be managed by appropriate layer thickness selection.

Figure 21A:
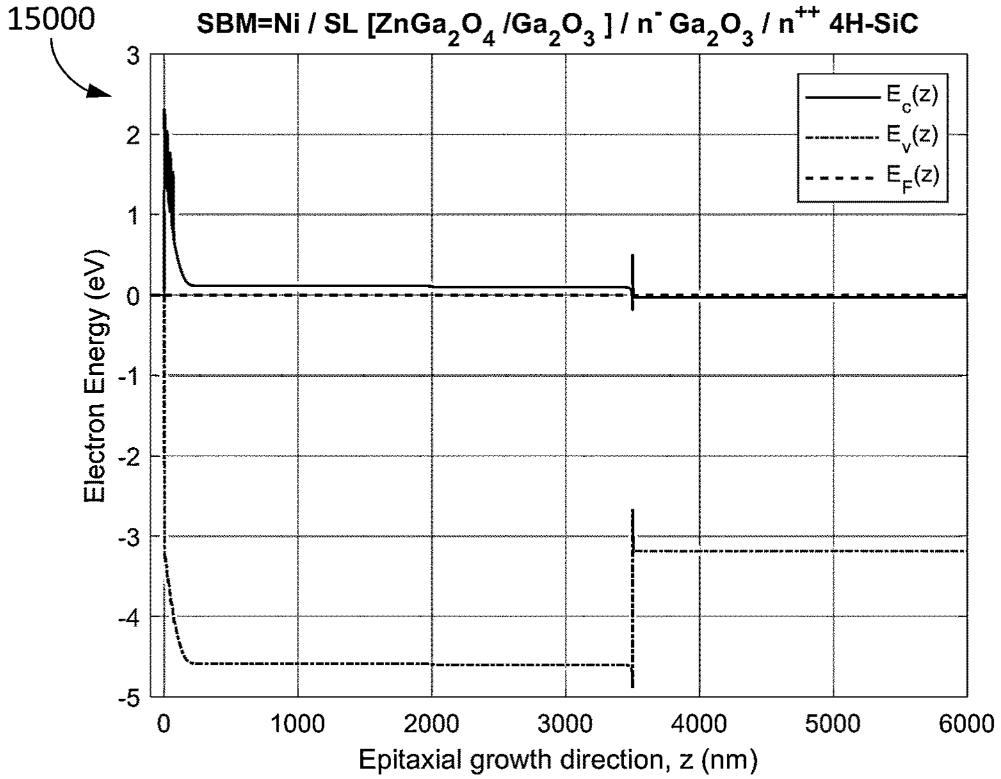
FIGS. 21A and 21B show plots of the spatial variation in the conduction and valence band edges along a growth direction for the multilayered diode structure comprising [Ni/superlattice intermediate layer/$\beta$-$Ga_2O_3$ drift-layer/4H—SiC substrate], wherein the finite number of periods of the superlattice intermediate layer comprises for example bilayer pairs of [$ZnGa_2O_4$/$Ga_2O_3$], in accordance with some embodiments.
Figure 21B:
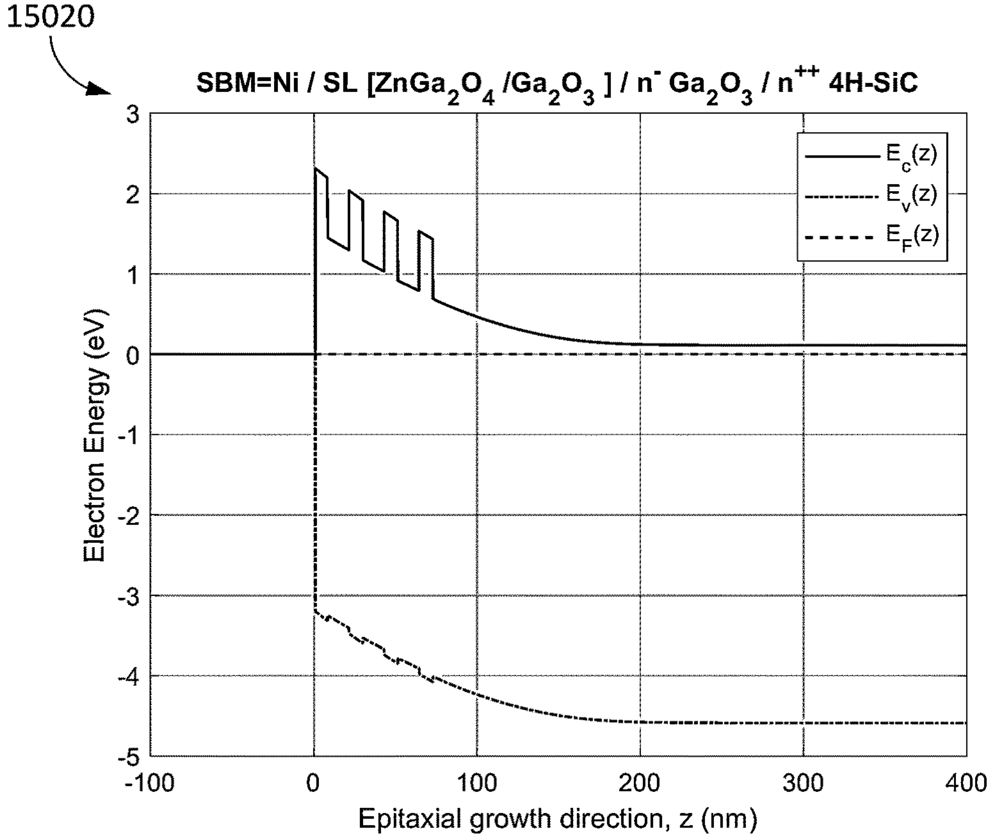

FIG. 21A is a simplified energy band diagram 15000 of a vertical multilayered semiconductor device with a structure similar to structure 14000 in FIG. 20 and comprising an intermediate layer formed of a finite period superlattice comprising $ZnGa_2O_4$ (111) and β-$Ga_2O_3$ (−201) sublayers. Other numbers of layers, and/or other combinations of materials for the SL are also possible. The full conduction and valence energy band diagram 15000 shows the stepped potential barrier ($\phi_S$) arising from the superlattice structure of the intermediate layer and a $Ga_2O_3$ drift layer. FIG. 21B shows a close-up energy band diagram 15020 in the vicinity of the Metal/SL IL/Drift layer with an effective $\phi_S$=2.25 eV and $N_{drift}$=5e16 $cm^{-3}$. In one example, the superlattice structure is configured so that the equivalent potential barrier is increased, resulting in the quantum mechanical tunnelling transmission coefficient being reduced and thermionic emission onset tuned to a higher turn-on voltage. The increased effective barrier potential energy can also improve the high temperature performance of the device. The leakage current associated with quantum tunnelling through the potential barrier in reverse bias can also be reduced using such structures to increase the effective barrier potential energy, as discussed previously.

Figure 21C:
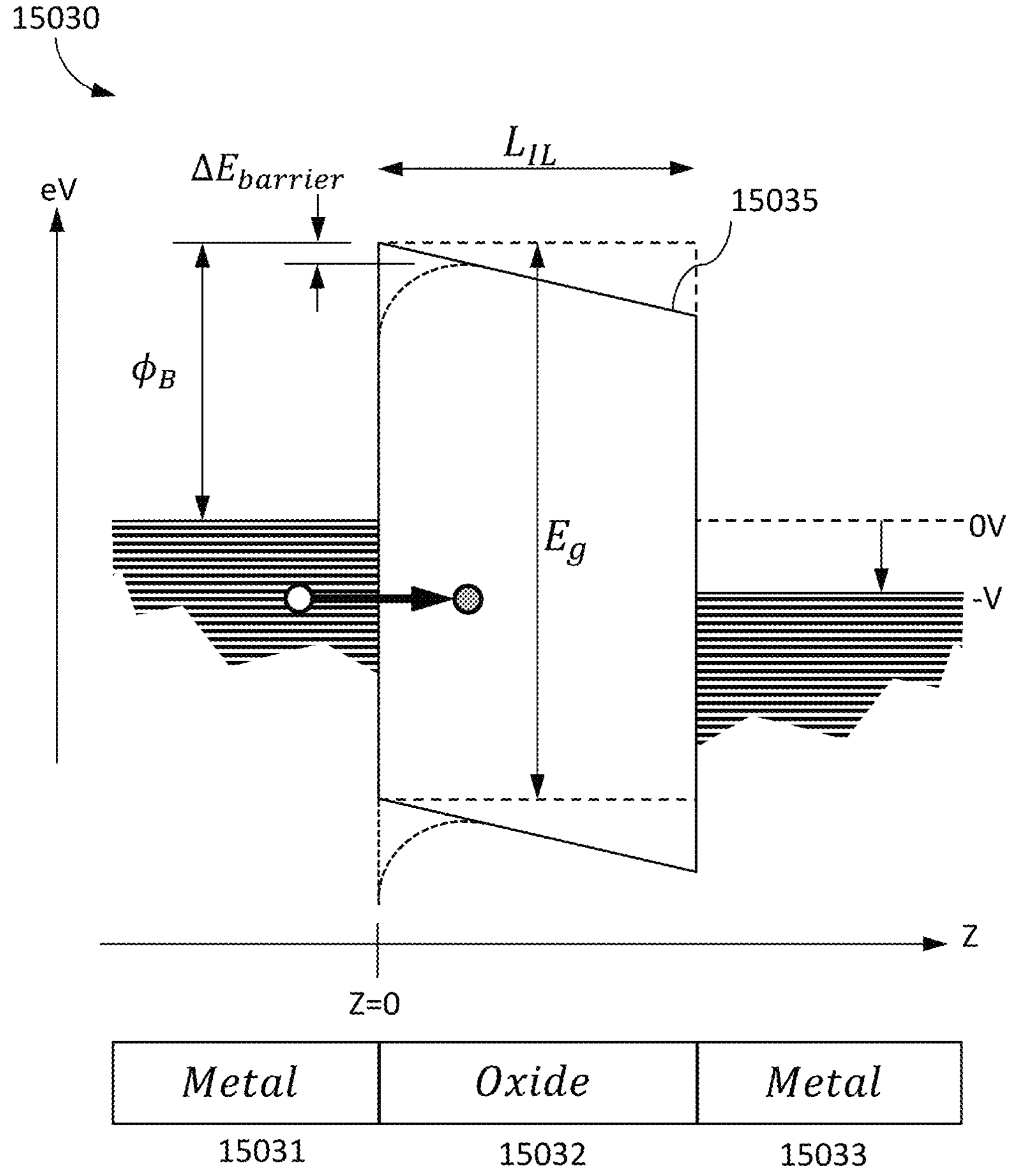
FIG. 21C shows a schematic spatial band energy diagram of a metal-oxide-metal (MOM) heterostructure, wherein the effect of high electric-field band bending is depicted for a biased MOM structure, in accordance with some embodiments.

In practice, even though Schottky barriers and UWBG IL can be realized in the devices, structures, and methods described herein, there exists a phenomenological potential barrier lowering effect (BLE) under the influence of high electric fields. Notably, BLE is correlated with both the bandgap energy and dielectric constant of the specific materials used. FIG. 21C schematically shows the energy diagram 15030 of a semiconductor slab (oxide 15032) with thickness $L_{IL}$, comprising a bandgap $E_g$ (distance between dashed lines), further sandwiched between two metals 15031 and 15033, thus forming a zero bias (V=0) potential barrier at the heterojunction $\phi_B$. The Metal-Oxide-Metal (MOM) structure upon application of a bias generates an electric field $$\mathcal{E}_z = V/L_{IL}$$

that alters the band diagram as shown, wherein the rectangular barrier (V=0) becomes a distorted parallelogram 15035 (e.g., with some band curvature) (V<0).

An electron injected from the left-hand side metal electrode into the oxide layer induces an equal but opposite positive image charge in the metal. If the electron is injected a distance z>0 into the oxide, the Coulomb image force $F_{im}$ generated between the charges separated by a distance 2z is:

$$F_{im}(z) = \frac{-q^2}{4\pi\varepsilon_{opt}(2z)^2}$$

which in turn generates an electrostatic potential $V_{im}$ (z) given by:

$$V_{im}(z) = -\int_{-\infty}^{z} F_{im}(z)dz = \frac{-q^2}{16\pi\varepsilon_{opt}z}$$

Clearly the MOM oxide barrier spatial potential under bias is composed of the: (i) rectangular barrier potential; (ii) the linear electric field; and (iii) the image potential, such that:

$$V_{Oxide}(z) = \phi_B - q\mathcal{E}_z z - \frac{q^2}{16\pi\varepsilon_{opt}z}$$

Figure 22:
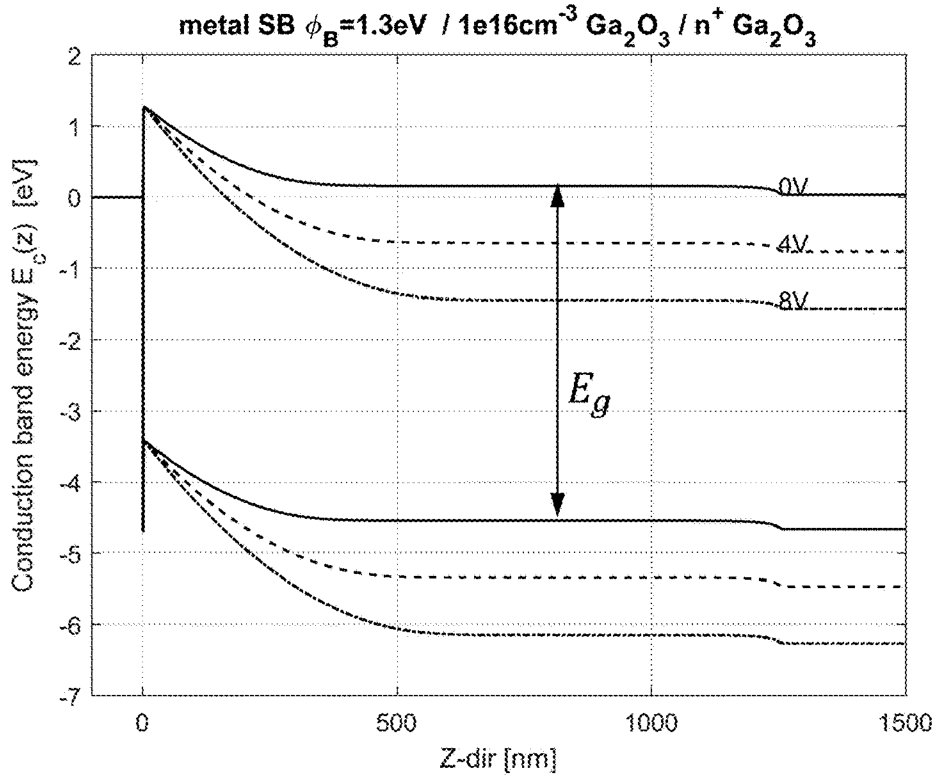
FIG. 22 is a plot of the spatial variation in the conduction and valence band edges along a growth direction for the multilayered diode structure comprising an example [Ni/$\beta$-$Ga_2O_3$ drift-layer/4H—SiC substrate] as a function of applied reverse bias including the barrier lowering effect due to the surface electric field developed across the Schottky barrier potential, in accordance with some embodiments.
Figure 23:
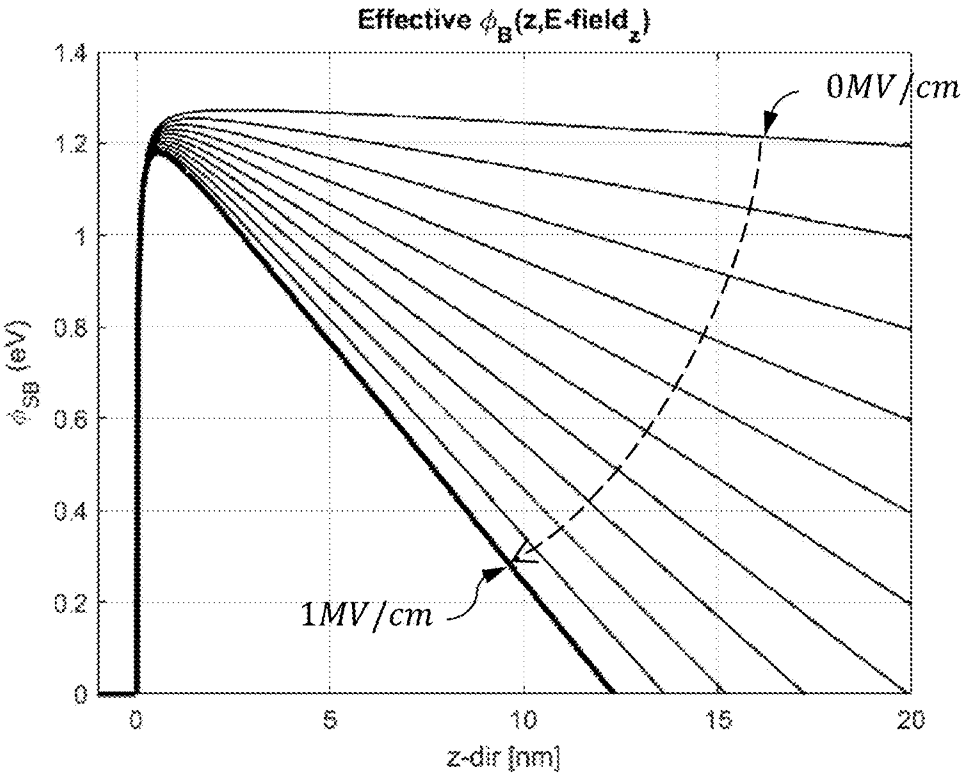
FIG. 23 is a plot of the spatial variation in the conduction band edges along a growth direction for the multilayered diode structure comprising an example [Ni/$\beta$-$Ga_2O_3$ drift-layer/4H—SiC substrate] as a function of applied reverse bias including the barrier lowering effect due to the surface electric field developed across the Schottky barrier potential, where the surface electric field is varied from 0 MV/cm to 1 MV/cm showing the Schottky barrier height and width variation, in accordance with some embodiments.

FIG. 22 shows the image force band bending of the Schottky barrier for an example comprising an ideal Ni/1e16 $cm^{-3}$ $Ga_2O_3$/n+$Ga_2O_3$/n+4H—SiC device. FIG. 23 shows closeup of the band bending near the peak of the potential. For UWBG oxides the sensitivity analysis shows the BLE is relatively small in comparison to the available $\phi_B$.

The BLE is responsible for reducing the peak barrier potential $\phi_B$ by an amount $\Delta E_{barrier}$ which can be quantitatively expressed in terms of the high frequency (optical) dielectric constant and the applied field.

The condition $$dV_{Oxide}/dz = 0$$

yields the maximum and is located at $$z_m = \left(\frac{q}{16\pi\varepsilon_{Opt}\mathcal{E}_z}\right)^{-1}$$

away from the heterointerface, such that, $$\Delta E_{barrier} = \sqrt{\frac{q^3\mathcal{E}_z}{4\pi\varepsilon_{opt}}}$$

Inclusion of the BLE into the metal Schottky barrier device example is shown in FIG. 22. This example case is for a Schottky barrier metal (SBM) having ¢B=1.3 eV on a 1250 nm drift region comprising $N_{drift}$=1e16 $cm^{-3}$ β-$Ga_2O_3$ (−201). A transition layer of n+β-$Ga_2O_3$ (−201) 1e17 $cm^{-3}$ is deposited on a nitrogen-doped n+1e18 $cm^{-3}$ 4H—SiC substrate. The zero bias (0V) and reverse bias (4V and 8V) band diagrams are plotted showing the change in the depletion width. FIG. 23 shows a close-up view of the conduction band of FIG. 22 in the vicinity of the Schottky barrier peak for a series of applied reverse bias voltages and resulting surface electric-fields. The band lowering effect and band bending are shown.

Figure 24:
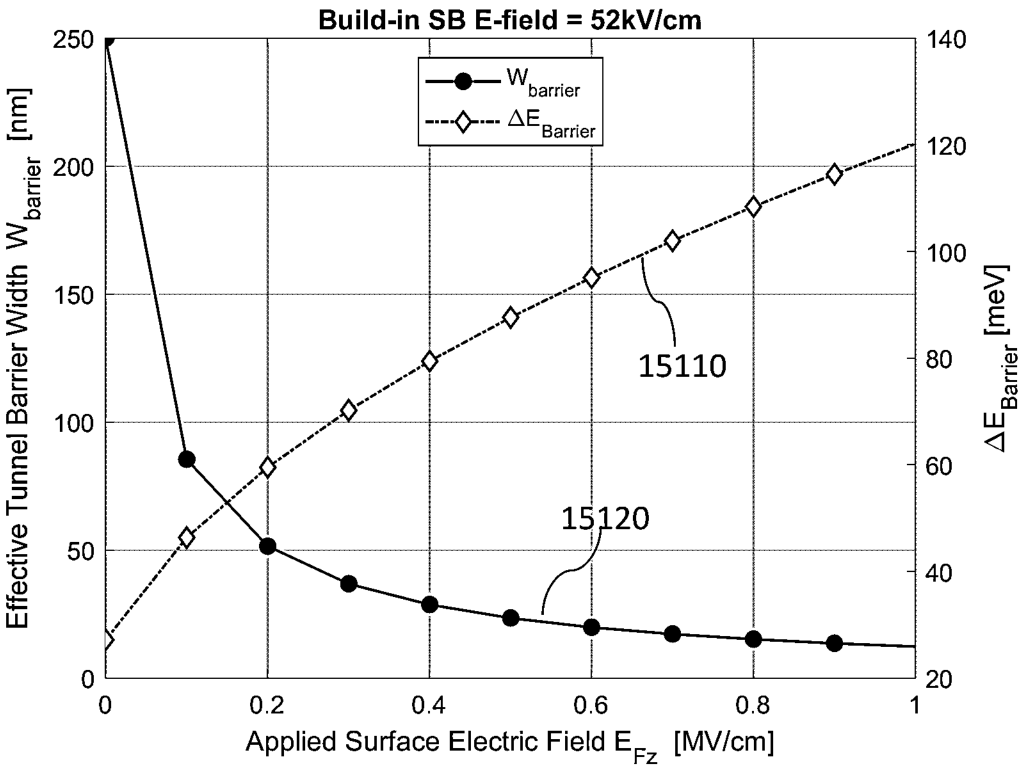
FIG. 24 shows a plot of the calculated effective barrier width and potential energy height of the Schottky heterojunction as a function of applied reverse bias and therefore the surface electric field, in accordance with some embodiments.

FIG. 24 plots the extracted values of the effective barrier height lowering energy $\Delta E_{Barrier}$ (curve 15110 and right-hand y-axis) and the effective barrier width $W_{barrier}$ (curve 15120 and left-hand y-axis) as a function of the surface electric-field $E_{Fz}$. For $E_{Fz}$=0 MV/cm the built-in electric field is ~52 kV/cm due to the depletion field.

Referring again to Eqtn. 2, the tunneling current is also dependent on the temperature as well as the transmission coefficient of electrons through the barrier as a function of the surface electric-field (refer to FIG. 23).

Figure 25:
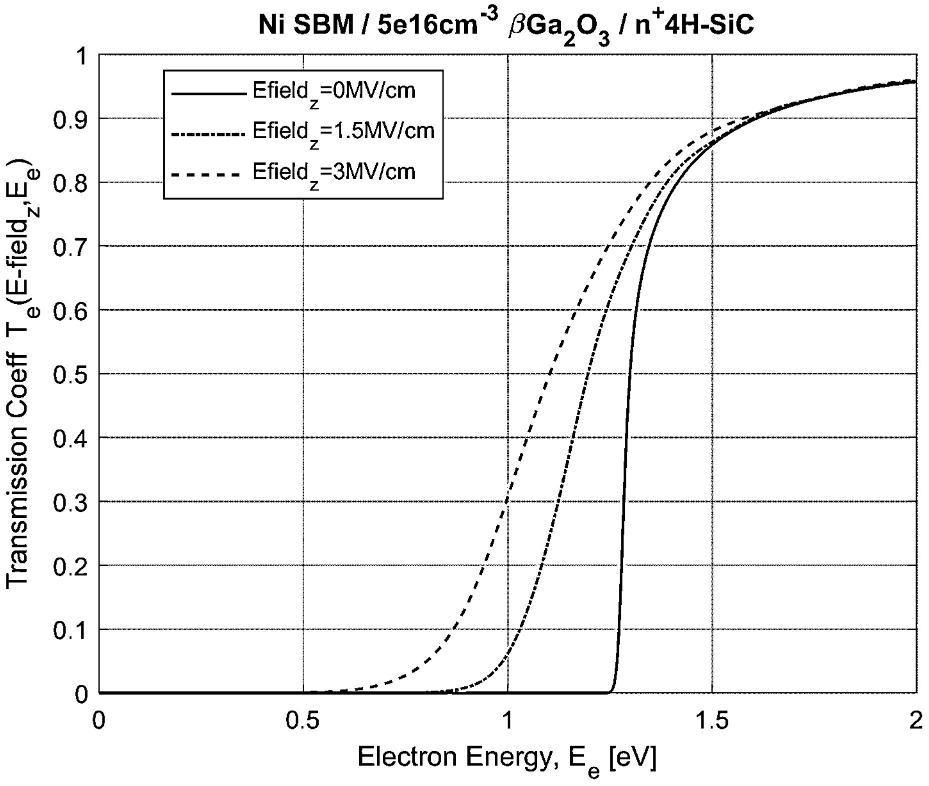
FIG. 25 shows the calculated quantum mechanical tunnelling coefficient versus the incident electron energy traversing the Schottky barrier formed by the [Ni/β-$Ga_2O_3$/4H—SiC] structure as a function of surface electric field, in accordance with some embodiments.
Figure 26:
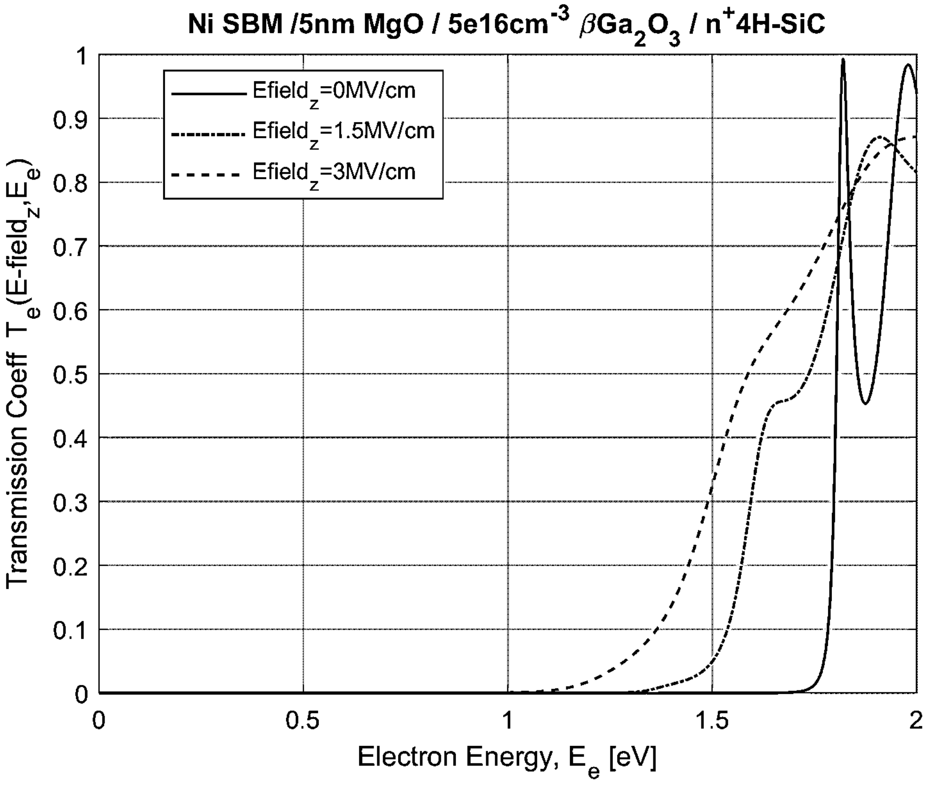
FIG. 26 shows the calculated quantum mechanical tunnelling coefficient versus the incident electron energy traversing the Schottky barrier formed by the [Ni/5 nm MgO/β-$Ga_2O_3$/4H—SiC] structure as a function of surface electric field, in accordance with some embodiments.

FIGS. 25 and 26 calculate the quantum mechanical transmission coefficient for two device configurations of: (i) Ni SBM/5e16 $cm^{-3}$ $Ga_2O_3$/n+4H—SiC in FIG. 25; and (ii) Ni SBM/5 nm MgO IL/5e16 $cm^{-3}$ $Ga_2O_3$/n+4H—SiC in FIG. 26, the device of FIG. 26 incorporating an intermediate layer of UWBG 5 nm MgO. The transmission coefficient T ($E_e$, $E_{Fz}$) is dependent on the incident electron energy $E_e$ relative to the Fermi energy ($E_{Fermi}$ is taken as zero), and the potential profile is dependent on the surface electric-field $E_{Fz}$. The tunneling current integral is performed over $E_e$ ranging from 0 to the maximum value of the potential energy shown in FIG. 23 yielding the curves in FIGS. 27 and 28.

Figure 27:
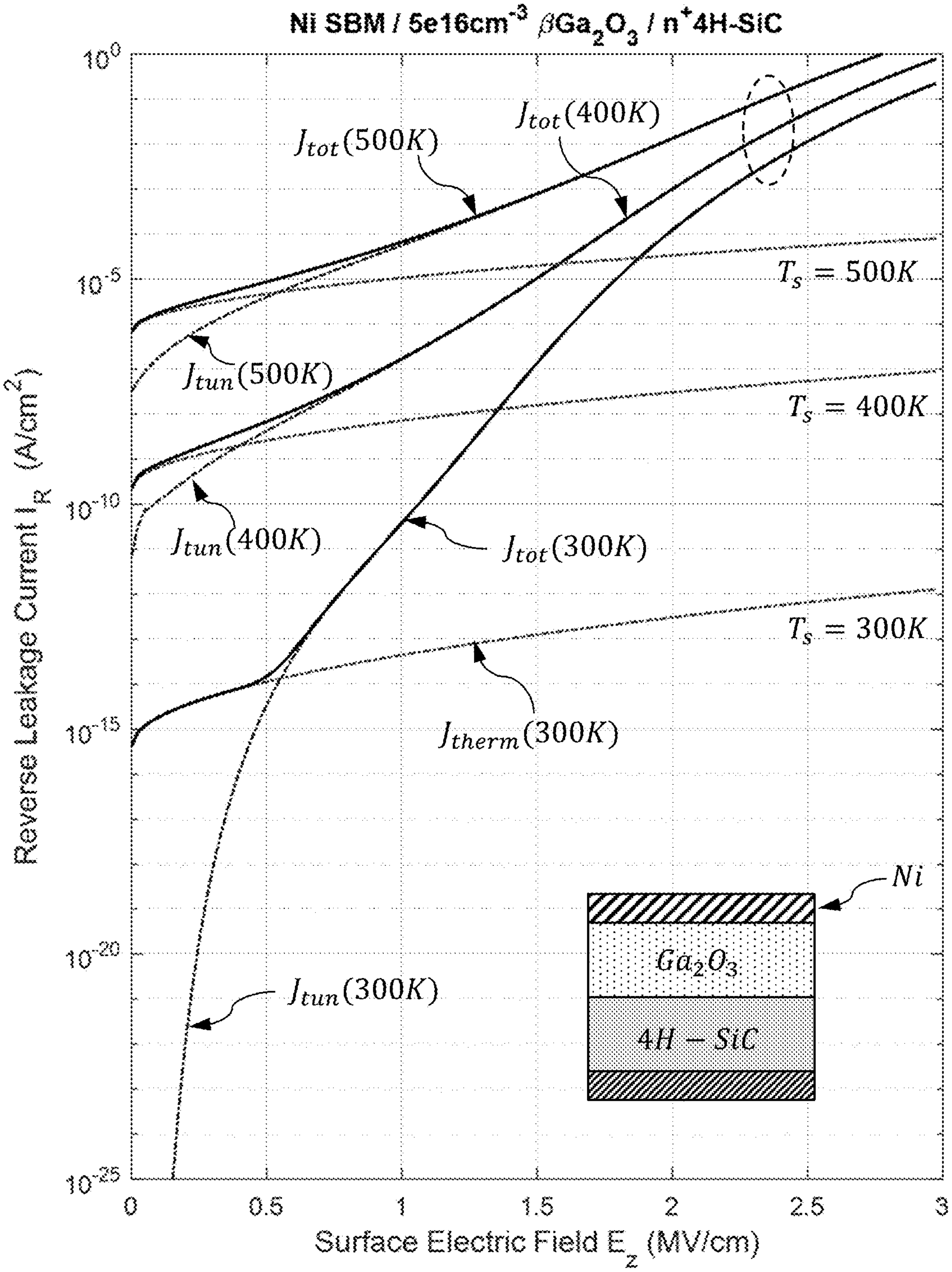
FIG. 27 plots the calculated component contributions of the thermionic emission current and quantum mechanical tunneling currents versus applied surface electric field as a function of several substrate temperatures, where the device structure comprises a vertical multilayer semiconductor structure [Ni/β-$Ga_2O_3$/4H—SiC], in accordance with some embodiments.
Figure 28:
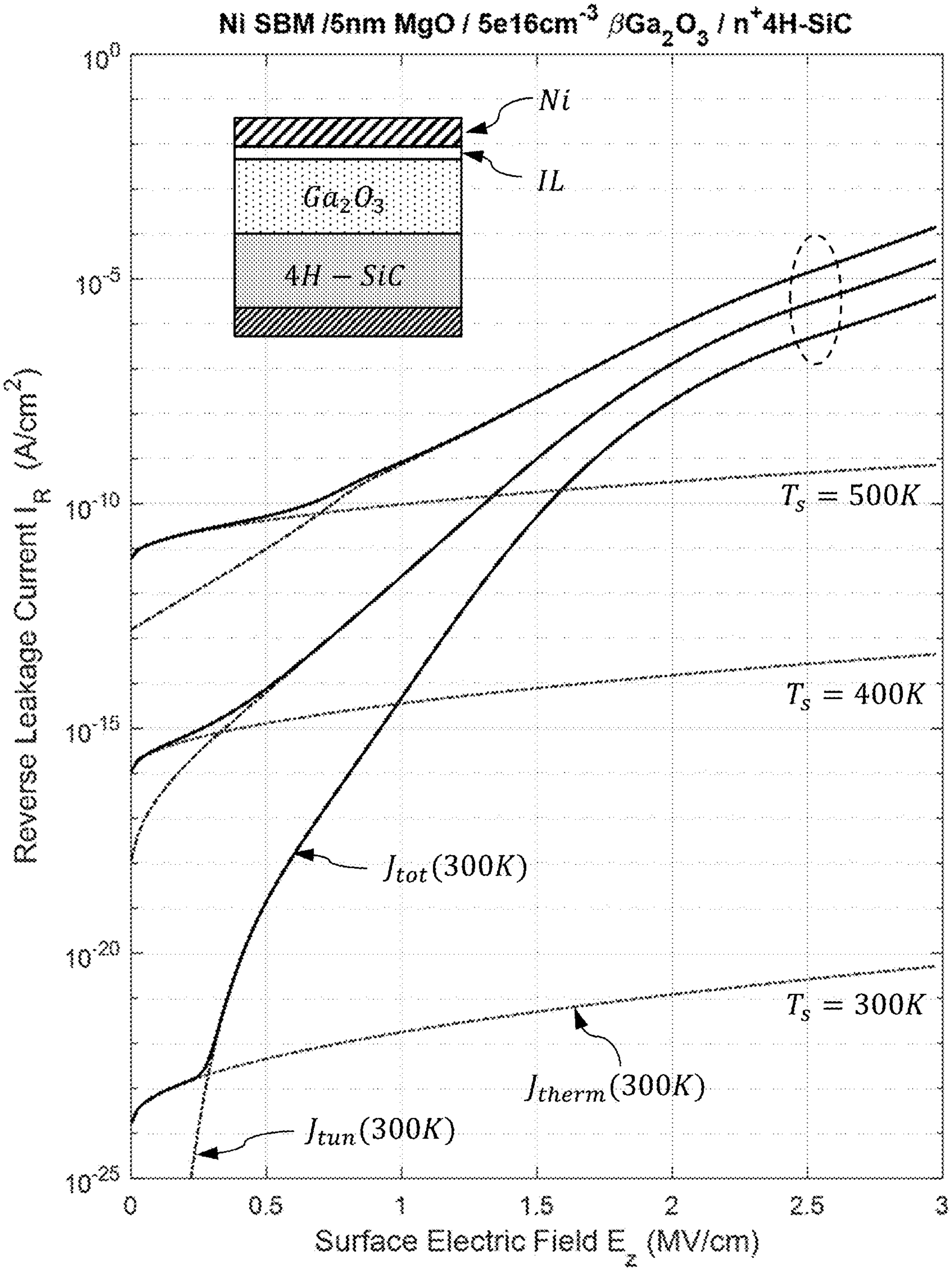
FIG. 28 plots the calculated component contributions of the thermionic emission current and quantum mechanical tunneling currents versus applied surface electric field as a function of several substrate temperatures, where the device structure comprises a vertical multilayer semiconductor structure [Ni/5 nm MgO/β-$Ga_2O_3$/4H—SiC], in accordance with some embodiments.

FIGS. 27 and 28 plot the calculated contributions of the thermionic current ($J_{therm}$) and the tunneling current ($J_{tun}$) to the total current ($J_{tot}$) for each of the two device structures of FIGS. 25 and 26. Three example operating temperatures are shown, viz., $T_s$=300K, 400K and 500K, indicative of the operating temperatures discussed above for the thermal performance of the Oxide/SiC hybrid device.

Close inspection of the curves detailed in FIG. 27 demonstrates that at low surface electric fields $E_z$≤0.5 MV/cm the reverse leakage current of the Schottky barrier diode is primarily determined by the thermionic current component. Above this critical surface electric field $E_z$>0.5 MV/cm the temperature dependent tunneling current dominates and indeed swamps the contribution from the thermionic emission. This indicates the design of the heterojunction Schottky barrier is important for managing and limiting the reverse leakage current for high surface electric field regime.

FIG. 28 shows the analogous plots of the calculated reverse leakage current for the case of the diode structure intentionally incorporating a UWBG 5 nm MgO IL between the Schottky metal and the $Ga_2O_3$ drift region. Inspection of the curves in FIG. 28 shows a lowering of the critical surface electric field where thermionic emission and tunneling components dominate, $E_z$≤0.25 MV/cm. However, the absolute reverse leakage currents for both thermionic and tunneling components are dramatically reduced compared to the case of FIG. 27 where there is no IL present. Therefore, the present disclosure shows that an UWBG intermediate layer can be advantageous for improving the reverse leakage performance of Schottky barrier didoes as disclosed herein.

Figure 29A:
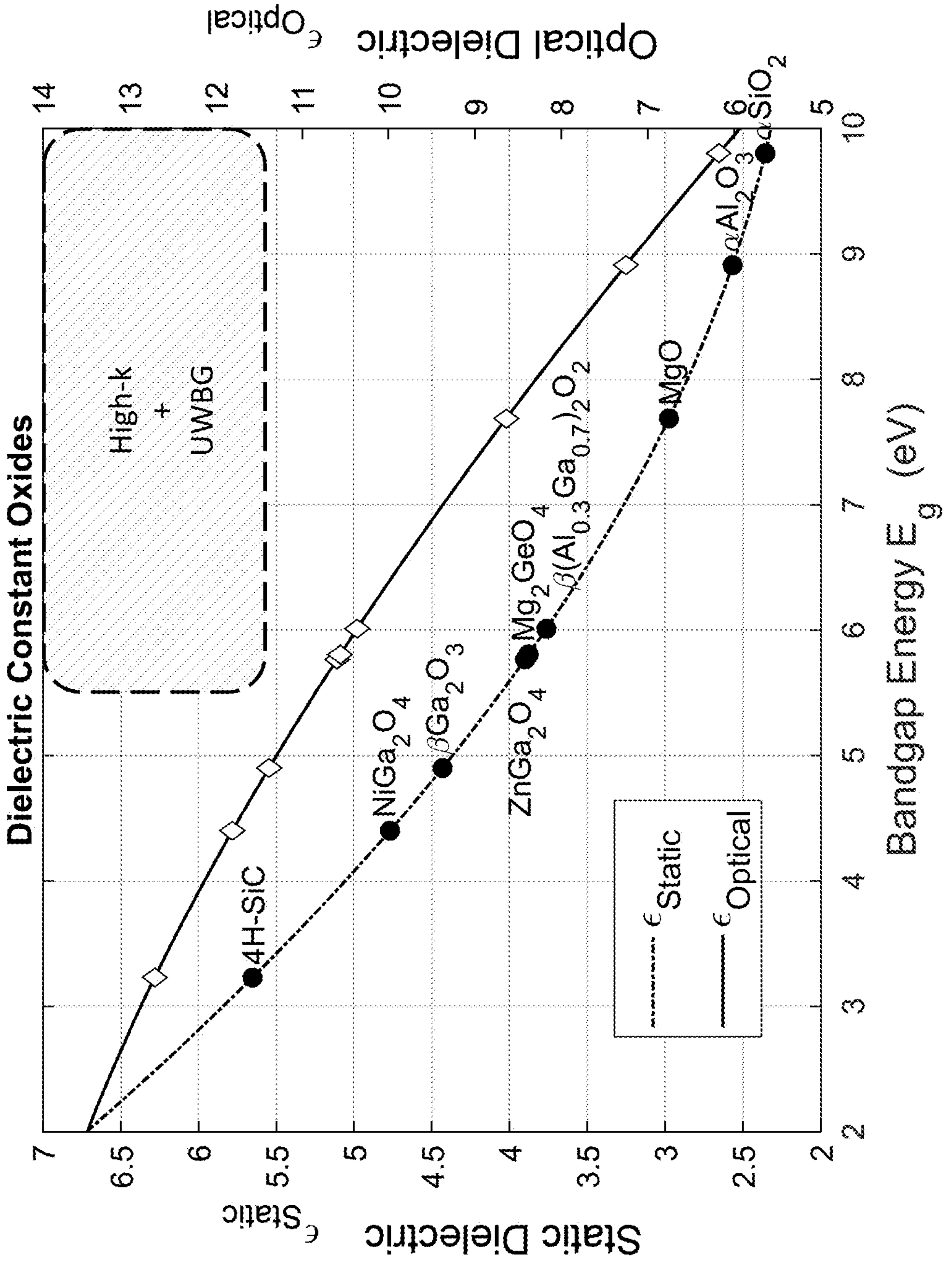
FIG. 29A shows a plot of static and optical (high frequency) dielectric constants calculated for a selection of semiconductors and oxide materials, where a trend for dielectric constant versus material bandgap energy is disclosed, in accordance with some embodiments.

Ab-initio theoretical calculations and experimental data yield a trend of the static dielectric constant (low frequency)

$$\varepsilon_r^s$$

and (high frequency) optical dielectric constant $$\varepsilon_r^{opt}$$

with respect to the bandgap $E_g$ of non-oxide and oxide materials. Density Functional Theory was used to simulate the energy band structure and dielectric dispersion of a variety of crystal structures. A selection of oxide materials is plotted in FIG. 29A showing the dielectric constants in general decrease (reduce) with increasing bandgap energy $E_g$. The static $\varepsilon_{static}$ and optical $\varepsilon_{optical}$ dielectric constants exhibit similar trends but have differing bowing, as shown.

Figure 29B:
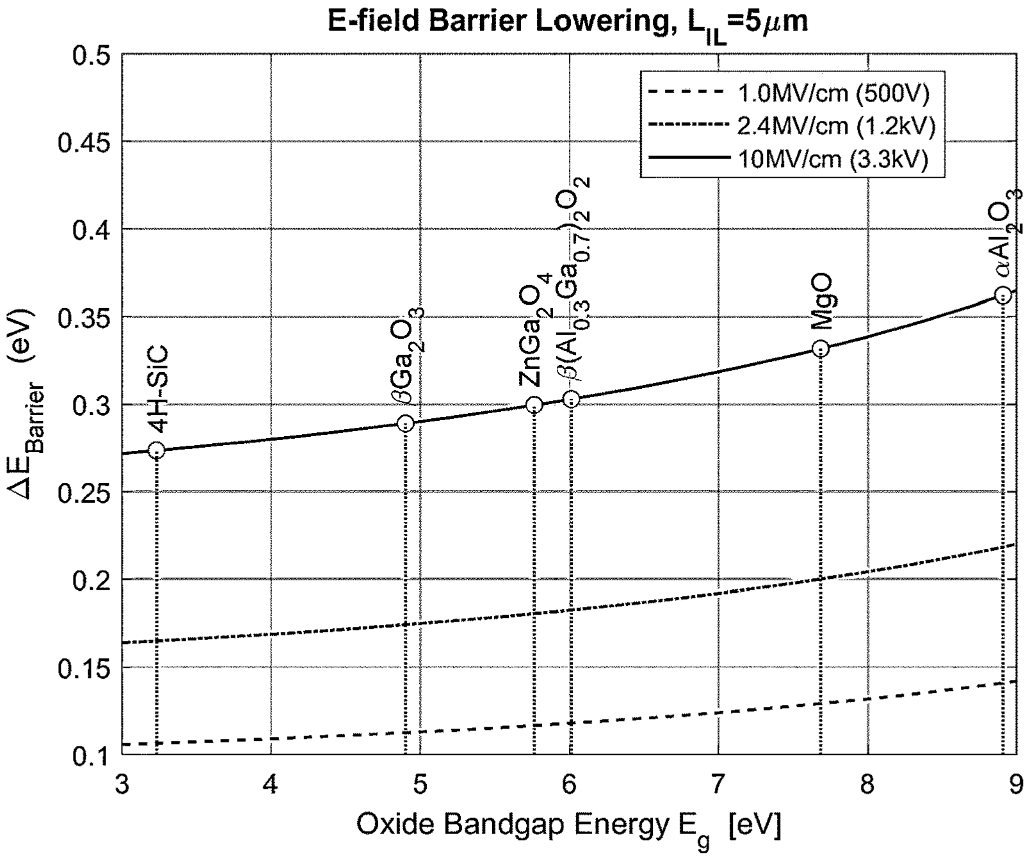
FIG. 29B is a plot of the electric-field induced conduction band edge barrier lowering energy versus material bandgap energy using the optical dielectric constants calculated in FIG. 29A, where three example electric-field strengths are plotted for 5 μm slabs, in accordance with some embodiments.

FIG. 29B shows the expected variation of $\Delta E_{barrier}$ with respect to $E_g$ for three cases of applied electric field across a slab of thickness of 5 μm with selected oxide semiconductors. Barrier lowering is observed to be higher for large band gaps due in part to dynamic screening which decreases with increasing band gap. Further, the high-frequency (optical) dielectric constant should be used to model screening associated with barrier lowering since the time associated with an electron transiting through the barrier is very short. The high surface electric fields can be accommodated using an IL as described for application to high voltage rectifiers.

Figure 29C:
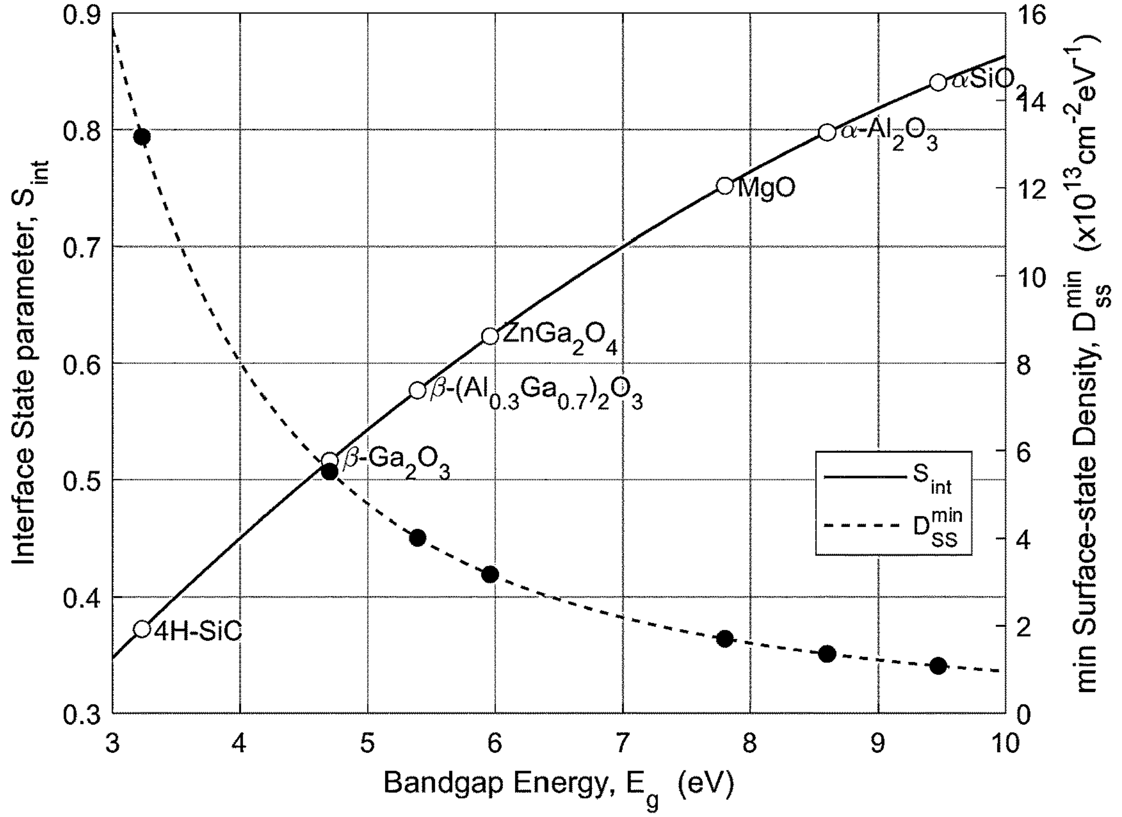
FIG. 29C plots the empirical trends of interface state parameter and minimum surface state density that varies as a function of a material bandgap energy, in accordance with some embodiments.

FIG. 29C discloses further trends available for advantageous incorporation of the IL oxide materials into the diode structure. A figure of merit for the interface quality $S_{int}$ (interface state parameter) of a given surface state can be estimated also by relation to the dielectric constant trend. Defining for clarity $$S_{int} = \frac{1}{1 + 0.1(\varepsilon_r^{opt} - 1)^2}$$

where $0 \le S_{int} \le 1$, and $S_{int}=1$ represents an ideal surface having a surface state density=0, and $S_{int}=0$ represents infinite surface state density. An empirical fit can also be estimated for the induced gap states resulting in a minimum surface state density $$D_{SS}^{min}$$

and is also related to the dielectric constant by:

$$D_{SS}^{min} = \frac{C_{dipole}}{q}\left(\frac{1}{S_{int}} - 1\right)$$

where $$C_{dipole} = \frac{\varepsilon_r^{opt}}{\delta},$$

such that, a typical dipole is across at least one unit cell of the material, δ~0.43 nm for MgO.

Referring again to both FIGS. 19C and 21A, the heterostructure design incorporating an IL (e.g., MgO, or other material(s)) between the metal and $Ga_2O_3$ enables a reduction in surface state density while maintaining a high barrier potential required for forward bias rectification and low reverse leakage current.

In another example, a repeating characteristic of the intermediate layer or drift layer is configured by introducing a repeating spatial modulation of the doping concentration as a function of growth direction ("z"). For example, the intermediate layer or drift layer can have a single material composition, and the conduction band potential can be modified using a repeating spatial modulation of doping concentration. In one example, the spatial extent of the doping region is very small and has a very high doping concentration. In another example, the doping region extends over one or more unit cells of the host composition but less than about 10 nm. In another example, the doping region comprises an extremely high doping concentration, of the order of $$N_\delta^{3D} = 10^{18} - 10^{20}\ \text{cm}^{-3}.$$

In yet another example, the doping region is called a delta-doped region wherein the thickness over which is doped is about 10-20 nm or less. In some cases, the doping region thickness is of the order of 1 or more monolayers of the host material composition. For very thin doping region thickness an equivalent two-dimensional doping density $$N_\delta^{2D}$$

can be defined related to the bulk-like $$N_\delta^{3D},$$

such that, $$N_\delta^{3D} = \left(N_\delta^{2D}\right)^{3/2}$$

That is, $$N_\delta^{3D} = 10^{18}\ \text{cm}^{-3}$$

is equivalent to an areal density $$N_\delta^{2D} = 10^{12}\ \text{cm}^{-2}.$$

In one example, the repeating spatial modulation of doping concentration may have a homoepitaxial superlattice type structure similar to superlattices described above except that instead of the sublayers having different compositions, in this example the sublayers will be of constant composition but have different doping concentration.

In another example, a repeating characteristic of the intermediate layer includes both repeating spatial modulation of the doping concentration and repeating changes in the composition of the intermediate layer.

Figure 30:
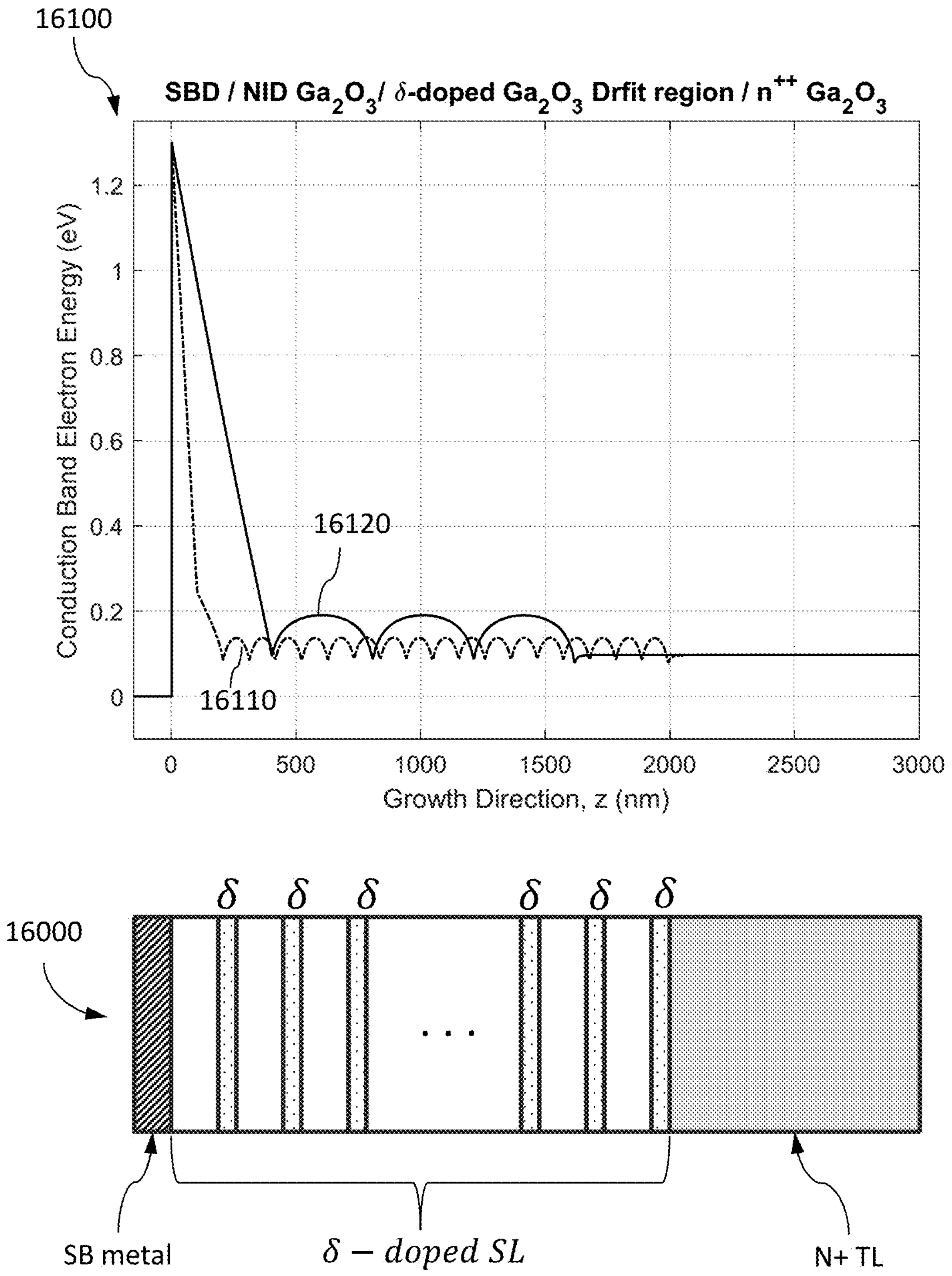
FIG. 30 is a plot of the spatial variation of the conduction band edge along a growth direction (upper diagram) for superlattice delta-doped drift region using an example $Ga_2O_3$ host layer coupled to a Ni Schottky barrier and deposited on a SiC substrate, where the lower diagram depicts the periodic doped layers punctuating not intentionally doped regions, in accordance with some embodiments.

An example of a homoepitaxial delta-doped superlattice (δ-SL) forming the drift region of an SB diode 16000 is shown in FIG. 30. Nickel metal forms a SB ("SB metal") to a delta-doped SL drift region ("δ-doped SL") formed by using either Sn, Ge or Si shallow dopants into a host β-$Ga_2O_3$ composition (i.e., $Ga_2O_3$ is used throughout the drift region). Shown in plot 16100 is a sheet density doping $$N_\delta^{2D} = 10^{12}\ \mathrm{cm}^{-2}$$

for two different periods of a periodic [δ-doped $Ga_2O_3$/NID $Ga_2O_3$] superlattice (δ-SL) extending over 2 μm forming the drift layer of the overall structure, Ni/δ-doped SL drift/n+ TL/n+4H—SiC. The high work function Ni metal is in direct contact with a first NID $Ga_{203}$ layer of the δ-SL thereby maximizing the SB potential. Two δ-SL periods are selected, by way of example, and plotted are the conduction band diagrams as a function of growth direction. Plot 16100 shows curves representing a first δ-SL 16110 comprising 19× periods of $$[N_d^\delta\ \mathrm{cm}^{-3}\ 5\ \mathrm{nm}, NID\ 100\ \mathrm{nm}]$$

and second δ-SL 16120 comprising 4× periods of $$[N_d^\delta\ \mathrm{cm}^{-3}\ 5\ \mathrm{nm}, NID\ 400\ \mathrm{nm}].$$

The SL doping region ratio is defined as:

$$\gamma = L(NID)/L(\delta - \mathrm{doped})$$

such that, the first and second δ-SL have γ1=20 and γ2=80, respectively.

The band structure again behaves as a SB diode, with the δ-SL having an effective bulk doping density of $$N_d^{eff} = 4.9e16\ \mathrm{cm}^{-3}$$

and 1.3e16 $cm^{-3}$ for the first and second δ-SL, respectively.

An advantage to utilizing the periodic δ-doping method for the drift region in order to achieve an effective bulk-like n-type doping level compared to continuous co-doped growth of $Ga_2O_3$ is that higher epitaxial material quality is possible. In general, higher levels of n-type impurity doping in the range of 1e17 $cm^{-3}$, and above, result in relatively reduced crystalline quality during co-doping epitaxial growth. Furthermore, active oxygen species may interact with the Si, Ge or Sn doping source in the growth reactor, forming potentially undesired byproduct. Periodic and short doping bursts during epitaxial growth enable confinement of the dopant in a small layer, followed by NID material growth which tends to repair any crystalline distortion due to the incorporation of the impurity atom within the $Ga_2O_3$ crystal lattice. This method of periodic doping further improves the crystal quality of the effective doped drift region for application to thick drift regions of 5 microns and higher.

Figure 31:
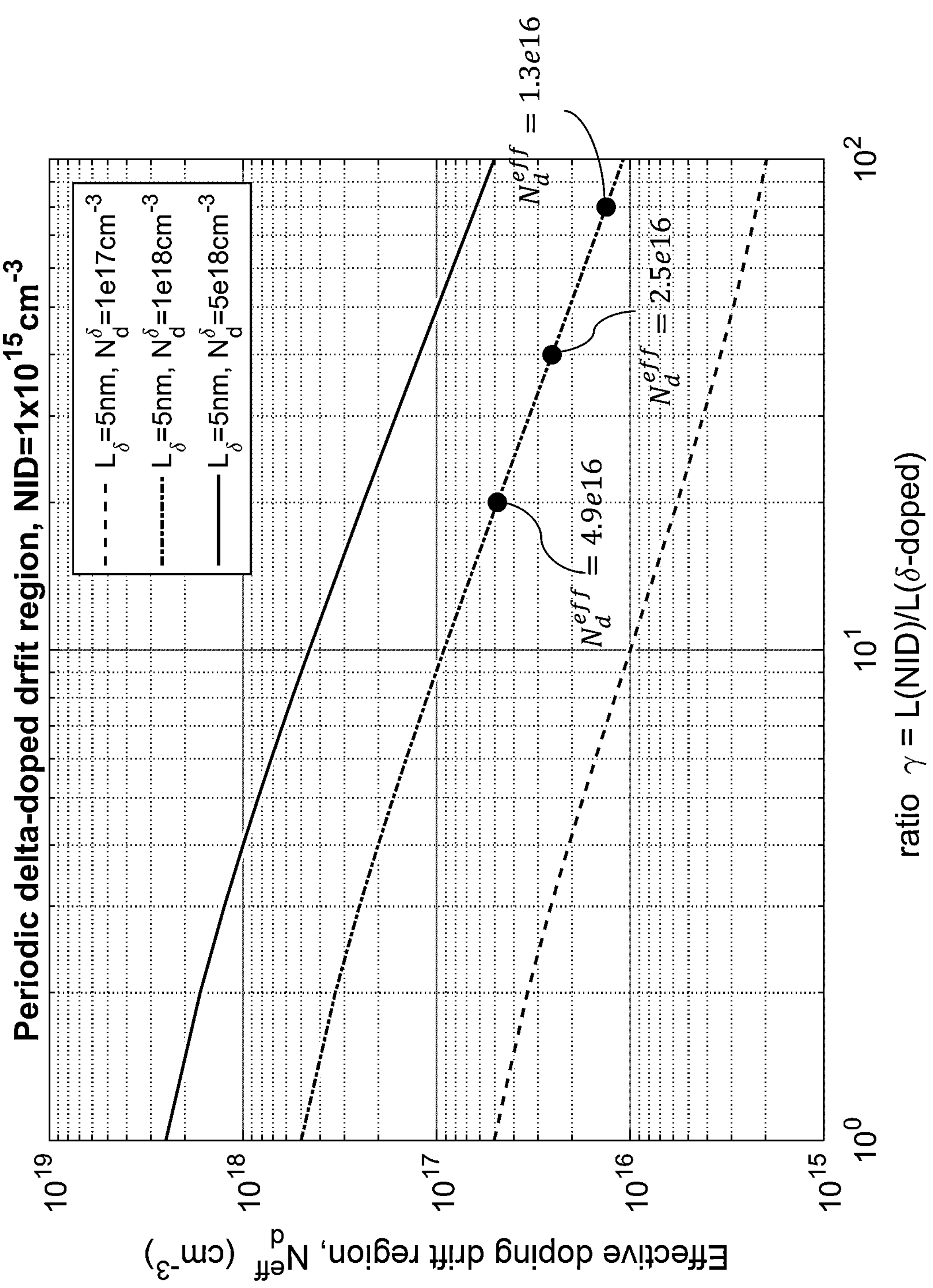
FIG. 31 shows a plot of the effective donor doping concentration of delta-doped superlattice drift region versus the thickness ratio γ, in accordance with some embodiments.

FIG. 31 shows a possible design space for achieving a target $$N_d^{eff}$$

using a δ-SL. Example configurations using a length of the individual delta doped layer L(δ–doped)=5 nm at three different 2D sheet doping densities, namely, $$N_\delta^{2D}\ (N_\delta^{3D}) = 2.2e11\ \mathrm{cm}^{-2}\ (1e17\ \mathrm{cm}^{-3}),$$
$$1.0e12\ \mathrm{cm}^{-2}\ (1e18\ \mathrm{cm}^{-3}),\ \text{and}\ 2.9e12\ \mathrm{cm}^{-2}\ (5e18\ \mathrm{cm}^{-3}),$$

and sheet doping densities in between the curves can be interpolated.

Figure 32A:
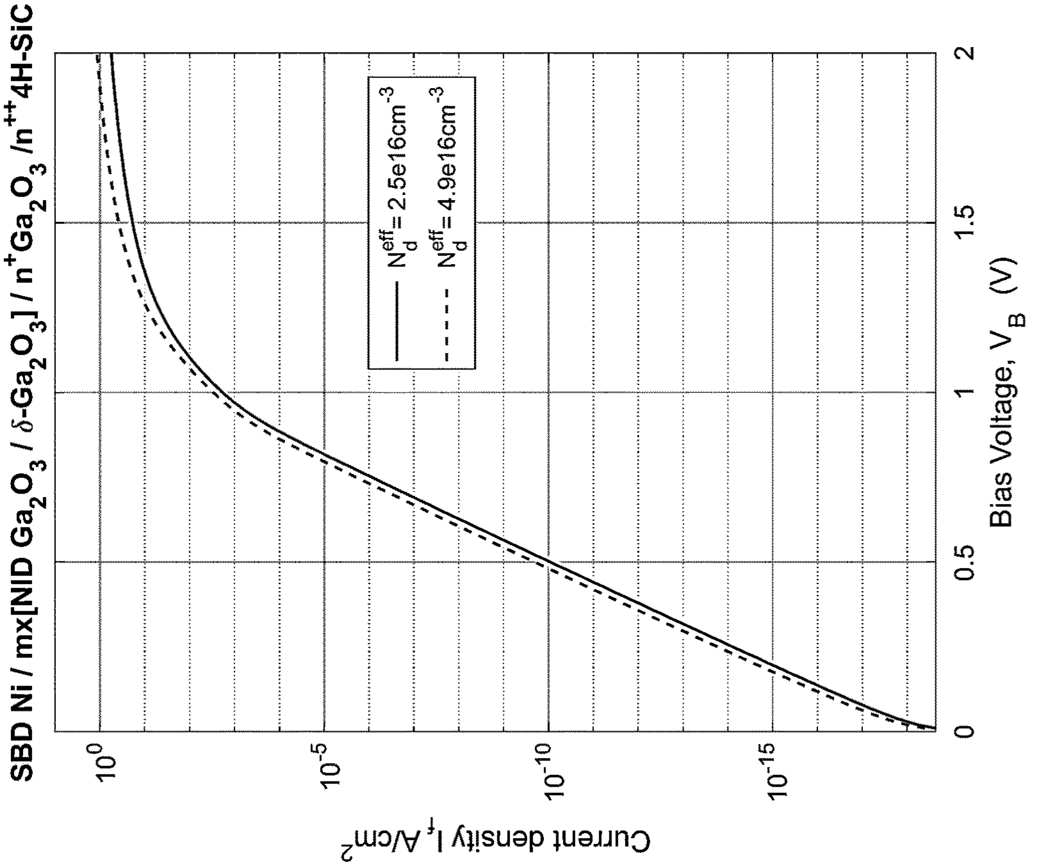
FIGS. 32A and 32B are plots of the forward bias I-V curves for two configurations of vertical multilayered Schottky barrier diode comprising a delta-doped SL $Ga_2O_3$ drift region, in accordance with some embodiments.
Figure 32B:
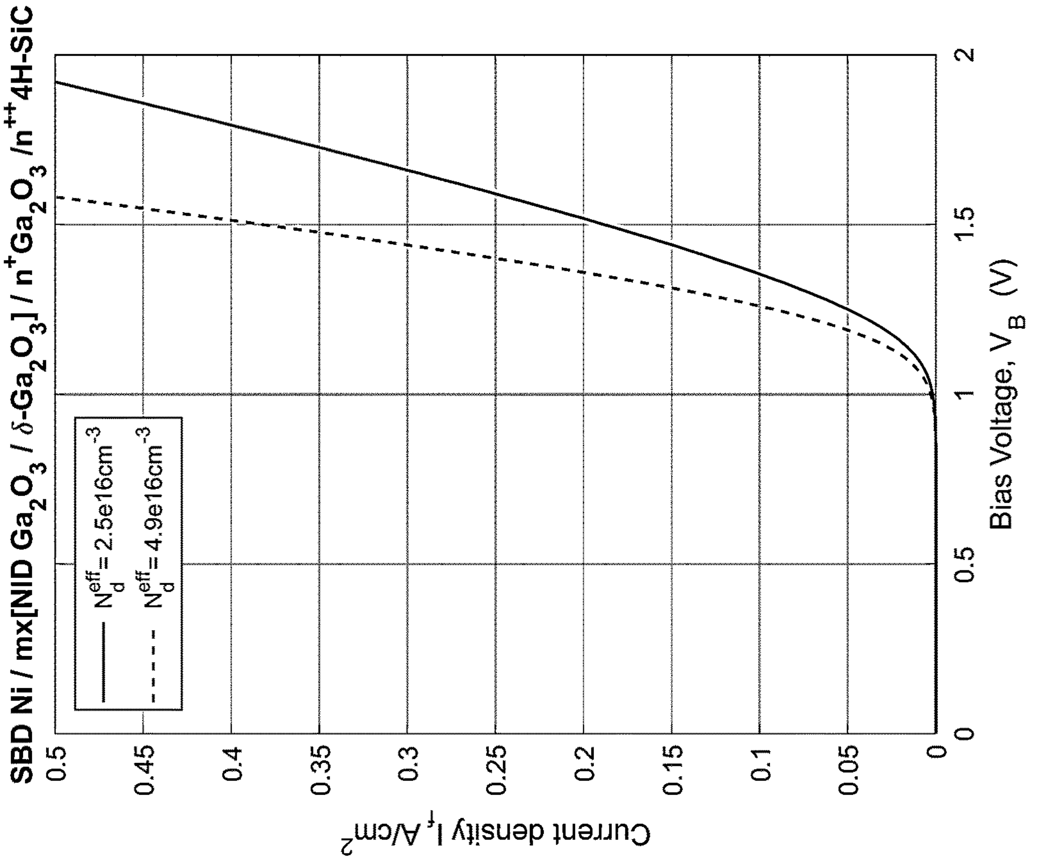

FIGS. 32A and 32B present the forward bias I-V curves for the SB diode of FIG. 30 incorporating two examples of a δ-SL drift region having $$N_d^{eff} = 4.9e16\ \mathrm{cm}^{-3}$$

and 2.5e16 $cm^{-3}$, where FIG. 32A uses a semilog scale and FIG. 32B uses a linear scale. The subthreshold slopes are comparable, whereas the differential resistance is higher for $$N_d^{eff} = 2.5e16\ \mathrm{cm}^{-3},$$

as expected.

In another example, the intermediate layer is formed comprising at least one quantum well (QW) sublayer sandwiched between wider bandgap layers, the QW formed by confinement of electrons due to the potential well thus formed. The QW has at least one quantized discrete energy levels within the narrow band gap QW layer. In one example, the quantum well sublayer is configured so that a resonant tunnelling current can occur for only a specific bias configuration, i.e., the quantum well sublayer is configured to have a bias dependent tunnelling current. In one example, this can be used for a voltage dependent switch for creating pulsed current or a bistable switch. Such a device can be a resonant tunneling diode having two electrical terminals and exhibiting a non-linear I-V response. The non-linear I-V response can have a property of negative differential resistance, which can be used advantageously in a switching or oscillator configuration of an electrical circuit.

In another example, this two-terminal switch can be used as part of a power converter for controlling pulse width and duration of a current.

An example of a vertical conduction resonant tunneling diode is described below. A double barrier IL incorporating a single QW is formed using the heterostructure of β-$(Al_{0.2}Ga_{0.8})_2O_3$/β-$Ga_2O_3$/β-$(Al_{0.2}Ga_{0.8})_2O_3$ which is further deposited upon an n-type β-$Ga_2O_3$ drift layer, further deposited upon a SiC conductive substrate. The thickness of the β-$(Al_{0.2}Ga_{0.8})_2O_3$ barrier is sufficiently thin to enable tunneling of electrons, for example $L_{barrier}$=1-10 nm or equal to a unit multiple (e.g., 1, or 2, or 3, or 5, or from 1 to 10) of the $(Al_{0.2}Ga_{0.8})_2O_3$ crystal unit cell along the growth direction. The thickness of the $\beta$-$Ga_2O_3$ layer comprising the QW can be selectively n-type doped or NID, and have a thickness of the order of 1 monolayer to about 10 monolayers, wherein 1 monolayer is defined as half the unit crystal dimension along the epitaxial growth direction. Due to the relatively large electron effective mass in both $$\beta\text{-}Ga_2O_3(m_e^* = 0.29 - 0.31) \text{ and } 4H\text{-}SiC\ (m_e^* = 0.25 - 0.29)$$

Figure 33A:
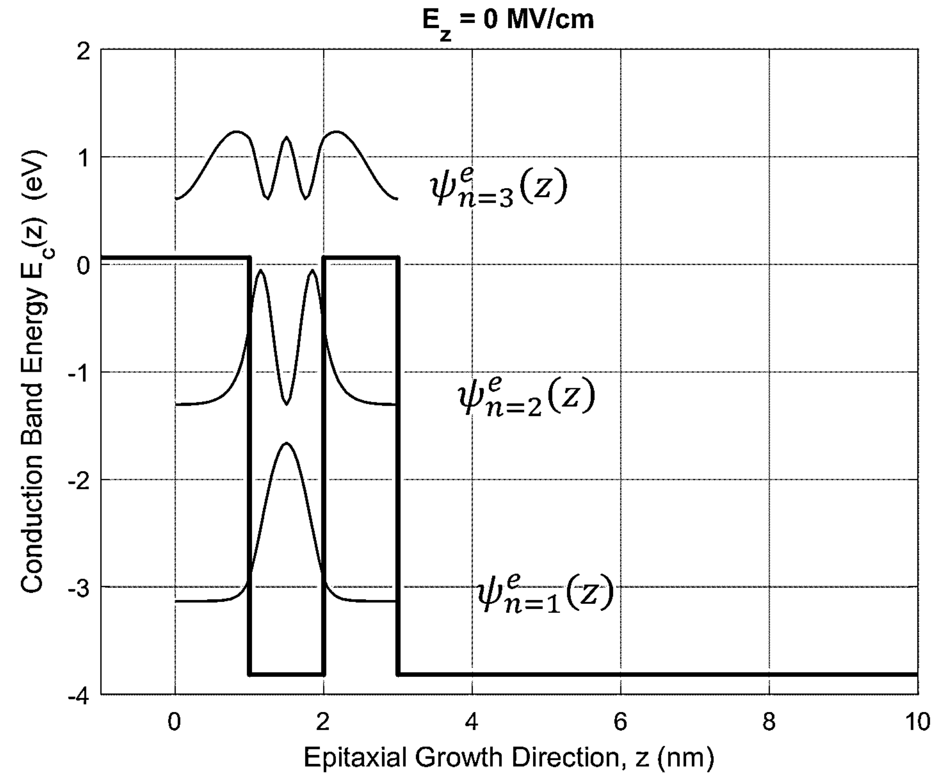
FIGS. 33A and 33B plot the spatial variation of the conduction band edge along a growth direction for a double barrier intermediate region comprising [$ZnGa_2O_4$/$Ga_2O_3$/$ZnGa_2O_4$] formed between a Ni metal and a $Ga_2O_3$ drift region, and the quantized electron energy states are shown for zero and high surface electric field applied to the structure, in accordance with some embodiments.
Figure 33B:
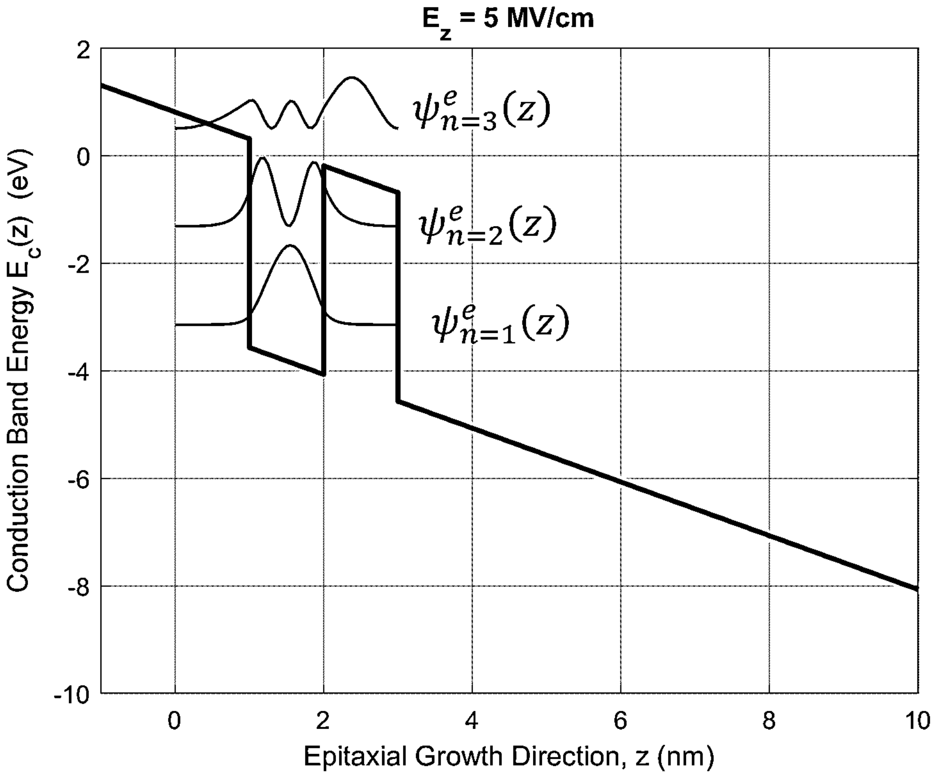

(which is essentially isotropic with respect to crystal momentum), quantum confinement occurs within even shallow potential wells in physically thin QW layers. As an example, a double heterostructure comprising a thin QW: $\alpha$-$(Al_xGa_{1-x})_2O_3$/QW $\alpha$-$Ga_2O_3$/$\alpha$-$(Al_xGa_{1-x})_2O_3$/drift $\alpha$-$Ga_2O_3$ is shown in FIGS. 33A and 33B for the cases of two electric field strengths applied to the structure along z, namely, $$\mathcal{E}_z = 0\,\frac{MV}{cm} \quad \text{(FIG. 33A)}$$

and $$\mathcal{E}_z = 5\,\frac{MV}{cm}. \quad \text{(FIG. 33B)}$$

The QW thickness is selected as 1 nm to achieve only two quantum confined states within the potential well, with barrier composition x=1 to provide the highest barrier potential. Wider QW thickness supports an increasing number of quantum confined states. The lowest energy quantum confined electron spatial wavefunctions profiles $$\psi_n^e(z)$$

are plotted with respect to their quantization energy level within the QW. An above barrier state is also plotted to represent a propagating state. In order to achieve significant barrier penetration of the electron wavefunction, the barrier thickness can be of the order of 1 nm or less. Such resonant tunneling structures require precise epitaxial growth to accurately control the thickness of the layers and enable the resonance.

An advantage of the devices and structures described herein is that the thermal conductivity of SiC is circa two orders of magnitude greater than $Ga_2O_3$, which advantageously enables the heat generated in the oxide drift layer to be rapidly conducted away from the device through the SiC substrate. Self-heating effects in conventional fully $Ga_2O_3$ power devices utilizing thick $\beta$-$Ga_2O_3$ substrates presents one of the most challenging issues for practical use in high power density technology. In contrast to a fully SiC device using a thick SiC substrate, a $Ga_2O_3$ substrate in a conventional device exhibits a low thermal conductivity thereby requiring other forms of heat management, such as, substrate thinning and integration with diamond heat spreaders, and the like. The present disclosure describes devices, structures and methods to simultaneously improve the electrical performance of device utilizing UWBG oxide materials, by integrating them with extremely high thermal conductance and low electrical resistance SiC substrates. That is, the simultaneous solution of the electrical and thermal performance of the device is enabled. This is a major improvement over thermally insulating and electrically conductive $\beta$-$Ga_2O_3$ substrates in terms of the overall performance of the device.

Yet a further advantage of the hybrid integration of semiconducting oxide-SiC materials in forming a Schottky barrier diode in the present disclosure is the improved electrostatic field distribution within the device.

Figure 34:
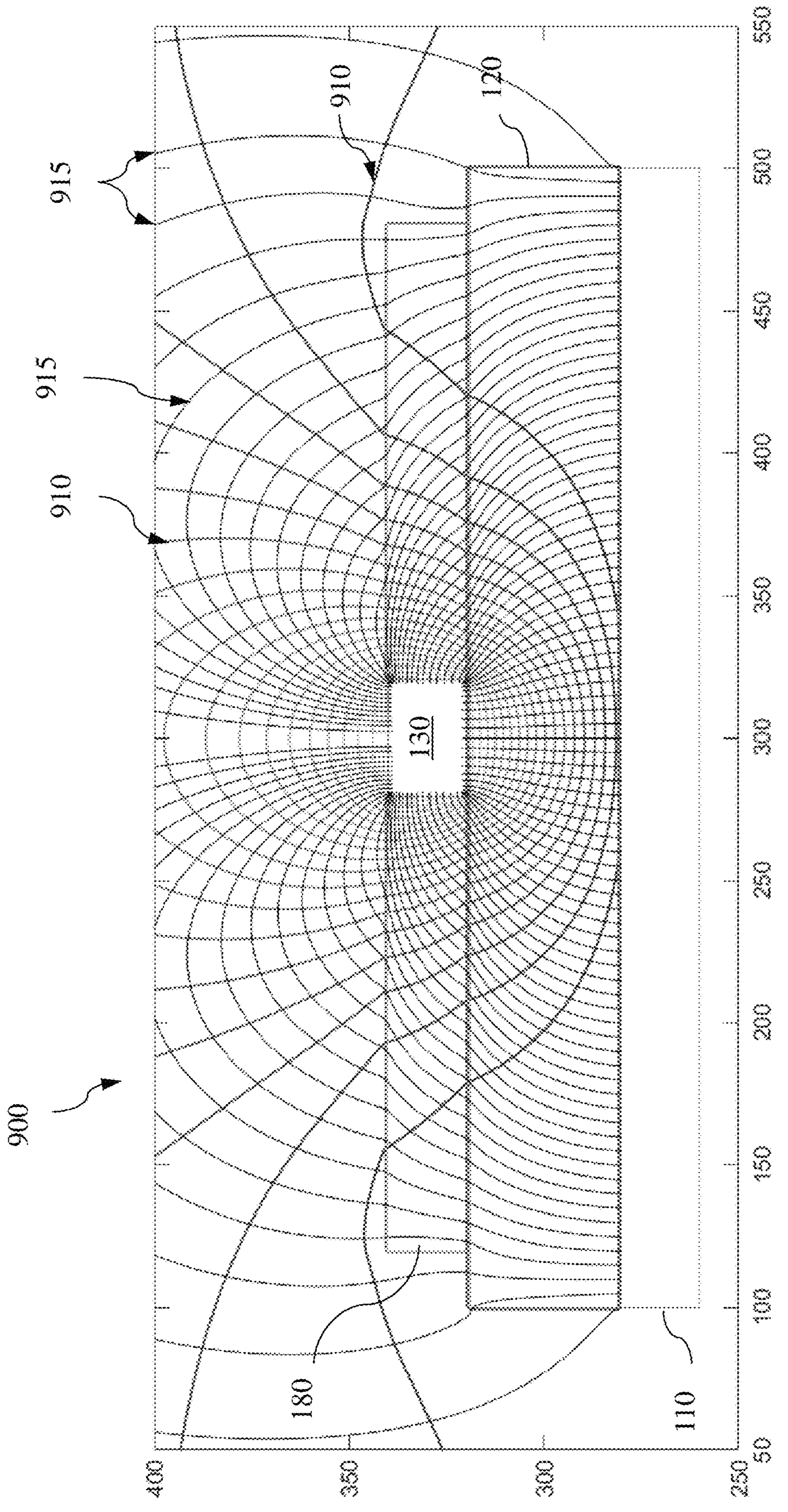
FIG. 34 plots the electrostatic potential and electric field lines calculated for an example [metal/$Ga_2O_3$/SiC] vertical structure with the topmost Ni contact surrounded by an isolation layer dielectric material, in accordance with some embodiments.

FIG. 34 shows a plot 900 of the simulated electric field lines 915 (and associated electric potential lines 910) of a vertical multilayered semiconductor device similar in configuration to device 100 illustrated in FIG. 1 but including an isolation layer 180 surrounding the metal layer 130 that functions to mitigate surface currents and manage the electrostatic vector field. The electric field lines 915 and equipotential lines 910 shown in FIG. 34 are indicative of what would be expected for a potential difference between the conductive substrate 110 and metal layer 130 in the range of about 100 V to about 10,000 V.

In this example, a Ni-metal patterned contact (metal layer 130) is positioned on a $\beta$-$Ga_2O_3$ drift layer 120, which is disposed upon a conductive 4H—SiC substrate 110. The isolation layer 180 is selected from a lower dielectric constant composition, for example $Al_2O_3$. The device is surrounded by vacuum or air. The contact (metal layer 130) is forced to positive potential (+V) and the conductive substrate 110 is forced to a negative potential (−V).

As can be seen from inspection, the field lines 915 are directed from the surface boundaries of the rectangular contact toward the conductive substrate surface 110 forming equipotential lines between metal layer 130 and substrate 110. The plot 900 shows high concentration of electric fields in regions of isolation layer 180 and drift layer 120 near the corners of the metal layer 130. As would be appreciated, in certain circumstances the magnitude of the electric field$|\varepsilon_{x,y,z}|$ may become so concentrated that it exceeds the breakdown electric field of the host material (e.g., as shown in FIG. 2B). In practice, sharp corners at conductor features concentrate electric fields and can be made rounded if possible. Fabrication methods for metal patterning, such as lift-off or damascene methods, typically cannot create perfectly rounded features in vertical cross-section. However, the in-plane (top surface) patterning of contacts can be managed via lithographic expression to form circular pads or rounded corners and the like, which can also help to reduce the electric field densities.

It should be noted that isolation layer 180 has a material with a bandgap substantially larger than the oxide active drift layer. Otherwise, isolation layer 180 will not be effectively insulating. Low electrical conductivity also dictates the choice of suitable materials for isolation layer 180. Compatibility with UWBG active drift region 120 is another factor for isolation layer 180 materials. In some cases, isolation layer 180 simultaneously possesses a low dielectric constant such that the electric field strength can be reduced within the host isolation layer 180. Referring again to the example selection of materials in FIG. 29A showing the trend of dielectric constant with bandgap energy, there is a range of suitable materials that are compatible with a $Ga_2O_3$ active drift layer and can be used for isolation layer 180 materials.

In some examples isolation layer 180 can include one or more of lower dielectric constant and higher bandgap materials than the drift layer semiconductor. If drift layer comprises $Ga_2O_3$, then isolation layer compositions of MgO and $Al_2O_3$ are possible. While $SiO_2$ has even better isolation layer properties, the practical methods for deposition (e.g. PECVD) produce hydrogenated $H{:}SiO_2$ films which have amorphous and substantially different properties to single crystal quartz ($\alpha$-$SiO_2$). Atomic layer deposition of $Al_2O_3$ exhibits one of the most favorable methods for producing high quality amorphous and conformal coatings while still exhibiting larger effective bandgap to $Ga_2O_3$ and low dielectric constant. It is also possible to use ALD deposited amorphous $(Al_xGa_{1-x})_2O_3$ for x>0, or other materials as described herein.

Referring again to the mesa metal contact device, FIG. 34 shows the electric field surrounding the contact 130 is relatively unbounded. An improved high voltage contact arrangement can be implemented to manage the lateral extent of electric field while keeping the contact area of 130 to the drift region fixed.

Figure 35A:
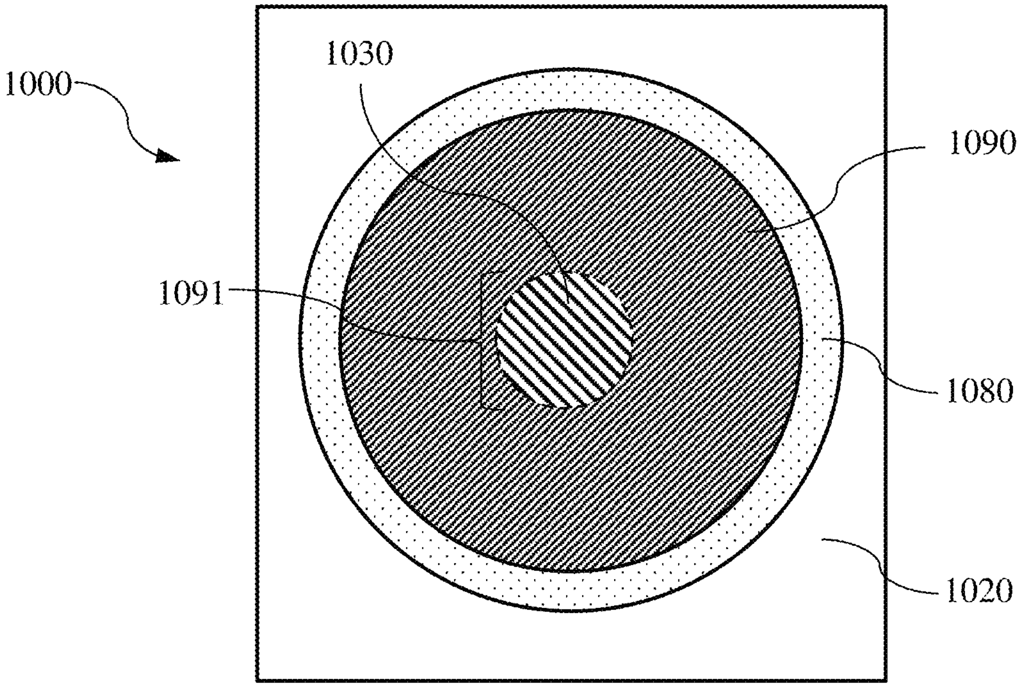
FIG. 35A shows a top view of an example of a diode formed on a $Ga_2O_3$/SiC multilayer structure using a circular Schottky barrier metal and circular field-plate metal contacts, in accordance with some embodiments.
Figure 35B:
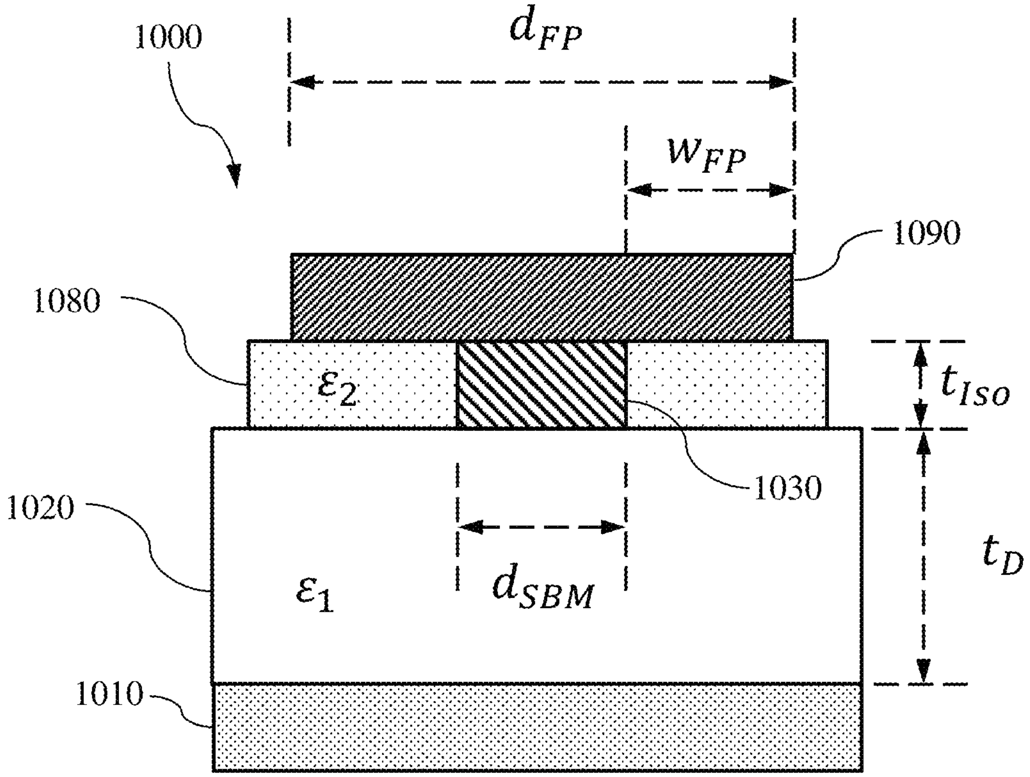
FIG. 35B shows a cross-sectional view of an example diode formed on a $Ga_2O_3$/SiC multilayer structure using a circular Schottky barrier metal and circular field-plate metal contacts, where the top field-plate contact is separated from the surface of the $Ga_2O_3$ drift layer using an isolation layer, in accordance with some embodiments.

FIGS. 35A and 35B show top and figurative sectional views, respectively, of a vertical multilayered semiconductor diode device 1000 according to an illustrative embodiment incorporating a lateral electric field-plate arrangement to modify the vector electric field of the device.

In this example, device 1000 comprises a substrate 1010 (FIG. 35B), epitaxial drift layer 1020 and metal layer 1030 as has been previously described (e.g., in device 100 in FIG. 1). In this example, an isolation layer 1080 is formed on top of epitaxial drift layer 1020 and surrounds metal layer 1030. Formed on a top surface of metal layer 1030 and on a top surface of isolation layer 1080 is a field plate arrangement in the form of a field plate layer 1090 formed of metal and having a central aperture 1091 sized and shaped to expose metal layer 1030. In this example, both the metal layer 1030 and the field plate layer 1090 have a circular configuration, and isolation layer 1080 has a ring or annular configuration surrounding (or wrapping around) metal layer 1030. The field plate layer has an outer diameter $d_{FP}$ and an overhang of $w_{FP}$ over the isolation layer 1080.

In this example, the metal layer 1030, isolation layer 1080 and field plate layer 1090 each have a complementary circular or annular configuration and this assists in minimizing edges where more intense electric fields may otherwise form. In other examples, the Schottky barrier metal of metal layer 1080 may have a n-polygon (e.g., rectangular, rounded corner elongated stripes, hexagonal, etc.) configuration and the other layers may have complementary configurations as required. Shown in FIG. 35B is the diameter of the Schottky barrier metal layer 1030, $d_{SBM}$, the diameter and annulus width of the field plate layer 1090, $d_{FP}$ and $w_{FP}$, in addition to the thickness of the drift layer 1020 and isolation layer 1070, $t_D$ and $t_{Iso}$ respectively.

In an example, drift layer 1020 will have a dielectric constant of $\varepsilon_1$ and band gap energy $E_{g_1}$, and isolation layer 1080 will have a dielectric constant of $\varepsilon_I$ and band gap energy $E_{g_2}$. In an example, the materials of the drift layer 1020 and isolation layer 1080 are chosen such that $\varepsilon_2 \ll \varepsilon_1$ and $E_{g_2} \gg E_{g_1}$.

A design principle that can be used to design the isolation layers and field-plates described herein is now discussed. Consider a plane parallel-metal plate capacitor separated by a thickness t, with a dielectric positioned between the finite lateral extent metal plates of area A. The capacitance $C_p$ is defined as: $C_p=\varepsilon_r\varepsilon_0 A/t$. To minimize the effective parasitic capacitance $C_p$ of the field-plate overhang $W_{FP}$, it is possible to select a low-k (i.e. low Er) material and/or increase the isolation layer thickness $t_{ISO}$. Furthermore, a low-k dielectric material can be compared to $Ga_2O_3$ by using the relation:

$$\frac{C_p(\text{low}-k)}{C_p(\text{Ga}_2\text{O}_3)} = \frac{\varepsilon_r^s(\text{low}-k)}{\varepsilon_r^s(\text{Ga}_2\text{O}_3)} \times \frac{t_{(Ga_2O_3)}}{t_{low-k}}$$

If a $t_{Ga_2O_3}$=100 mm thickness is used, then $(C_p/A)$=89 fF/μm$^2$. To achieve a relative reduction in overhang capacitance density to a target value of $$\frac{C_p(\text{low}-k)}{A} = 10\ \text{fF}/\mu\text{m}^2$$

the device can use $Al_2O_3$ with a thickness of $t_{low-k}$=640 nm.

In an example, the field plate layer 1090 and SB metal contact 1030 may be formed from the same metal, for example, a high work function metal or alloy of Cu, Te, Be, Rh, Co, C, Ni, Au, Ir, Pd, Pt, Se, Os and combinations thereof (refer to FIG. 11A). In another example, the metal layer 1030 may be formed from high work function metals including, but not limited to Cu, Te, Be, Rh, Co, C, Ni, Au, Ir, Pd, Pt, Se, Os and combinations thereof, whereas field-plate layer 1090 metal may be selected from non-high work function metals, such as, Al, Ti, Mo, W and others. High melting point metals can be advantageous, for example for use in high temperature operation (e.g., in excess of 300° C.).

Ohmic contacts to the substrate may also comprise high work function metals to enable co-processing of front and backside of the device structure. For example, Ni can be used as a SB metal for the drift layer surface whereas Ni may act as an Ohmic contact to the highly doped SiC substrate. Furthermore, silicides may be used to form low resistance Ohmic contacts to the substrate. Silicon may be scavenged from the SiC substrate by thermal anneal processing of contact metal to form a silicide. For example, Ni may form $Ni_xSi_{1-x}$ and similarly Ti may form $Ti_xSi_{1-x}$. Furthermore, multiple metal layers may form an Ohmic contact to the substrate, such as SiC/$Ti_xSi_{1-x}$/Ti/Al.

Some examples of field-plate metal layer 1090/isolation layer 1080/Schottky barrier metal 1030/wideband gap oxide drift layer 1020/substrate 1010/Ohmic contact layer structures are:

Al/$Al_2O_3$/Al/Ni/$Ga_2O_3$/4H—SiC/Ni/Al
Cu/$Al_2O_3$/Al/Ni/$Ga_2O_3$/4H—SiC/Ni/Cu
Cu/$Al_2O_3$/Al/Ni/NiO/$Ga_2O_3$/4H—SiC/Ni/Cu
Cu/$Al_2O_3$/Al/Ni/$Ni_xCu_yO$/$Ga_2O_3$/4H—SiC/Ni/Cu
Al/$Al_2O_3$/Al/Ni/Pd/$Ga_2O_3$/4H—SiC/Ni/Cu.

In one embodiment, isolation layer 1080 is formed from a wider band gap material than drift layer 1020. In an example, isolation layer 1080 is formed from $Al_2O_3$. In another example, isolation layer 1080 is formed from $SiO_2$.

In other examples, the isolation layer can be a wide bandgap oxide that has p-type conductivity type. For example, oxides for the isolation layer may include Nickel-Oxide, Nickel-Copper-Oxide, Copper-Oxide, Tellurium-Oxide, or Osmium-Oxide. The isolation layer may also comprise a portion of a metal oxide formed from the SB metal.

In other examples the IL may also be of p-type character which may or may not possess a larger bandgap than the drift layer.

Figure 36:
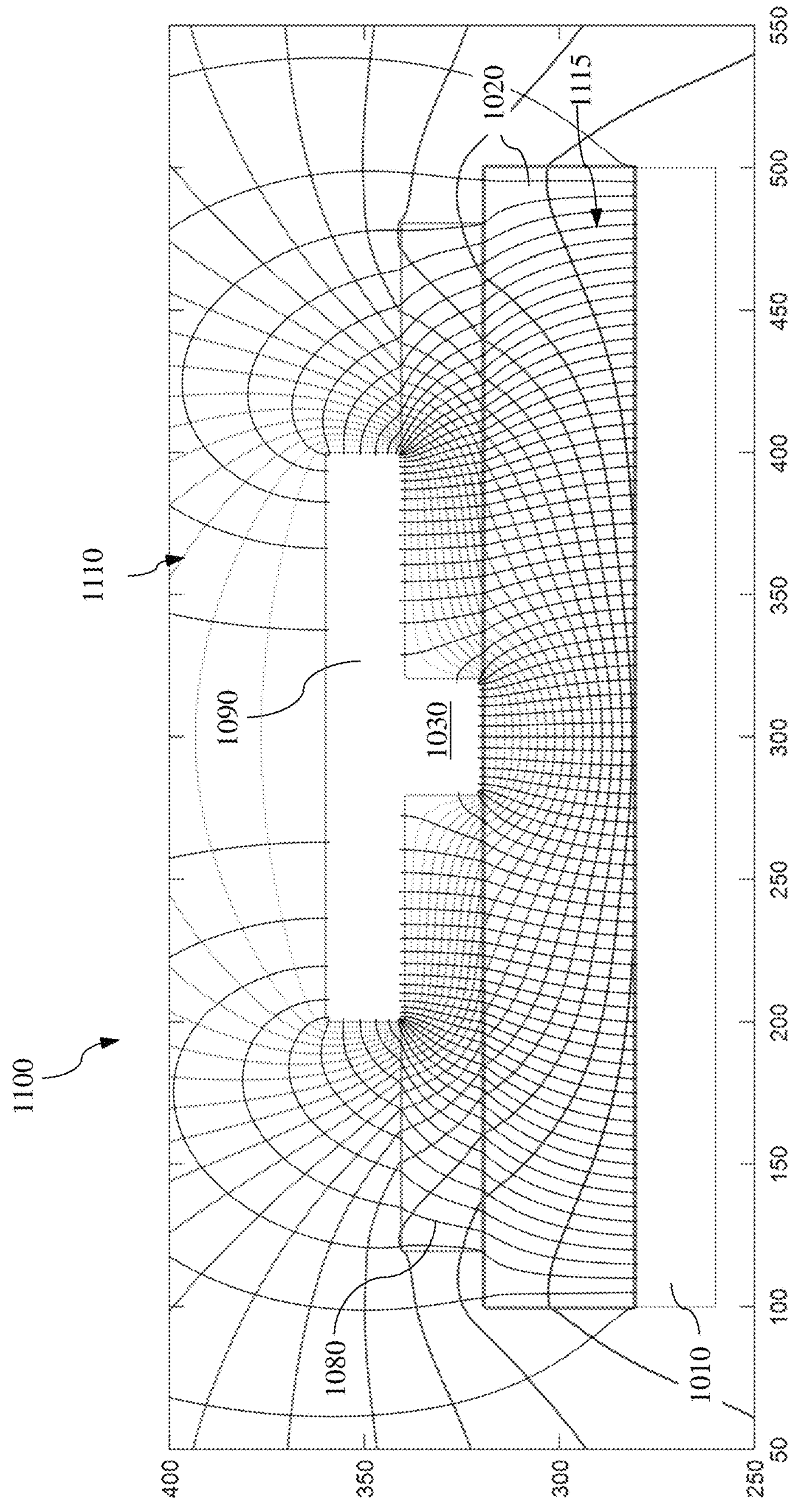
FIG. 36 plots the electrostatic potential and electric field lines calculated for an example [metal/$Ga_2O_3$/SiC] vertical structure with the topmost Ni contact surrounded by an isolation layer dielectric material and a further field-plate positioned upon the isolation layer and in electrical contact with the Schottky barrier contact, in accordance with some embodiments.

FIG. 36 shows a plot 1100 of the simulated electric field distribution 1110 of a vertical multilayered semiconductor device similar in configuration to the device 1000 illustrated in FIGS. 35A and 35B incorporating a field-plate arrangement as has been previously described (e.g., with respect to FIGS. 35A and 35B).

As can be seen from inspection, the field plate layer 1090, including the outer diameter (e.g., $d_{FP}$ in FIG. 35B) and the overhang (e.g., $W_{FP}$ in FIG. 35B) over the isolation layer 1080, functions to reduce the concentration of electric-field lines proximal to the vertical boundary or corners of the metal layer 1030 that is in contact with the drift layer surface. The equipotential lines 1110 between the portion of the contact metal 1030 interface with the drift layer 1020 are significantly flattened in comparison to the case with no field-plate layer 1090. The concentration of electric-field lines 1115 is also significantly reduced near the contact region (metal layer 1030) which is in direct contact with the drift region 1020. The low-k isolation layer 1080 also acts to spread out the equipotential lines laterally, thereby reducing the maximal electric field strength beneath the field plate layer 1090. Furthermore, the conducting channel that is formed between the metal layer 1030 in contact with the drift region and laterally disposed conductive substrate 1010 exhibits a substantially uniform electric field. Not to be limited by theory, the reduction of the electric field density in regions adjacent to metal layer 1030 (especially at a corner region near the interface between drift layer 1020 and metal layer 1030, such as interface region 140 shown in FIG. 1) can improve the device performance, for example by reducing the peak electric field with in the device to well below the critical breakdown field of the host drift material.

For a fixed vertical device configuration, the current-carrying capacity of the diode structure in FIG. 1 can be increased by scaling the contact area 140 to larger areas, or by multiplexing a number of parallel connected diodes. A trade-off in epitaxial area consumed, maximum vertical current capacity and thermal effects is possible by partitioning vertical current across a number of parallel interconnected diodes.

Figure 37A:
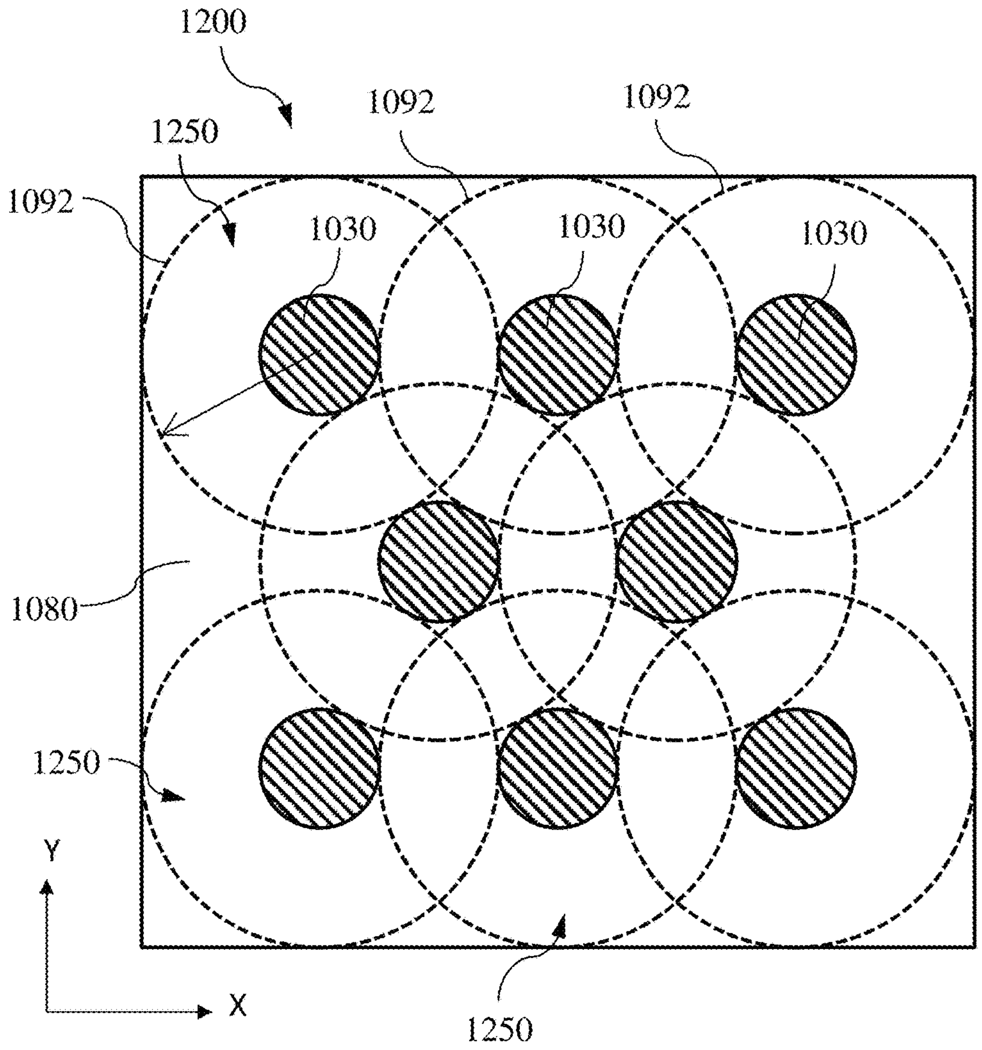
FIG. 37A schematically shows a top view of a plurality of close packed circular Schottky barrier metal contacts separated by a fixed radius, in accordance with some embodiments.
Figure 37B:
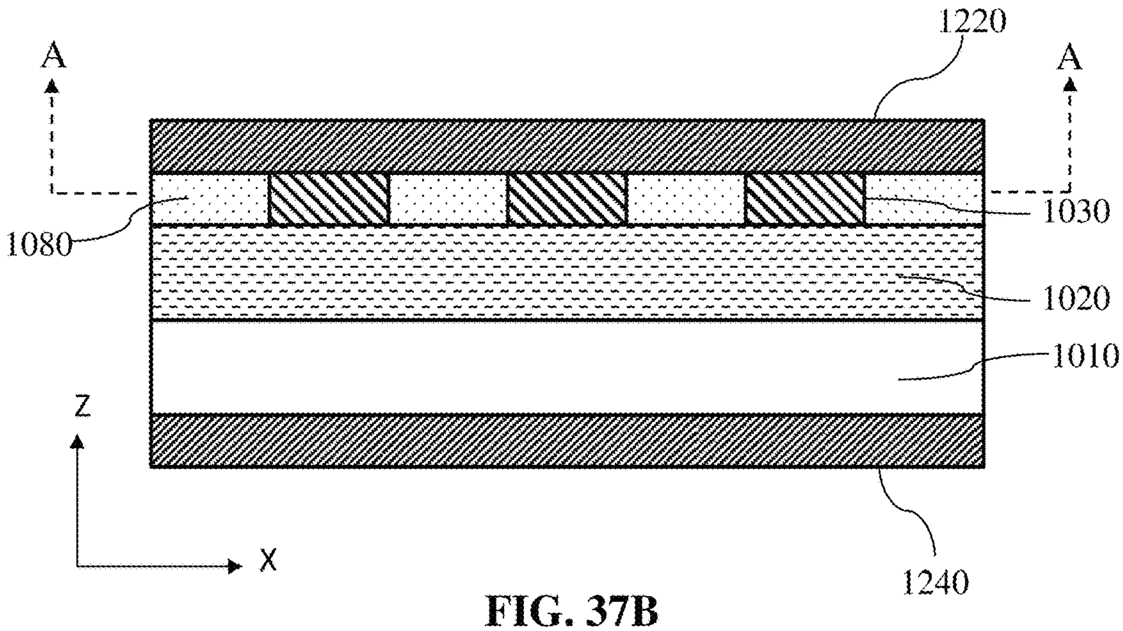
FIG. 37B is the cross-sectional view of the structure in FIG. 37A showing the relation between the Schottky barrier metal, field-plate contact, isolation layer, drift layer, substrate and rear ohmic contact, in accordance with some embodiments.

FIGS. 37A and 37B respectively show horizontal and vertical cross-sectional views of a composite diode device 1200 having a plurality of unit cells 1250 similar to the vertical multilayered semiconductor diode device 1000 illustrated in FIGS. 35A and 35B. The top view cross-section in FIG. 37A is taken through section A-A, representing a plane parallel with the substrate surface that intersects circular metal layers 1030 and the isolation layer 1080. The vertical cross-sectional view in FIG. 37B relates the features of an optional continuous top contact metal 1220 interconnecting the plurality of SB metal contacts 1030, in which the top contact metal 1220 serves as a top field-plate 1090. Drift layer 1020 is disposed upon substrate 1010 as well as an Ohmic contact 1240. Metal layer 1030 comprises several circular metal regions. Isolation layer 1080 extends across composite diode device 1200 and surrounds each of the circular metal regions of metal layer 1030. A drift layer (e.g., drift layer 1020 in FIG. 35B) can be between the metal layers 1030 and a substrate (e.g., substrate 1010 in FIG. 35B), and can extend across composite diode device 1200. A field plate layer 1220 (e.g., 1090 in FIG. 35B) can be formed above metal layer 1030, and can also extend across composite diode device 1200. The unit cells 1250 each have a circumference 1092, which can be related to the outer diameter and overhang dimensions of a field plate needed for each unit cell to reduce the electric field concentrations at each of the circular regions of metal layer 1030. Therefore, in this example, the dimension of the field plate layer 1090/1220 are a limiting factor as to the number of unit cells that may arranged withing a given surface area.

In various examples, each unit cell may have a width that varies between 1 micron and 100 microns, or from 100 microns up to 1 cm. In an example, each unit cell will share a common substrate (1010) and drift layer 1020. In these examples, a highly resistive edge termination region may be formed between each unit cell. In an example, the termination region is formed as a physical trench or channel extending downwardly into the drift layer 120 and forming a boundary between each of the unit cells 1250. In another example, the termination region may be formed by ion implantation where a resistive trench or channel region is formed in the oxide material of the drift layer 1020.

In various embodiments, the metal layer (e.g., metal layer 130 in FIG. 1, or metal layer 1030 in FIGS. 35A and 35B) is deposited using a metal deposition process (such as, sputtering, thermal evaporation, electron beam deposition or by electro-deposition) following the formation of the epitaxial drift layer (e.g., drift layer 120 in FIG. 1, or drift layer 1020 in FIGS. 35A and 35B) and in any further epitaxial layers formed above the drift layer. That is, the metal deposition process is ex-situ to the epitaxial oxide deposition. As would be appreciated, this requires a process change from an epitaxial oxide layer deposition process to a metal deposition process. The topmost surface of the final deposited epitaxial oxide may be protected by limiting the exposure to a contaminating environment prior to metal deposition. This can be achieved by configuring separate deposition chambers with a vacuum wafer transfer mechanism. In other methods, the metal deposition can be performed in the same process chamber as the oxide deposition once disadvantageous species are removed from the chamber. In some cases, the metal can be epitaxially deposited in the epitaxial oxide deposition chamber, as described further herein.

Figure 38A:
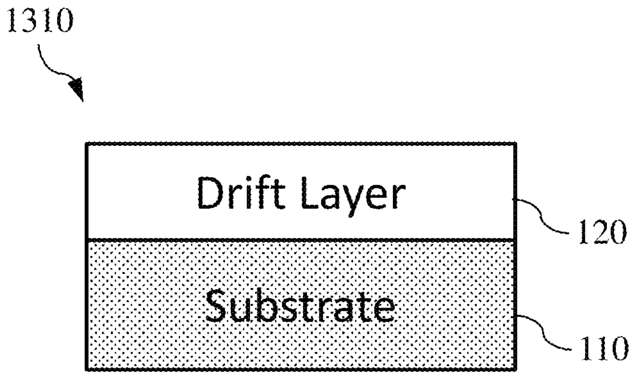
FIGS. 38A, 38B and 38C depict schematically the process flow for the formation of a top Schottky metal mesa region formed on an epitaxial drift layer formed on a substrate, in accordance with some embodiments.
Figure 38B:
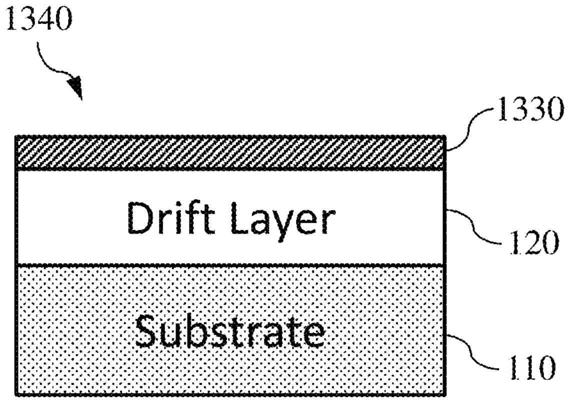
Figure 38C:
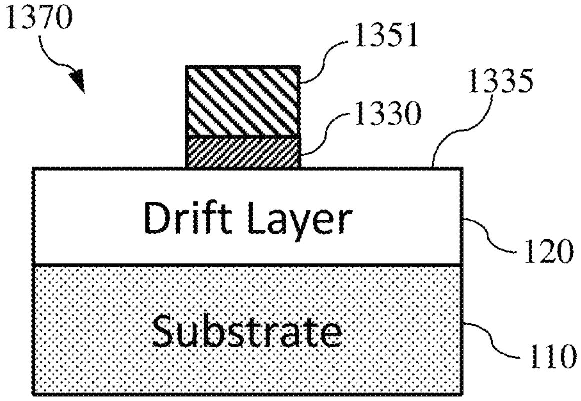

FIGS. 38A-38C depict a process flow for forming a vertical multilayered semiconductor device including an epitaxial drift layer of an oxide material with a metal layer forming a Schottky barrier junction. The metal layer 1330 can be an epitaxial metal layer (e.g., formed using MBE, ALD or MOCVD), or a non-epitaxial metal layer (e.g., formed using sputtering, pulsed laser deposition, or thermal evaporation of a metal). Each process block (or unit operation) of the process results in an intermediate product shown in FIGS. 38A-38C.

At a stage/block of the process, the epitaxial drift layer 120 is formed on substrate 110, as depicted by intermediate product 1310 in FIG. 38A.

At another block of the process, an (epitaxial) metal layer 1330 is formed on drift layer 120, as depicted by intermediate product 1340 in FIG. 38B. The lattice constant and or crystal structure mismatch between the specific metal and the final surface reconstruction of the oxide surface plays an important role in the metal-oxide interface quality. Methods are disclosed later in this disclosure that form advantageous metal-oxide interfaces. In other examples, the (epitaxial) metal layer 1330 may be formed on any intervening or intermediate epitaxially deposited layer formed on drift layer 120. In one example, the thickness of the (epitaxial) metal layer 1330 is between 1 Angstrom and 100 Angstroms. The epitaxial metal or first deposited metal layer may be relatively thin, and another metal layer may be deposited subsequently to increase the total layer thickness. The second metal deposition step may comprise a dissimilar metal to the first metal composition, or the same metal.

At another block of the process, metal layer 1330 may be patterned as depicted by intermediate product 1370 in FIG. 38C. Intermediate product 1370 may be produced via photolithographic patterning of a mask and subsequent selective material removal via physical etch process. The etch process may be at least one of a dry reactive gas plasma process or wet etching process or other. The device may also be further processed as required to form a vertical multilayered semiconductor diode device in accordance with the present disclosure. For example, in some cases a patterned contact layer 1351 is included on top of the epitaxial metal layer. In some cases, a metal layer that is not epitaxial can also be used to form the Schottky barrier junction with the epitaxially deposited drift layer 120. In some cases, a transition layer (e.g., as shown in structure 400 in FIG. 4, and described above) can be deposited between the substrate 110 and the drift layer 120. In some cases, an intermediate layer (e.g., as shown in structure 800 in FIG. 8, and described above) can be deposited between the drift layer 120 and the (epitaxial) metal layer 1330. In some cases, some of the layers are patterned (e.g., using wet etching, plasma etching, and/or photolithography) to form the structures described herein. Optionally an oxide surface exposed by metal patterning 1335 may be treated to reduce surface damage, reduce surface leakage and passivate the surface.

Any of the device structures described herein (e.g., structures 100 in FIG. 1, 300 in FIG. 3, 400 in FIG. 4, 600 in FIG. 6, 800 in FIG. 8, 1000 in FIGS. 35A and 35B, and 1200 in FIG. 37A) can be made using the process above.

FIGS. 39A-39G depict a process flow for forming a vertical multilayered semiconductor diode device according to another illustrative embodiment. including an epitaxial drift layer of an oxide material with a metal layer forming a Schottky barrier junction. The metal layer 1430 in this process can also be an epitaxial metal layer (e.g., formed using MBE or MOCVD), or a non-epitaxial metal layer (e.g., formed using sputtering, pulsed laser deposition, or thermal evaporation of a metal). Each process block (or unit operation) of the process results in an intermediate product shown in FIGS. 39A-39G.

Figure 39A:
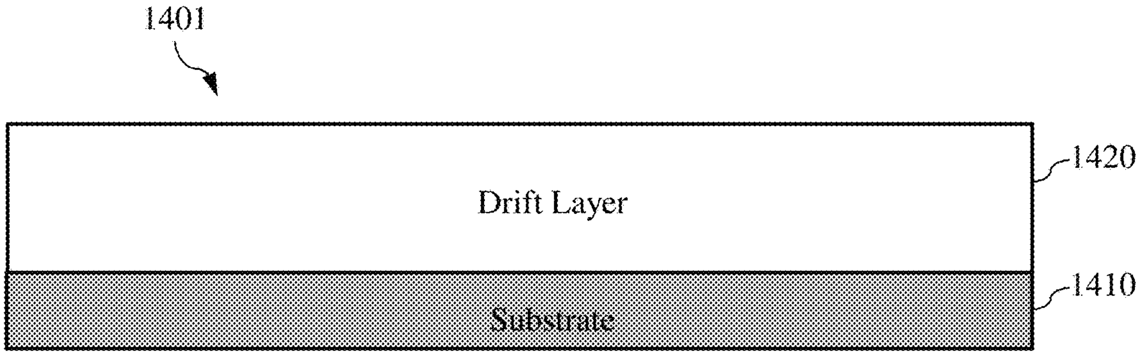
FIGS. 39A-39G schematically depict a fabrication process flow for a vertical conduction multilayered semiconductor diode structure in accordance with an illustrative embodiment.

At a block of the process, an epitaxial drift layer 1420 comprising a semiconductor oxide material is formed on a SiC substrate 1410, as depicted by intermediate product 1401 shown in FIG. 39A.

Figure 39B:
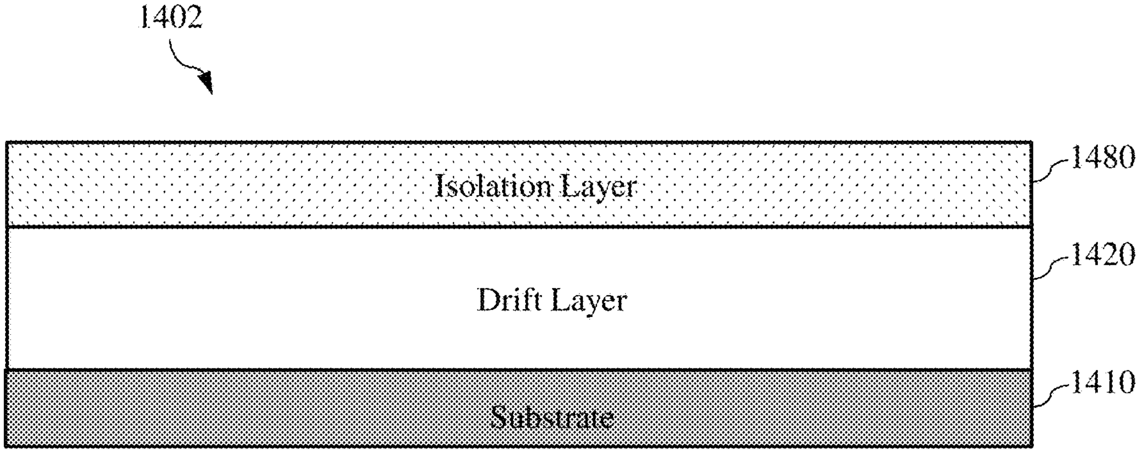

At another block of the process, an isolation layer 1480 is formed on drift layer 1420, as depicted by intermediate product 1402 shown in FIG. 39B. In an example, isolation layer 1480 is formed from a suitable oxide material, such as $Al_2O_3$, $NiGa_2O_4$, $AlCu_2O_4$, $GaCu_2O_4$, MgO, $ZnGa_2O_4$, or $SiO_2$. In an example, isolation layer 1480 is formed on drift layer 1420 by a conformal deposition process such as atomic layer deposition (ALD). In another example, isolation layer 1480 is an epitaxial layer formed using an epitaxial deposition process (e.g., MBE or MOCVD). In an example, the isolation layer 1480 is formed to have a layer thickness from 100 nm to 300 nm.

Figure 39C:
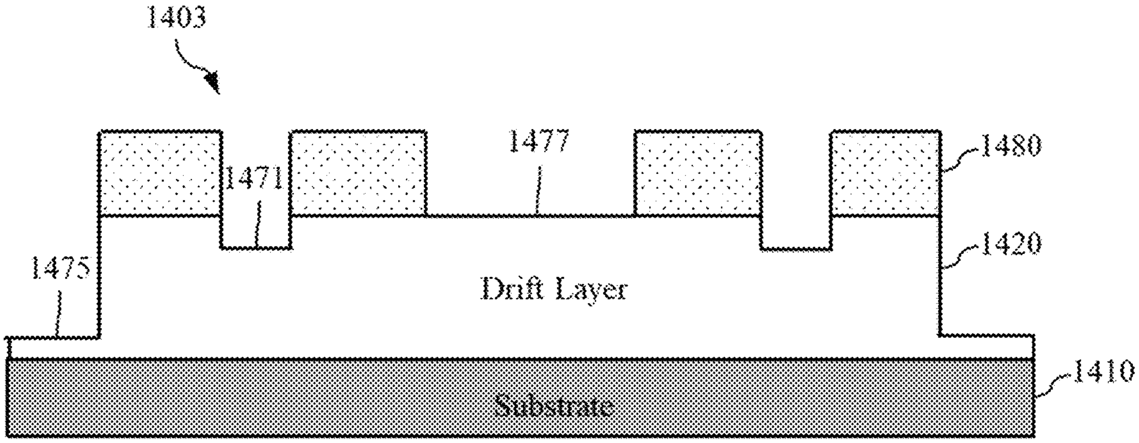

At another block of the process, opposed intra-device field termination regions 1471 and opposed inter-device isolation regions 1475 are formed by physical removal of portions of the isolation layer 1470 and drift layer 1420 respectively, as depicted by intermediate product 1403 shown in FIG. 39C. Alternatively, physical alteration of selective area and depth can be attained via ion-implantation process. Furthermore, a central contact area region 1477 is formed by removing the isolation layer 1480 to expose drift layer 1420. The opposed intra-device field termination regions 1471 and opposed inter-device isolation regions 1475 can be formed by patterning and etching the isolation layer 1480 and the drift layer 1420 (e.g., using wet etching, plasma etching, and/or photolithography). In one example, the portions are removed by applying a photoresist followed by etching.

Figure 39D:
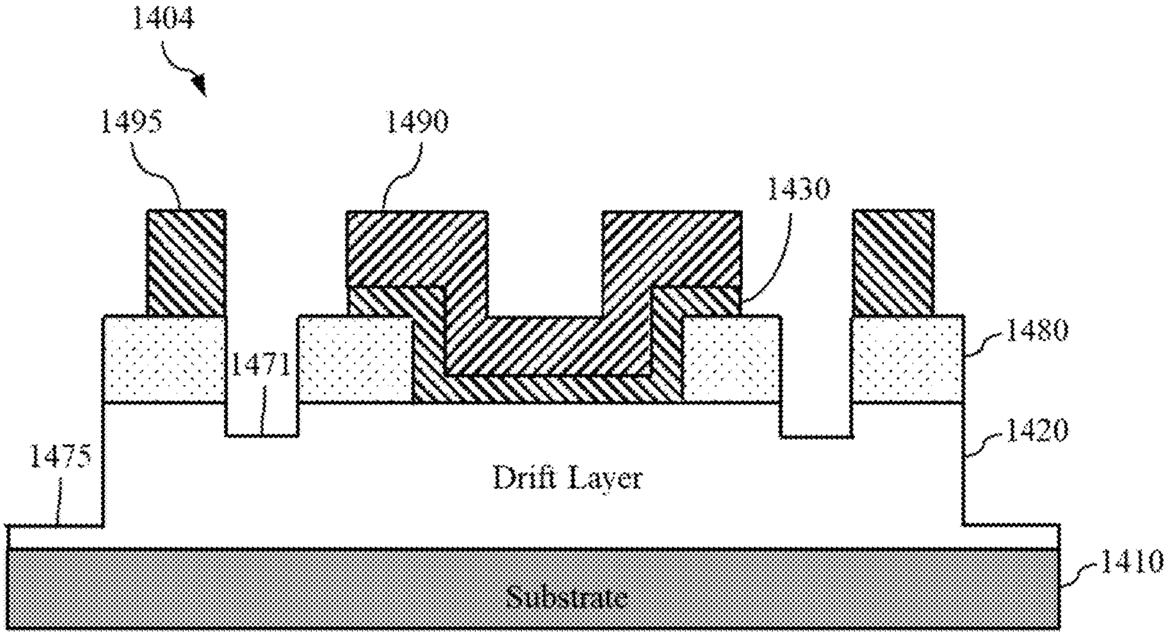

At another block of the process, a top metal layer is deposited which in this example will form the metal layer 1430 and the field plate layer 1490, as depicted by intermediate product 1404 shown in FIG. 39D. In some cases, metal layer 1430 is thinner than field plate layer 1490. For example, metal layer 1430 can be deposited using an epitaxial technique and be thinner than field plate layer 1490, which can be deposited using a method with a faster growth rate (e.g., sputtering, or thermal evaporation). In this example, a guard ring 1495 is formed on the isolation layer 1480 on the outer side of field termination region 1471. The guard ring 1495 can provide a reference voltage and/or mitigate parasitic currents and voltages. In various examples, the top metal layers (e.g., 1430, 1490 and/or 1495) may be formed from Ti/Al, Al, Ni, Mo, Pd, or combinations thereof. In some cases, the device does not include an intermediate layer (e.g., as shown in structure 100 in FIG. 1, or structure 400 in FIG. 4), and the guard ring 1495 can be deposited on the epitaxial oxide layer. Portions of the top metal layers (e.g., 1430, 1490 and/or 1495) corresponding to the field termination regions 1471 and isolation regions 1475 are also removed, for example using a patterning and plasma etch process. In another example, patterning and metal lift-off (MLO) processes are used.

Figure 39E:
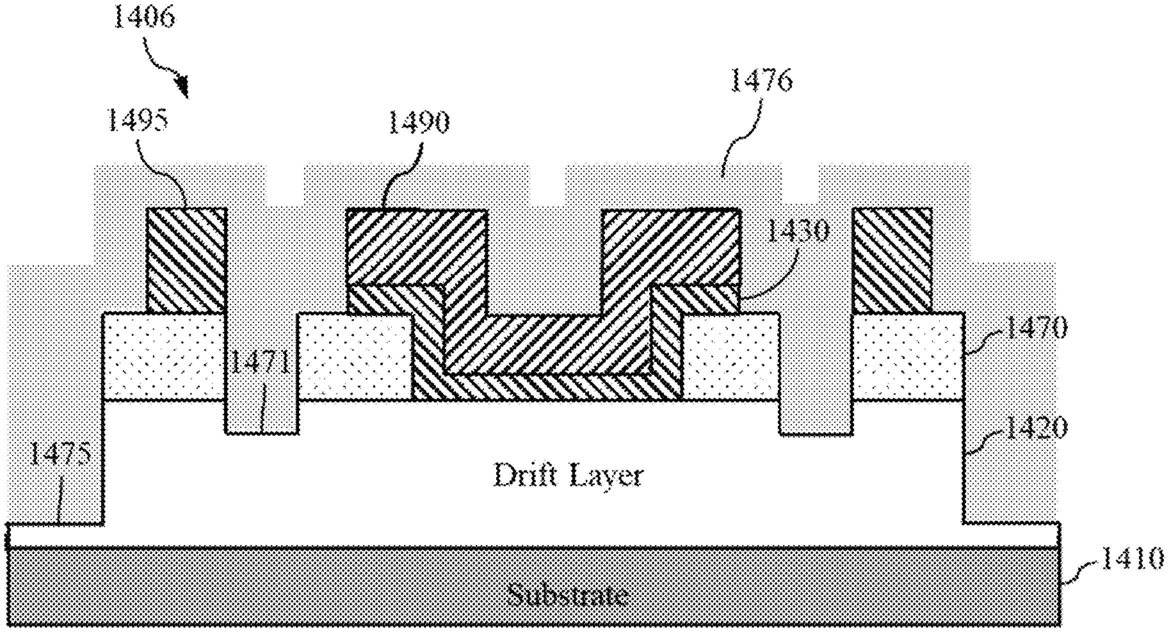

At another block of the process, a top passivation layer 1476 is formed over the entire device, as depicted by intermediate product 1405 shown in FIG. 39E. In an example, the top passivation layer 1476 is formed from a suitable oxide material such as $Al_2O_3$ or $SiO_2$.

Figure 39F:
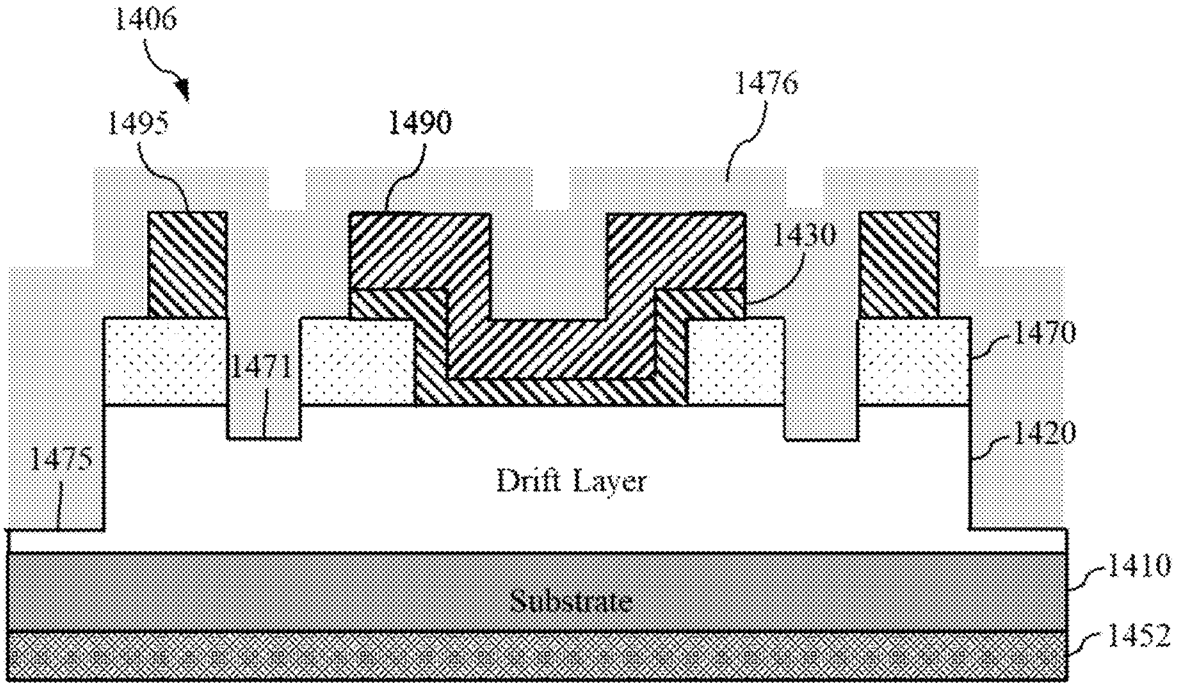

At another block of the process, a bottom contact layer 1452 is formed on the backside of substrate 1410, as depicted by intermediate product 1406 shown in FIG. 39F. Bottom contact layer 1452 can make an ohmic contact with the substrate 1410, and can be deposited using any of the metal deposition techniques described herein.

Figure 39G:
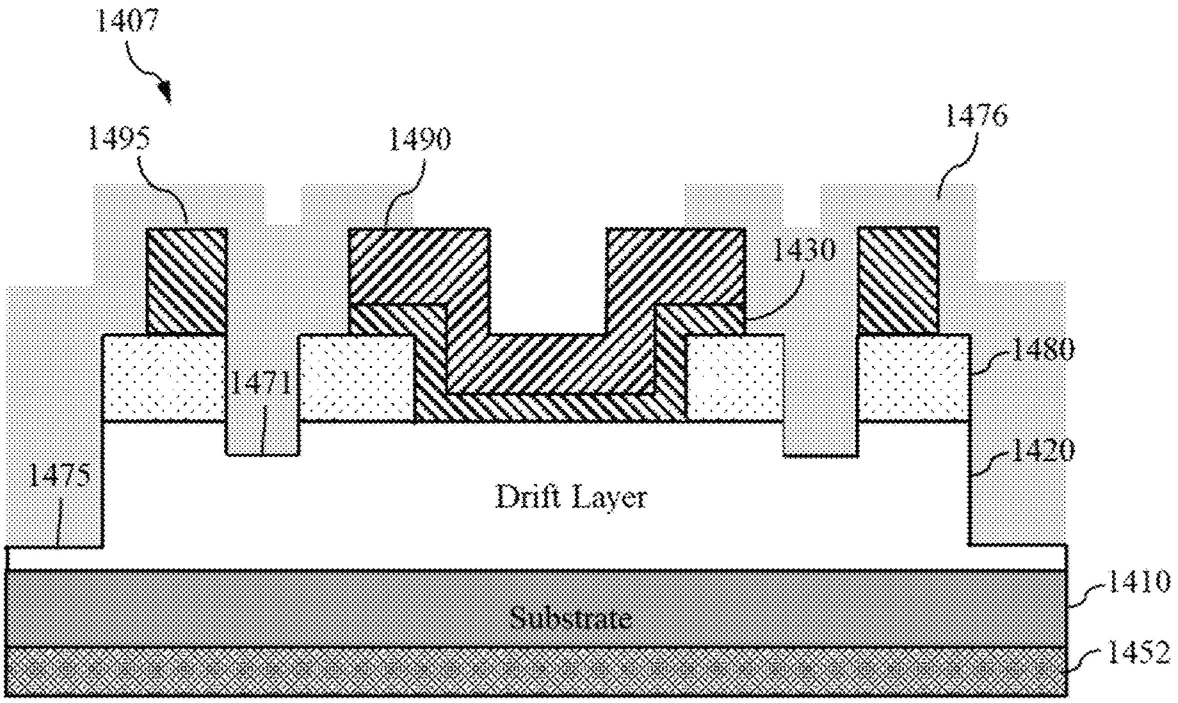

At another block of the process, the metal layer 1430, which in this example also forms the top contact, is exposed by a further etching process that removes a portion of the passivation layer 1476, as depicted by intermediate product 1407 shown in FIG. 39G.

Figure 40:
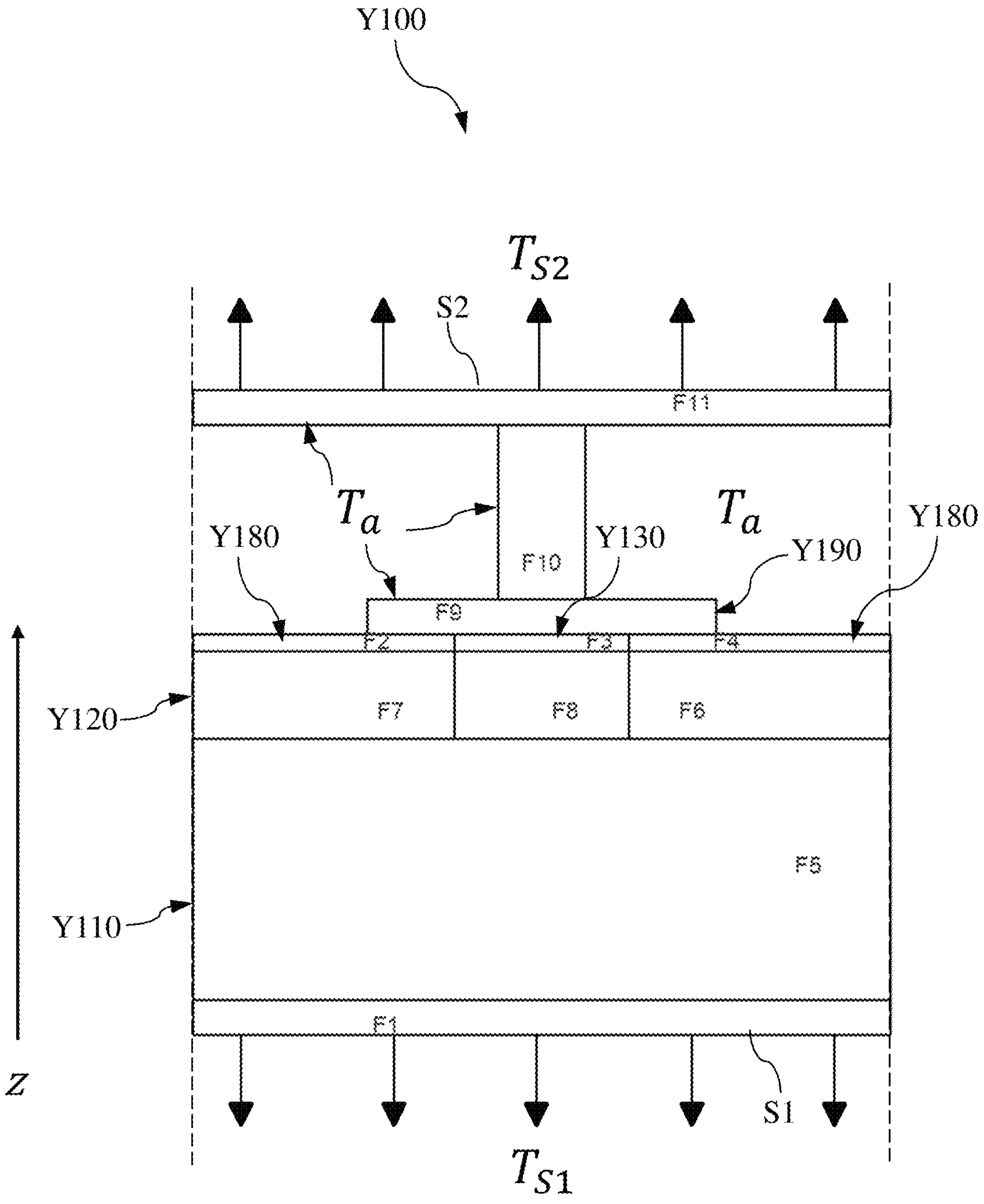
FIG. 40 is a two-dimensional thermal model of the vertical multilayered semiconductor diode used to solve conduction-dominant heat transfer with convection and radiation occurring at boundaries, in accordance with some embodiments.

FIG. 40 is an example of a figurative sectional view of a vertical multilayered semiconductor diode device configuration Y100 adopted to simulate thermal heating effects.

In the thermal models in this example, semiconductor diode device configuration Y100 is assumed to be continuous to the left and right (i.e., semi-infinite) with no lateral boundary conditions.

Moving generally upwards (in the positive z-direction) from the bottom of FIG. 40, semiconductor device configuration Y100 comprises a horizontally extending back side drain metal ohmic contact layer F1 (cathode) whose lower surface (i.e., S1) is held at temperature $T_{S1}$. The next layer comprises substrate Y110 (F5). In various examples as set out below, thermal modelling is performed comparing different substrate materials such as highly doped (n- or p-type) SiC or $Ga_2O_3$. To first order, the doping level and type does not significantly alter the host material thermal conductivity.

Formed above the substrate Y110 is an epitaxial drift layer Y120 (F6+F7+F8) comprising a semiconductor oxide material which in this example is modelled as three regions including a central region F8 and opposed border regions F6 and F7. This division of epitaxial drift layer Y120 into three regions allows the temperature performance characteristics of the central region F8 to be separately characterized (e.g., see FIG. 44 below). The central region F8 is where the most ohmic heating occurs due to a large forward conducting channel. Regions F7 and F6 represent semiconductor regions which are subject to less or no vertical current flow.

Located above the central region F8 of the epitaxial drift layer Y120 is a Schottky barrier metal layer Y130 (in region F3) that forms a Schottky barrier junction between the metal layer Y130 and epitaxial drift layer Y120 central region F8.

Located above epitaxial drift layer border regions F6 and F7 are respective isolation layer Y180 border regions F2 and F4 formed from a wider band gap material compared to the semiconductor oxide material forming the epitaxial drift layer Y120. In general, isolation layer regions F2 and F4 may comprise lower thermal conductivity composition than the drift layer Y120 (F7, F8 and F6). Extending over Schottky barrier metal layer Y130 and partway over isolation layer Y180 regions F2 and F4 is field plate layer Y190 (in region F9) formed from a low, medium or high work function metal. Centrally disposed metal interconnect F10 extends upwardly from the field plate layer Y190 to an overlying, horizontally extending, top contact bus metal layer F11 (anode). In one example, field plate layer Y190, metal interconnect F10 and top contact metal layer F11 may be formed of Al. In another example, the electrical conductivity types can be changed to the opposite conductivity type in which case the top bus metal layer F11 will function as a cathode. As would be appreciated, the thermal conductivity performance will be equivalent.

In this example, the exposed bottom surface of top contact bus metal layer F11, the exposed side surfaces of interconnect F10, the exposed side and top surfaces of field plate layer Y190 as well as the exposed top surfaces of isolation layer Y180 border regions F2 and F4 are all assumed to be at the ambient air temperature Ta (as depicted in FIG. 40). In this manner, these exposed surfaces are modelled to allow convective transfer of heat generated by the device configuration Y100 to the "air." This will be seen as a worst-case scenario as in other examples, the "air" region will be a thermally insulating dielectric material (e.g., a polymer planarization layer) also minimally transferring heat from device configuration Y100 (e.g., interconnect F10 implemented as a wire bond connected to contact bus metal layer F11 in the form of a bond pad). Additionally, the lower surface S1 of metal contact region F1 is assumed to be held at temperature $T_{S1}$ and the upper surface of metal contact bus region F11 is assumed to be held at temperature $T_{S2}$.

Figure 41:
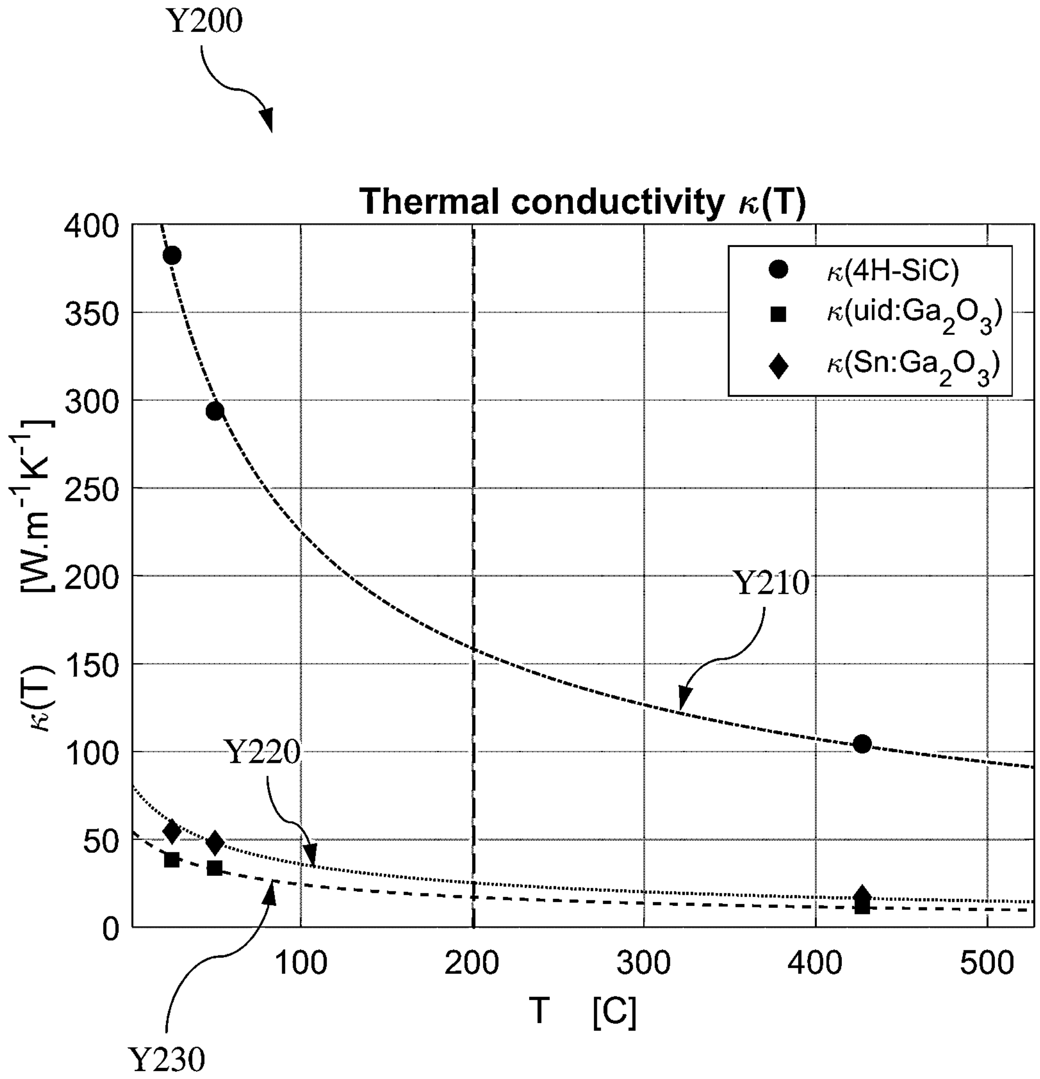
FIG. 41 is a plot of the temperature dependent thermal conductivity for single crystal SiC and $Ga_2O_3$ materials, in accordance with some embodiments.

FIG. 41 shows a plot Y200 of the thermal conductivity of various semiconducting materials as a function of temperature that can be used for the temperature modelling of vertical multilayered semiconductor device configuration Y100 as will be described below. The plot shows the thermal conductivity curves of semiconducting materials including those for potential substrate materials 4H—SiC Y210 and n+ doped (Sn)$Ga_2O_3$Y220, as well as for unintentionally doped $Ga_2O_3$Y230 which may in one example be employed to form the epitaxial drift layer Y120 of device configuration Y100 as shown in FIG. 40.

As can be seen by inspection, the thermal conductivity of all the depicted materials reduces with increasing temperature. At an operating temperature of 200° C. the thermal conductivity of SiC is at least five times greater than that of the depicted $Ga_2O_3$-based materials. This aspect represents one of the major advantages of the hybrid approach disclosed herein.

In an example, the thermal modelling comprises simulating a voltage being initially applied to an approximately 1 μm central region at the top contact layer F11 with the drain contact layer F1 held at ground potential. In this example, the simulated voltage applied corresponds to an initial current of 65 Amps being conducted by model configuration Y100 between the top contact layer F11 and the drain contact layer F1. In addition, the temperature $T_{S1}$ of surface S1 of configuration model Y100 is set to 25° C. and the temperature $T_{S2}$ of surface S2 is set to 75° C. The model is then allowed to evolve to an equilibrium state with a steady state forward current being conducted by semiconductor device configuration Y100.

The model is calculated using finite element method for piecewise construction of the spatial distribution of the material properties in a high-density tensor mesh. Heat transfer throughout the 2D model structure is applied and solved using the parabolic partial differential equation:

$$Q = \rho C_h \frac{\partial T}{\partial t} - \nabla \cdot (\kappa \nabla T)$$

where Q is the heat transfer, T is the temperature, $C_h$ the specific heat, K is the thermal conductivity, and ρ is the material density. Each parameter is a function of time and spatial position of each element (t, x, y).

The simulation workflow includes the steps or blocks of: (i) create a 2D physical model for steady-state or transient simulation; (ii) apply a spatial mesh algorithm to discretize the model; (iii) assign matrix elements $C_h$(t=0,x, y), ρ(t=0,x, y), κ(t=0,x,y); (iv) specify internal heat sources Q within the geometry; (v) specify temperatures on the boundaries or heat fluxes through the boundaries, T(t=0, x, y); (v) specify the ambient temperature and the convective heat transfer coefficients, and radiative heat flux; (vi) specify emissivity ¿, and Stefan-Boltzmann constant σ for each material of the structure. Once the model is fully specified, the simulation heat flow algorithm is initialized with an initial temperature or initial guess.

Figure 42:
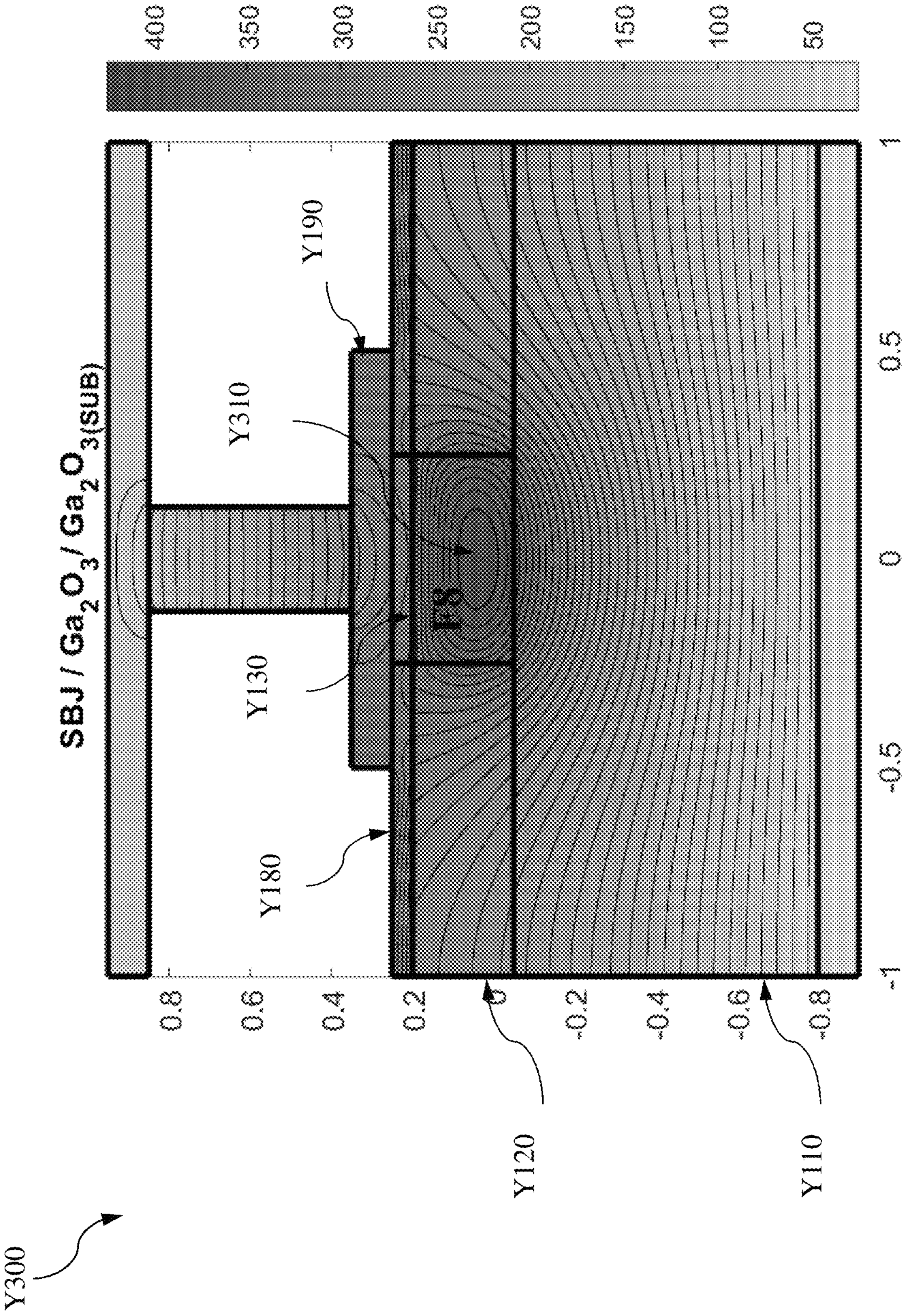
FIG. 42 is a steady-state heat distribution contour plot of the 2D diode model configured with a $Ga_2O_3$ drift layer and electrically conductive and low thermal conductance $Ga_2O_3$ substrate. A steady-state current induces ohmic heating in region F8, and the metal contacts are connected to thermal reservoirs.

Referring now to FIG. 42, there is shown a temperature contour shade plot Y300 showing the resultant steady-state temperature distribution following thermal modelling of the semiconductor device configuration Y100 comprised of in this example a highly doped $Ga_2O_3$ substrate Y110 (e.g., material Y220 of FIG. 41) and a $Ga_2O_3$ epitaxial drift layer Y120 (e.g., material Y230 of FIG. 41). Schottky barrier metal layer Y130 is selected to be a high work function metal, such as Ni, and the $Ga_2O_3$-based epitaxial drift layer Y120 is n' doped. In other examples, the Schottky barrier metal layer Y130 may be selected from other high work function metals such as Pt, Pd, Cu or Os. In an alternative configuration, the $Ga_2O_3$ epitaxial oxide layer is $p^-$ doped and the Schottky barrier metal layer Y130 may be selected from a low work function metal such as Al or Ti. The thermal conductivity of most metals selected do not significantly alter the conclusions herein. An internal heat source within the structure Y300 is generated by resistive heating effect due to vertical current (e.g., constant current) flowing within region F8 of the drift region Y120.

As can be seen from FIG. 42, the maximum temperature region Y310 is within the central region F8 of drift layer Y120 and is approximately 400° C., with a temperature gradient extending laterally and into the contact and field-plate Y190. The top contact and isolation layer are coupled to open surfaces for air convection. Even so, the top contact Y190 is raised to approximately 300° C., which implies refractory metals may be required for stability (or reliability, or durability). In general, metal junction temperatures exceeding 250° C. are problematic for high power and high reliability applications. For this example model, it is concluded the materials comprising the Schottky barrier metal layer Y130, isolation layer Y180, and field-plate layer Y190 would be required to operate at temperatures in the range of 250° C. to 300° C. which would be expected to adversely impact reliability.

The forward biased diode operation is modelled as the central epitaxial drift layer Y130 region F8 as a current "filament" conducting where the heating power will follow the $IR^2$ relationship, where I is the current flowing through the region and R is the effective resistance of the region governed by the doping concentration.

Referring to FIG. 42 again, the steady-state temperature of the interface between the $Ga_2O_3$ drift region and substrate junction is also shown to be ~350° C. with a gradient extending toward the rear contact held at 25° C. The low thermal conductivity of the $Ga_2O_3$ substrate causes this self-heating effect of the drift region.

Figure 43:
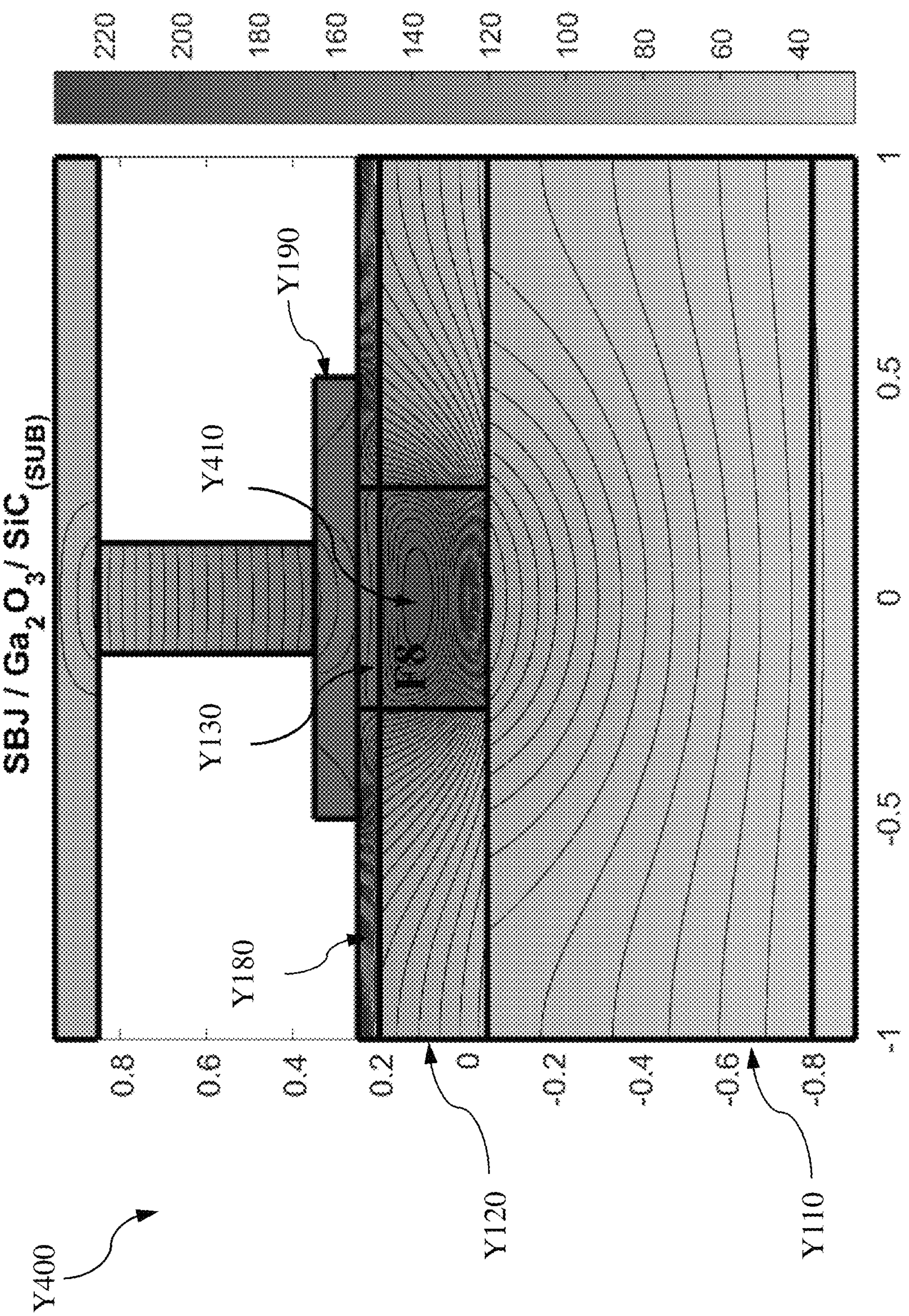
FIG. 43 is a steady-state heat distribution contour plot of the 2D diode model configured with a $Ga_2O_3$ drift layer and electrically conductive and high thermal conductance SiC substrate, where a steady-state current induces ohmic heating in region F8, and the metal contacts are connected to thermal reservoirs, in accordance with some embodiments.

In contrast to the structure of FIG. 42, a high thermal conductivity substrate is now substituted in FIG. 43. There is shown a temperature contour shade plot Y400 showing the resultant temperature distribution following thermal modelling of the semiconductor device configuration Y100 modelled in FIG. 42 except that a SiC substrate (e.g., see material Y210 of FIG. 41) is substituted for the $Ga_2O_3$ substrate of the structure adopted in FIG. 42.

In contrast to the modeling results shown in FIG. 42, the results in FIG. 43 show that the maximum temperature Y410 for central region F8 has a maximum temperature is in the range of 200° C. to approximately 220° C. which is substantially lower than the maximum temperature of the structure with the $Ga_2O_3$ substrate modeled in FIG. 42. Note, the same thermal heat source is applied for both FIG. 42 and FIG. 43. Additionally, the materials comprising the Schottky barrier metal layer Y130, isolation layer Y180, and field-plate layer Y190 operate at temperatures of approximately 175° C., which is more favorable toward conventional thermal dissipation methods. The SiC substrate having a high thermal conductivity provides efficient heat-sinking of the drift region and provides lateral thermal management throughout the structure. The lower temperature enabled by the improved thermal management herein also relaxes constraints on the types of metals that can be used, and advantageously impacts device reliability.

Many material parameters are dependent on temperature. Thermal conductivity, heat capacity and bandgap energy, in general, decrease with increasing temperature. Thermally activated carrier generation also increases the number of free-carriers and reduces the electrical resistance in semiconductors. Conversely, in metals, the electrical resistance typically increases with increasing temperature. The self-heating effect disclosed in FIG. 42 may, therefore, lead to thermal "runaway" and premature breakdown of the device when the thermal dissipation is limited.

Transient thermal response of the model reveals further advantages and disadvantages of the oxide drift region being coupled to high and low thermal conducting substrates.

Figure 44:
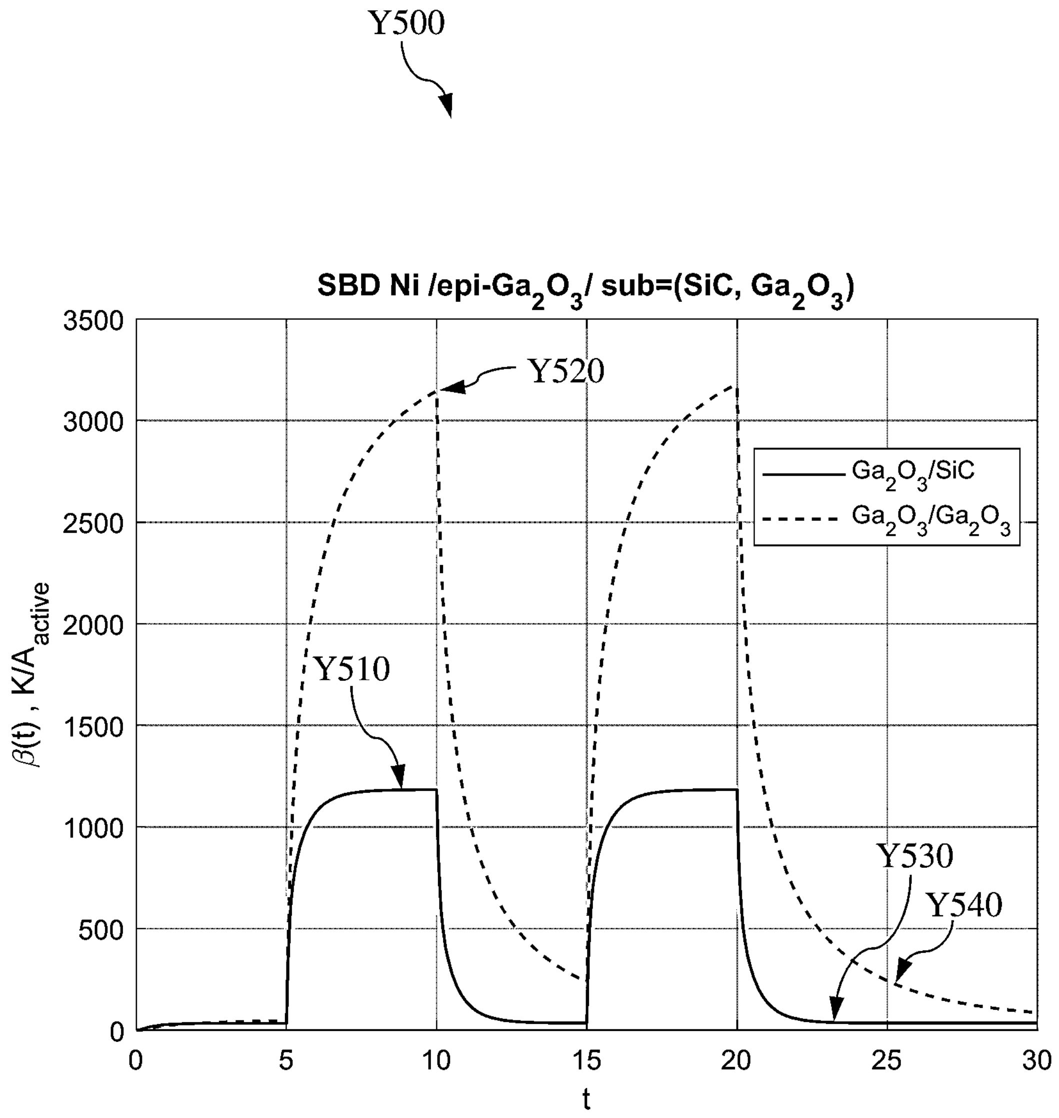
FIG. 44 is a plot of the transient heat transfer and dissipation rate in the multilayered semiconductor diode for forward bias current pulses, where the $Ga_2O_3$ and SiC substrate configurations are compared, in accordance with some embodiments.

Referring to FIG. 44, there is shown a transient response of the device models Y300 and Y400 for two current pulse cycles generated in the current filament regions F8. The plot Y500 of the integrated thermal intensity B (t) for region F8 of the drift layer Y120 as a function of time (in microseconds) is provided for the two device configurations shown in FIG. 42 (i.e., with the $Ga_2O_3$ substrate) and FIG. 43 (i.e., with the SiC substrate) assuming a pulsed current input into region F8 having a 5 us on-period and a 5 us off-period (with a 50% duty cycle). By inspection, the maximum thermal intensity Y510 of the SiC substrate-based device is approximately a factor of three below the maximum thermal intensity Y520 of the $Ga_2O_3$ substrate-based device, even though both devices have the same $Ga_2O_3$ drift layer and top contact structure. Furthermore, the thermal intensity of the SiC substrate-based device is able to recover to zero Y530 before the next 5 μs second pulse commences, which contrasts with the recovery Y540 of the $Ga_2O_3$ substrate-based device.

As would be appreciated, the increased time required for the $Ga_2O_3$ substrate-based diode device to dissipate heat will increase the minimum dwell time required for any switching application as compared to the SiC substrate-based diode device. Alternatively, if such a minimum dwell time (or off-period duration) is not sufficiently long, then the $Ga_2O_3$ substrate-based device could suffer from thermal "runaway."

Figure 45:
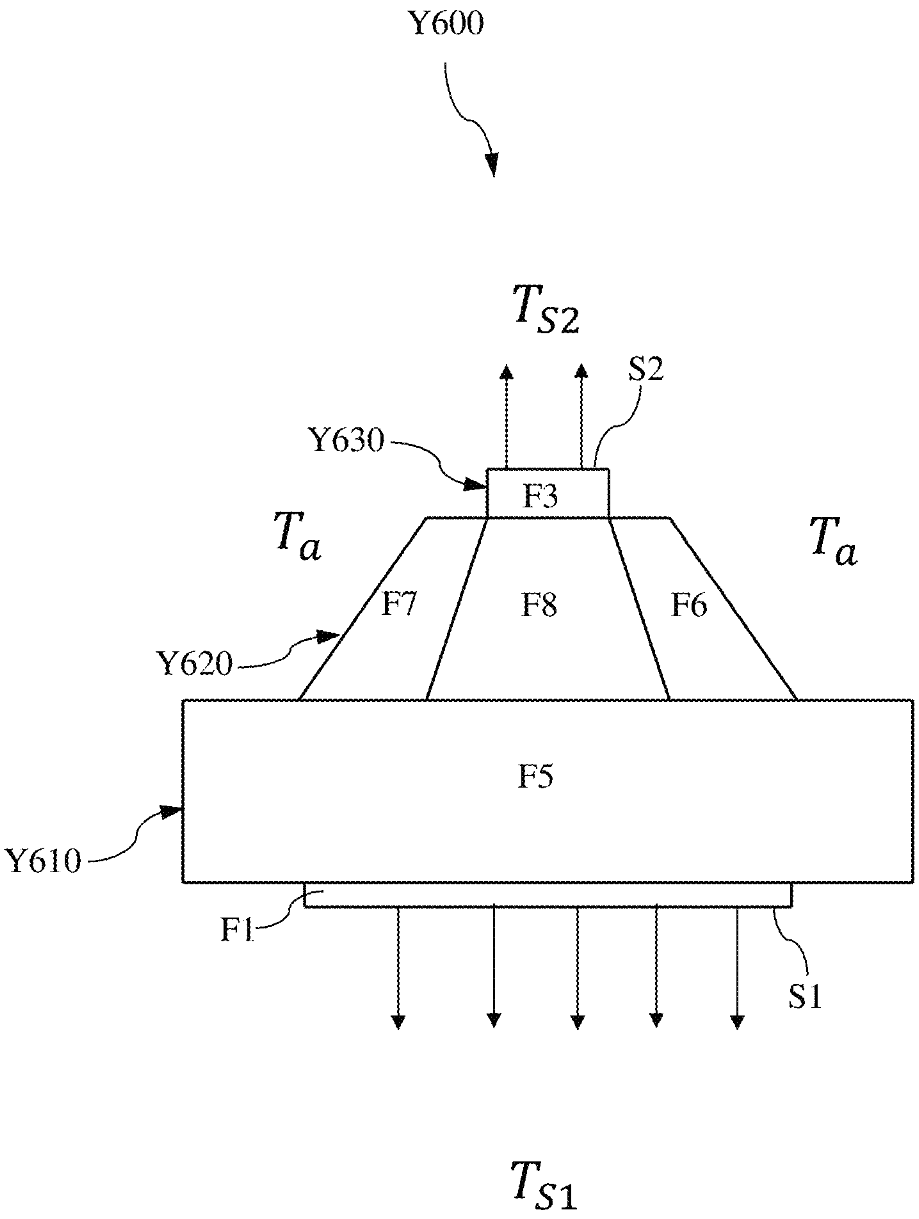
FIG. 45 is a two-dimensional thermal model of the vertical multilayered semiconductor diode configured as a mesa drift region and used to solve conduction-dominant heat transfer with convection and radiation occurring at boundaries, in accordance with some embodiments.

FIG. 45 shows a figurative sectional view of a vertical multilayered semiconductor diode device configuration Y600 adopted to simulate the thermal performance of a mesa structure semiconductor device. In this example, the epitaxial drift layer Y620 (F6+F7+F8) of device model configuration Y600 has been formed into a mesa structure with angled walls that extend upwardly from the substrate Y610 (F5), and the regions outside of the mesa are assumed to be ambient air temperature Ta (as shown in FIG. 45).

Again, moving generally upwards from the bottom of FIG. 45, device model configuration Y600 comprises a horizontally extending back side drain metal ohmic contact layer F1 (cathode) whose lower surface (i.e., S1) is held at temperature $T_{S1}$. The next layer comprises substrate Y610 (F5). Formed above the substrate F5 is the epitaxial drift layer Y620 comprising a semiconductor oxide material and which again is modelled as three regions including a central region F8 and opposed border regions F6 and F7 to allow characterization of central region F8. Located above the central region F8 of the epitaxial drift layer Y620 is a Schottky barrier metal layer Y630 (F3) that forms a Schottky barrier junction between the metal layer Y630 (F3) and epitaxial drift layer Y620 central region F8. In this example, metal layer Y630 also forms the top contact layer, and its upper surface is assumed to be held at temperature $T_{S2}$ (e.g., the upper surface is coupled to a thermal heat sink at temperature $T_{S2}$).

In this example, the thermal modelling comprises simulating a voltage being initially applied to an approximately 1 μm central region at the Schottky barrier metal layer Y630 with the drain contact layer F1 held at ground potential. In this example, the simulated voltage applied corresponds to an initial current of 65 Amps being conducted by model configuration Y600 between the Schottky barrier metal layer Y630 and the drain contact layer F1. In addition, the temperature $T_{S1}$ of surface S1 of configuration model Y600 is set to 25° C. and the temperature $T_{S2}$ of surface S2 is set to 75° C. The model is then allowed to evolve to an equilibrium state with a steady state forward current being conducted by device configuration Y600.

Figure 46:
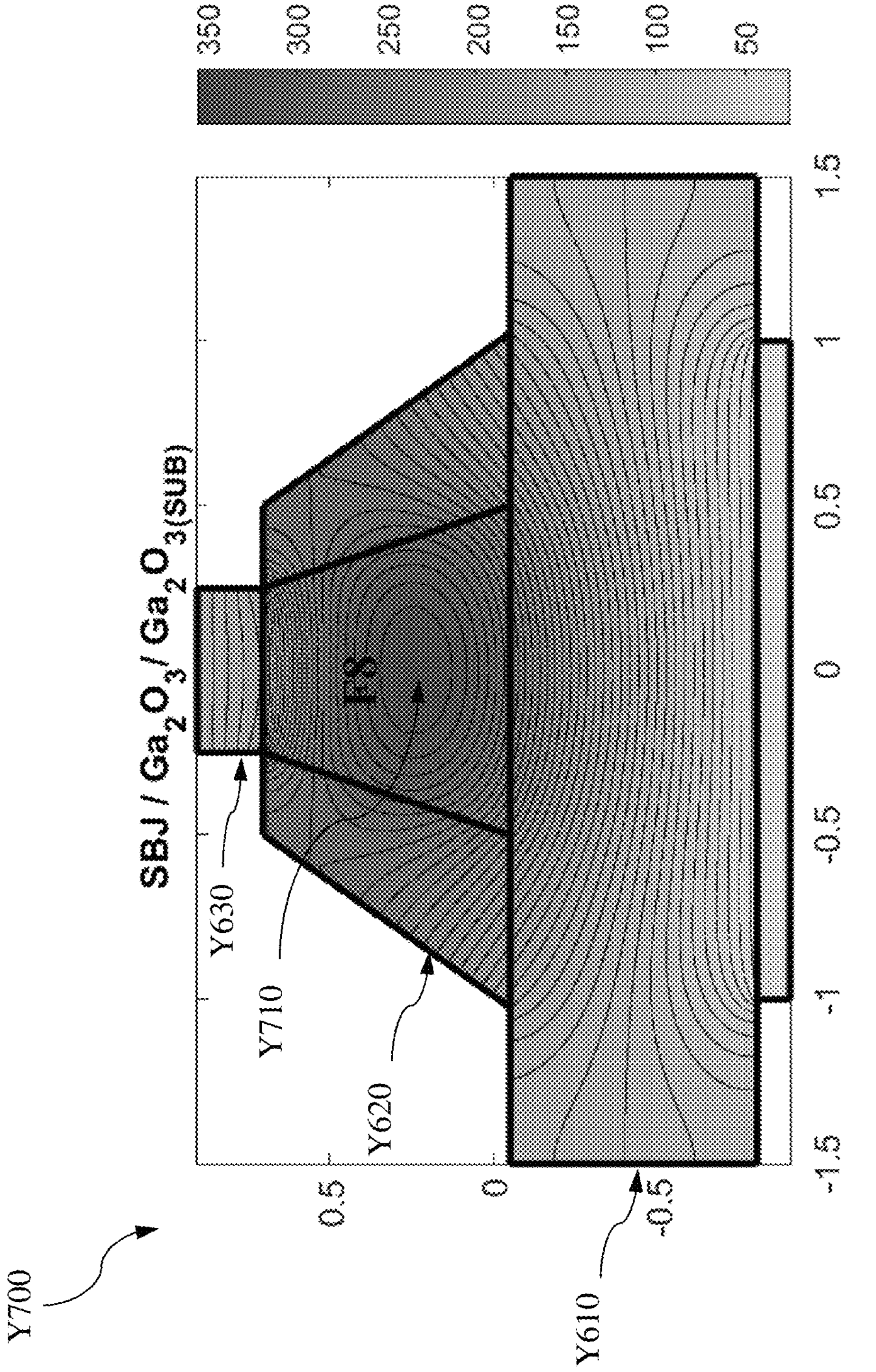
FIG. 46 is a steady-state heat distribution contour plot of the 2D diode model configured with a mesa $Ga_2O_3$ drift layer and electrically conductive and low thermal conductance $Ga_2O_3$ substrate, where a steady-state current induces ohmic heating in region F8, and the metal contacts are connected to thermal reservoirs, in accordance with some embodiments.

Referring now to FIG. 46, there is shown a steady-state temperature contour shade plot Y700 showing the resultant temperature distribution following thermal modelling of configuration Y600 comprised of in this example a highly doped $Ga_2O_3$ substrate (e.g., see material Y220 of FIG. 41) and a $Ga_2O_3$ epitaxial drift layer (e.g., see material Y230 of FIG. 41). Schottky barrier metal layer Y630 is selected to be a high work function metal such as Ni, and $Ga_2O_3$ epitaxial oxide layer is n' doped. In other examples, the Schottky barrier metal layer Y630 may be selected from other high work function metals such as Pt, Pd or Os. In an alternative configuration, the $Ga_2O_3$ epitaxial oxide layer is $p^-$ doped and the Schottky barrier metal layer Y630 may be selected from a low work function metal such as Al.

As can be seen from the modeling results shown in FIG. 46, which are similar to those in FIG. 42, the maximum temperature Y710 for central region F8 is approximately 350° C. which again far exceeds a desired operating temperature of 200° C. to 220° C. for a semiconductor diode device. Additionally, extended regions of the epitaxial drift layer Y620 would be required to operate at temperatures in the range of 250° C. to 300° C. which would be expected to impact reliability.

Figure 47:
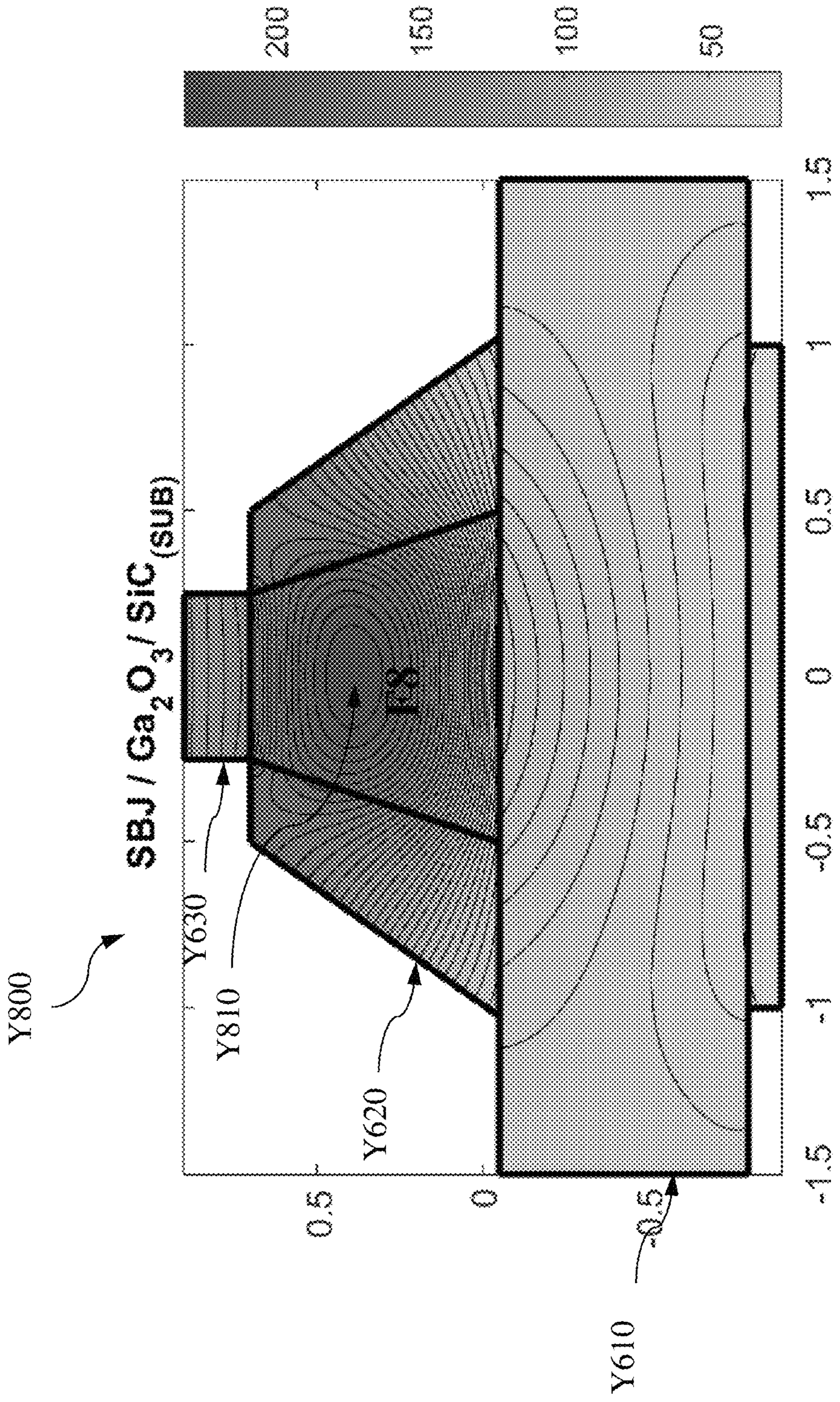
FIG. 47 is a steady-state heat distribution contour plot of the 2D diode model configured with a mesa $Ga_2O_3$ drift layer and electrically conductive and high thermal conductance SiC substrate, where a steady-state current induces ohmic heating in region F8, and the metal contacts are connected to thermal reservoirs, in accordance with some embodiments.

Referring now to FIG. 47, there is shown a steady-state temperature contour shade plot Y800 showing the resultant temperature distribution following thermal modelling of the semiconductor device configuration Y600 modelled in FIG. 46 except now a SiC substrate (e.g., see material Y210 of FIG. 41) is substituted for the $Ga_2O_3$ substrate. By contrast to FIG. 46, the maximum temperature Y810 for central region F8 has a maximum temperature in the range of 200° C. to 220° C. which is substantially lower than the maximum temperature of the $Ga_2O_3$ substrate-based device shown in FIG. 46. Additionally, the epitaxial drift layer Y620 considered in total has an overall operating temperatures of approximately 150° C. which is well within the conventional operating temperatures for these types of diode devices.

The thermal models described herein illustrate advantageous hybrid integration of a oxide drift layer on a high thermal conductivity SiC substrate to dramatically improve steady-state and transient device performance, which can be applied to high power switching.

Further detailed aspects of the hybrid metal oxide semiconductor and SiC substrate device architecture and manufacturing methods are now discussed.

Figure 48:
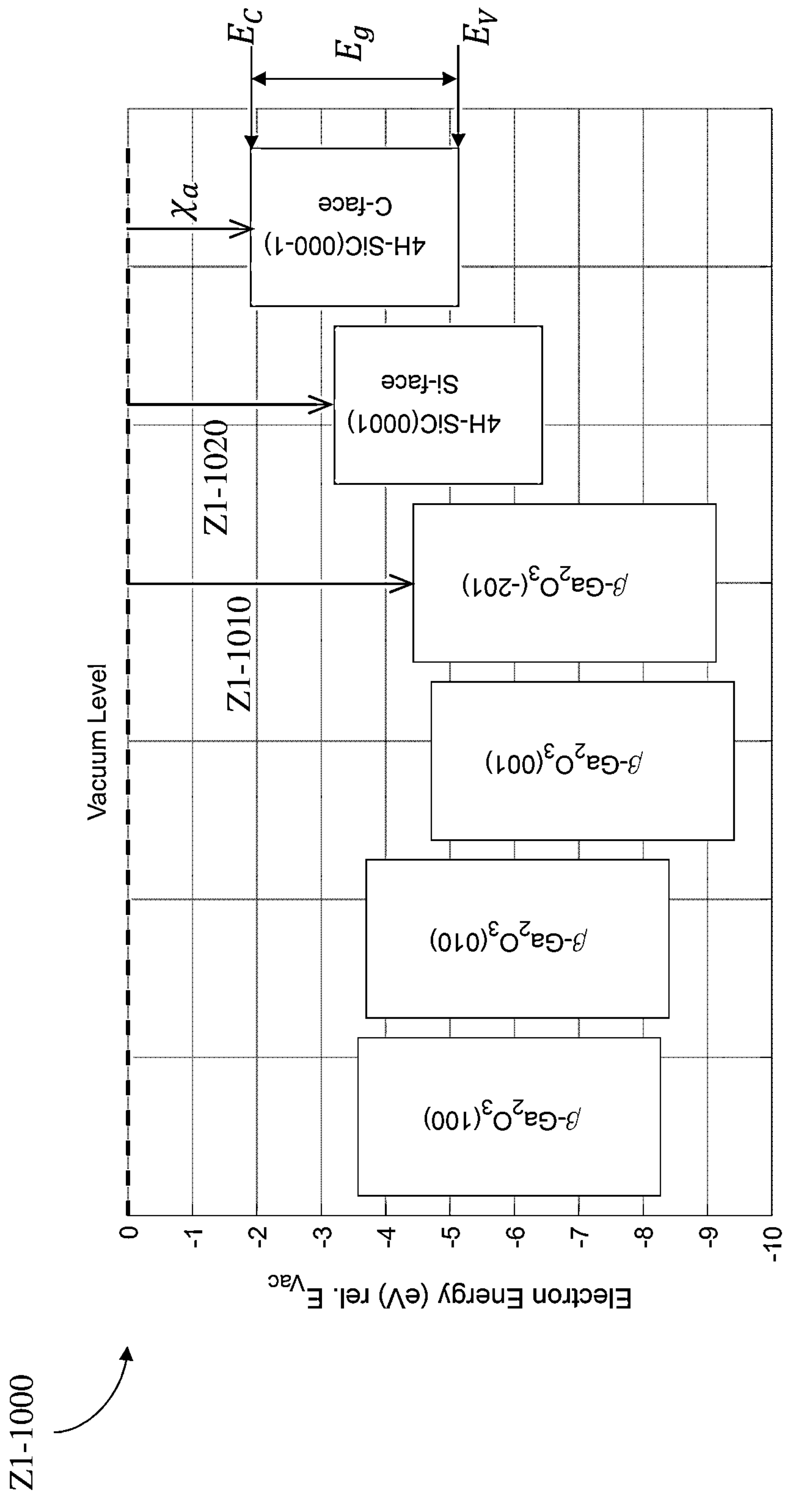
FIG. 48 plots the absolute energy alignment relative to vacuum energy of the conduction and valence bands for the surface orientation dependence of β-$Ga_2O_3$ and the Si-polar and C-polar 4H—SiC C-plane surfaces, in accordance with some embodiments.

FIG. 48 shows a plot Z1-1000 of the crystal surface orientation electron-affinity ($\chi_A$) on an absolute energy scale relative to vacuum for vicinal surfaces labelled by the miller indices (hkl) of β-$Ga_2O_3$ and the (000+1) surface of 4H—SiC(i.e., Si-polar and C-polar surface). The bandgap of each material is represented by a shaded box with the topmost level representing the conduction band edge and the lower boundary of each box representing the valence band edge. The bandgap and ($\chi_A$) in FIG. 48 were calculated using Density Functional Theory (DFT) for specific material crystal slabs.

In particular, the Si-polar 4H—SiC(0001) surface is advantageous for the epitaxial deposition of β-$Ga_2O_3$ (−201) oriented films. Electron affinity of β-$Ga_2O_3$ (−201) is shown as Z1-1010 and 4H—SiC(0001) is Z1-1020, assuming not intentionally doped materials.

Figure 49:
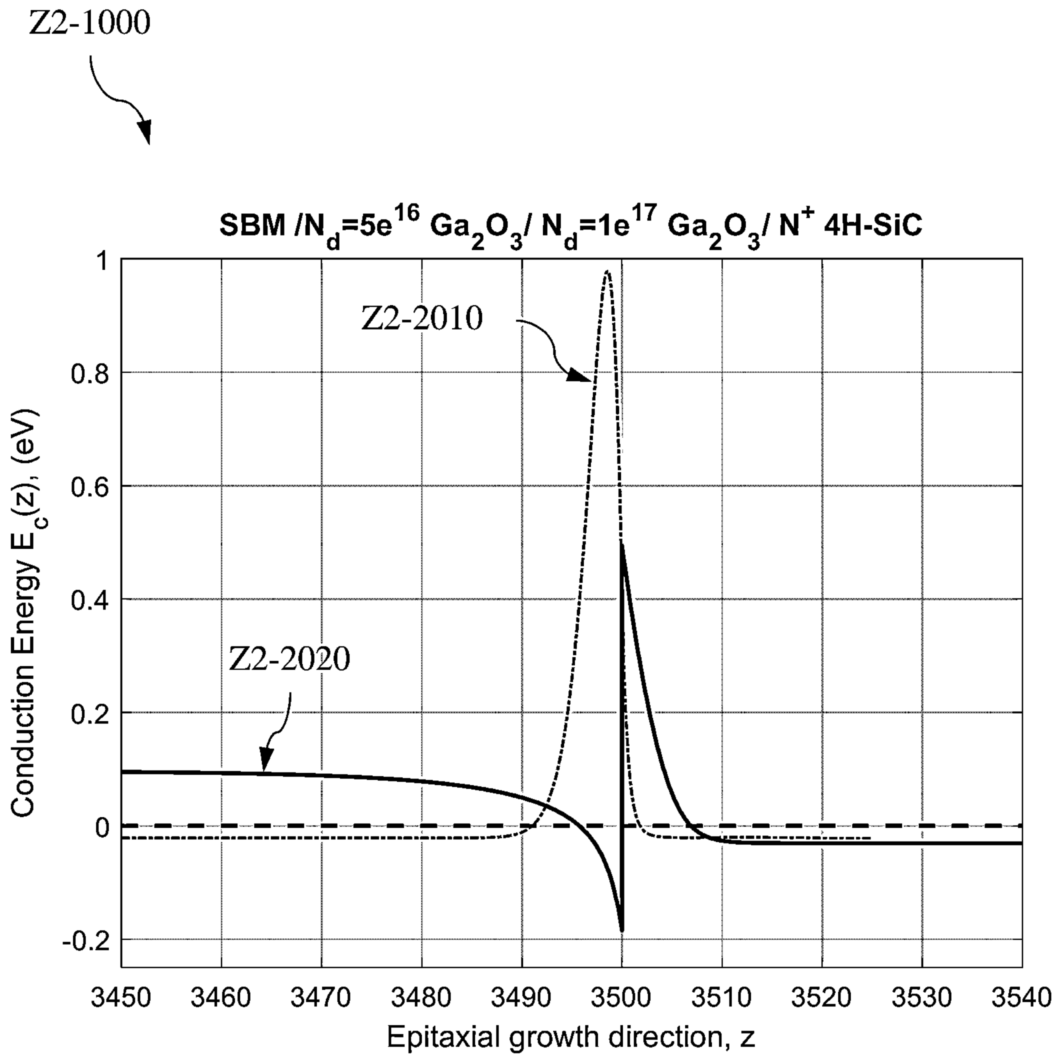
FIG. 49 is a plot of the spatial conduction band energy diagram in the vicinity of the β-$Ga_2O_3$/Si-polar 4H—SiC heterojunction, where the lowest energy quantum confined electron wavefunction is positioned below the Fermi energy level, in accordance with some embodiments.

The interface between an epitaxially grown β-$Ga_2O_3$ (−201) layer and a 4H—SiC(0001) layer results in the energy band lineup as shown in FIG. 49. The conduction band edge Z2-2020 is shown along a growth direction of the device in FIG. 9C at the heterointerface junction. The drift region is n-type (5e16 $cm^{-3}$) and the n-type 4H—SiC region is 1e19 $cm^{-3}$ and results in a conduction band discontinuity as shown, with a triangular potential well induced on the $Ga_2O_3$ side. The device configuration of FIG. 9C further shows the first quantized energy level in the potential well is below the Fermi energy, thereby inducing a two-dimensional electron gas (2 DEG) at the heterojunction. The lowest energy quantized electron wavefunction, which is an example of a 2 DEG localized at the heterojunction is shown as Z2-2010. The presence of the 2 DEG is used advantageously in the present disclosure to form an electrical contact between the two regions and effectively pins the conduction band locally.

The devices, structures and methods described herein can include the crystallographic matching of two dissimilar crystal space groups (SG) comprising $Ga_2O_3$ (SG=C2m) and 4H—SiC(SG=P63mc).

Figure 50:
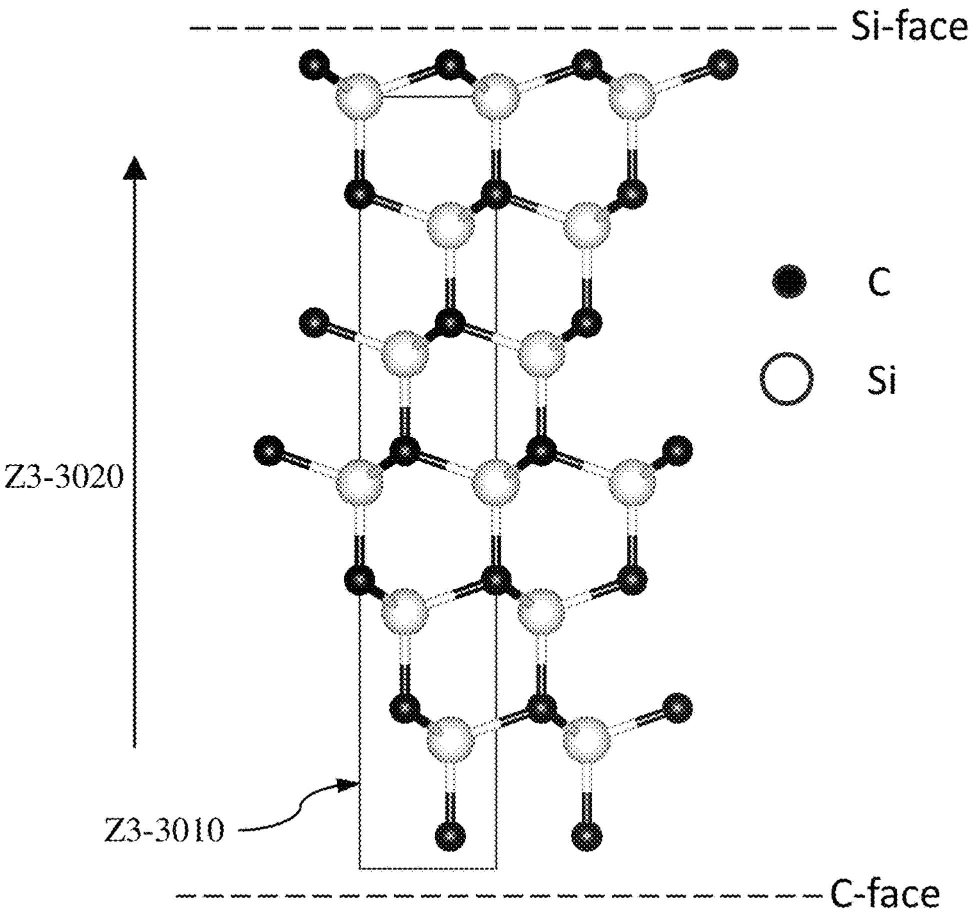
FIG. 50 shows a cross-section of the atomic crystal structure of 4H—SiC polytope along the direction, in accordance with some embodiments.
Figure 51:
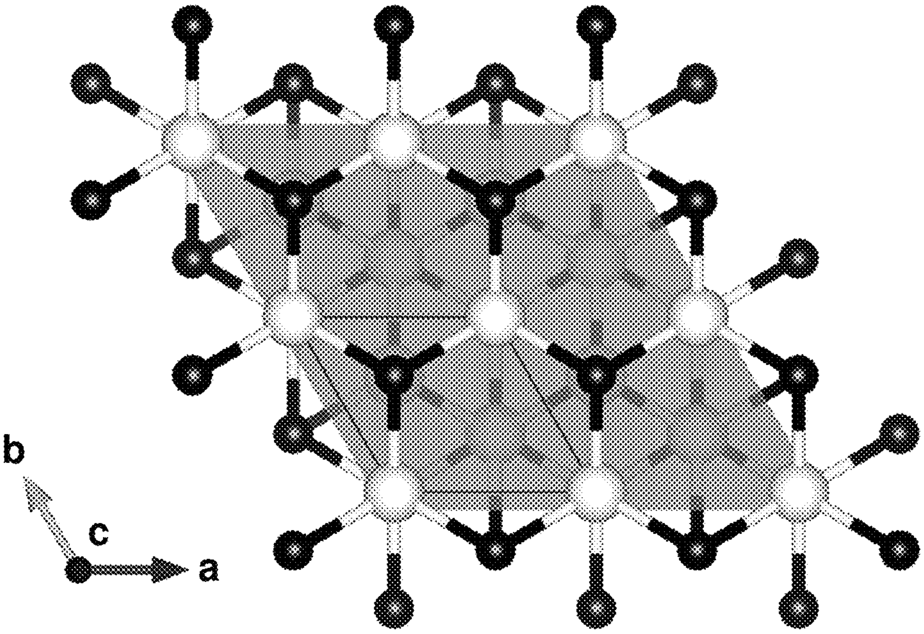
FIG. 51 shows the atomic crystal structure arrangement of 4H—SiC polytope viewed on the C-plane hexagonal surface, in accordance with some embodiments.

FIGS. 50 and 51 show detailed atomic arrangements of the Si and C atoms comprising a single crystal 4H—SiC polytope, oriented along the C-direction Z3-3020 and in the C-plane, respectively. FIG. 50 shows the single crystal unit cell Z3-3010 comprising the wurtzite-like hexagonal atomic arrangement. The polar orientation refers to the directed Si—C bond along the or [000-1] axis, as is evident with the Si-face and C-face which are shown. The C-plane (i.e. (0001) or (000-1)) oriented surface is shown in FIG. 51 which has in-plane Si—Si and C—C lattice spacing a(Si—Si)=3.095 Å. The stacking sequence along the Si-polar direction is: (A-B-C-B-A-B-C-B- . . . ), having an equal number of cubic and hexagonal bonds.

Epitaxial bonding of a single crystal $Ga_2O_3$ composition is possible to the dissimilar SiC surface, however, $Ga_2O_3$ may form in a variety of polytopes exhibiting distinct symmetry groups selected from monoclinic (C2m), rhombohedral (R3c or R3m), orthorhombic (Pna21), cubic (Fm3m), and even hexagonal (P63mc). Ideally a single homogeneous polytope is desired for the epilayer to achieve the highest electronic performance for the present application. Mixed polytope epilayer compositions are possible but may produce lower quality materials and devices. The stability of a given polytope epitaxially formed on the SiC surface is governed by several factors: (i) in-plane lattice mismatch between dissimilar crystal symmetry space groups of the epilayer and substrate for a given crystal oriented plane and epilayer; (ii) the surface energy of the SiC surface; (iii) the first bonding atomic species of the SiC surface to a first complementary atomic specie of $Ga_2O_3$ (i.e. Ga or O); (v) the relative ratio of incident fluxes Ga and active-O atoms chemisorbed and physisorbed at a given surface deposition temperature, as well as other factors.

Figure 52:
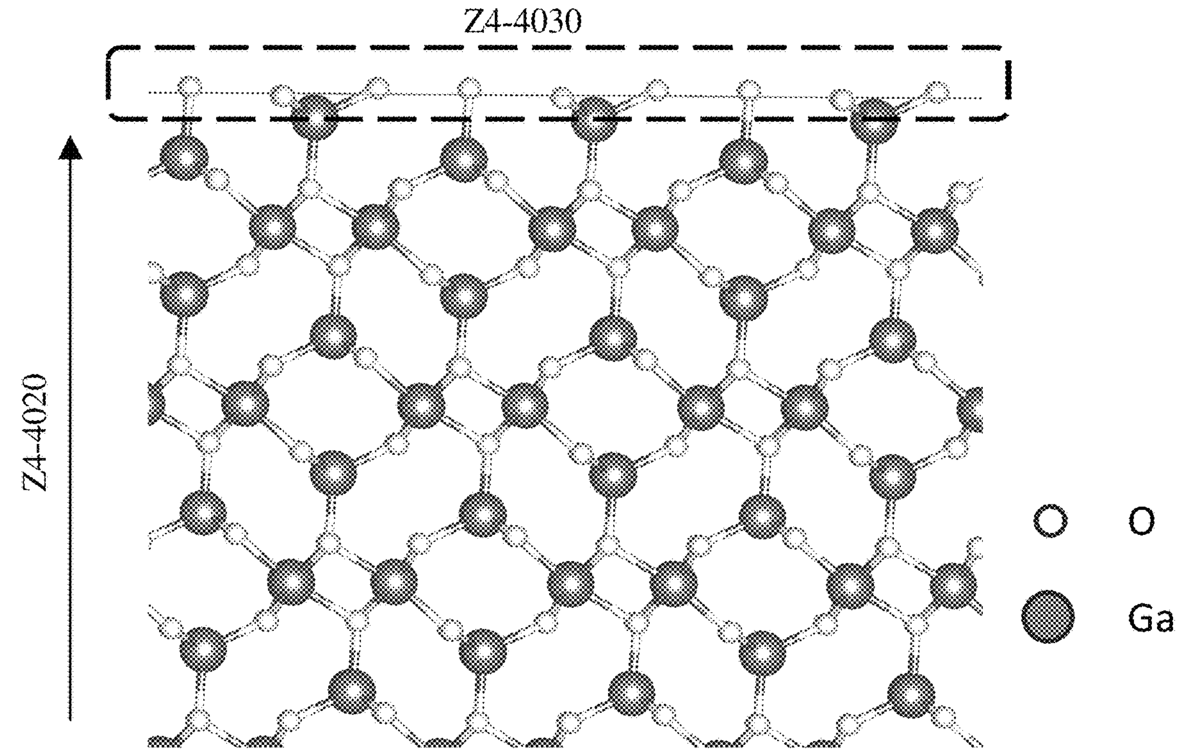
FIG. 52 is a cross-sectional view of the monoclinic β-$Ga_2O_3$ crystal structure along the [−201] direction, in accordance with some embodiments.
Figure 53:
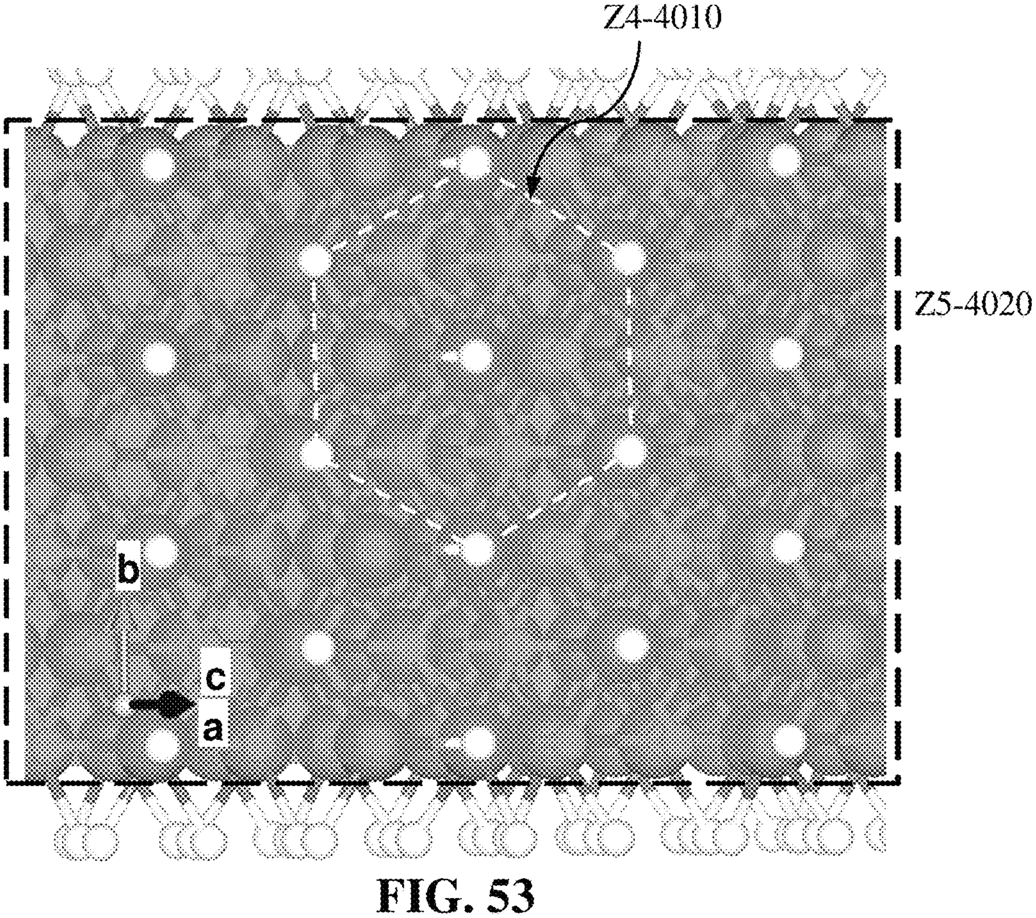
FIG. 53 shows the oxygen sub-lattice arrangement on the (−201) β-$Ga_2O_3$ surface, in accordance with some embodiments.

The devices, structures and methods described herein can include the beta-phase monoclinic form of $Ga_2O_3$ which can be stabilized to a wide growth window by selectively depositing on a prepared C-plane surface of 4H—SiC. Furthermore, the β-$Ga_2O_3$ film epitaxially forms in a layer-by-layer growth mode oriented in the [−201] crystal direction Z4-4020, as shown in FIG. 52. Monoclinic $Ga_2O_3$ has 50% of the Ga—O bonds tetrahedrally coordinated and the other 50% of the Ga—O bonds are octahedrally coordinated. The coordination of an O-terminated SiC surface is discussed later with implications to the stacking sequence of $Ga_2O_3$ epitaxy. Of interest is the stacking sequence of the Ga and O atoms along the epitaxial growth direction Z4-4020. Atomic planes comprising: a buckled Ga—Ga layer, followed by a substantially planar two-dimensional O-lattice, a substantially planar two-dimensional Ga-lattice, followed again by a substantially planar two-dimensional O-lattice—the sequence repeating along the growth direction. During co-deposition of Ga and O species the self-assembly of the crystalline structure occurs. An optional final surface on the (−201) plane is shown as an oxygen terminated surface Z4-4030. This can be achieved post epitaxial deposition by exposing the surface to active-O species (or exclusively active-O species). The surface reconstruction of an O-terminated plane is shown in FIG. 53, showing the hexagonal arrangement of O-atoms Z4-4010.

Figure 54:
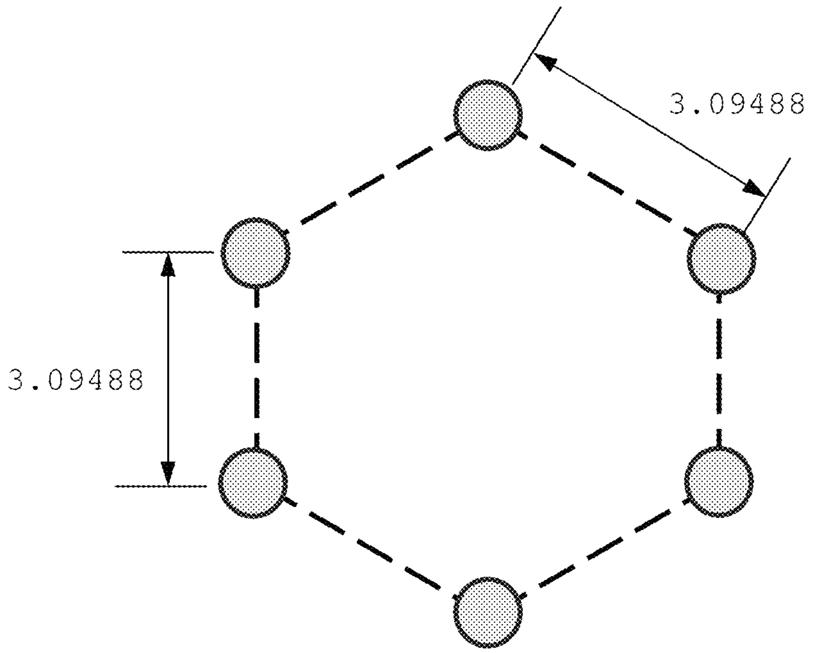
FIG. 54 shows the Si or C hexagonal sublattice for the 4H—SiC(0001) surface, in accordance with some embodiments.

FIG. 54 shows a further simplified lattice model for assessing the lattice mismatch of a first Si-terminated or C-terminated surface for an on-axis C-plane-oriented 4H—SiC in FIG. 54 having planar hexagonal inter-atomic distances a(Si—Si)=α(C—C)=3.095 Å.

Figure 55:
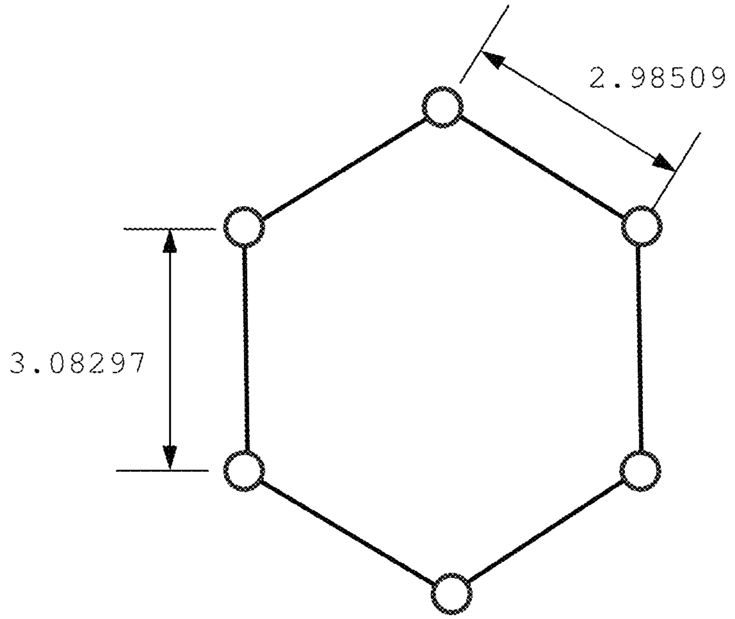
FIG. 55 shows the oxygen hexagonal sublattice for the (−201) β-$Ga_2O_3$ surface, in accordance with some embodiments.

FIG. 55 shows the oxygen hexagonal lattice for an oxygen terminated (−201) oriented β-$Ga_2O_3$ surface. The O-lattice is a deformed hexagon with 2.985≤α(0-0)≤3.083 Å. This enables an estimation of the in-plane lattice constant mismatch (LM) to range from:

$$-0.38 \le \Delta a = \frac{(a_{O-O} - a_{Si-Si})}{a_{Si-Si}} \le -3.6\%$$

In practice, LM<5% is desirable for lower defect density epilayers, indicating that the O-lattice should be able to accommodate the in-plane compressive strain elastically.

Figure 56:
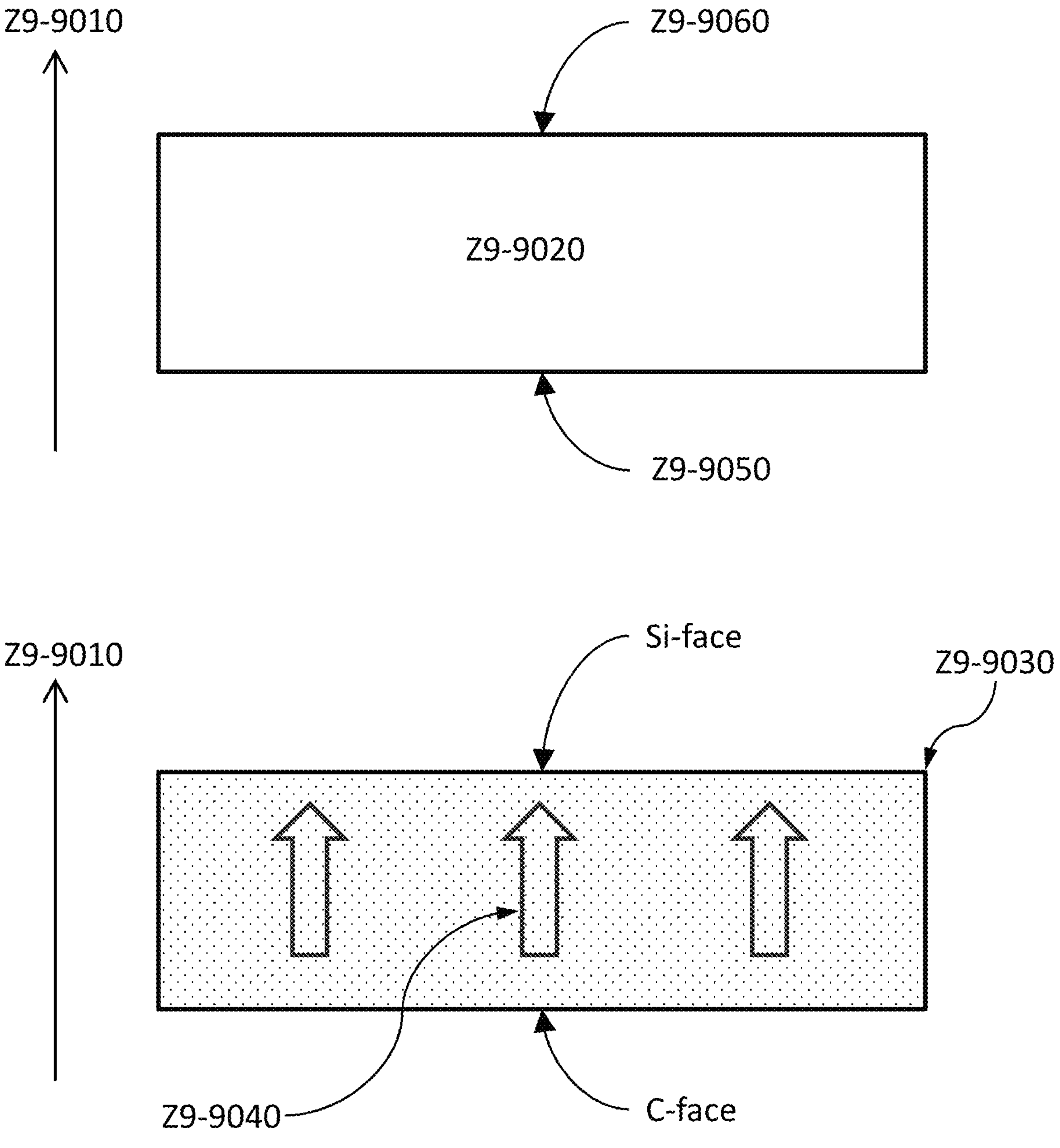
FIG. 56 depicts the surface orientations and polarity of two slabs comprising (−201)-oriented β-$Ga_2O_3$ and 4H—SiC as Si-polar or C-polar, in accordance with some embodiments.

FIG. 56 depicts schematically the epitaxial orientations possible for producing the Oxide-SiC article. The C-plane cut 4H—SiC substrate Z9-9030 can be oriented to present a Si-face or C-face for epitaxial deposition. The intrinsic polarity Z9-9040 of 4H—SiC influences the surface electron affinity (as shown in FIG. 48) and therefore the heterojunction band alignment with an epitaxial oxide. If the 4H—SiC is oriented with surface normal Z9-9010, this defines the epitaxial growth direction Z9-9010. It is also possible the epilayer may grow/assemble with a tilt such that the surface normal may not completely coincide with the epilayer crystal plane. For example, the semiconducting oxide Z9-9020 can be β-$Ga_2O_3$. The first surface of the epilayer Z9-9050 can be predetermined by the growth sequence initiating the epitaxy process. Furthermore, the final epilayer surface Z9-9060 may also be predetermined by virtue of the growth process.

Further analysis of the 4H—SiC C-plane oriented surface structures are shown in FIGS. 57A, 57B, 57C and 57D.

Figure 57A:
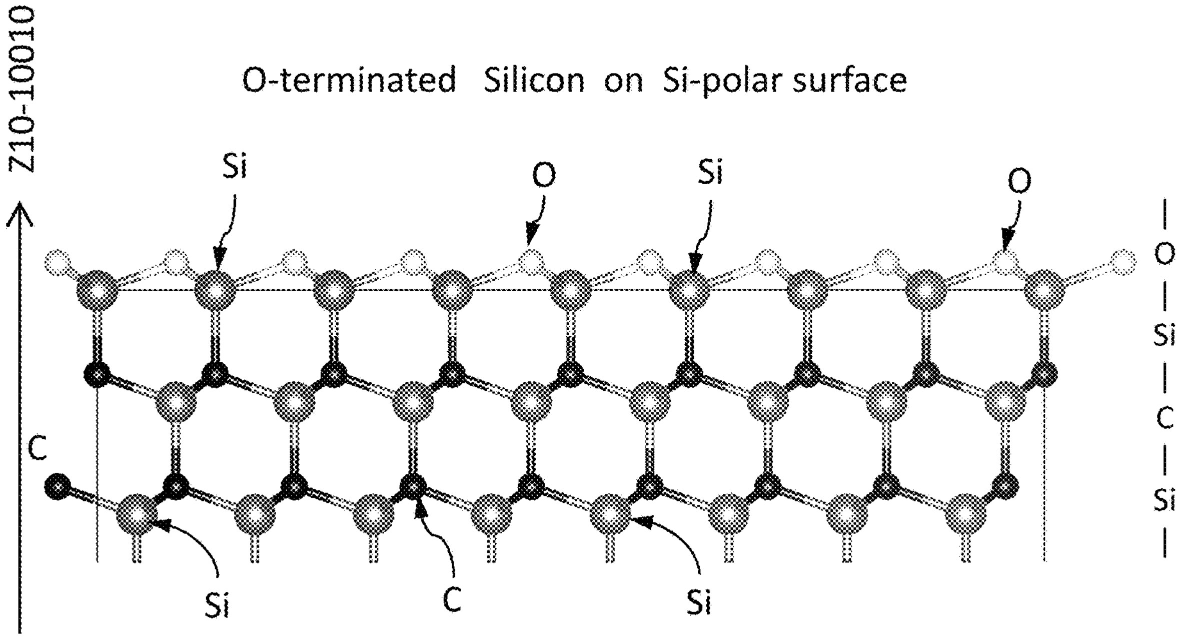
FIG. 57A shows the atomic arrangement a bulk 4H—SiC crystal having Si-polar surface and the SiC surface with preferentially terminated Si atoms with a first oxygen adatom layer, in accordance with some embodiments.

FIG. 57A shows a cross-sectional view of the atomic arrangements for a prepared C-plane 4H—SiC crystal which is Si-polar Z10-10010, and presenting a final surface that has a topmost plane of Si-atoms that are preferentially bonded to oxygen (O) atoms. This can be achieved by ultrahigh vacuum anneal up to approximately 1000° C. Optionally, exposure of a low flux of Si atoms impinging on the surface can also ensure a final Si surface state once the native silicon-oxy-carbide has been desorbed. Exposure of the Si-terminated surface with active species of oxygen can then self-limit the surface with a O-terminated surface. The stacking sequence would then be from the surface downwards: —O—Si—C—Si—C—.

Figure 57B:
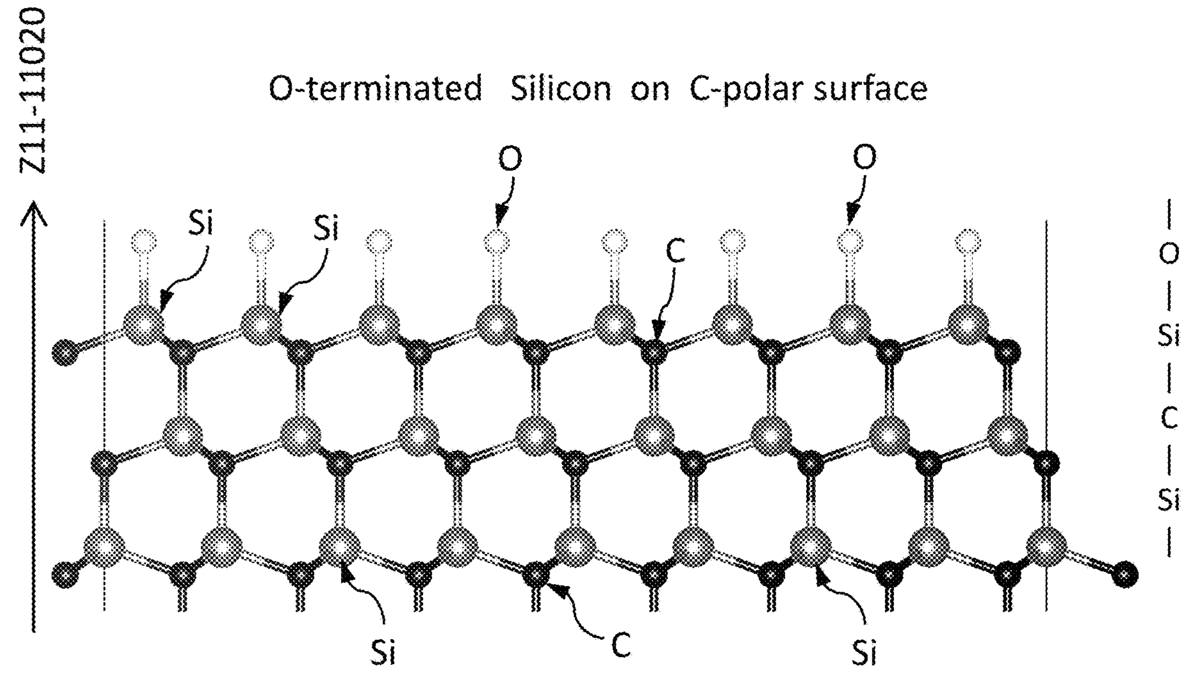
FIG. 57B shows the atomic arrangement a bulk 4H—SiC crystal having C-polar surface and the SiC surface with preferentially terminated Si atoms with a first oxygen adatom layer, in accordance with some embodiments.

FIG. 57B shows a cross-sectional view of the atomic arrangements for a prepared C-plane 4H—SiC crystal which is C-polar Z10-10020, and presenting a final surface that has a topmost plane Si-atoms that are preferentially bonded to oxygen (O) atoms. This can be achieved by ultrahigh vacuum anneal up to approximately 1000° C. Optionally, exposure of a low flux of Si atoms impinging on the surface can also ensure a final Si surface state once the native silicon-oxy-carbide has been desorbed. Exposure of the Si-terminated surface with active species of oxygen can then self-limit the surface with a O-terminated surface. The stacking sequence would then be from the surface downwards: —O—Si—C—Si—C—.

Comparison of FIGS. 57A and 57B shows the oxygen bonding between the topmost O—Si atoms having distinct bonding symmetry which dictates the preferred next adatom layer of Ga arrangement (refer the Ga and O arrangement in FIG. 52).

Oxygen can Bond to Either Si or C with Bond Strengths:

$$E_{bond}(\mathrm{Si-O}) = 452\ \mathrm{kJ/mol},\ E_{bond}(\mathrm{Si=O}) = 590\ \mathrm{kJ/mol},$$

$$E_{bond}(\mathrm{C-O}) = 360\ \mathrm{kJ/mol},\ \text{and}\ E_{bond}(\mathrm{C=O}) = 715\ \mathrm{kJ/mol}$$

Figure 57C:
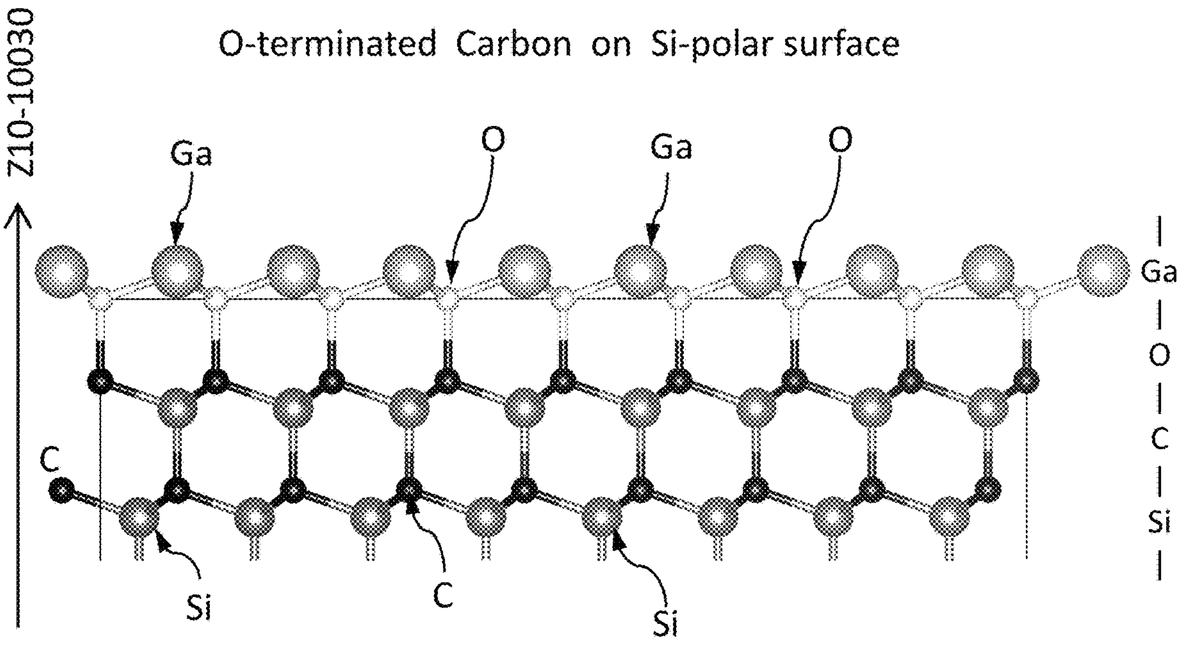
FIG. 57C shows the atomic arrangement a bulk 4H—SiC crystal having Si-polar surface and the SiC surface with preferentially terminated C atoms with a first oxygen adatom layer and second Ga adlayer, in accordance with some embodiments.
Figure 57D:
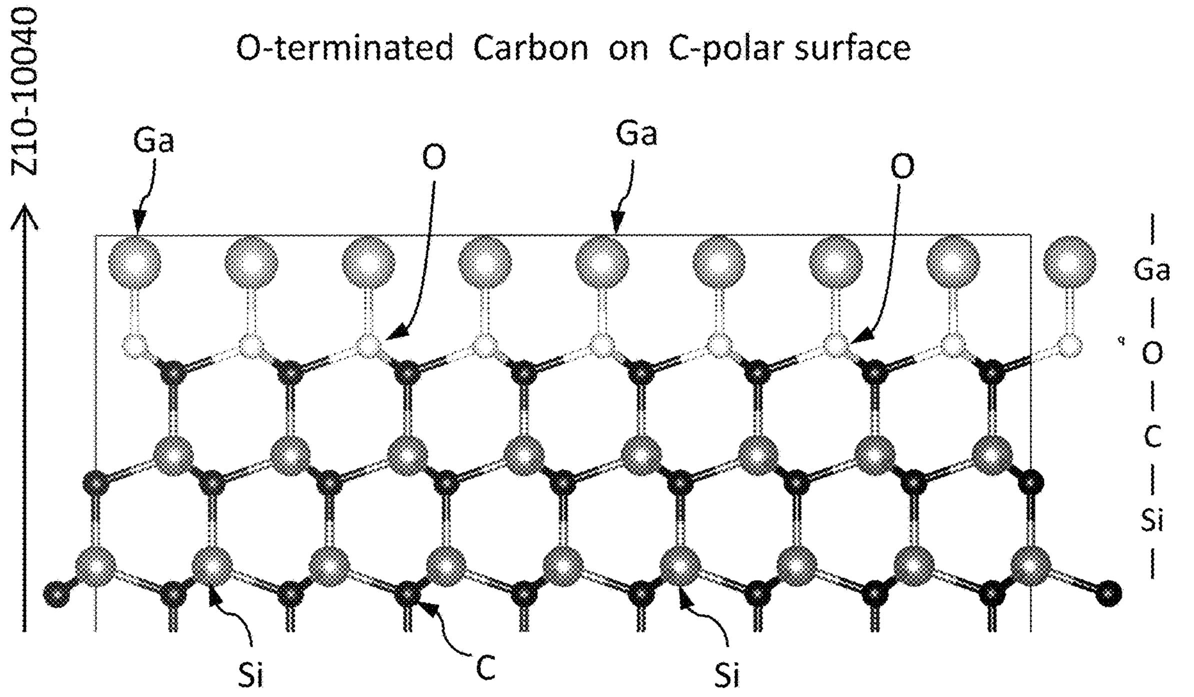
FIG. 57D shows the atomic arrangement a bulk 4H—SiC crystal having C-polar surface and the SiC surface with preferentially terminated C atoms with a first oxygen adatom layer and second Ga adlayer, in accordance with some embodiments.

FIGS. 57C and 57D show an alternate first oxygen bonding arrangement to a carbon topmost surface configured on a Si-polar or C-polar 4H—SiC surface, respectively.

FIG. 57C shows a cross-sectional view of the atomic arrangements for a prepared C-plane 4H—SiC crystal which is Si-polar Z10-10030, and presenting a final surface that has a topmost plane C-atoms that are preferentially bonded to oxygen (O) atoms. This can be achieved by ultrahigh vacuum anneal in excess of approximately 1000° C. Optionally, exposure of a low flux of C atoms impinging on the surface can also ensure a final C surface state once the native silicon-oxy-carbide has been desorbed. Exposure of the C-terminated surface with active species of oxygen can then self-limit the surface with a O-terminated surface. The stacking sequence would then be from the surface downwards: —O—C—Si—C—. Further crystal growth is shown with an additional Ga adlayer shown with tetragonal bonding arrangement forming sequence —Ga—O—C—Si—C—.

FIG. 57D shows a cross-sectional view of the atomic arrangements for a prepared C-plane 4H—SiC crystal which is C-polar Z10-10040, and presenting a final surface that has a topmost plane C-atoms that are preferentially bonded to oxygen (O) atoms. This can be achieved by ultrahigh vacuum anneal in excess of approximately 1000° C. Optionally, exposure of a low flux of C atoms impinging on the surface can also ensure a final C surface state once the native silicon-oxy-carbide has been desorbed. Exposure of the C-terminated surface with active species of oxygen can then self-limit the surface with a O-terminated surface. The stacking sequence would then be from the surface downwards: —O—C—Si—C—. Further crystal growth is shown with an additional Ga adlayer shown with tetragonal or octahedral bonding arrangement forming sequence —Ga—O—C—Si—C—.

The SiC surface preparation is an important step for the realization of high-quality single crystal β-$Ga_2O_3$ (−201) oriented epilayers, with methods and structures disclosed herein.

Figure 57E:
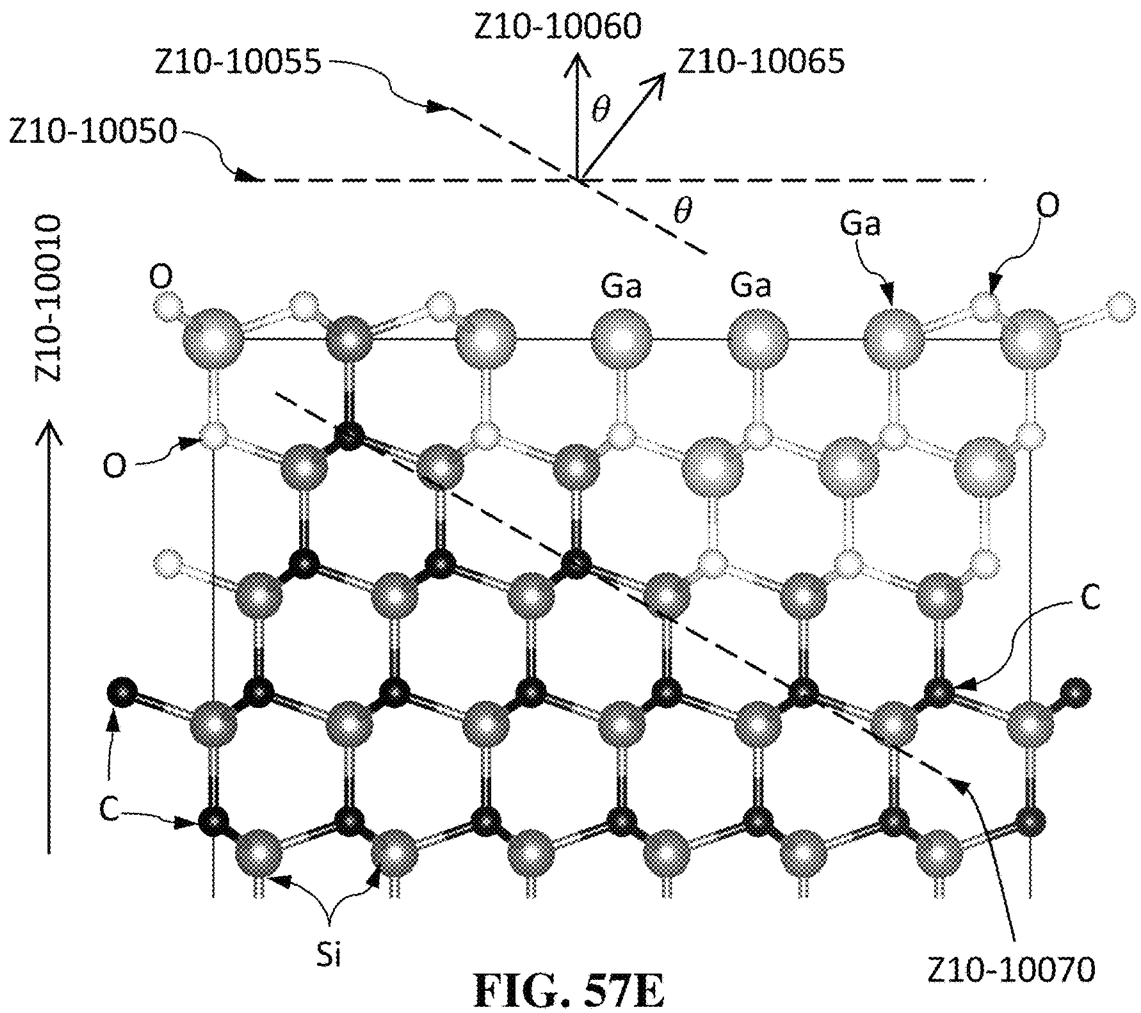
FIG. 57E shows a possible atomic arrangement at an intentionally miscut 4H—SiC(0001) surface and the subsequent epitaxial Ga—O bond formation as a template for further $Ga_2O_3$ film growth, in accordance with some embodiments.
Figure 57F:
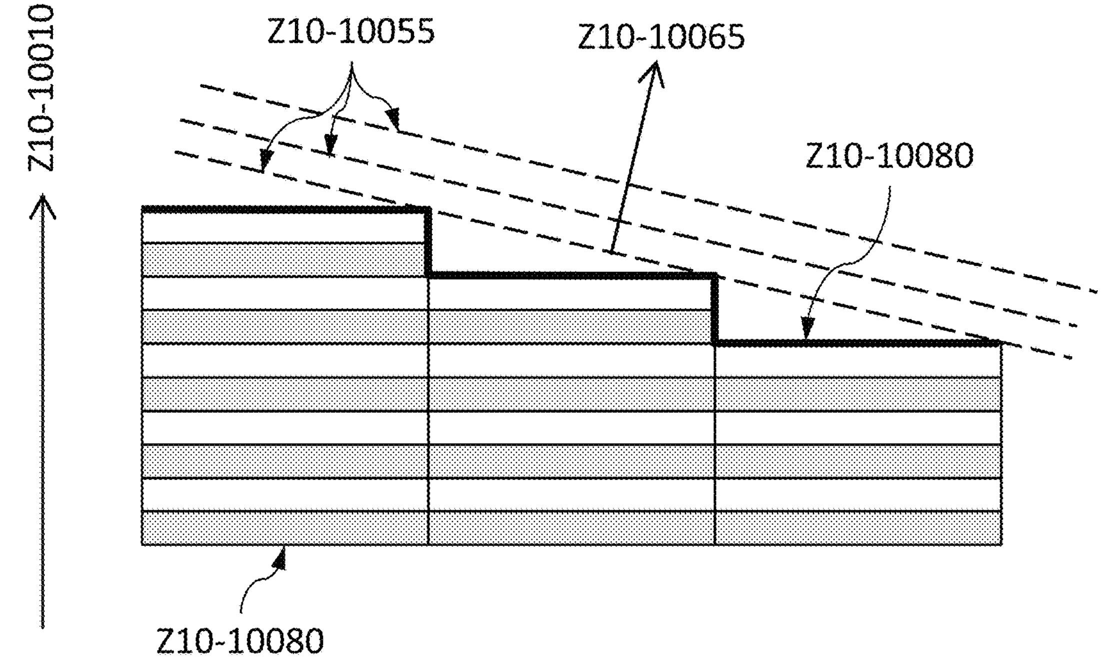
FIG. 57F depicts a cross-section of the 4H—SiC(0001) crystal miscut to create a plurality of steps and ledges on the SiC surface, creating a film formation surface that is tilted with respect to the 4H—SiC crystal axis, in accordance with some embodiments.

FIGS. 57E and 57F depict influence of a C-plane 4H—SiC surface that is intentionally misoriented from the on-axis surface (i.e., miscut at an angle >0 from the on-axis surface) on the epilayer growth of $Ga_2O_3$.

FIG. 57E shows the cross-sectional view of the Si-polar 4H—SiC crystal along the direction Z10-10010 with a miscut surface Z10-10070 inclined an angle θ from the on-axis c-plane surface Z10-10050. Z10-10065 is a miscut direction normal to the substrate surface, while direction Z10-10060 is the c-axis of the SiC. The angle θ (or miscut angle) in FIG. 57E is not drawn to scale. In some cases, θ is from 2 to 6 degrees, or about 4 degrees. Below the plane of miscut surface Z10-10070 comprises the SiC crystal and above comprises the epitaxial $Ga_2O_3$ growth. The epilayer can either grow along the Z10-10060 direction with stacking faults or grow inclined with tilt substantially directed with epilayer crystal planes Z10-10055. FIG. 57F schematically depicts the epilayer crystal planes growing with tilted planes Z10-10055 on the 4H—SiC crystal Z10-10080 having a step-terrace surface Z10-10080.

Figure 57G:
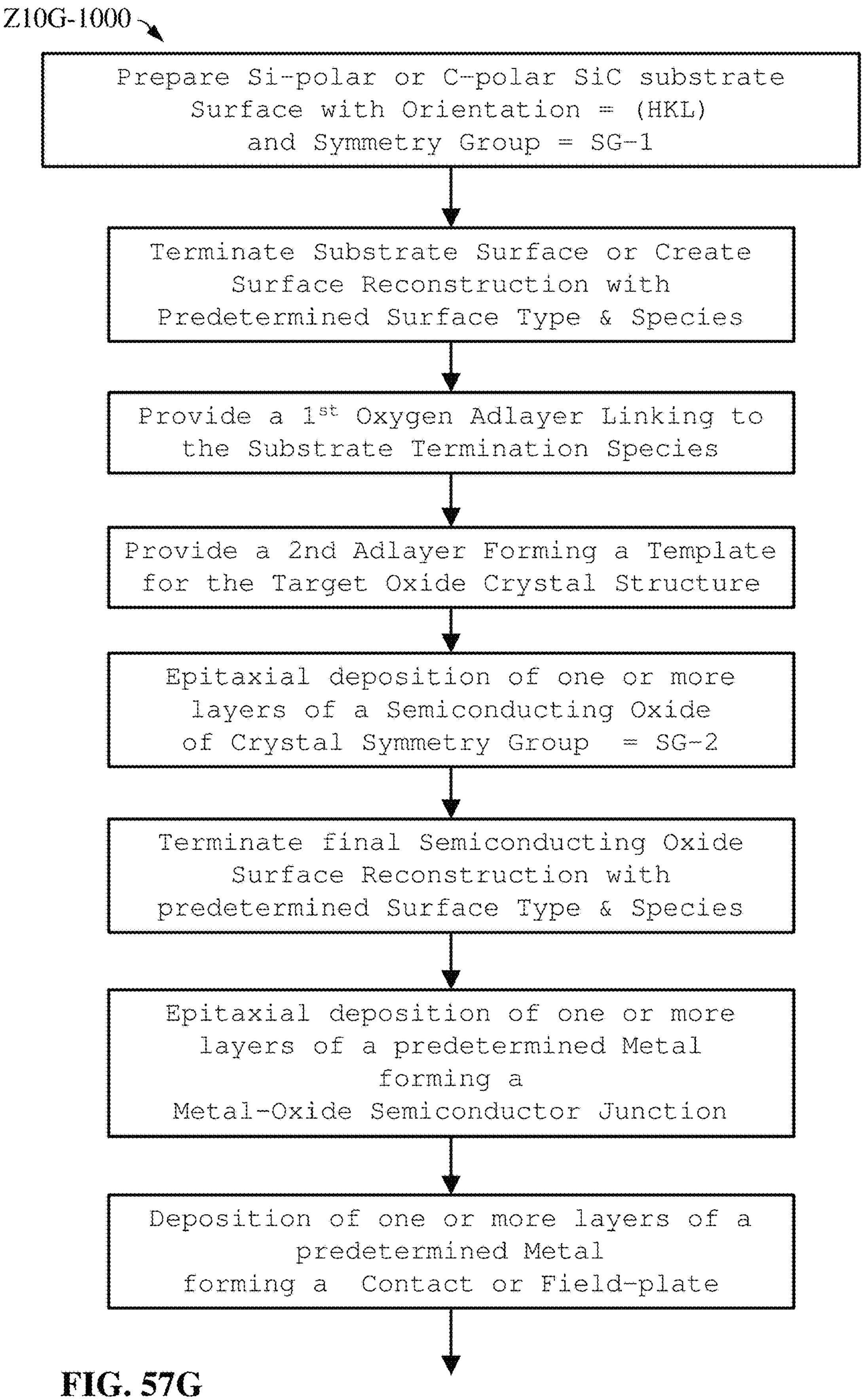
FIG. 57G is an example process flow for the heterogenous deposition of an oxide semiconductor upon a preselected surface orientation of a SiC substrate, where a process step of manipulating the substrate and/or oxide semiconductor surface species and state in preparation for oxide epitaxy and/or metal deposition sequence for the device structure is shown, in accordance with some embodiments.

FIG. 57G further discloses an example process flow Z10G-1000 for the fabrication of the structure template surfaces disclosed in FIGS. 57A, 57B, 57C and 57D that can be further incorporated into structures and devices disclosed herein.

The integration of two dissimilar crystal symmetry groups (SGs) begins by the epitaxial deposition of an oxide having a symmetry group SG-2 (e.g., monoclinic $Ga_2O_3$) onto the substrate having a symmetry group SG-1 (e.g., hexagonal 4H—SiC). Advantageous alignment of SG-2 with SG-1 can occur via judicious choice of substrate crystal plane in order to match to a possible epilayer layer plane of the oxide SG-2. For example, the Si-polar face of C-plane 4H—SiC can be terminated with a Si sub-lattice surface. The Si sub-lattice can be terminated with an oxygen adlayer thereby forming a linking layer with a Ga-adatom layer.

The oxide epilayer (e.g., β-$Ga_2O_3$) final surface can also be terminated surface type and with a species conducive for subsequent formation of a high quality first metal layer. The first metal layer can be of the order of 1-10 nm in thickness or more, and can be followed by another second metal layer.

Figure 57H:
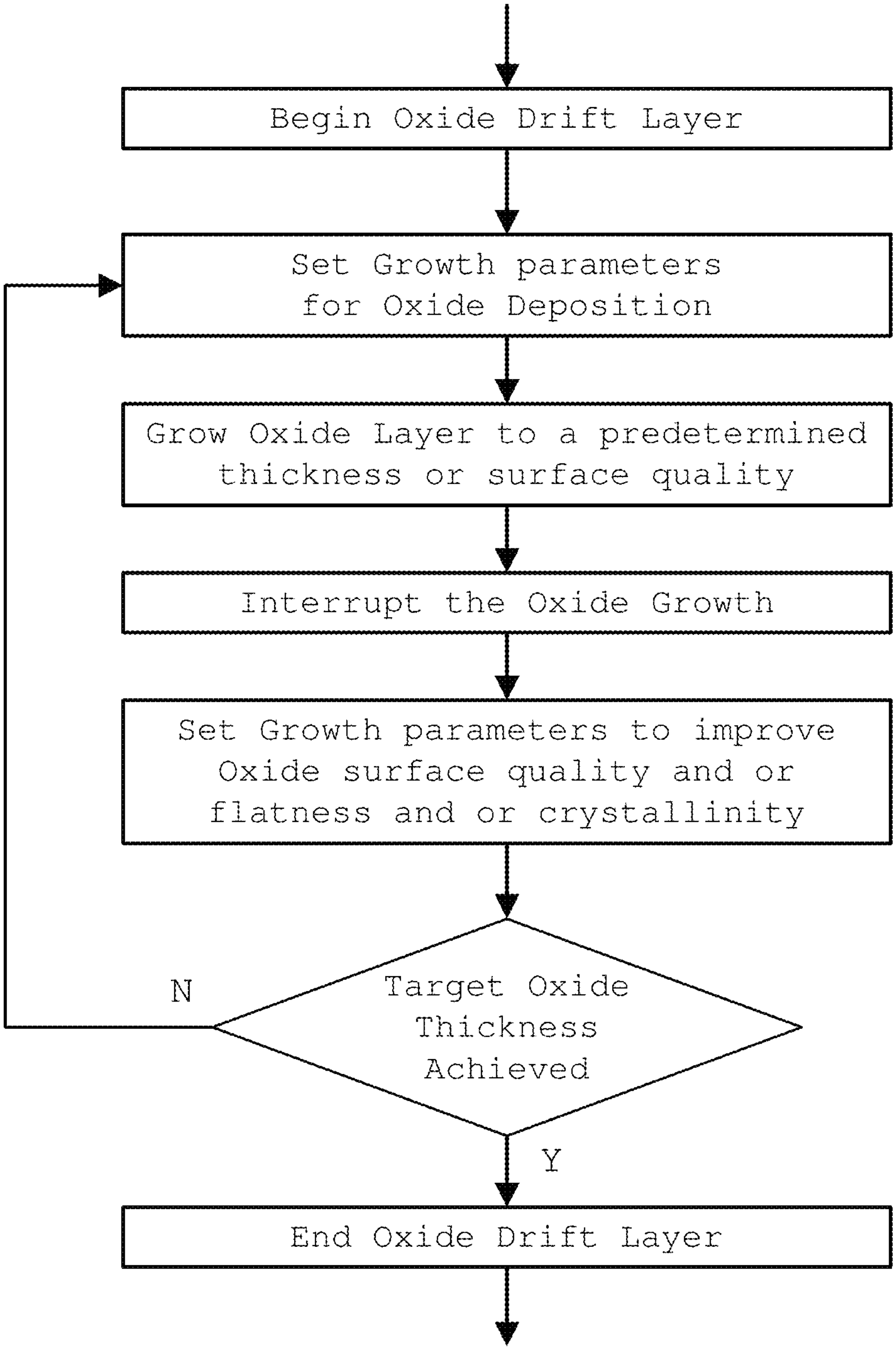
FIG. 57H is an example process flow for the heterogenous deposition of an oxide semiconductor using the method of growth interruptions for improving the film quality, in accordance with some embodiments.

FIG. 57H is another example of a fabrication process flow for the epitaxial deposition of thick oxide films deposited on SiC substrates. Growth conditions necessary for the self-assembly of Ga and O into a specific polytope of $Ga_2O_3$ (e.g., monoclinic) can be achieved by providing a growth temperature and a predetermined incident flux and ratio of co-deposited Ga and active-oxygen species. Stacking faults and other crystalline misalignments and coordination are possible and may accumulate as a function of film thickness. An example method to achieve thick epitaxial films in excess of some limiting co-deposition thickness provides for a growth interruption wherein the film growth is suspended and the surface quality is recovered. For example, epitaxial growth of β-$Ga_2O_3$ (−201) can be interrupted after approximately ~100 nm and annealed in an oxygen environment by suspending the Ga-flux. The surface improvement may be evidenced by in-situ diagnostics. The epitaxial growth can be recommenced again for predetermined time or figure of merit indicative of film quality. The cycle can be repeated a plurality of times until a desired thickness is achieved. In some examples, the growth interruption introduces non-growth species, such as, nitrogen, atomic nitrogen, a surfactant (e.g., Bismuth or Zinc or Magnesium or Germanium), hydrogen or atomic hydrogen, and others.

Figure 58:
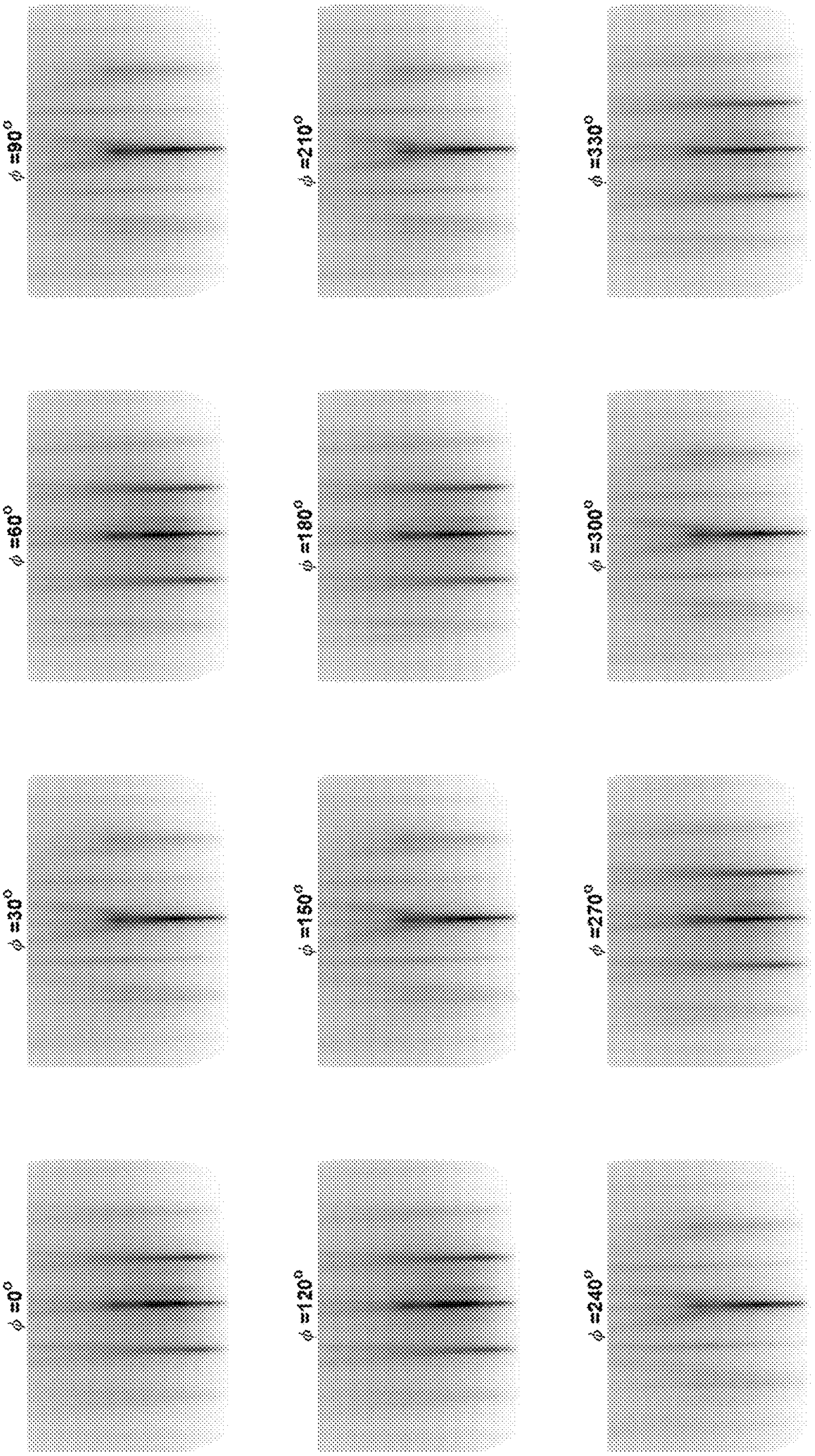
FIG. 58 is a complete series of reflection high energy electron diffraction (RHEED) images with azimuthal rotation around the rotation axis of the epitaxial growth, where the long sharp RHEED streaks indicate atomically flat and high crystal quality of a 2 μm of Si-doped β-$Ga_2O_3$ (−201) oriented film deposited upon a 0 deg miscut n+4H—SiC (0001) substrate, in accordance with some embodiments.

FIG. 58 shows experimental data from an epitaxial β-$Ga_2O_3$ (−201) film deposited directly onto a prepared on-axis n-type 4H—SiC(0001) oriented substrate surface. Atomic beam epitaxy was used in an ultrahigh vacuum deposition chamber, utilizing a pure Ga metal and an activated oxygen source from high power quartz bulb inductively coupled RF-plasma source. In some example growths $O_2$ and $N_2$ and $N_2O$ were co-fed into one or more RF plasma sources. Epitaxy systems and methods are described for example in U.S. Pat. Nos. 10,964,537, 11,282,704, 11,342,484, and 11,670,508, which are hereby incorporated by reference.

The 4H—SiC substrate for the example of FIG. 58 was directly heated with a high temperature or mid infrared emissivity SiC heater. The wafer was rotated during growth and positioned with respect to the sources so that a highly uniform film could be deposited over a 4" diameter wafer. The substrate growth temperature was between 500-1000° C. depending on the SiC substrate resistivity. N-type 4H—SiC(0001) substrates were grown at about 500-700° C. without a backside coating due to the direct emissivity match between the heater and substrate. Semi-insulating 4H—SiC substrates were grown at about 700-950° C. without a backside coating due to the direct emissivity match between the heater and substrate. It was found in some example epitaxial growths that the highest quality single crystal films resulted from higher substrate deposition temperatures.

Reflection high energy electron diffraction (RHEED) is an essential in-situ diagnostic for direct and real time assessment of the epilayer film quality and crystal structure. FIG. 58 shows the RHEED images at high symmetry points as a function of azimuthal rotation of the substrate about the surface normal for an approximately 2 micron thick β-$Ga_2O_3$ (−201) epilayer grown upon n-type 4H—SiC (0001) Si-polar on-axis. The excellent single crystal quality is evidenced by the long and sharp RHEED diffraction streaks indicating an atomically flat film. The RHEED streaks were monitored and maintained throughout the film growth. The (−201)-oriented film has a 60-degree periodicity as expected and is completely devoid of any polycrystalline arcs or pyramidal surface features as spots.

Figure 59:
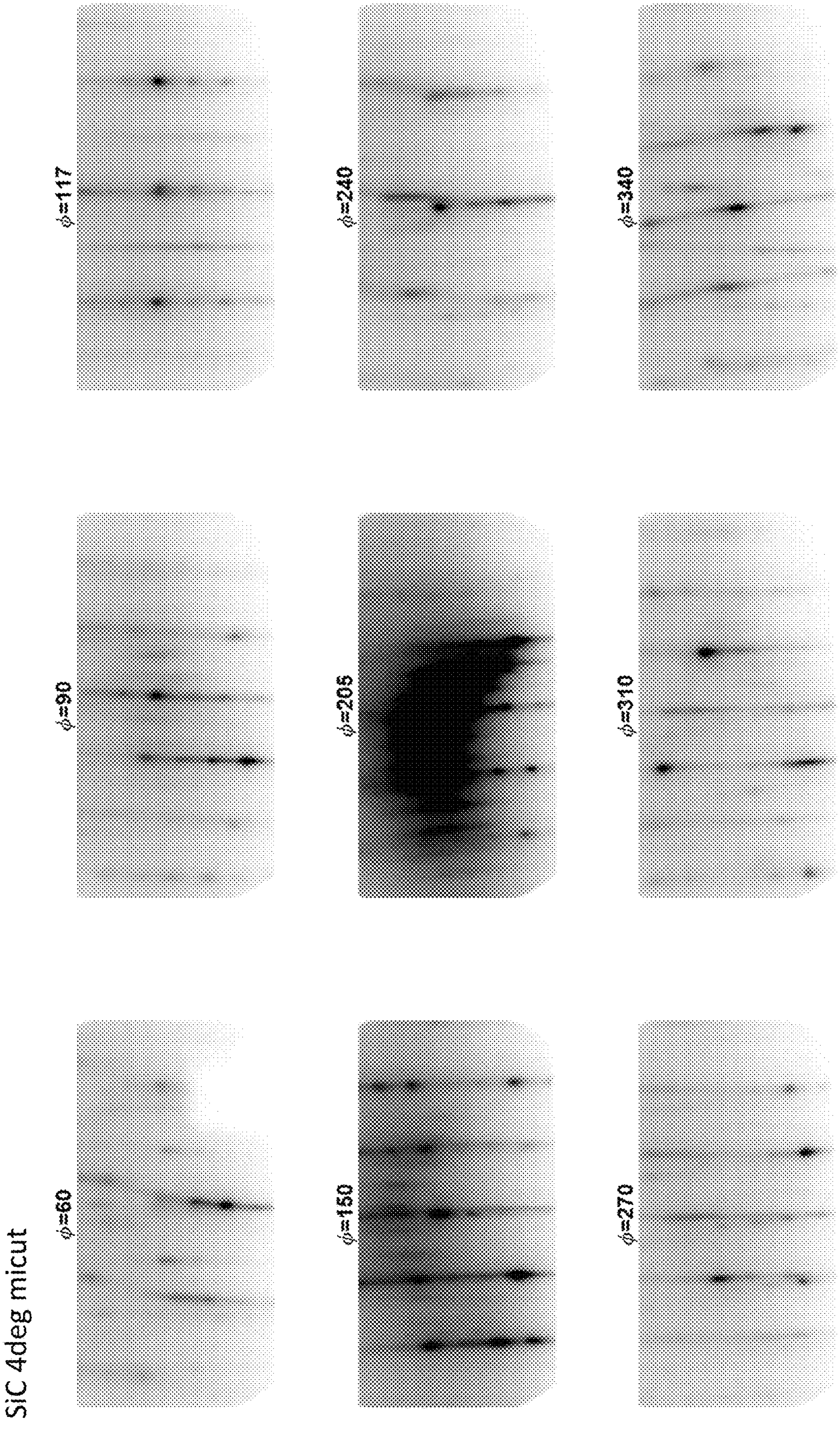
FIG. 59 is a series of RHEED images with azimuthal rotation around the rotation axis of the epitaxial growth. The long sharp RHEED streaks indicate atomically flat and high crystal quality of a 2 μm of Si-doped β-$Ga_2O_3$ (−201) oriented film deposited upon a 4 deg miscut n+4H—SiC (0001) substrate, where the RHEED dots represent transmission of the electron beam through the step edges, in accordance with some embodiments.

FIG. 59 shows RHEED images of a thick β-$Ga_2O_3$ (−201) epilayer grown upon n-type 4H—SiC(0001) Si-polar substrate with an intentional 4-degree miscut from the on-axis surface toward the A-plane. Sharp and intense streaks are also shown and the streaks are bent due to the miscut of the substrate. Spots are superimposed on the streaks indicating the incident RHEED electron beam being partially transmitted through the terrace steps. It is determined in the present disclosure that growth on miscut SiC surfaces may provide superior $Ga_2O_3$ film quality with respect to rotation domains that are possible for the (−201) reconstruction.

Figure 60A:
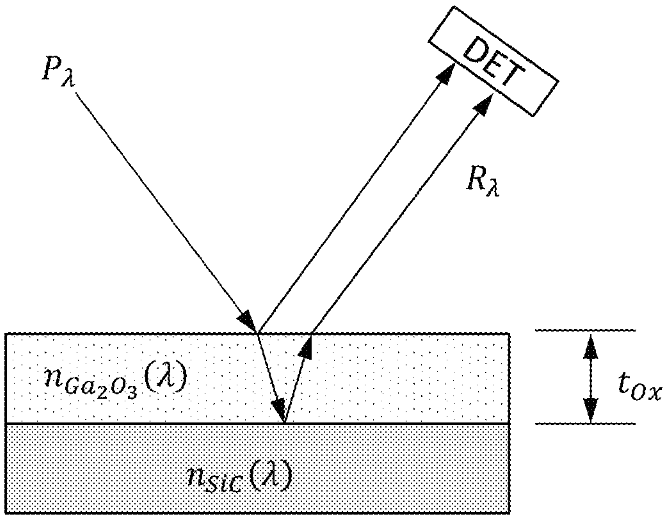
FIGS. 60A and 60B depict in-situ laser reflectance used for epitaxial deposition of β-$Ga_2O_3$ (−201) oriented film on an n+4H—SiC(0001) substrate, where the periodic thickness oscillations shown in the experimental data in FIG. 60B are a result of constant $Ga_2O_3$ growth rate initially deposited on a bare n+SiC substrate, in accordance with some embodiments.
Figure 60B:
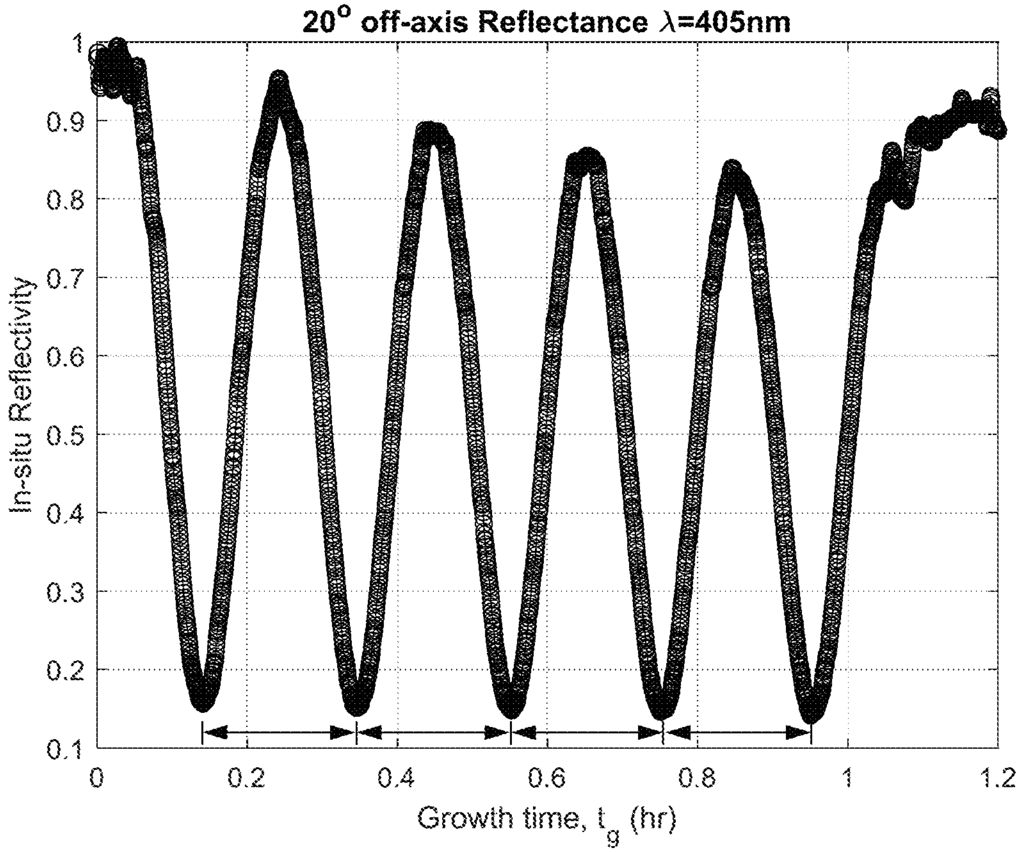

FIGS. 60A and 60B show yet further evidence of the high crystal and optical quality of the epilayer $Ga_2O_3$ grown on SiC substrate, in the form of in-situ oblique laser reflectance (equipment set-up shown in FIG. 60A) at a wavelength of Λ=405 nm. The high initial reflectance (plot in FIG. 60B) from the bare SiC surface decreases upon deposition of the $Ga_2O_3$ film with optical thickness oscillations appearing every $\lambda/2n$ where n ($Ga_2O_3$)=1.9. Growth rates (GR) between 0.1 and 4 Angstroms per second are possible. Higher growth rates are also possible with scaled elemental sources and chamber characteristics.

Figure 61A:
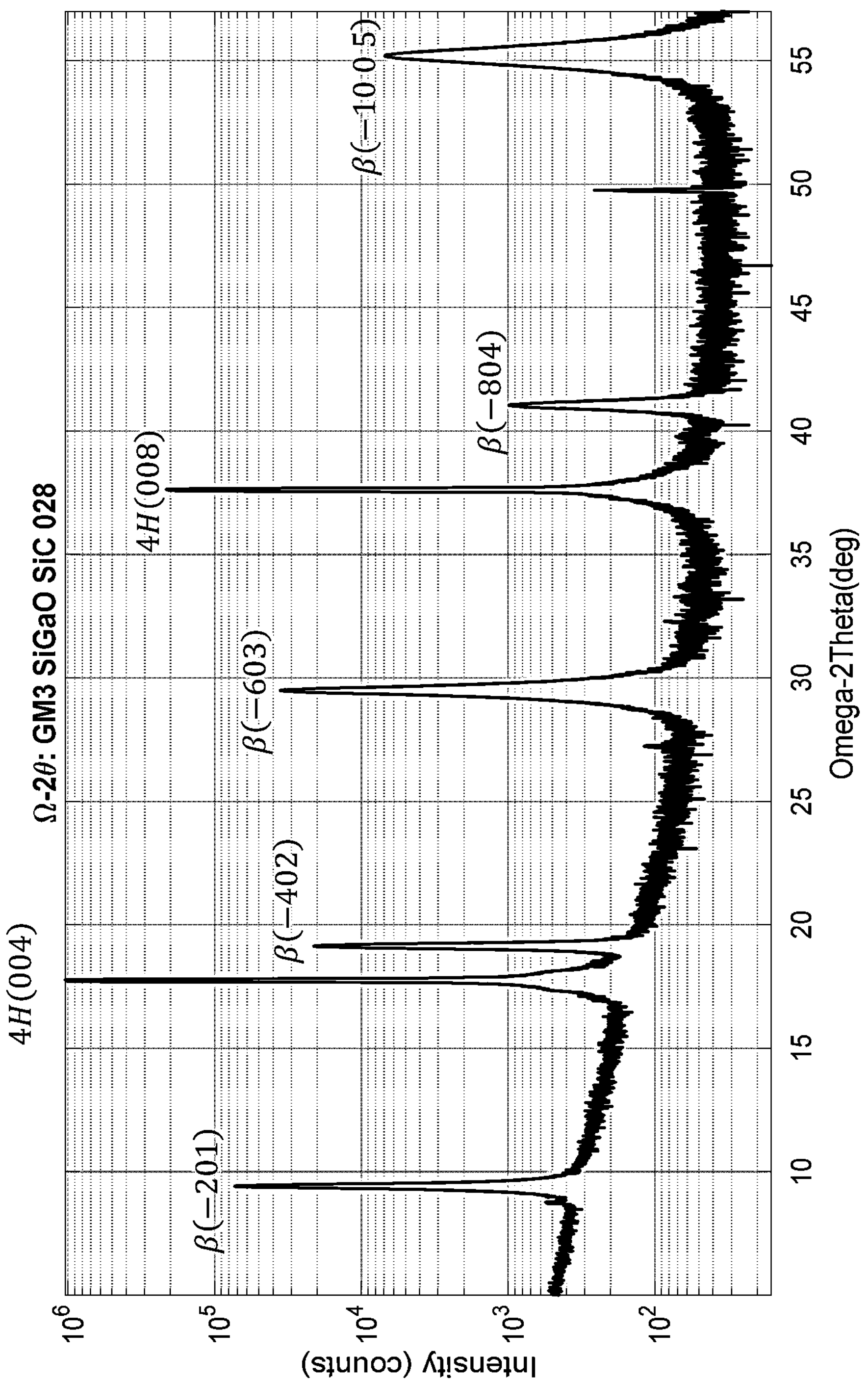
FIG. 61A is a plot of the X-ray diffraction symmetric double crystal rocking curve of a single crystal β-$Ga_2O_3$ (−201) oriented film on n+4H—SiC(0001)_0 deg miscut, where the sharp β-$Ga_2O_3$ peaks indicate beta-phase pure growth conditions, in accordance with some embodiments.

FIG. 61A shows the wide-angle double crystal diffraction 22-20 symmetric scan of a $Ga_2O_3$ epilayer on an SiC substrate. Sharp and strong β-$Ga_2O_3$ n (−201), n=1, 2, 3, 4 and 5 Bragg peaks are shown with no evidence of parasitic polytopes.

Figure 61B:
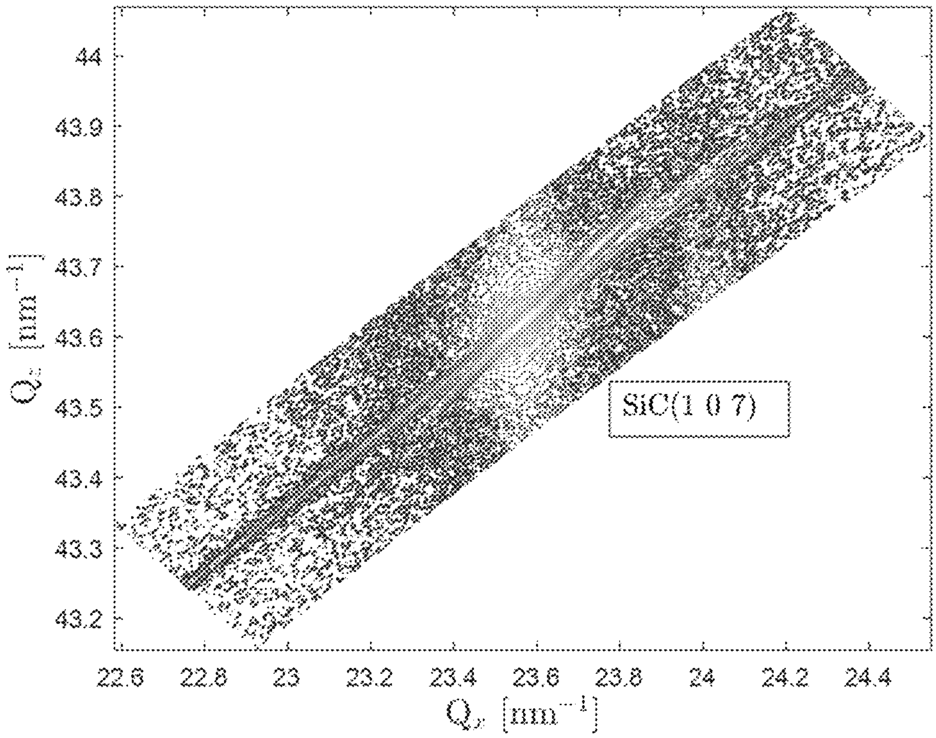
FIG. 61B is a contour plot of a reciprocal space map of a β-$Ga_2O_3$ (−201) oriented film on n+4H—SiC(0001)_0 deg miscut, where a reciprocal space map (RSM) of the asymmetric Bragg SiC(107) peak is shown, in accordance with some embodiments.
Figure 61C:
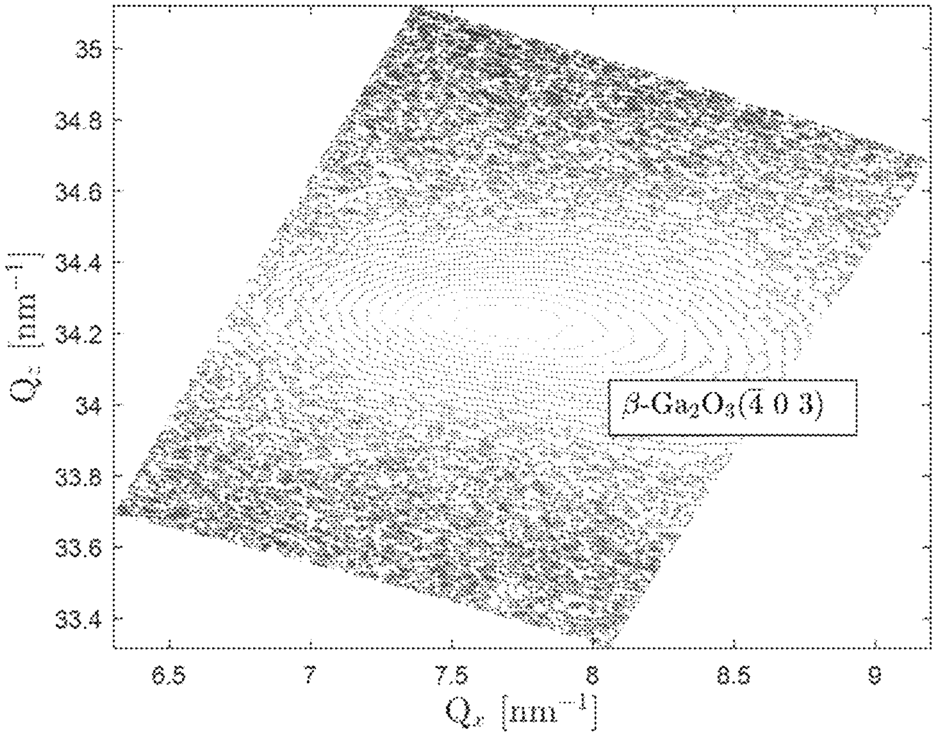
FIG. 61C is a contour plot of a reciprocal space map of a β-$Ga_2O_3$ (−201) oriented film on n+4H—SiC(0001)_0 deg miscut, where an RSM of the asymmetric Bragg β-$Ga_2O_3$ (−403) peak is shown, in accordance with some embodiments.

FIGS. 61B and 61C disclose the asymmetric x-ray diffraction reciprocal lattice maps in the vicinity of two Bragg peaks centered on the 4H—SiC(107) and β-$Ga_2O_3$ (−403) for a hetero-epitaxial structure formed as a 2 μm thick β-$Ga_2O_3$ (−201)//4H—SiC(0001) 0 deg miscut. The RSM maps show the oxide film is single crystal and of high quality and shows that dissimilar crystal symmetry space groups can be conformed.

Figure 62:
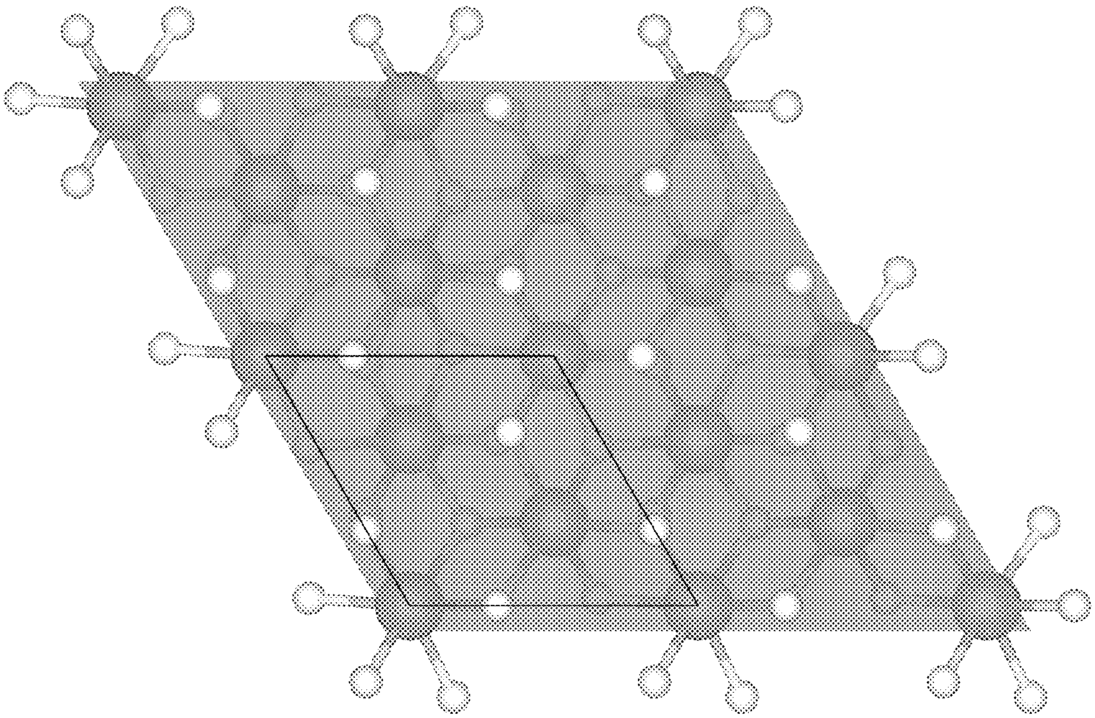
FIG. 62 is a top view of the atomic arrangement of an alpha-phase $Ga_2O_3$ crystal showing the (0001) plane and the hexagonal oxygen sublattice, in accordance with some embodiments.
Figure 63:
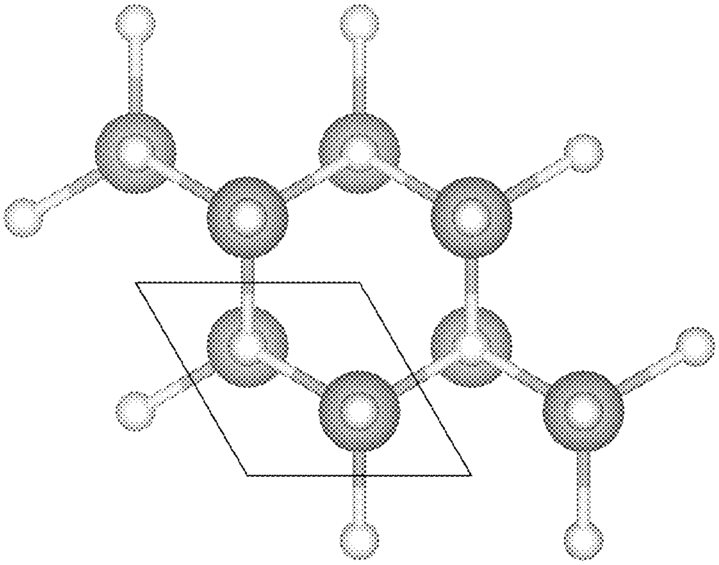
FIG. 63 is a top view of the atomic arrangement of a wurtzitic-phase $Ga_2O_3$ crystal showing the (0001) plane and the hexagonal oxygen sublattice, in accordance with some embodiments.

It is also possible in another example for the $Ga_2O_3$ epilayer to have other pure polytope when deposited on alternate SiC surface orientations. For example, FIG. 62 depicts the crystal structure of the alpha-phase $Ga_2O_3$ (SG=R3c) which is similar to sapphire and may be formed on A-R- or M-plane SiC(2H—, 4H— or 6H—). FIG. 63 also shows the possible wurtzite crystal polytope of $Ga_2O_3$ having a SG=P63mc that may be formed on some SiC substrate orientations. Other polytopes are also possible such as the SG=Pna21 or a cubic (defective SG=Fm3m). Of particular interest are the Pna21 and P63ms space groups due to the intrinsic property that they are polar crystals. It is determined in the present disclosure that forming Ga-polar or O-polar $Ga_2O_3$ films (e.g., with Pna21 and P63ms space groups) on Si-polar or C-polar SiC enables new electronic devices to be constructed potentially utilizing spontaneous and piezoelectric polarization induced carrier doping.

Figure 64:
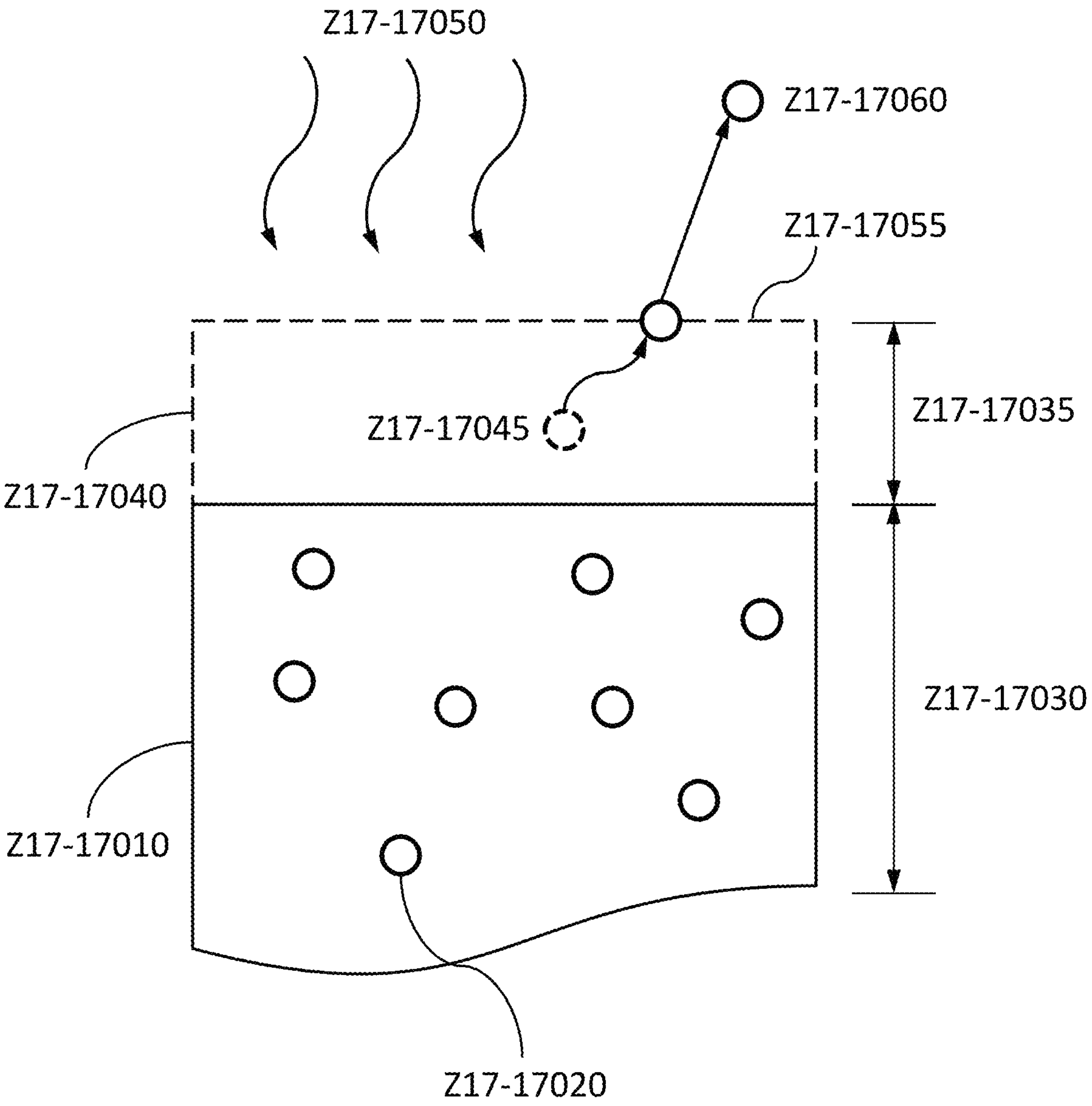
FIG. 64 is a schematic representation of a bulk region and surface region of an oxide epilayer with hydrogenic impurities disposed within the structure, in accordance with some embodiments.

FIG. 64 schematically depicts a novel aspect of the present disclosure directed toward pre-determining the electronic character of a final surface of an oxide epitaxial film.

It was found that the β-$Ga_2O_3$ (−201) surface has an electron affinity that is sensitive to the deposition condition, post deposition condition, thermal annealing, annealing in oxygen, and exposure to other environments. It was further found that hydrogen can play an important role in controlling the final state of the surface electron affinity. The bulk region of a β-$Ga_2O_3$ film or substrate is depicted as Z17-17010 which may have previously incorporated hydrogenic (or hydrogen containing) impurities Z17-17020 distributed throughout the bulk or within a thickness Z17-17030. For example, bulk grown $Ga_2O_3$ substrates exhibit high levels of hydrogenic impurities. These hydrogenic impurities may be liberated from surface region Z17-17040 by thermal or chemical treatment Z17-17050, wherein hydrogenic (or hydrogen containing) particle Z17-17045 diffuses or migrates to the surface Z17-17055 and is removed from the structure Z17-17060. A topmost surface portion of thickness Z17-17035 can therefore be dissimilar to a bulk region Z17-17030.

Conversely, a surface region Z17-17040 can be chemical or thermally treated with a process Z17-17050 that introduces hydrogenic species into the surface region Z17-17040 to a depth of Z17-17035. In one example, the high temperature epitaxial growth of oxide layer is terminated, and growth temperature ramped to ambient over a time (t) while still being subjected to a large oxygen partial pressure. The oxygen annealing during substrate temperature ramp-down post-growth of the epilayer may selectively deplete the surface region Z17-17040 of impurities or induce an effect to deplete the surface of a charge carrier. Such techniques can be useful, for example, if the epilayer is co-doped with Si, Ge or Sn during epitaxy then the final surface region Z17-17040 may be significantly lower doping than the bulk region Z17-17010. Such a depleted surface, if left unmodified, would directly impact the Schottky barrier creation, as discussed herein.

Figure 65:
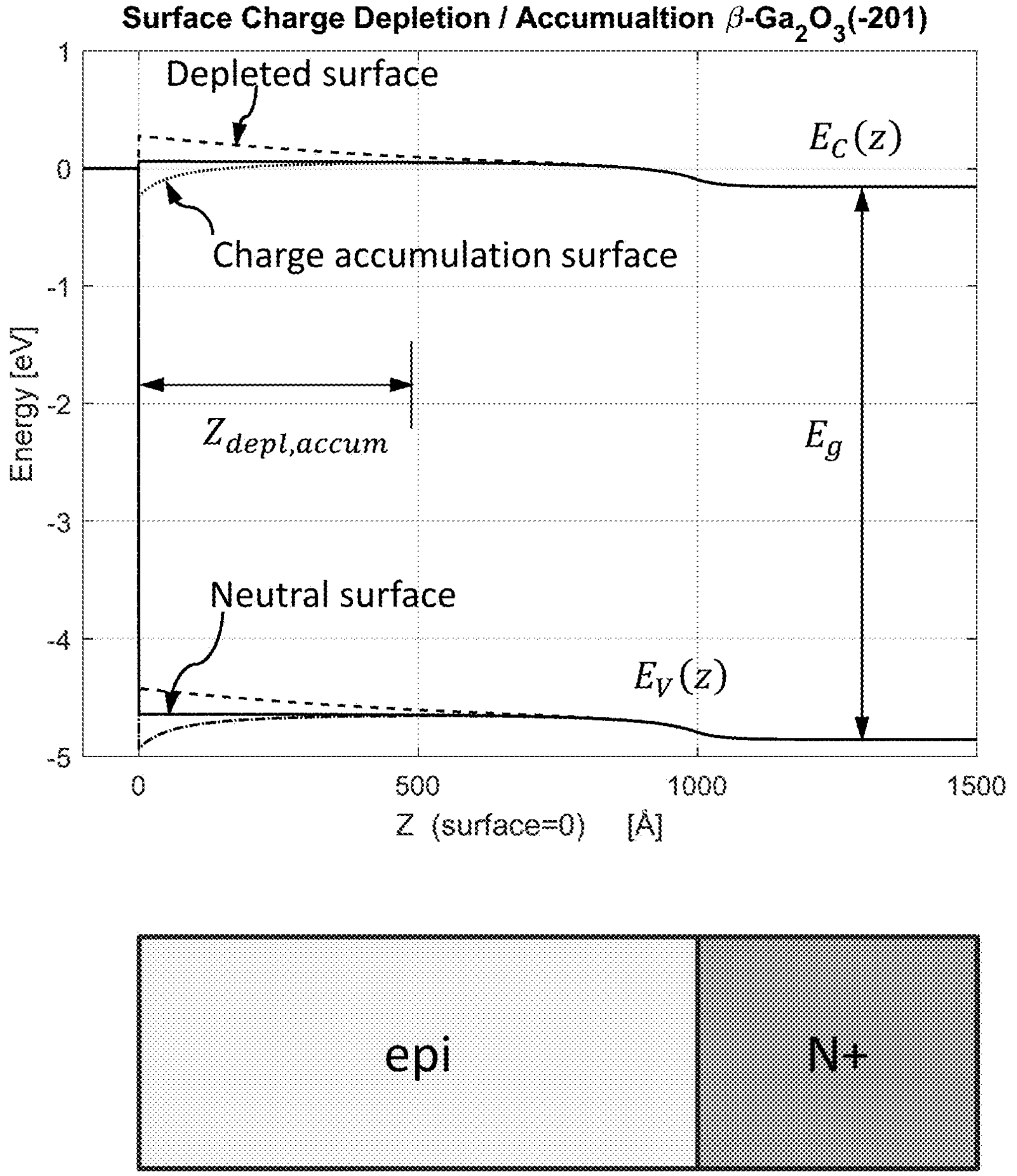
FIG. 65 is a plot of the spatial energy band diagram of a $Ga_2O_3$ multilayered structure showing surface depletion and accumulation effects at the surface, in accordance with some embodiments.

FIG. 65 shows the effect on a β-$Ga_2O_3$ (−201) oriented epilayer surface deposited as an n-type drift layer on top of a highly doped n+ layer or substrate. The bandgap Eg is shown separating the conduction $E_C(z)$ and valence $E_V(z)$ band edges. For this example, Si-doped $Ga_2O_3$ with impurity donor doping is used for the epilayer ("epi") $N_{drift}$=5e16 $cm^{-3}$.

Intentionally exposing the post epitaxial growth surface to hydrogen and atomic hydrogen can result in a neutral surface, however at elevated substrate temperatures the hydrogen exposure can create a surface electron accumulation layer that penetrates into the epilayer to a depth $Z_{accum}$ ("$Z_{depl,accum}$). Conversely, a post grown epitaxial layer surface when exposed to oxygen at elevated temperatures creates a depleted surface. The surface band bending for the possible scenarios is shown in FIG. 65 as 'Depleted surface' or as a 'Charge accumulation surface'.

Figure 66B:
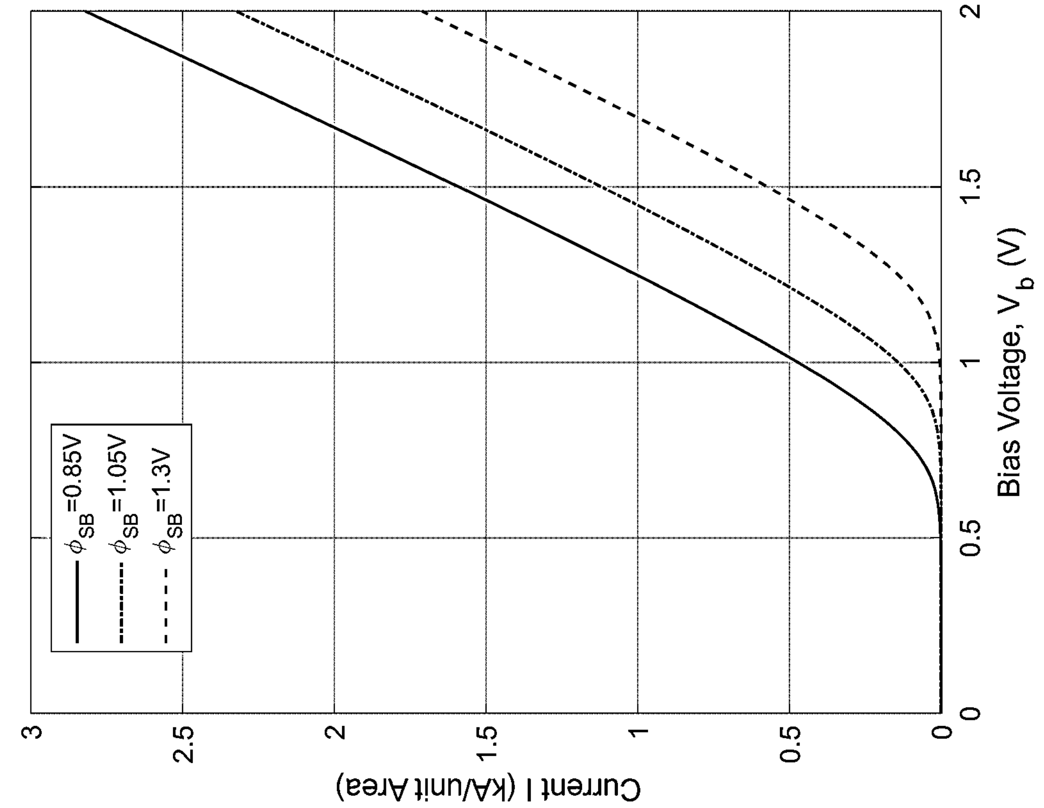
FIGS. 66A and 66B are plots of the forward bias I-V curves calculated for a Schottky barrier diode comprising Ni/β-$Ga_2O_3$/4H—SiC with three cases of surface modification of the β-$Ga_2O_3$ semiconductor and the effect on the turn-on voltage of the diode, in accordance with some embodiments.
Figure 66A:
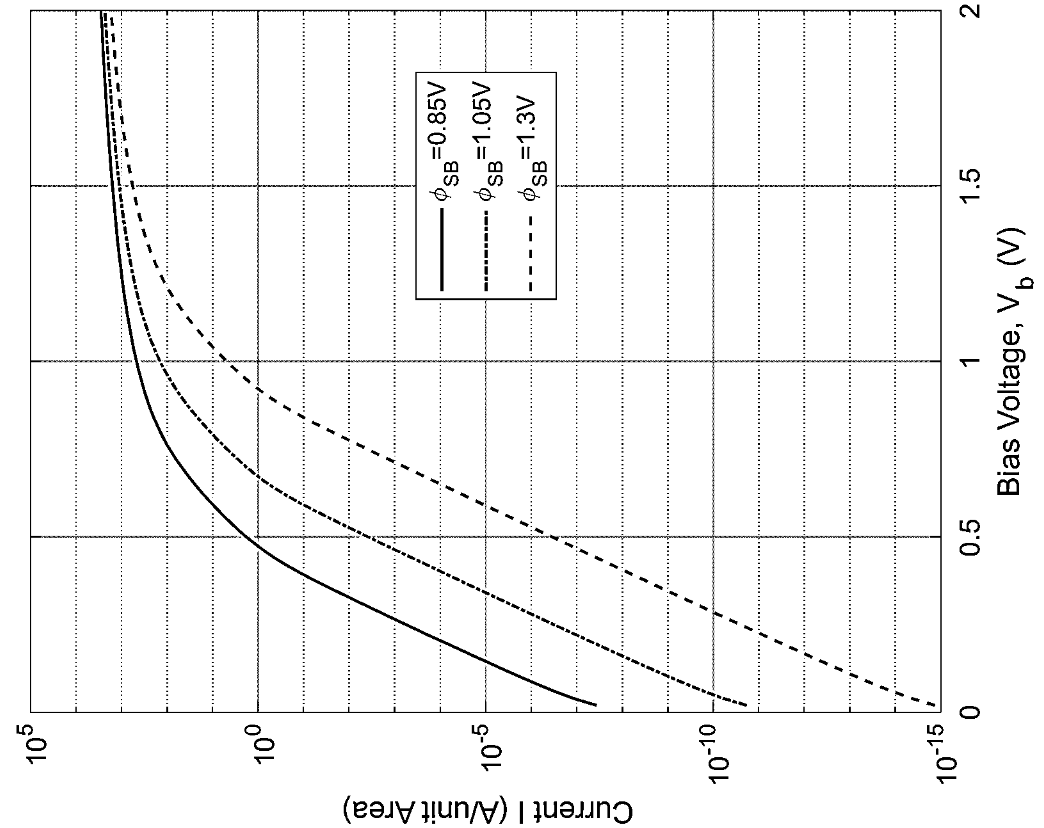

FIGS. 65, 66A and 66B show the effect of surface modification to the β-$Ga_2O_3$ (−201) drift layer for a device similar to that shown in FIG. 9B using a Ni metal contact. A neutral drift layer surface will result in SB potential of $\phi_{SB}$=1.05 eV, a depleted surface will have a high barrier at the heterointerface $\phi_{SB}$=1.3 eV, whereas the surface charge accumulated case will result in $\phi_{SB}$=0.85 eV. The results of the forward bias I-V are shown in FIG. 66A (semilog) and 66B (linear) plots.

The plots show that the surface state of the post growth drift layer directly influences the turn-on voltage and sub-threshold slope of the diodes.

Figure 67:
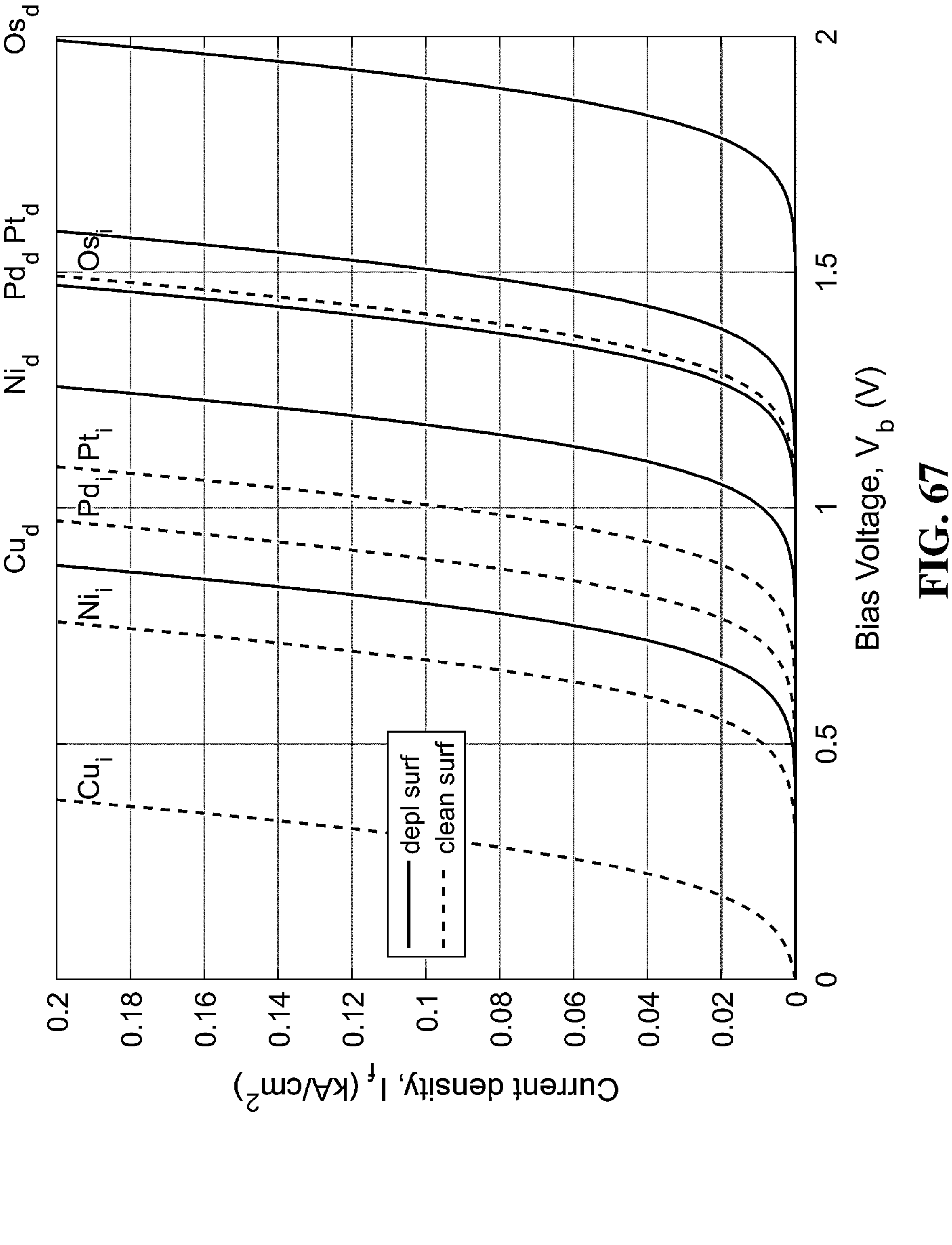
FIG. 67 is a plot of the forward bias I-V curves calculated for a series of Schottky barrier diodes comprising [high work function metals/β-$Ga_2O_3$/4H—SiC] with two cases of surface modification (clean and depleted) of the β-$Ga_2O_3$ semiconductor and the effect on the turn-on voltage of the diode, in accordance with some embodiments.

Comparing 'clean' and 'depleted' surfaces of a β-$Ga_2O_3$ (−201) drift layer with a range of high work function metals for the device structure similar to that shown in FIG. 9B (but with different contact metal) is shown in FIG. 67. A clean surface is treated with hydrogen at elevated temperatures, whereas the depleted surface is annealed in oxygen.

FIG. 67 shows the large variation in the possible forward I-V curves for the various high work function metals when deposited upon the two types of surfaces (depleted or clean). This helps explain the variation in experimental results for various devices and processing methods.

Figure 68A:
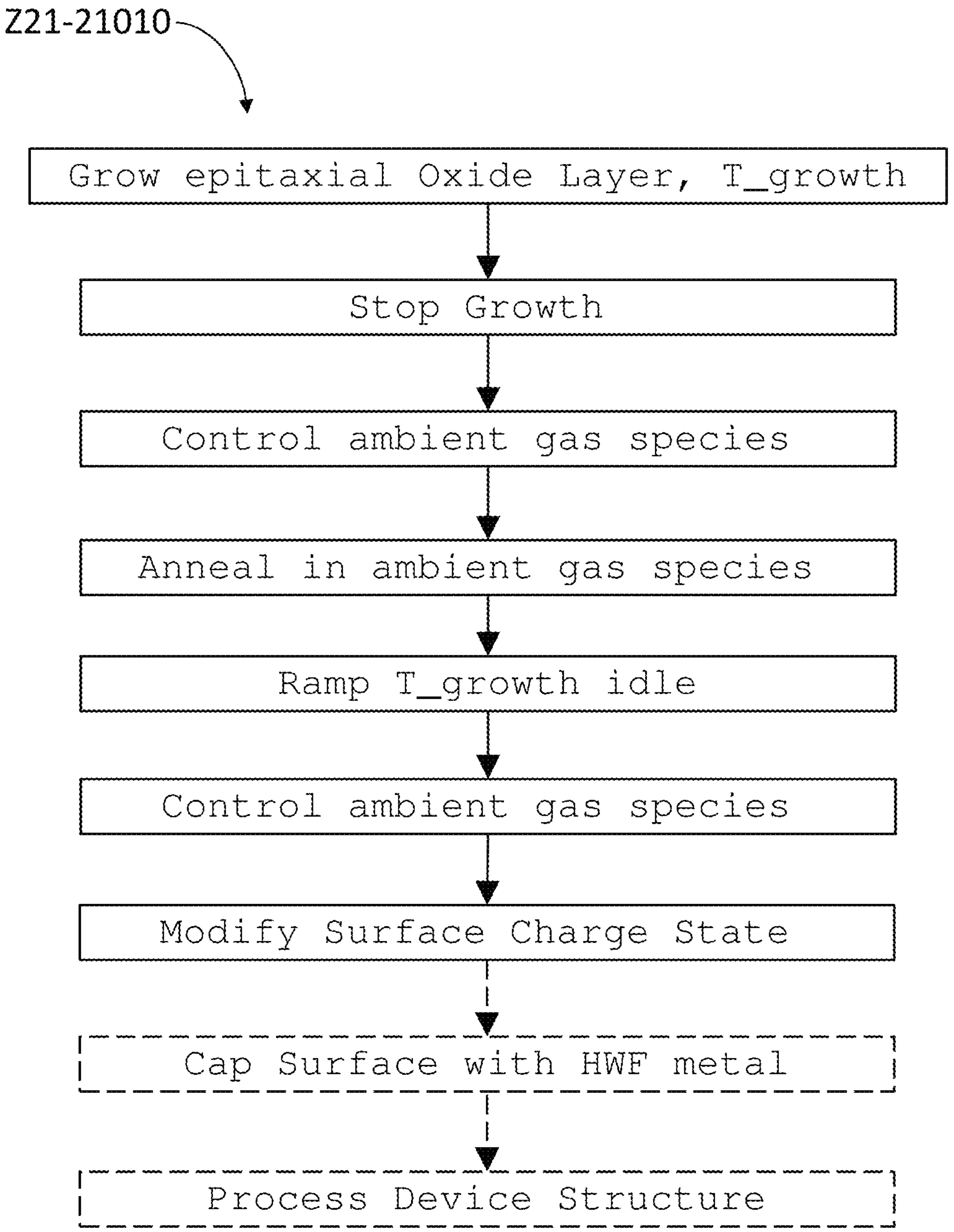
FIG. 68A is an example process flow sequence for the fabrication of an oxide semiconductor region followed by a surface modification which is then capped advantageously by a high work function metal, in accordance with some embodiments.
Figure 68B:
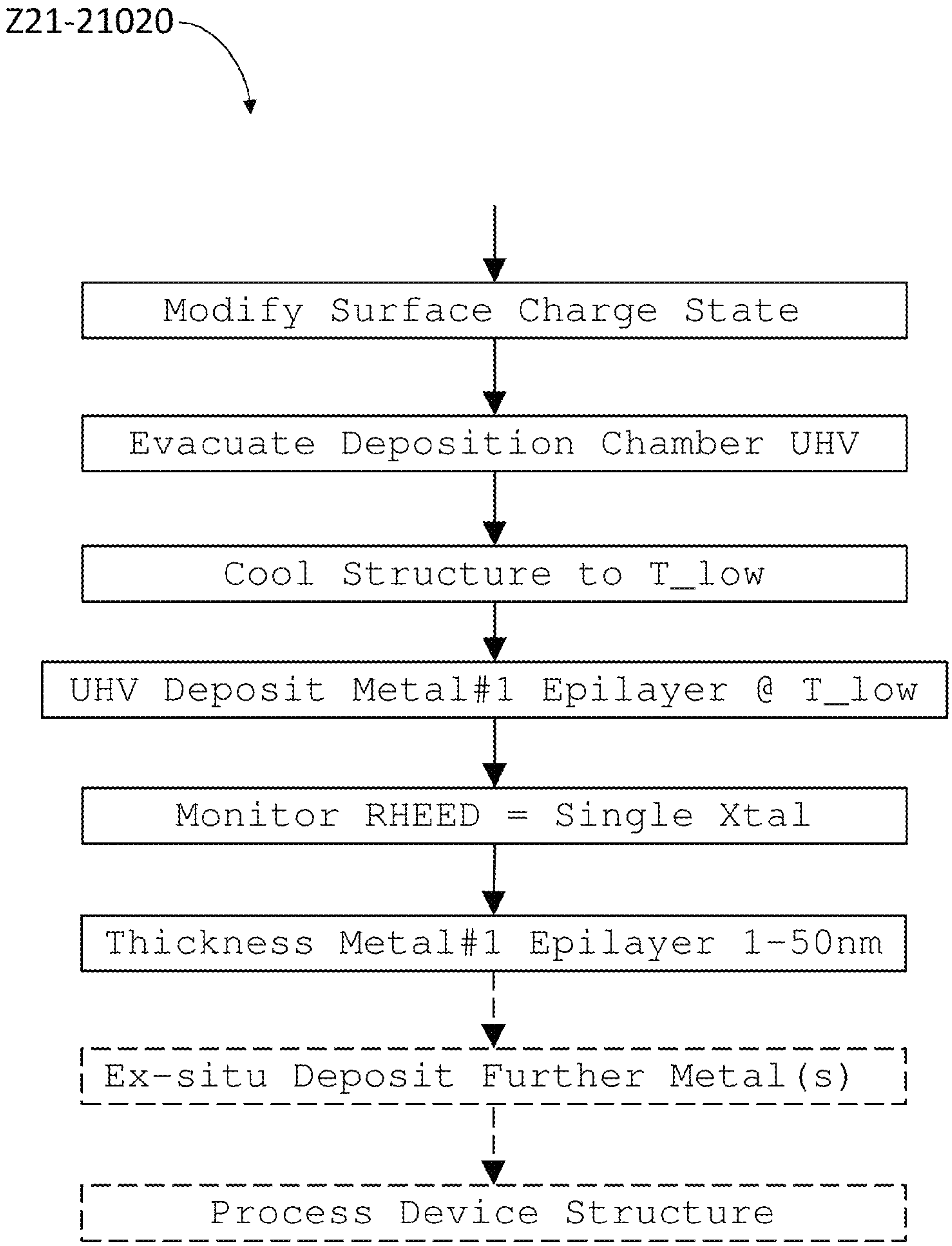
FIG. 68B is an example process flow sequence for the fabrication of an in-situ deposition of a first metal layer on a modified surface of an epitaxial oxide layer, followed by further processing steps, in accordance with some embodiments.

FIGS. 68A and 68B show example process flows for the manipulation of the surface charge state of a final surface of an epitaxial oxide layer. An epitaxial oxide layer is grown in a highly oxidizing environment by design to form the metal oxide composition and at a high growth temperature T_growth. Post epilayer growth the metal source is abruptly removed from growth region, shown as the step 'Stop growth'. The oxygen and active oxygen species in the growth chamber may be in the range of 1e−6 to 1e−4 torr and takes a finite time to evacuate from the chamber such that the epilayer surface is not substantially interacting. The substrate may be cooled at a ramp rate to a cooler temperature or a hotter temperature. In one example the growth temperature is reduced to a lower idle value while the ambient gas environment is substantially oxygen.

In this example, the epilayer surface may be modified to exhibit a depleted surface charge density. In another example, once the epilayer growth is stopped then oxidizing gas is removed and replaced with an alternate gas species or none. An alternate gas species may be nitrogen or argon such that the surface does not substantially interact with the gas while ramping to idle. In another example, the epilayer post growth is held at a high temperature or lower temperature while replacing the chamber gas with a non-oxidizing hydrogenic species, such as hydrogen, forming gas or hydrogen plasma, or methane, as well as others. In other examples, the surface may be subjected to hydrogen and oxygen or hydrogen peroxide or a hydrocarbon. During the ramp to idle the hydrogenic specie may be maintained or pumped out.

After the surface charge state is achieved, the epilayer article may be transferred to another chamber under vacuum or remain in the growth chamber for a subsequent in-situ direct metal deposition. Metal deposition may be a high work function metal that is deposited directed onto the charge state modified surface of the epilayer. In one example a Nickel effusion source is used to deposit pure Ni in UHV environment directly onto the β-$Ga_2O_3$ (−201) surface. In an example, the Ni may be epitaxial and form a Ni(111) oriented first metal layer directly on the hexagonal β-$Ga_2O_3$ (−201) surface. The electronic surface charge of the β-$Ga_2O_3$ (−201) can be preserved with the in situ Ni(111) cap. Subsequent ex-situ processing may deposit further metal(s) to increase the thickness of the contact layer for mechanical strength and/or increased conductivity.

In some cases, a Ni-oxide layer can be formed directly on the oxygen terminated β-$Ga_2O_3$ (−201) surface followed by a Ni metal cap.

Figure 69:
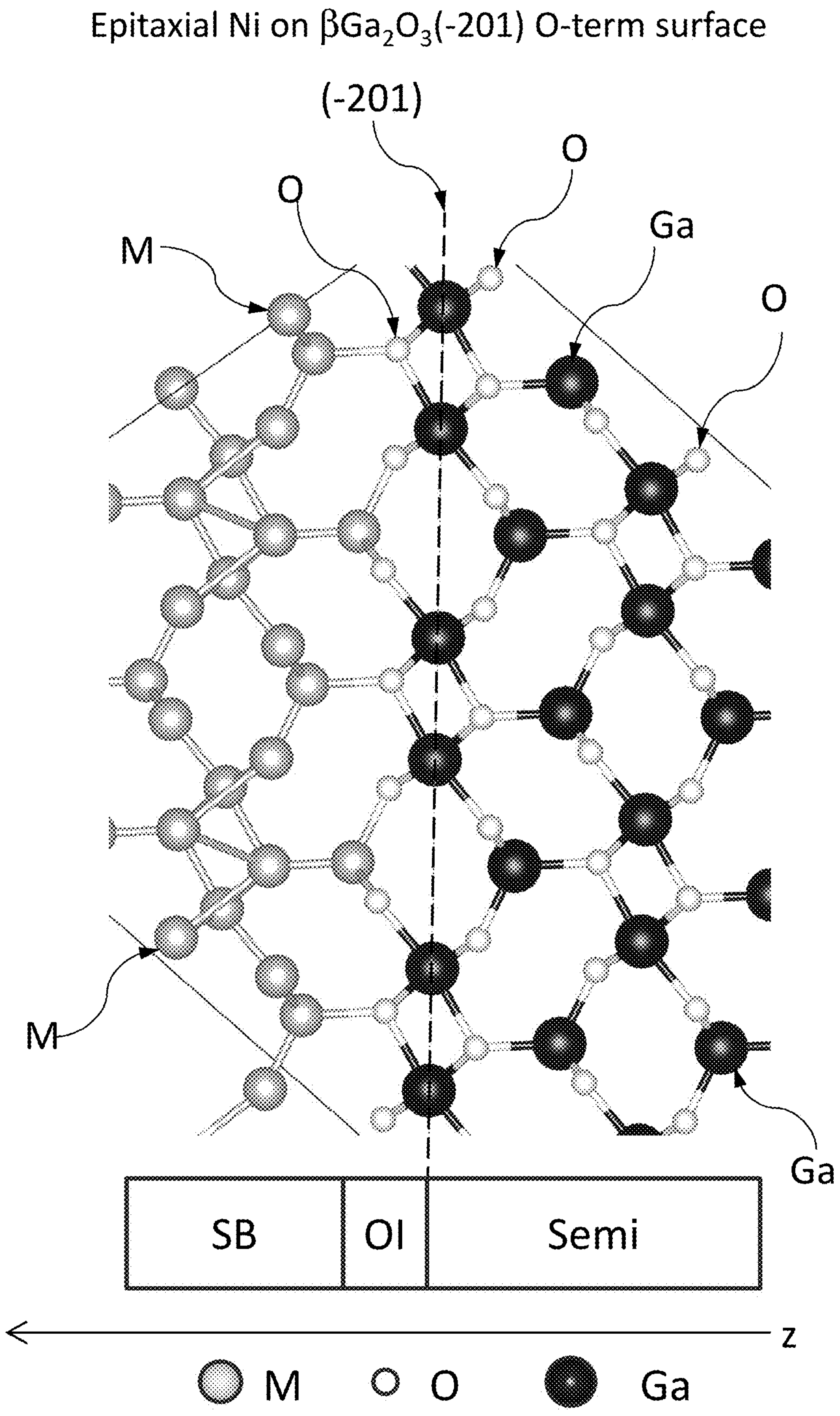
FIG. 69 shows possible atomic arrangements in the vicinity of a metal-oxide heterojunction, where a surface portion of a single crystal β-$Ga_2O_3$ region with an epitaxial coordination of an epitaxial metal region is shown with an interfacial oxygen termination layer, in accordance with some embodiments.

FIG. 69 describes the epitaxial Ni metal contact layer (SB) deposition directly onto the semiconducting β-$Ga_2O_3$ (−201) surface ("Semi"). A monolayer of oxygen (OI) can be used on the O-terminated surface to form linking bonds to the Nickel (M) metal contact (SB). In some cases, a thick intentional deposition of NiO can be formed followed by the Ni metal cap. Structures similar to the structure shown in FIG. 69 are also possible. In some cases, any of the metal materials used for the Schottky metal described herein can form an oxide at the interface between the drift layer and the Schottky metal layer. For example, any of the metal materials in FIG. 11A can form an oxide containing the metal species and oxygen (e.g., $PtO_2$) at the interface between a drift layer (e.g., including $Ga_2O_3$ or other epitaxial oxide material) and a layer of the metal (the Schottky contact). In some cases, the oxide of the metal forming the Schottky barrier can form the intermediate layer, as described herein. In some cases, the oxide of the metal forming the Schottky barrier can be thicker than the example shown in FIG. 69. For example, it can have a thickness in the range of the intermediate layers described herein.

The devices, structures and methods described herein can include in-situ single crystal Ni(111) oriented films directly deposited on the $\beta$-$Ga_2O_3$ (−201) surface at low temperatures and high vacuum <1e−8 torr.

There are also many other possible configurations for implementing intermediate layers (IL) or drift layers comprising UWBG oxide compositions.

FIGS. 70A-70G show an experimental example of an epitaxial structure comprising an epitaxial $\beta$-$Ga_2O_3$ (−201) layer formed on a SiC(0001) substrate, and an epitaxial Ni (111) layer. The Ni(111) layer in this example was 20 nm thick. The epitaxial structure in this example was formed using MBE using the techniques described herein, for example as described in methods Z10G-10000 in FIG. 57G, or Z21-21010 and Z21-21020 in FIGS. 68A-68B.

Figure 70A:
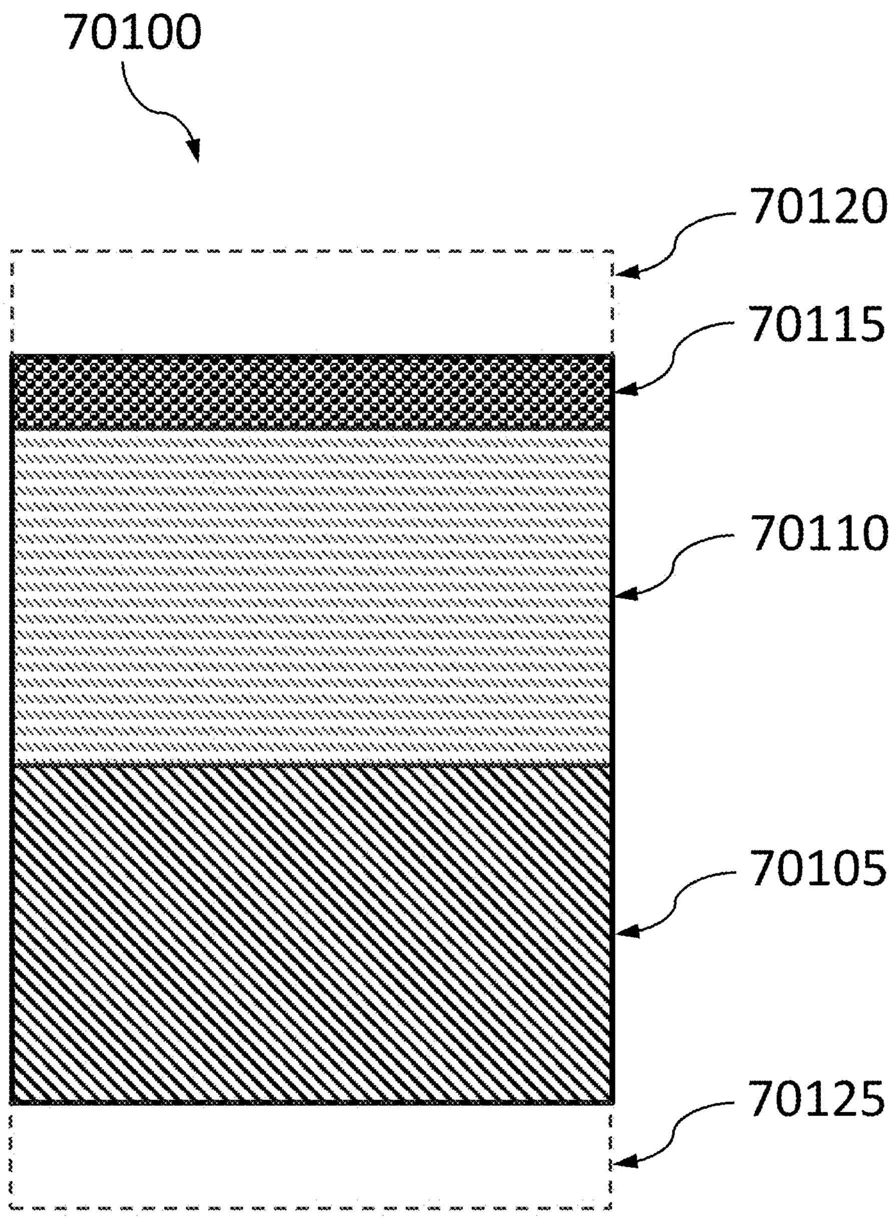
FIG. 70A depicts schematically a multilayered epitaxial structure comprising a SiC substrate, an epitaxial semiconducting oxide layer, and an epitaxial metal layer, in accordance with some embodiments.

FIG. 70A depicts schematically a multilayered epitaxial structure 70100 comprising a SiC substrate 70105, an epitaxial semiconducting oxide layer 70110, an epitaxial metal layer 70115, an optional further contact layer 70120 to the metal layer 70115, and an optional contact layer 70125 to the substrate 70105.

Figure 70B:
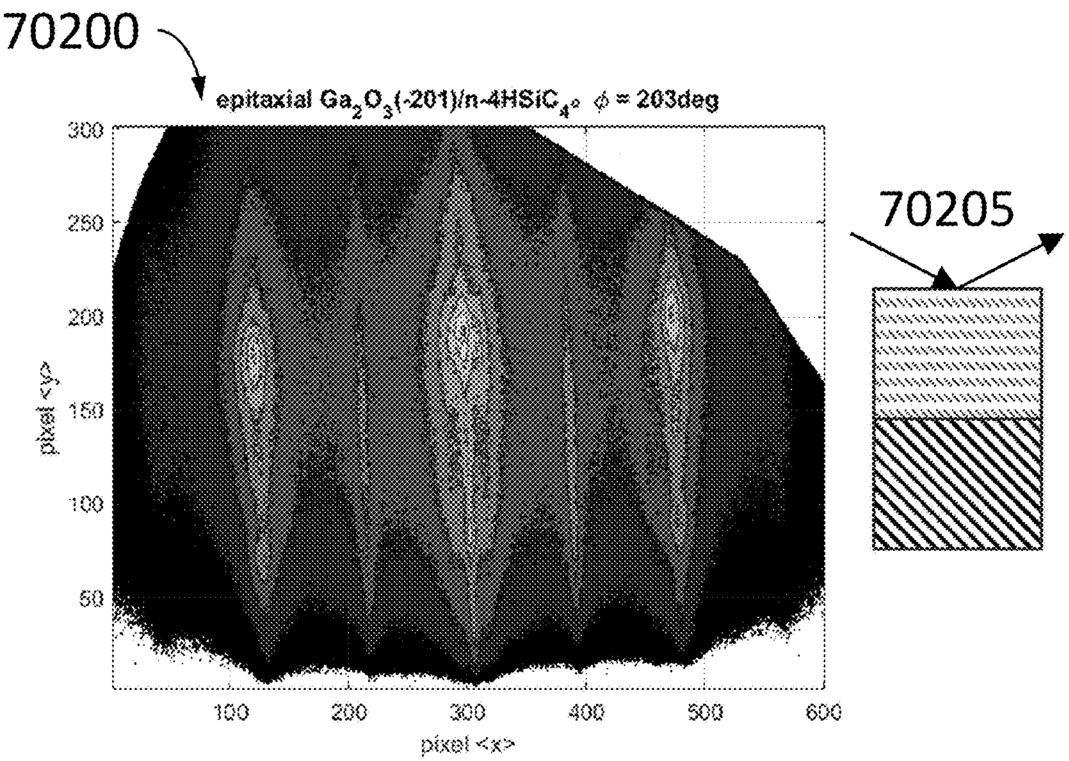
FIGS. 70B-70E show RHEED images of a high symmetry surface diffractogram of the structure of FIG. 70A, in accordance with some embodiments.

FIG. 70B shows a RHEED image 70200 of a high symmetry surface in-plane azimuth ($\phi$=203°) diffractogram of structure 70205, which includes a single crystal epitaxial $\beta$-$Ga_2O_3$ (−201) oriented layer at the top surface, which was formed on a 4-degree miscut n-type Si-polar 4H polytope SiC(0001) substrate. The single crystal high quality oxide film is evidenced by the elongated and thin RHEED streaks in FIG. 70B.

Figure 70C:
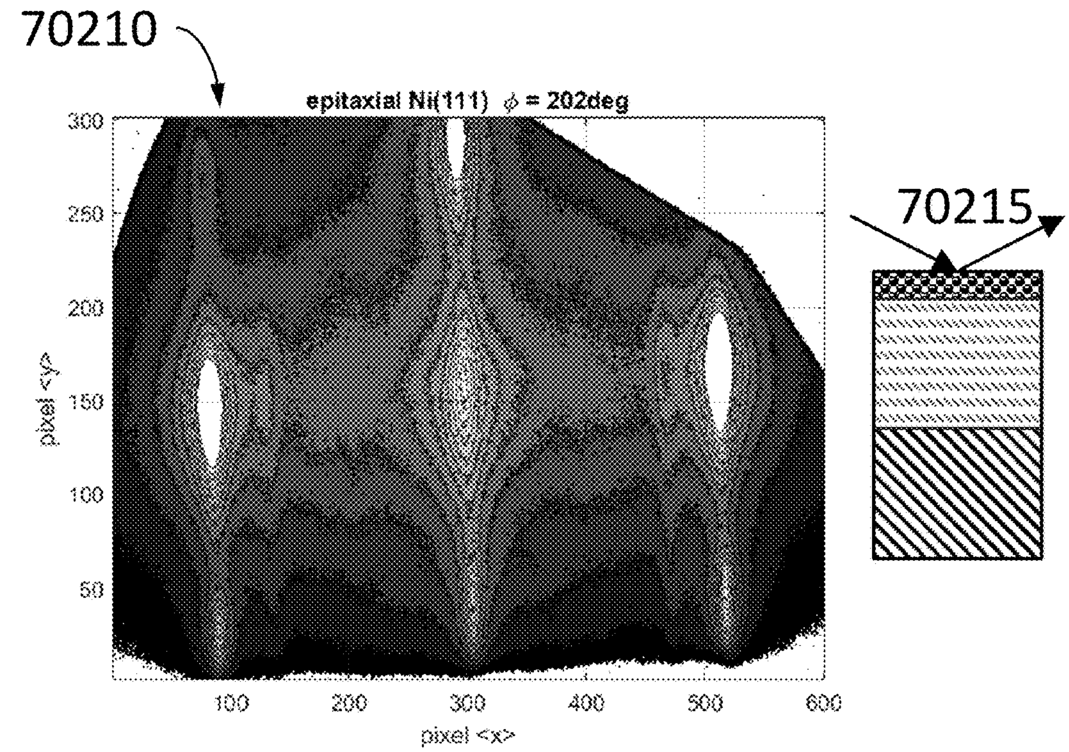

FIG. 70C shows a RHEED image 70210 of the same high symmetry surface in-plane azimuth ($\phi$=203°) for a diffractogram of structure 70215, which includes a single crystal epitaxial metal Ni(111) oriented layer at the top surface, which was deposited directly upon the single crystal epitaxial $\beta$-$Ga_2O_3$ (−201) oriented surface of structure 70205. The single crystal high quality metal film is evidenced by the elongated and thin RHEED streaks in FIG. 70C.

Figure 70D:
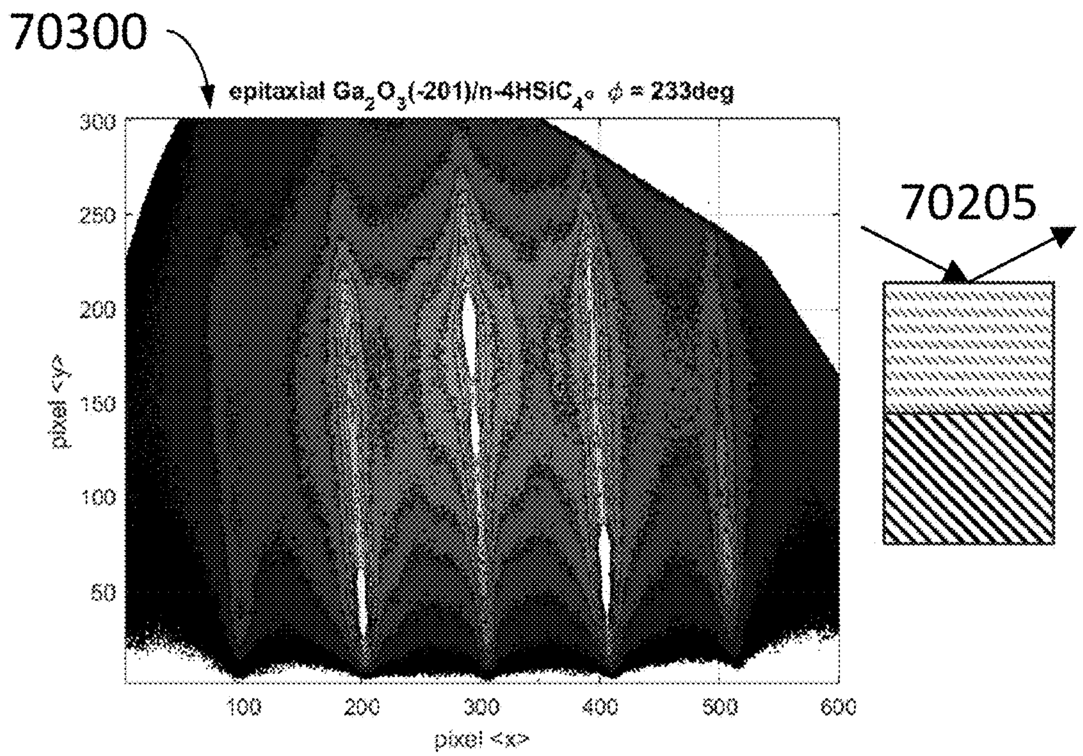

FIG. 70D shows a RHEED image 70300 of a high symmetry surface in-plane azimuth ($\phi$=233°) diffractogram of the same structure 70205 of FIG. 70B, which includes the single crystal epitaxial $\beta$-$Ga_2O_3$ (−201) oriented surface deposited directly upon a 4-degree miscut n-type Si-polar 4H polytope SiC(0001) substrate. The single crystal high quality oxide film is again evidenced by the elongated and thin RHEED streaks as shown.

Figure 70E:
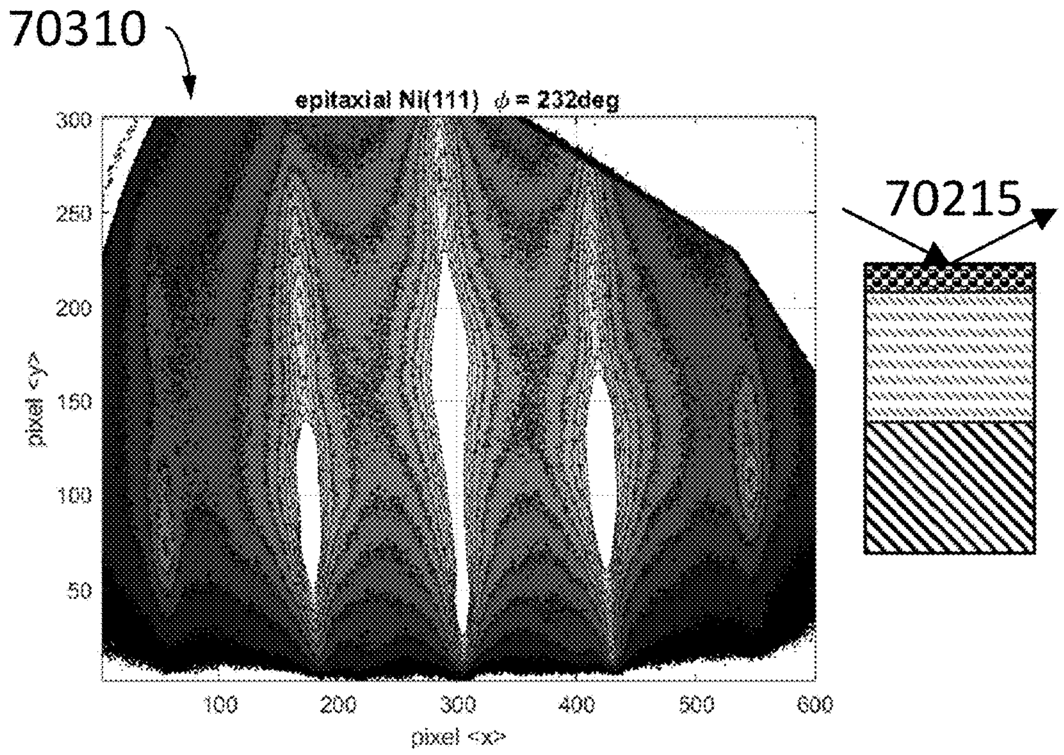

FIG. 70E shows a RHEED image 70310 of the same high symmetry surface in-plane azimuth ($\phi$=233°) diffractogram of the structure 70215, which includes a single crystal epitaxial metal Ni(111) oriented surface deposited directly upon the single crystal epitaxial $\beta$-$Ga_2O_3$ (−201) oriented surface of structure 70205. The single crystal high quality metal film is again evidenced by the elongated and thin RHEED streaks as shown.

The RHEED results shown in FIGS. 70C and 70E confirm that the periodicity of the surface azimuth RHEED diffractograms occurs every $\Delta\phi$=60°, which is indicative of a Ni(111) oriented film comprising a face-centered cubic crystal.

Figure 70F:
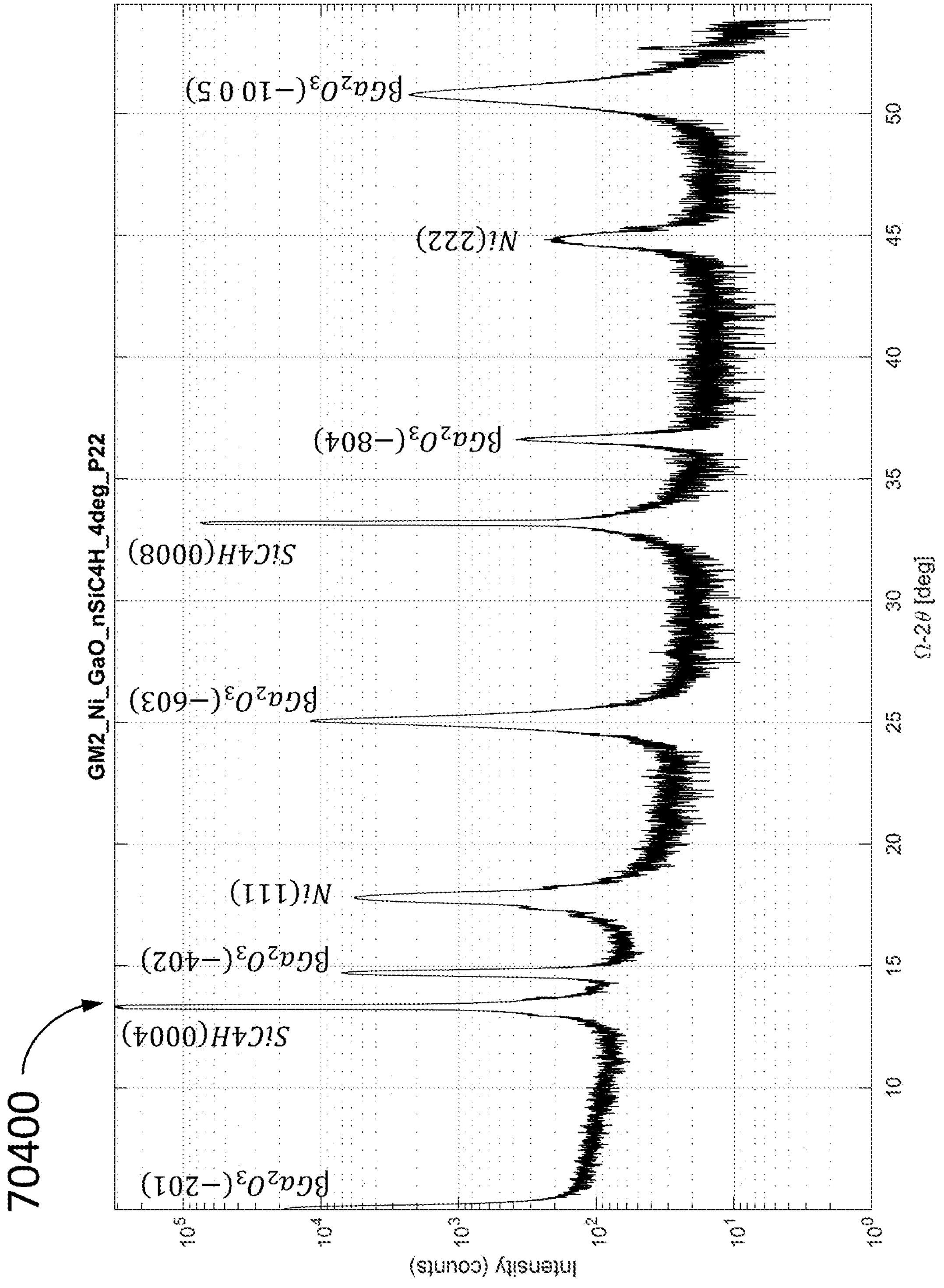
FIGS. 70F-70G respectively show a wide angle x-ray diffraction plot and a high-resolution x-ray diffraction plot for the completed multilayered structure of FIG. 70A, in accordance with some embodiments.
Figure 70G:
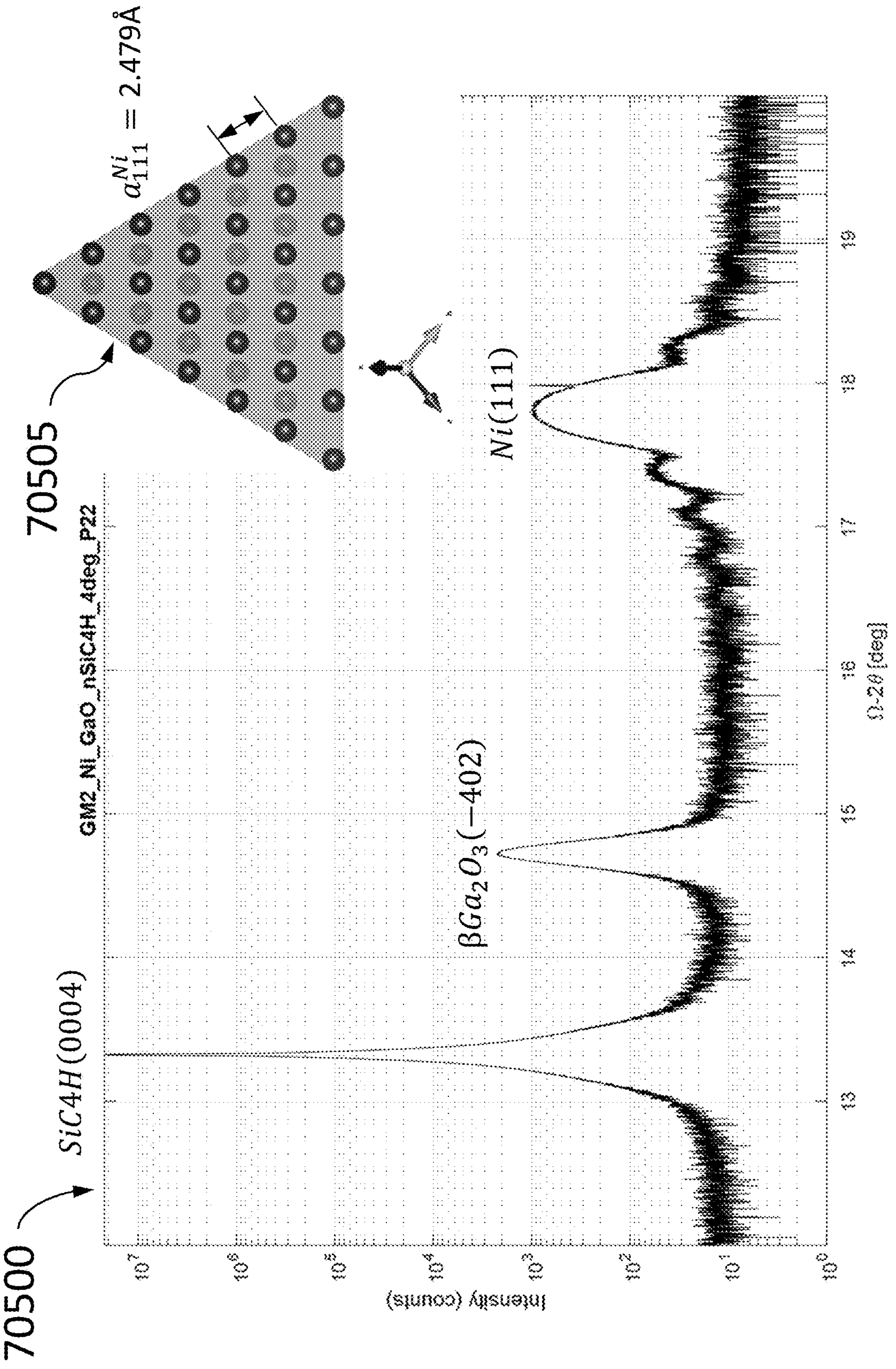

FIGS. 70F and 70G respectively show a wide angle x-ray diffraction plot 70400 and a high-resolution x-ray diffraction plot 70500 for the completed multilayered structure 70215 comprising epitaxial Ni(111), which was formed on an epitaxial $\beta$-$Ga_2O_3$(−201) layer, which was formed on an Si-polar 4H polytope SiC(0001) substrate. Inset 70505 shows an atomic structure of a Ni(111) oriented surface. The high resolution x-ray diffraction plot 70500 in FIG. 70G includes thickness fringes for the Ni(111) peak, which shows the high quality of the interfaces and the low amount of surface roughness of the structure 70215.

These RHEED and x-ray diffraction results in FIGS. 70B-70G clearly show phase pure (or single phase) semiconducting oxide and Ni-metal Bragg diffraction patterns, indicating a coherent epitaxial relationship between the deposited layers.

FIGS. 71A, 71B, 72 and 73 disclose a range of suitable UWBG semiconducting oxide compositions that are possible and advantageous for increasing the performance of high electrical power devices and diodes.

In general, any of the materials described herein (e.g., any of the compositions of Materials 1-7, $(Mg_xZn_{1-x})(Al_yGa_{1-y})_2O_4$ where 0≤(x,y)≤1 or $(Mg_xNi_{1-x})_z(Al_yGa_{1-y})_{2(1-z)}O_{3-2z}$, where 0≤(x, y, z)≤1, or $(Ni_zMg_xZn_{1-x-z})(Al_yGa_{1-y})_2O_4$ where 0≤(x,y,z)≤1, or $(Zn_pMg_xNi_{1-x-p})_z(Al_yGa_{1-y})_{2(1-z)}O_{3-2z}$, where 0≤(p, x, y, z)≤1) can be used for the drift layers, intermediate layers, and other layers of the devices, structures and methods described herein.

Figure 71A:
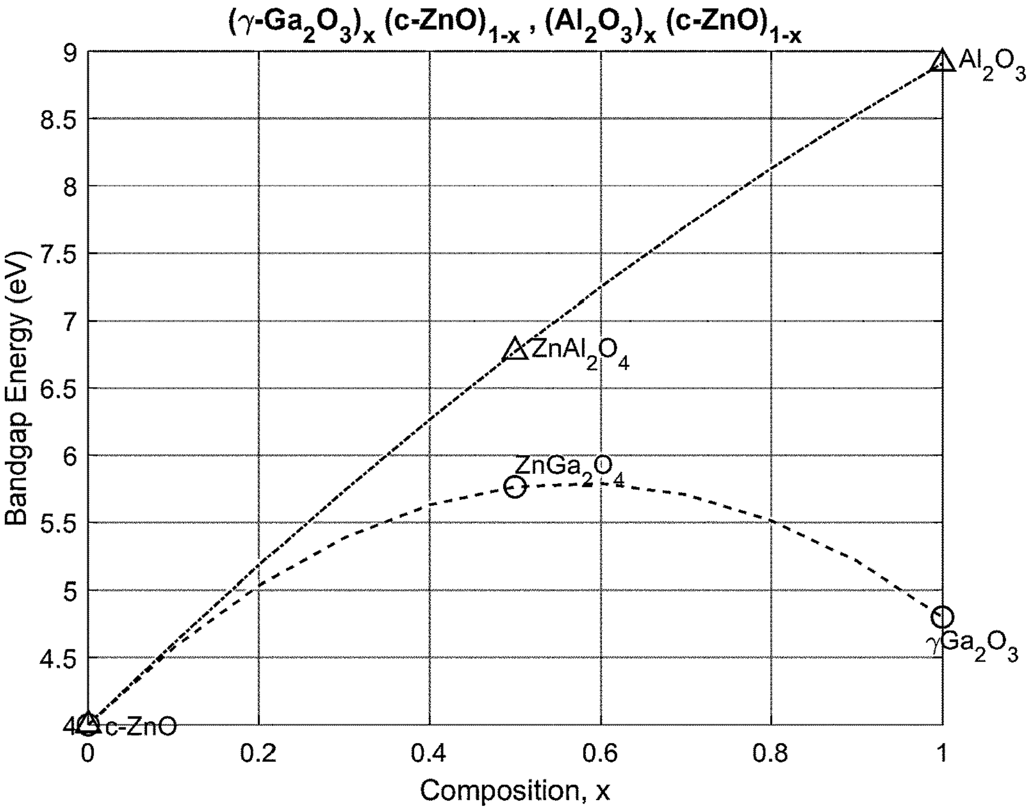
FIG. 71A plots the variation of bandgap energy versus composition for binary and ternary compositions of the form $(Ga_2O_3)_x(ZnO)_{1-x}$ and $(Al_2O_3)_x(ZnO)_{1-x}$ which are suitable for integration with the vertical multilayered semiconductor devices disclosed herein, in accordance with some embodiments.

For example, FIG. 71A discloses the bandgap range possible for compositions of the form of Zinc-Gallium-Oxide and Zinc-Aluminum-Oxide. The spinel structures $ZnGa_2O_4$ and $ZnAl_2O_4$ exhibit SG=Fd3m and deposit as (111)-oriented films on $\beta$-$Ga_2O_3$(−201) or C-plane 4H—SiC.

Figure 71B:
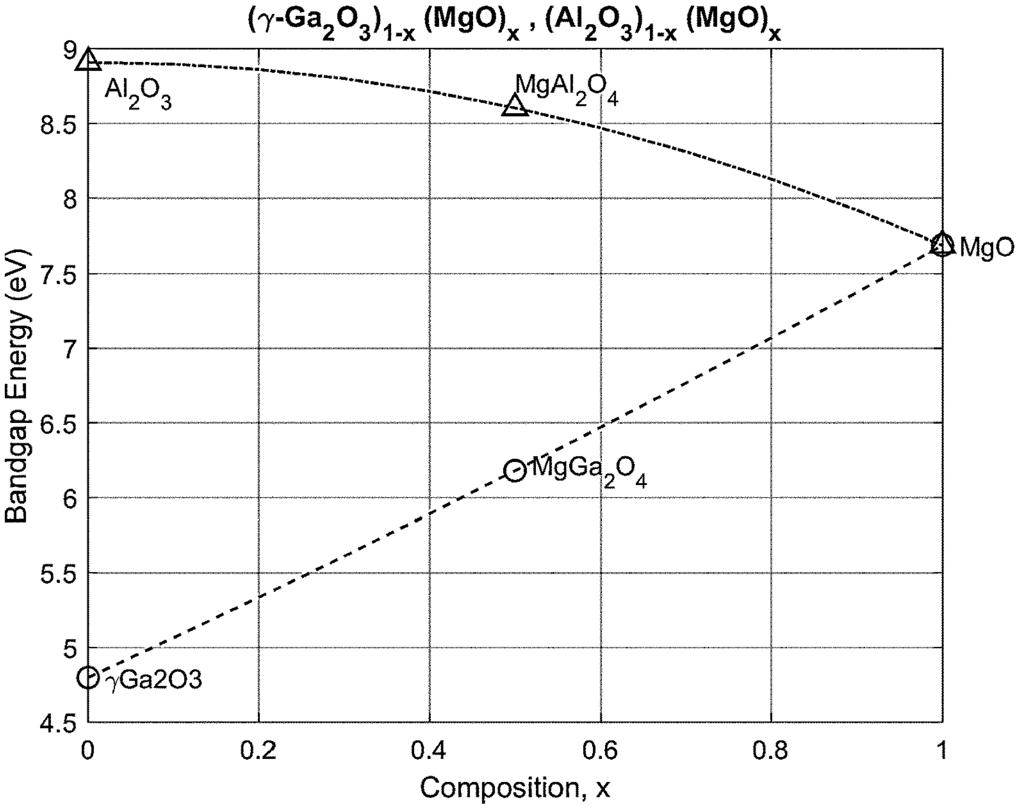
FIG. 71B plots the variation of bandgap energy versus composition for binary and ternary compositions of the form $(Ga_2O_3)_x(MgO)_{1-x}$ and $(Al_2O_3)_x(MgO)_{1-x}$ which are suitable for integration with the vertical multilayered semiconductor devices disclosed herein, in accordance with some embodiments.

In another example, FIG. 71B discloses the bandgap range possible for compositions of the form of Magnesium-Gallium-Oxide and Magnesium-Aluminum-Oxide. The spinel structures $MgGa_2O_4$ and $MgAl_2O_4$ exhibit SG=Fd3m and deposit as (111)-oriented films on $\beta$-$Ga_2O_3$ (−201) or C-plane 4H—SiC.

Figure 72:
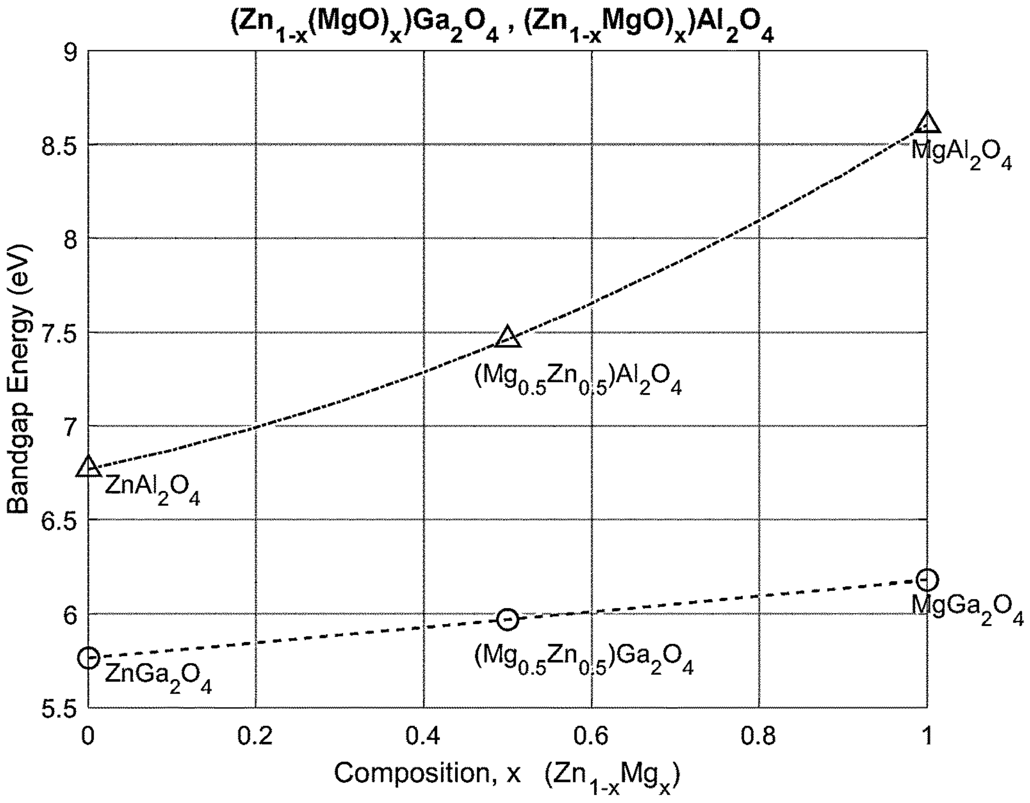
FIG. 72 plots the variation of bandgap energy versus composition for ternary and quaternary compositions of the form $(Zn_xMgO_{1-x})Ga_2O_4$ and $(Zn_xMgO_{1-x})Al_2O_4$ which are suitable for integration with the vertical multilayered semiconductor devices disclosed herein, in accordance with some embodiments.
Figure 73:
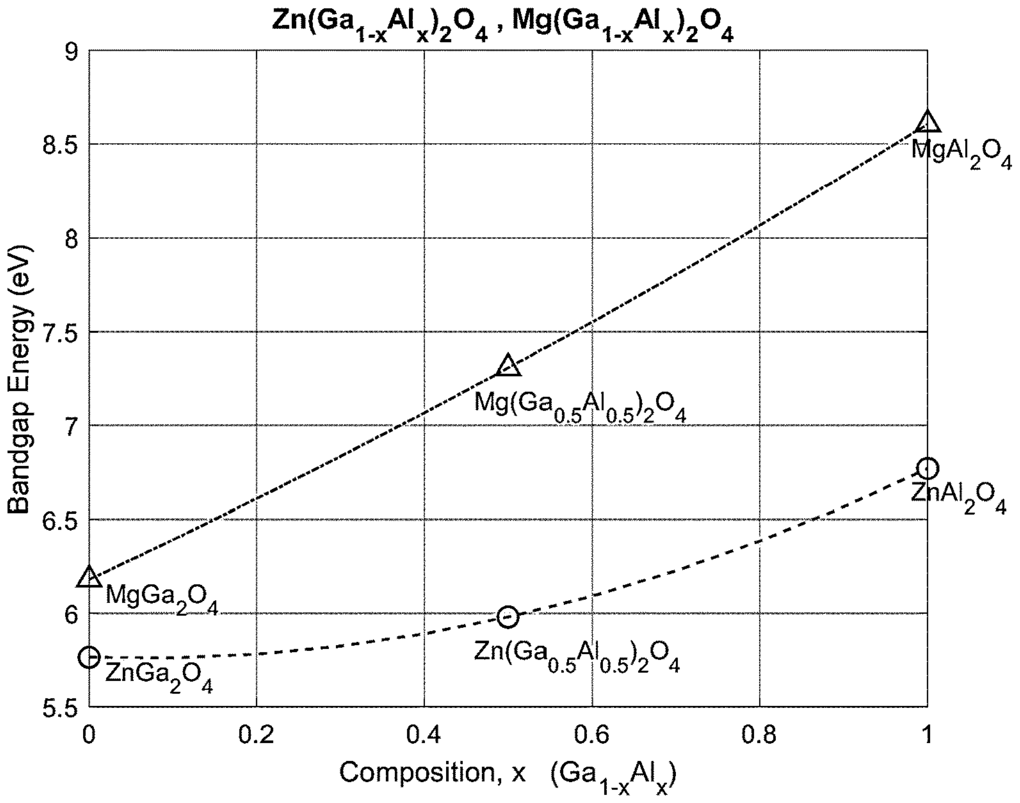
FIG. 73 plots the variation of bandgap energy versus composition for ternary and quaternary compositions of the form $(Al_xGaO_{1-x})_2ZnO_4$ and $(Al_xGaO_{1-x})_2MgO_4$ which are suitable for integration with the vertical multilayered semiconductor devices disclosed herein, in accordance with some embodiments.

In other examples, FIGS. 72 and 73 show quaternary composition of oxide materials that can be used for the drift layers, intermediate layers, and other layers of the devices, structures and methods described herein.

FIG. 73 shows the possible bandgap variation of magnesium-zinc-gallium-oxide and magnesium-zinc-aluminum-oxides.

Figure 74:
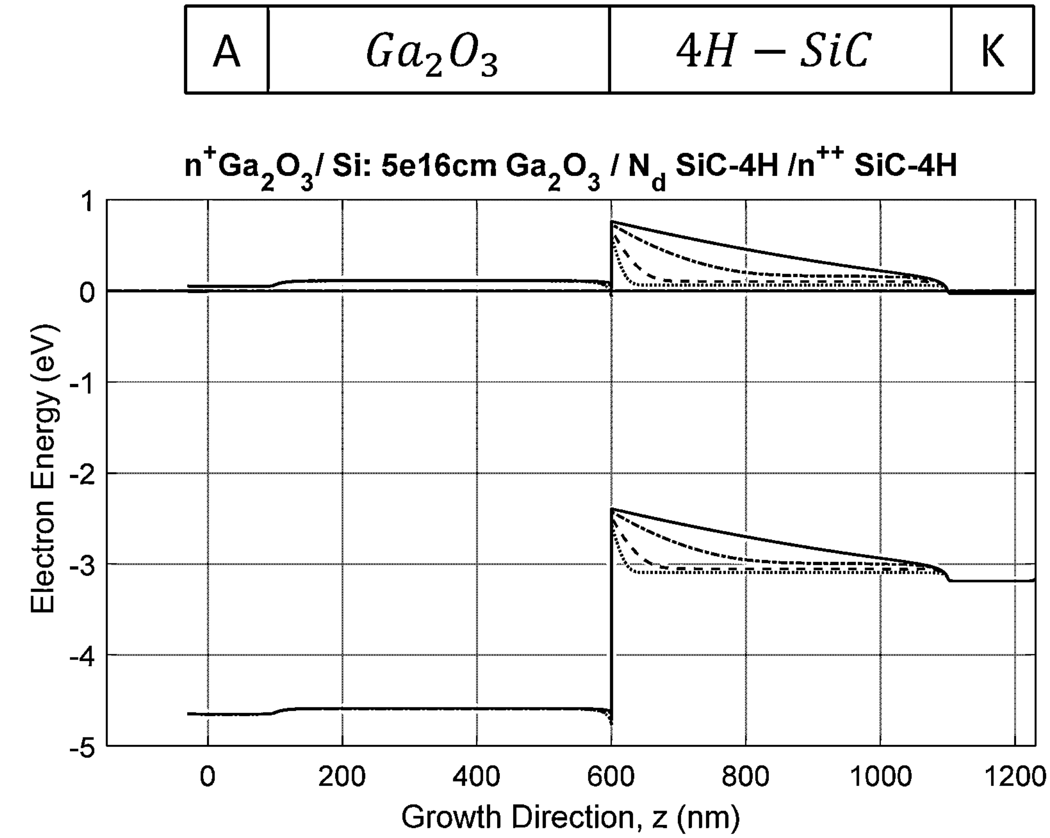
FIGS. 74 and 75 are spatial energy band diagrams for a [metal/n+$Ga_2O_3$/4H—SiC/metal] multilayered structure showing the effect of donor doping concentration within the 4H—SiC region, in accordance with some embodiments.

FIG. 74 shows the possible bandgap variation of magnesium-aluminum-gallium-oxide and zinc-aluminum-gallium-oxides.

In some cases, the drift layers, intermediate layers, and other layers of the devices, structures and methods described herein can include the spinel forms (SG=Fd3m) of $(Mg_xZn_{1-x})(Al_yGa_{1-y})_2O_4$ where 0≤(x,y)≤1 forming complex oxides can be realized as intrinsic p-type or n-type conductivity types (without impurity doping) thereby alleviating the need for impurity doping. In another form, the spinels can be deposited as (111)-oriented films on $\beta$-$Ga_2O_3$ (−201) or C-plane 4H—SiC.

In an example, $(Ni_zMg_xZn_{1-x-z})(Al_yGa_{1-y})_2O_4$ where 0≤(x, y, z)≤1, or $(Mg_xNi_{1-x})_z(Al_yGa_{1-y})_{2(1-z)}O_{3-2z}$, where 0≤(x, y, z)≤1 forming complex oxides (e.g., with the spinel forms (SG=Fd3m)) can be used as intrinsic, p-type, or n-type conductivity types (without impurity doping) in the structures and devices described herein, thereby alleviating the need for impurity doping. In another form, the spinels can be deposited as (111)-oriented films on β-$Ga_2O_3$ (−201) or C-plane 4H—SiC in the structures and devices described herein.

Other SG forms of $Ga_2O_3$ (e.g., α-phase or β-phase); $(Al_xGa_{1-x})_2O_3$ (e.g., α-phase or β-phase) where 0≤x≤1; $Mg_xGa_{2(1-x)}O_{3-2x}$ where 0≤x≤1; $Mg_xAl_{2(1-x)}O_{3-2x}$ where 0≤x≤1; $(Mg_xZn_{1-x})_z(Al_yGa_{1-y})_{2(1-z)}O_{3-2z}$ where 0≤x≤1, 0≤y≤1, and 0≤z≤1; $Zn_xGa_yO_z$ where 0≤x≤1, 0≤y≤1, and 0≤z≤1; $Zn_xAl_yO_z$ where 0≤x≤1, 0≤y≤1, and 0≤z≤1; $Mg_xGa_yO_z$ where 0≤x≤1, 0≤y≤1, and 0≤z≤1; $Mg_xAl_yO_z$ where 0≤x≤1, 0≤y≤1, and 0≤z≤1; $Ni_xGa_yO_z$ where 0≤x≤1, 0≤y≤1, and 0≤z≤1; $Ni_xAl_yO_z$ where 0≤x≤1, 0≤y≤1, and 0≤z≤1; $(Ni_xMg_{1-x})_yGa_{2(1-y)}O_{3-2y}$ where 0<x<1 and 0<y<1; or $(Mg_xNi_{1-x})_z(Al_yGa_{1-y})_{2(1-z)}O_{3-2z}$, where 0≤x≤1, 0≤y≤1, and 0≤z≤1, or $(Ni_zMg_xZn_{1-x}\text{-}z)\,(Al_yGa_{1-y})_2O_4$ where 0≤(x, y, z)≤1, or $(Zn_pMg_xNi_{1-x-p})_z(Al_yGa_{1-y})_{2(1-z)}O_{3-2z}$, where 0≤(p, x, y, z)≤1, can also be used in the materials, structures and devices described herein.

Yet another aspect of the heterojunction β-$Ga_2O_3$ (−201)/4H—SiC(0001) is disclosed, which relates to the doping density of the SiC.

Figure 75:
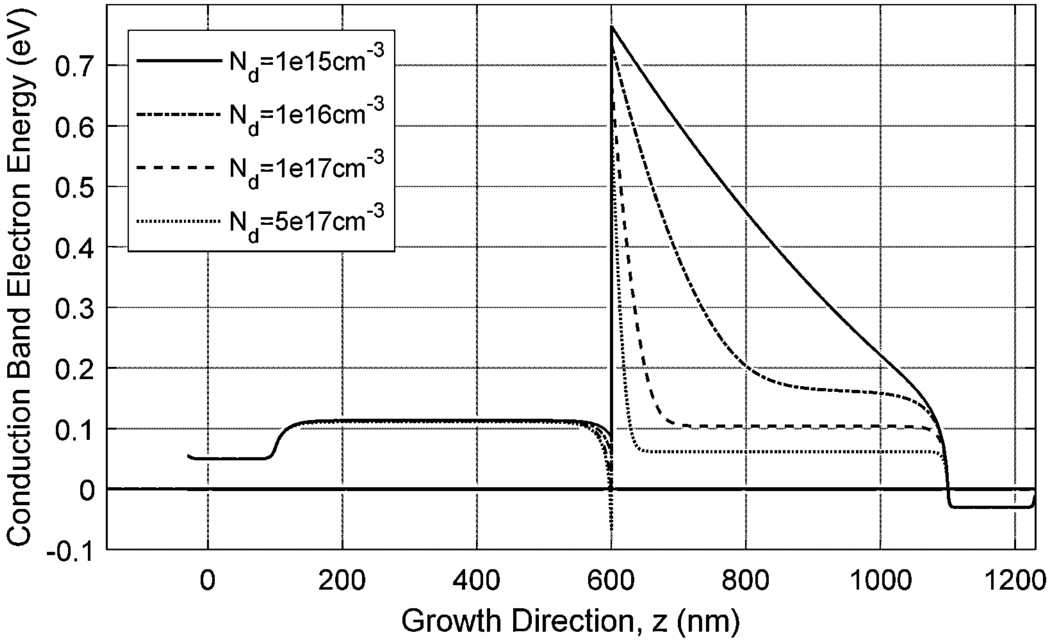

Consider the diode formed as shown in FIGS. 74 and 75 as structure 75-28010, showing an anode contact (A) and β-$Ga_2O_3$ (−201) epilayer deposited on Si-polar on-axis 4H—SiC(0001) layer or substrate with cathode contact (K). Consider further the oxide is n-type and doped to a concentration of 1e17 $cm^{-3}$, whereas the n-type doping concentration of the 4H—SiC layer is varied $$1e15 \le N_d^{SiC} \le 5e17\ \text{cm}^{-3}.$$

FIG. 74 shows the full conduction and valence band structure as a function of growth direction. The conduction band heterointerface is expanded in FIG. 75 showing the depletion effect at the junction extending into the SiC region. In this case, low $N_d^{SiC}$ generates a large potential barrier which can significantly impact device performance, for example in the diode structure in FIG. 9C.

Therefore, it can be advantageous to control the epitaxy process utilized to fabricate the structure to also control the doping density of the SiC (substrate or layer). For example, a highly conductive 4H—SiC substrate can be prepared for epitaxial oxide growth. While the SiC substrate is heated to the required growth temperature in vacuo, the surface of the SiC substrate may alter the surface charge density and desorb potential impurity dopants. This may significantly reduce the 4H—SiC surface donor density and therefore create a significantly wider depletion region extending into the SiC material. The result may be a higher ON-resistance for the diode and increased electrical losses.

In some cases, the SiC substrate is heated to the required growth temperature in an environment that avoids altering the surface charge density. For example, the SiC substrate may be heated in an inert environment, or under an Si flux, to prevent Si desorption.

It may not be fully appreciated by workers in the field that heterojunctions formed at the interface between two dissimilar Oxide materials may also form complex interactions. The Metal-[Oxide Semiconductor] junction may form a Schottky Barrier-type contact or Ohmic-type contact, as discussed above. Heterojunctions between two Oxides having dissimilar bandgap energies, composition, electron affinity and furthermore dissimilar dielectric constants directly affects the properties in the vicinity of the heterojunction.

Figure 76:
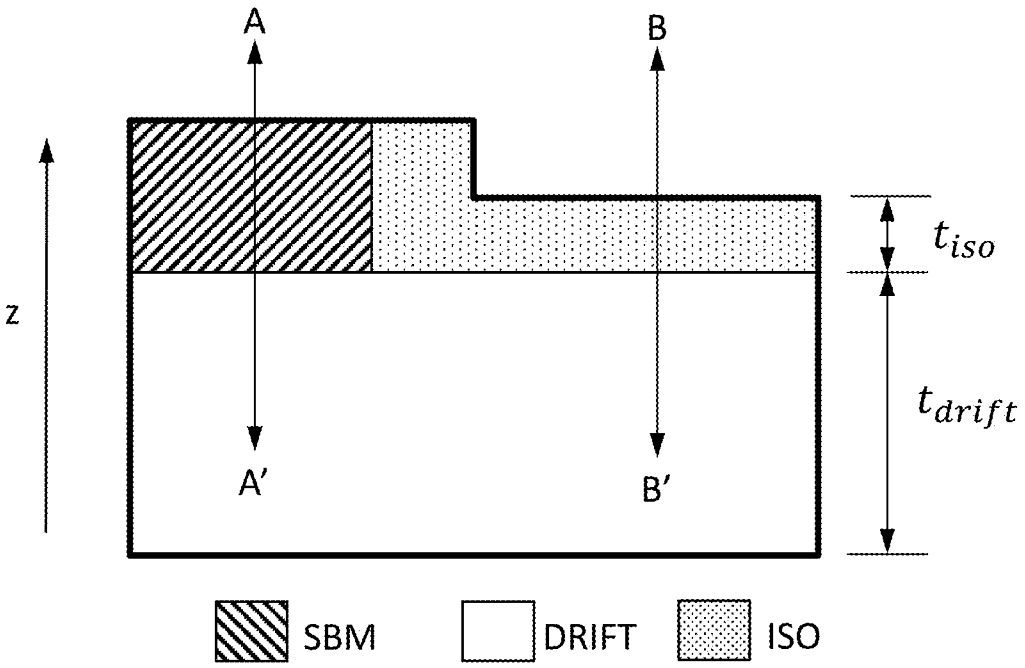
FIG. 76 is cross-section of a portion of a device comprising the region of an epitaxial oxide, Schottky metal contact and a dielectric isolation region, in accordance with some embodiments.

FIG. 76 shows the simplified cross-sectional physical structure of a drift oxide semiconductor with a portion of the drift oxide surface deposited with a metal along the A-A' direction parallel to the growth direction, z. Similarly, the isolation layer discussed above serving as the dielectric insulator between a field-plate and the oxide drift layer (refer to FIGS. 79-86) is also formed along a portion of the oxide drift surface along the direction B-B', as shown. The thickness of the isolation layer (ISO) $t_{iso}$ and the thickness of the drift layer $t_{drift}$ are indicated. Assuming the isolation layer further comprises an oxide material composition that possesses a wider bandgap energy than the drift layer oxide composition, such that, $E_{g1}<E_{g2}$, then the equivalent energy band diagram along the B-B' direction is shown in FIG. 77.

Figure 77:
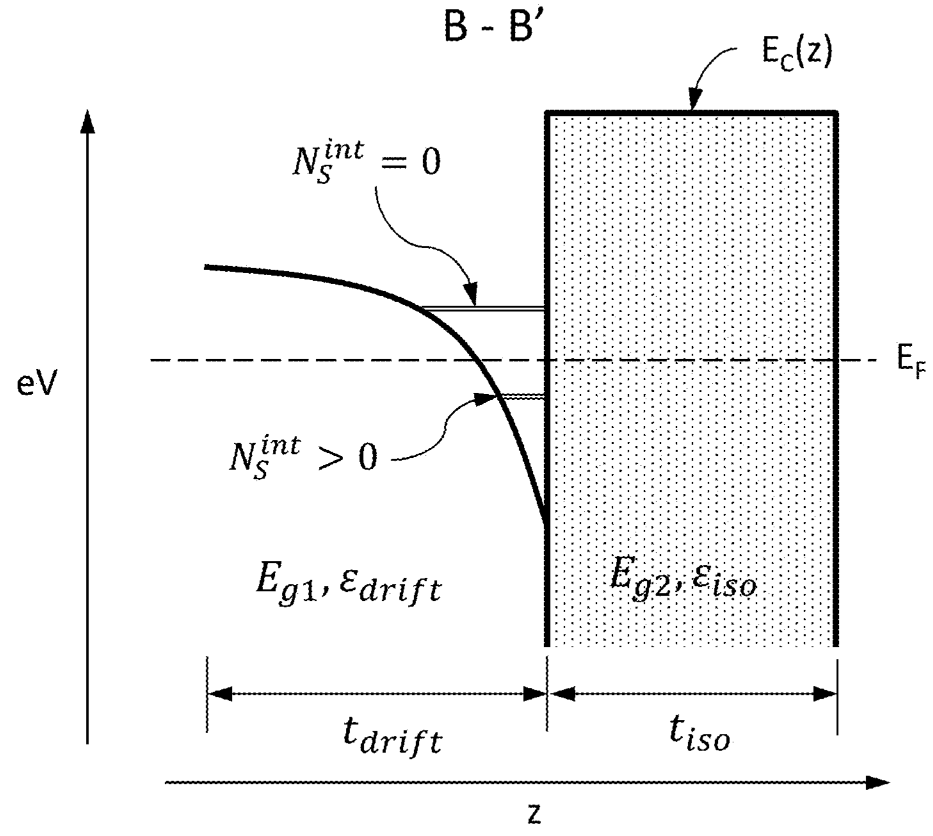
FIG. 77 is a plot of the spatial energy band diagram of the heterojunction formed between the oxide semiconductor drift and the dissimilar oxide or material region forming the isolation region, in accordance with some embodiments.

FIG. 77 is a plot of the spatial energy band diagram of the heterojunction formed between the oxide semiconductor drift and the dissimilar oxide or material region forming the isolation region. The left-hand side of the spatial conduction band diagram $E_C(z)$ corresponds to the drift layer and the right-hand side corresponds to the isolation layer, with the equilibrium Fermi energy $E_F$ position between two possible 1st electron quantized states in the inverted potential well located at the heterointerface.

If the $E_F$ is positioned above the 1st quantized electron state, then heterointerface two-dimensional electron gas may exist with a surface charge $N_s^{int}>0$, forming an interfacial negatively charged sheet. This charge sheet may be continuous or discontinuous depending on the surface roughness at the interface, however, this represents a surface leakage path that is disadvantageous for vertical conduction device operation. This may be utilized in a lateral transport device.

Conversely, if $E_F$ is positioned below the 1st quantized electron state then the heterointerface will not accumulate a surface charge $N_S=0$, and therefore may act as a suitable blocking barrier.

Yet a further aspect specific to interactions between abrupt interfaces between dissimilar oxide material compositions is the large variation in dielectric constant that is possible and the resulting large dielectric constant discontinuity $\Delta\varepsilon=\varepsilon_{drift}-\varepsilon_{iso}$ at the heterointerface. Dielectric confinement (deconfinement) effects are possible to increase (decrease) the Coulomb interaction between charge carriers located at or in the vicinity of the discontinuity.

For example, if the drift layer comprises a $Ga_2O_3$, and the isolation layer a low-k dielectric constant material then $\Delta\varepsilon=\varepsilon_{drift}-\varepsilon_{iso}>0$. Alternately, in another example, if the drift layer comprises a $Ga_2O_3$ and the isolation layer a high-k dielectric constant material then $\Delta\varepsilon=\varepsilon_{drift}-\varepsilon_{iso}<0$.

FIG. 78A tabulates the calculated static and optical dielectric constants for some example UWBG oxide materials suitable for incorporation into the present disclosure. For some materials there exist crystallographic direction dependent properties.

The concept of dielectric confinement and screening is treated herein by specific reference to a boundary between two slabs of oxide materials having dissimilar dielectric constants.

Figure 78B:
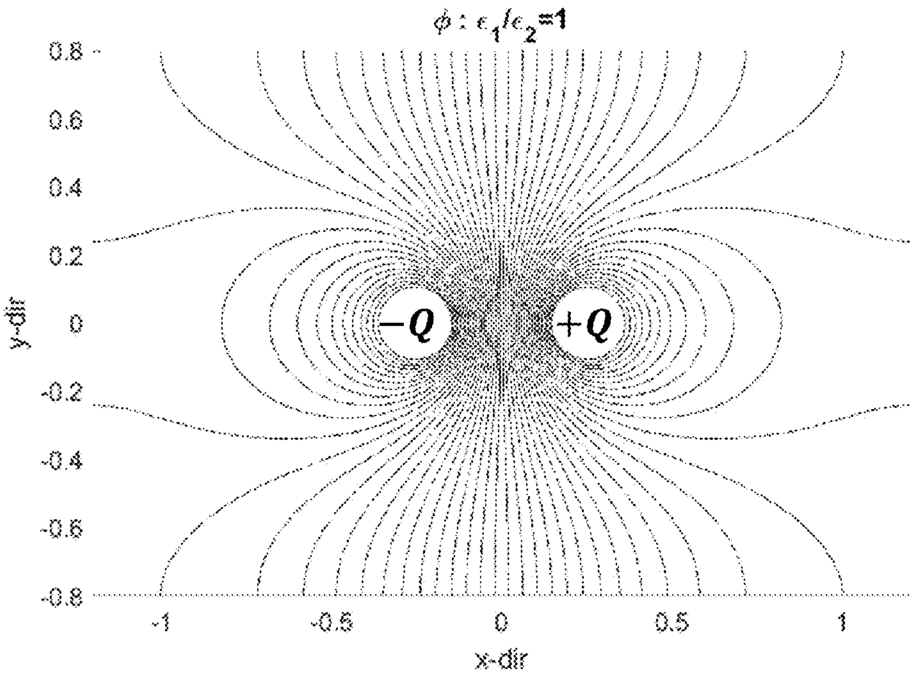
FIGS. 78B and 78C are models for electrostatic interaction between equal and opposite charges positioned separately within two different dielectric constants materials, in accordance with some embodiments.
Figure 78C:
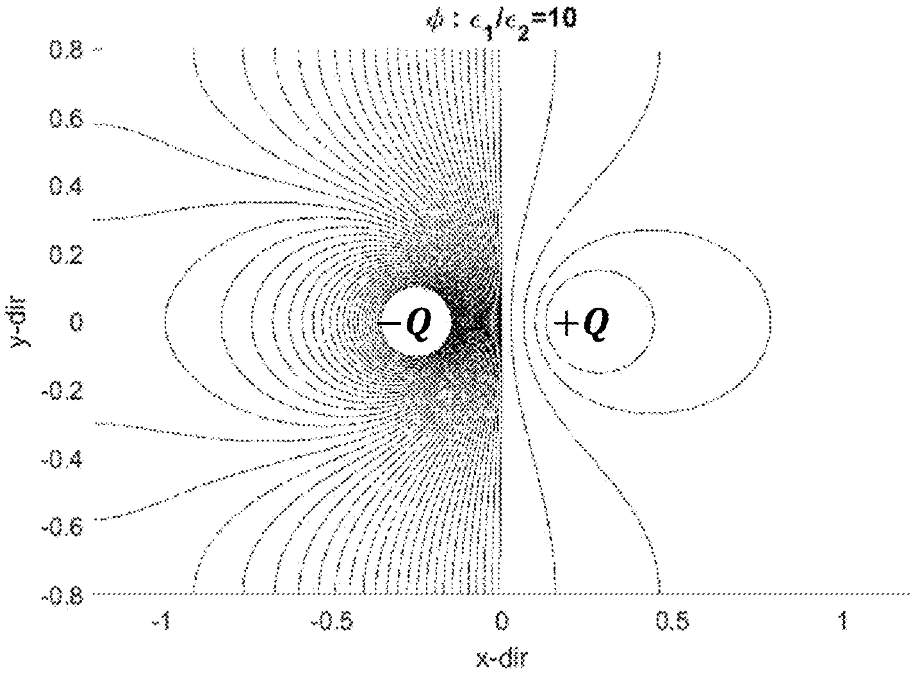

FIGS. 78B and 78C plot the electrostatic equipotential lines between two equal and opposite charge regions separated by a distance of 0.5 units in the x-direction and hosted in differing dielectric constants slabs of materials. FIG. 78B provides the case for equal dielectric constants between both the left-hand side ($\varepsilon_1$) and right-hand side ($\varepsilon_2$) slabs. The symmetric equipotential lines are shown. However, for the case where the ratio of $$\varepsilon_2/\varepsilon_1 = 1.$$

is shown in FIG. 78C the equipotential lines are highly asymmetric across the hetero-dielectric interface with the potential screened within the higher dielectric constant slab.

Figure 78D:
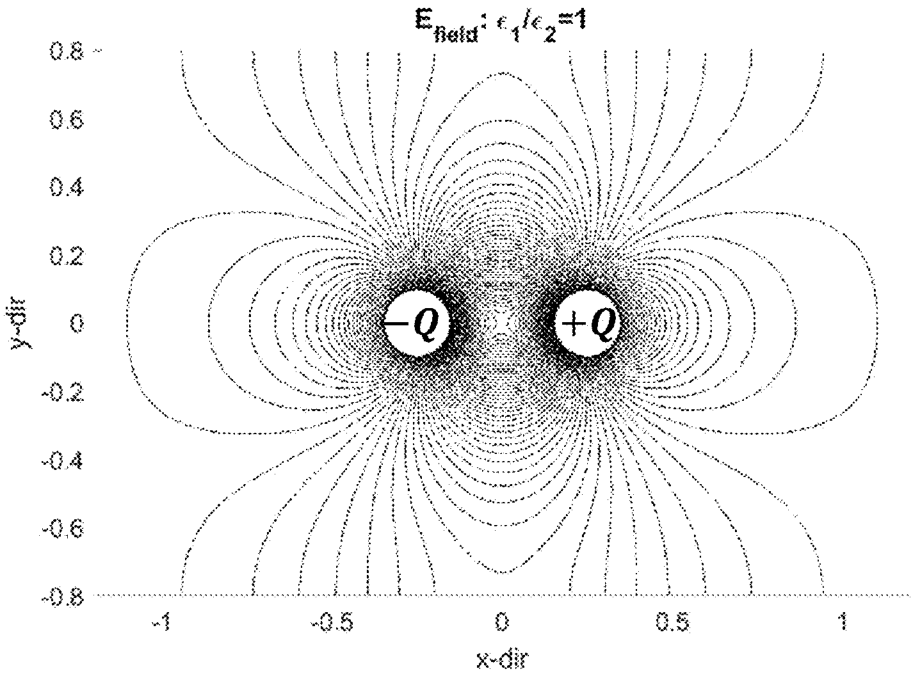
FIGS. 78D and 78E are models for electrostatic interaction between equal and opposite charges positioned separately within two materials, in accordance with some embodiments.
Figure 78E:
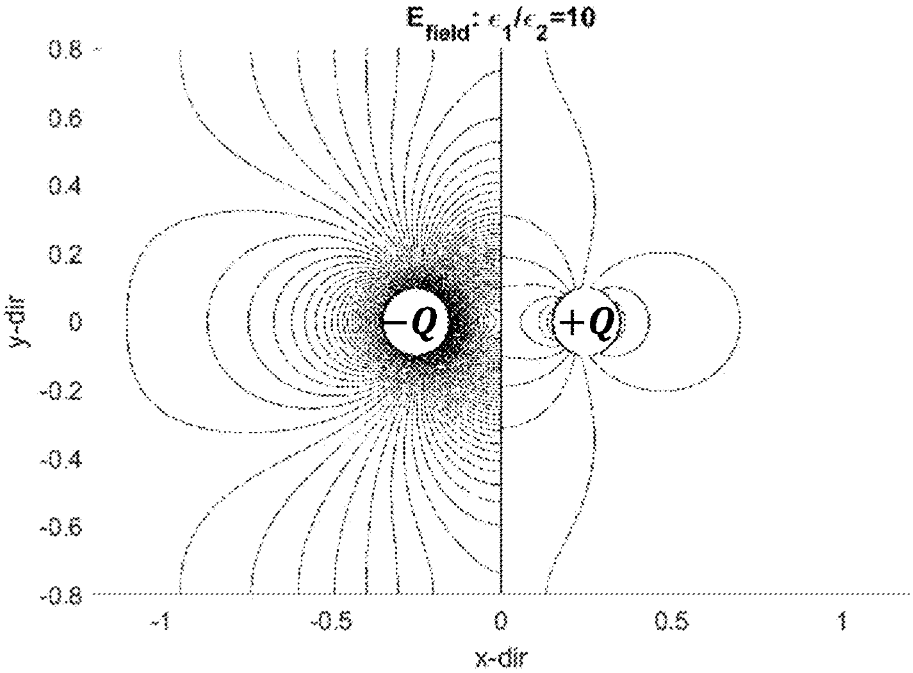

From FIGS. 78B and 78C are calculated the electric-field strengths shown in the contour plots of FIGS. 78D and 78E, respectively. The electric field screening effect of the high dielectric region is shown. Quantitative values of the electric-field vector are calculated in the vicinity of the hetero-dielectric interface and are shown in FIGS. 78F and 78G.

Figure 78F:
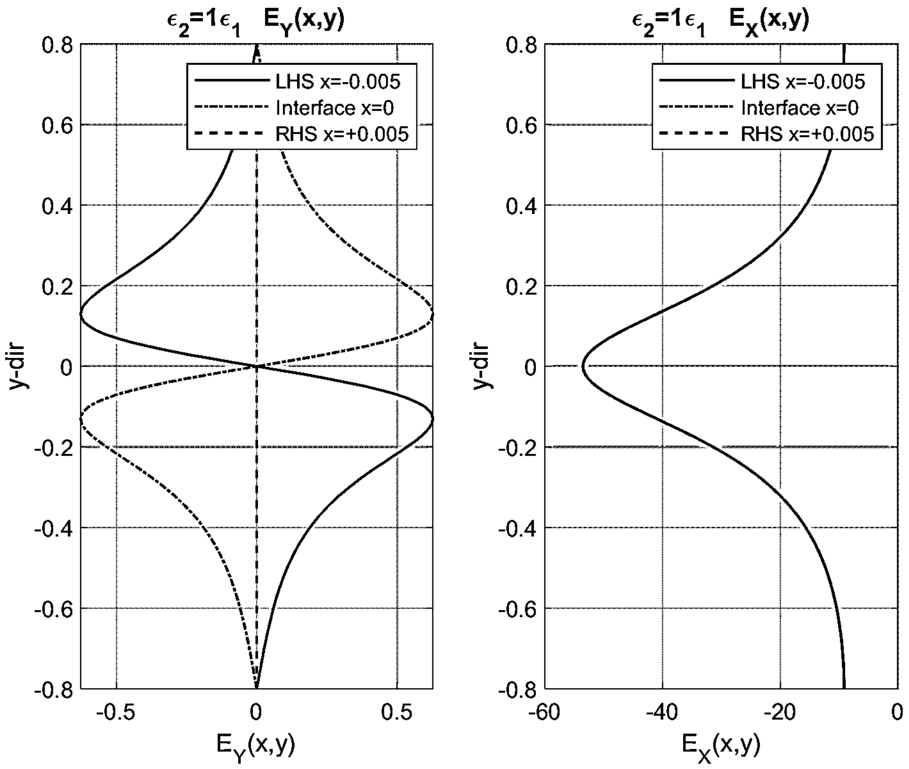
FIGS. 78F and 78G are plots of the parallel $E_Y$ and perpendicular $E_X$ electric field components in the vicinity of the heterointerface for the electrostatic model structures in FIGS. 78D and 78E, respectively, in accordance with some embodiments.

FIG. 78F shows the spatial variation of the x- and y-components of the electric-field $E_X$ ($E_Y$). If both halves of the structure have equal dielectric constants, s.t., $$\varepsilon_2/\varepsilon_1 = 1,$$

then the symmetry in the $E_X$ and $E_Y$ components along the interface are shown for three cases at the interface x=0 and a small amount on either side (x=+/−0.005 units). As expected, the symmetry of the curves reflects the equal and opposite charges.

Figure 78G:
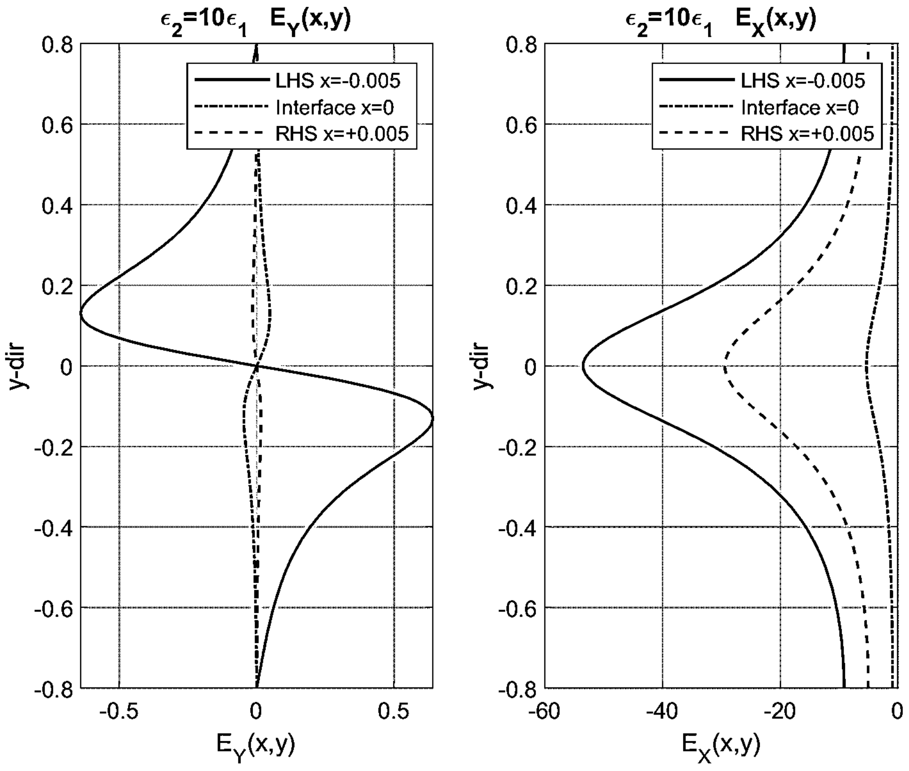

FIG. 78G shows the simulation for the case of $$\varepsilon_2/\varepsilon_1 = 10,$$

in which the electric field within the high dielectric region is substantially screened as shown. This phenomenon can be utilized in the present disclosure for engineering the maximum electric-fields created in device structures due to fabrication geometry-induced effects. For example, sharp edges that are typically formed at the periphery of metal contacts by photolithographic processing, lift-off or etching can create disadvantageous fringing fields. It is therefore desirable to manage these fringing fields at sharp metal features because electric fields can be generated in excess of the oxide electric field breakdown strength.

Figure 79:
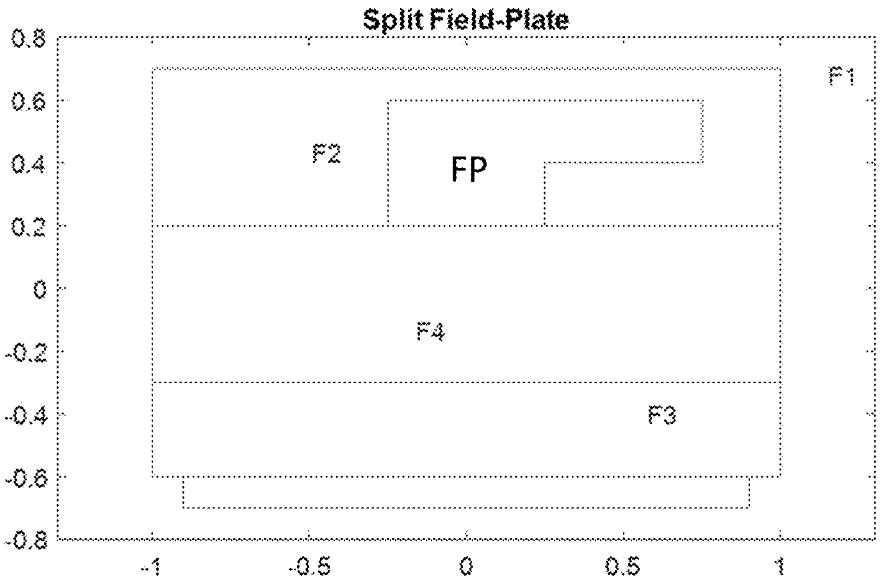
FIGS. 79 and 80 are two-dimensional electrostatic models of an example multilayered semiconductor diode structure comprising a lower electrode, a substrate, a drift layer and a field-plate electrode embedded within an isolation region dielectric, in accordance with some embodiments. The field-plate electrode is drawn asymmetrically about the vertical center line of the structure to simulate simultaneously a structure without a field-plate on the left-hand side, and a structure with a field-plate on the right-hand side.
Figure 80:
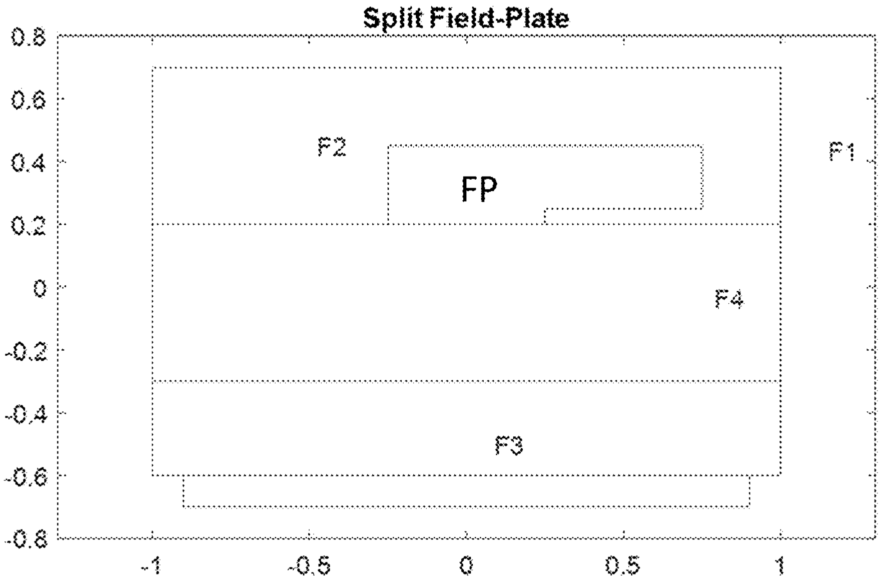

FIGS. 79 and 80 show two-dimensional electrostatic models of two types of vertical multilayered semiconductor devices used for the formation of Schottky barrier diodes.

Shown are two similar structures differentiated by the thickness between the field-plate (FP) overhang region and the drift region final surface (F4). The SiC substrate F3 is electrically conductive, whereas the isolation region F2 is given the properties of having a bandgap energy in excess of the drift region but having a dielectric constant that can be selected to be different to the drift layer. The region F1 is taken as air and the drift region F4 is $Ga_2O_3$ having a low charge density. The gap between the FP and drift region is 0.4 units in the vertical direction for the model of FIG. 79 and 0.05 units in the vertical direction for the model of FIG. 80. Furthermore, the Schottky metal contact is drawn as a split field-plate wherein the left-hand side does not have a field-plate overhang. This enables the same simulation to compare designs with and without a field-plate. The contribution to the overall device capacitance of the FP will be larger for the small gap configuration which is important for high-speed switching application.

Figure 81:
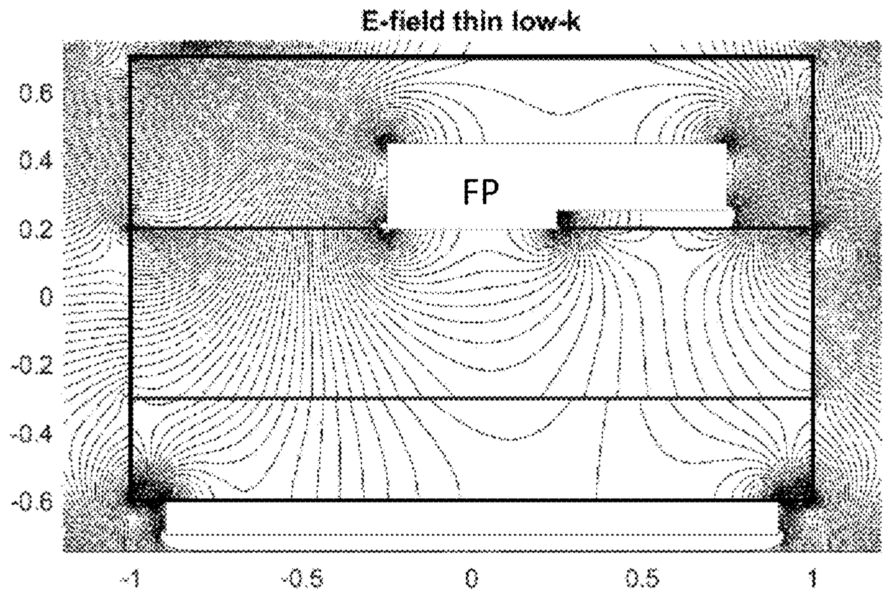
FIGS. 81 and 82 are electrostatic simulations of a split field-plate design having a thin dielectric spacing and the resulting spatial variation of the electric-field strength, where the two cases of a low-k dielectric (FIG. 81) and high-k dielectric (FIG. 82) isolation layer are compared, in accordance with some embodiments.
Figure 82:
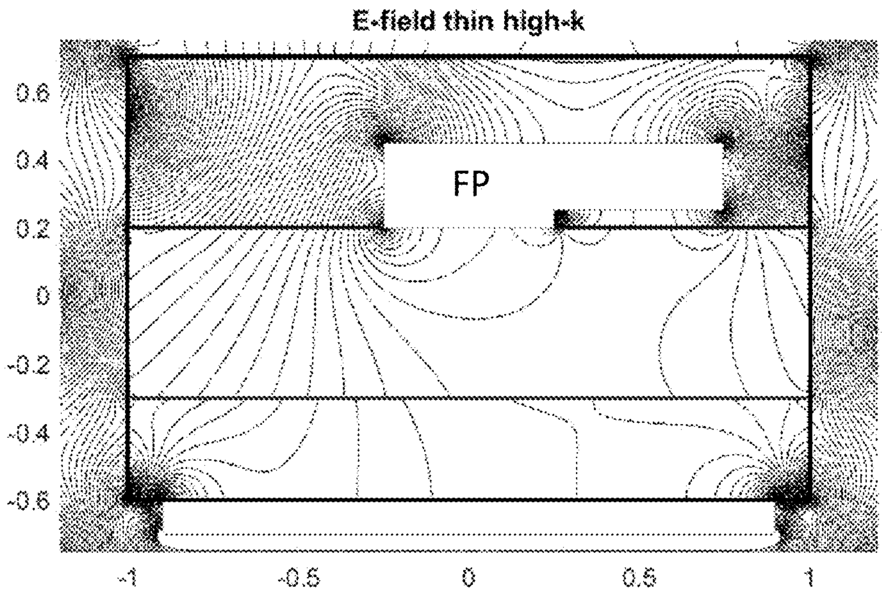

FIGS. 81 and 82 show the magnitude of the calculated spatial electric fields as contours for the thin FP biased at +1000V and the rear contact at −1000V. The dielectric constants of all the regions are taken into account with FIG. 81 having $$\varepsilon_{ISO}/\varepsilon_{Drift} = 0.2$$

and FIG. 82 having $$\varepsilon_{ISO}/\varepsilon_{Drift} = 3.$$

Figure 83:
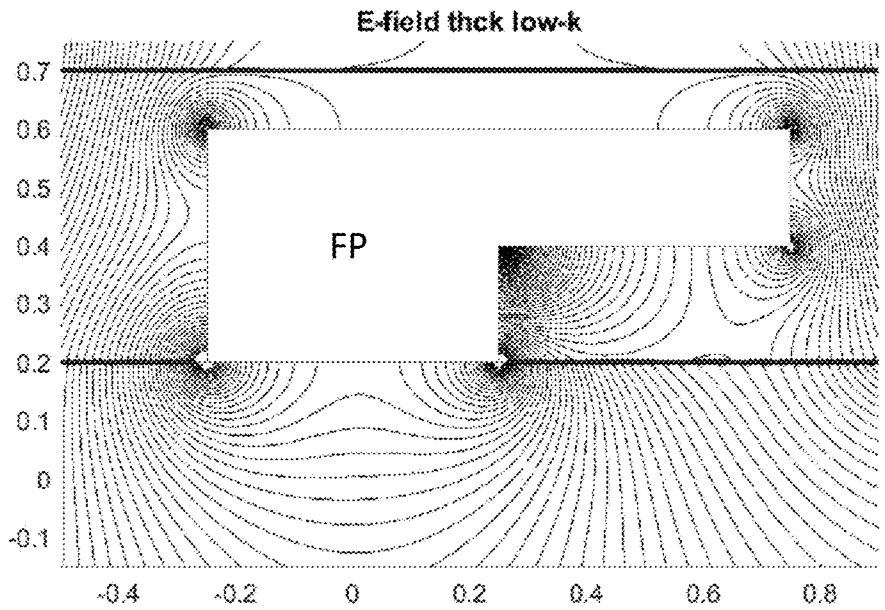
FIGS. 83 and 84 are electrostatic simulations of a split field-plate design having a thick dielectric spacing and the resulting spatial variation of the electric-field strength in the vicinity of the interface drift region and isolation region, where the two cases of a low-k dielectric (FIG. 83) and high-k dielectric (FIG. 84) isolation layer are compared, in accordance with some embodiments.
Figure 84:
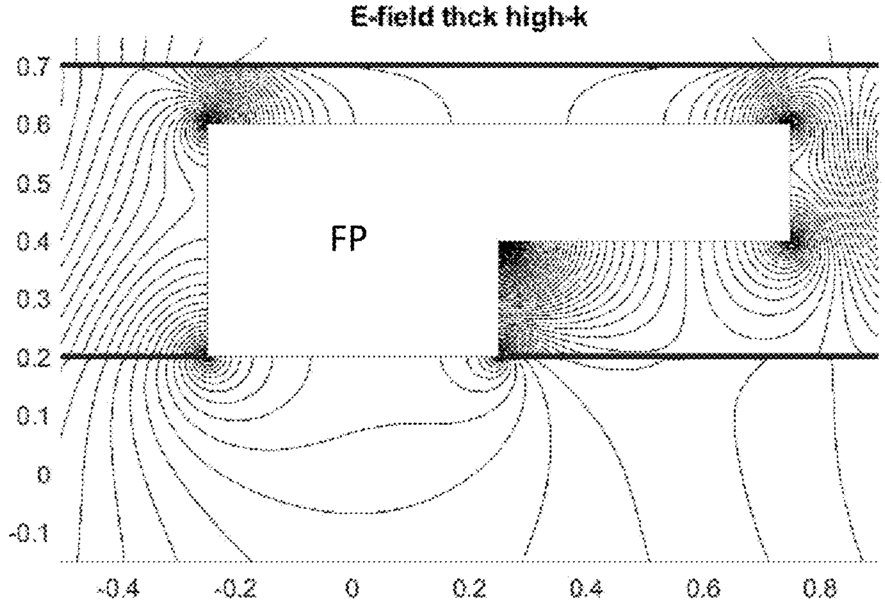

FIGS. 83 and 84 show a 'thick' FP closeup of the electrostatic electric field contours for the case of low-k and high-k, respectively.

Figure 85:
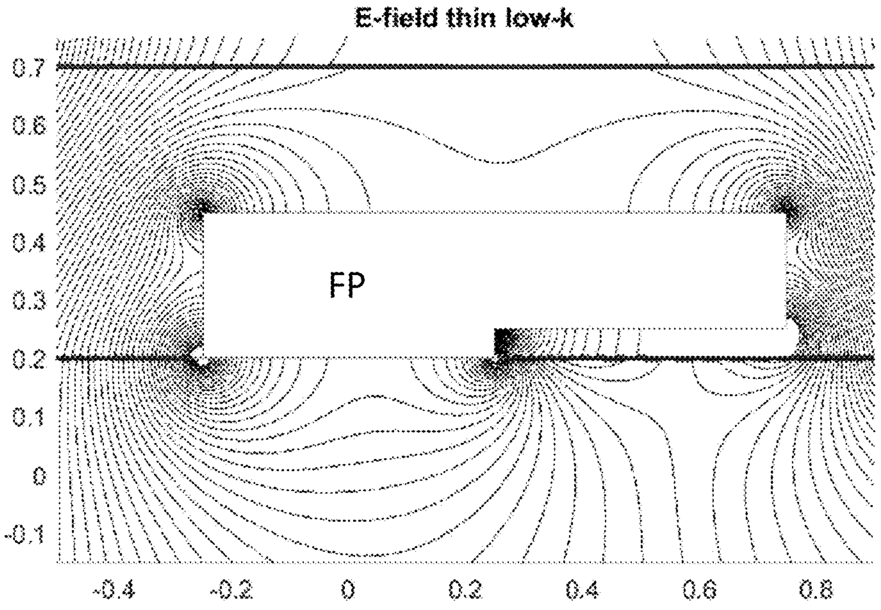
FIGS. 85 and 86 are electrostatic simulations of a split field-plate design having a thin dielectric spacing and the resulting spatial variation of the electric-field strength in the vicinity of the interface drift region and isolation region, where the two cases of a low-k dielectric (FIG. 85) and high-k dielectric (FIG. 86) isolation layer are compared, in accordance with some embodiments.
Figure 86:
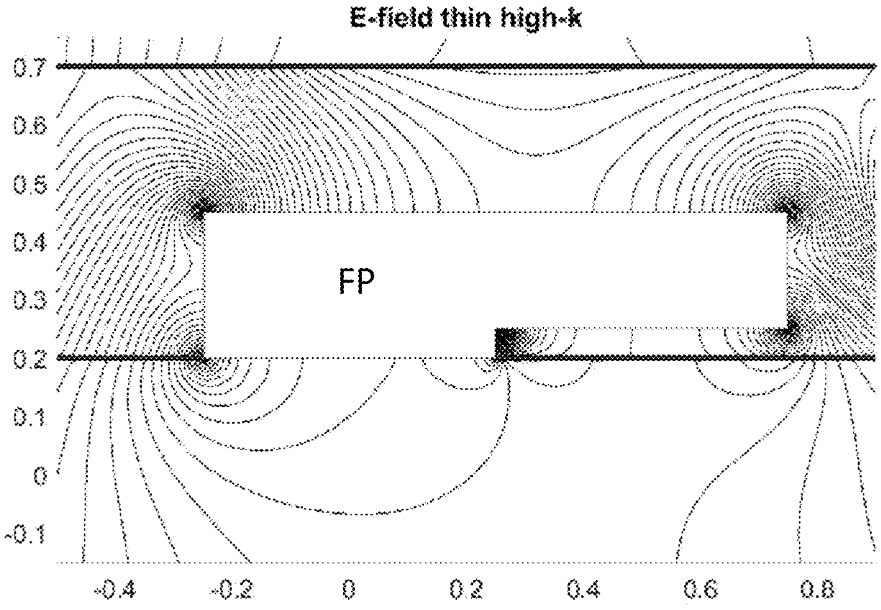

FIGS. 85 and 86 show a 'thin' FP closeup of the electrostatic electric field contours for the case of low-k and high-k, respectively.

Figure 87:
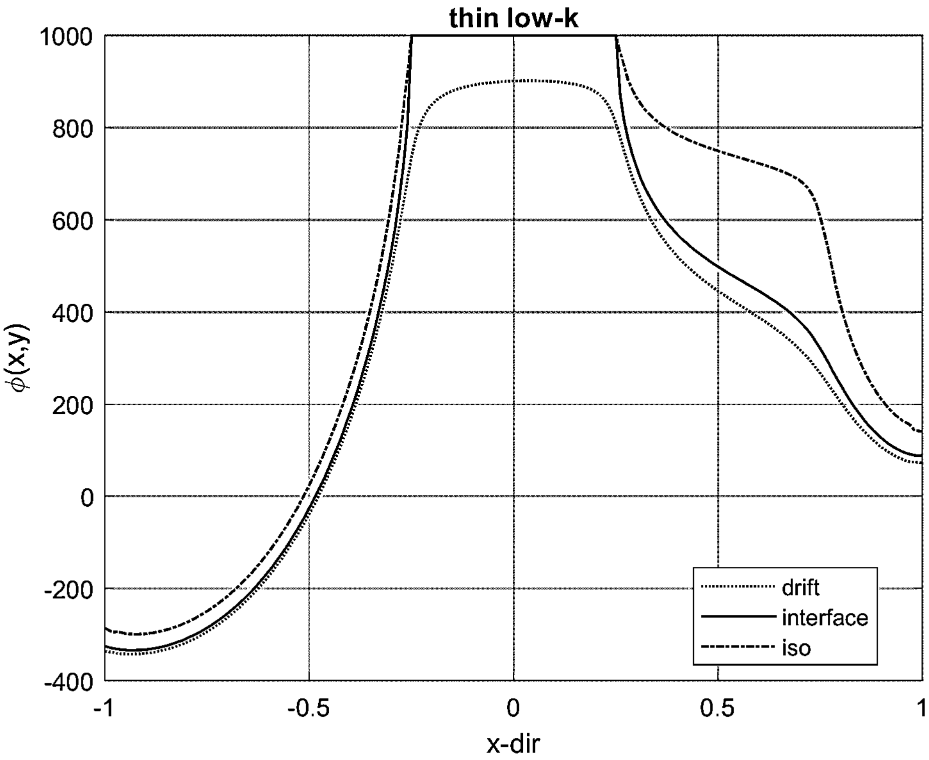
FIGS. 87 and 88 are plots of the magnitude of the electric field generated within the structures at the heterointerface between the drift layer and isolation layer and laterally extending along the x-direction. The device structure has a thin field-plate/isolation layer/drift layer spacing, in accordance with some embodiments.
Figure 88:
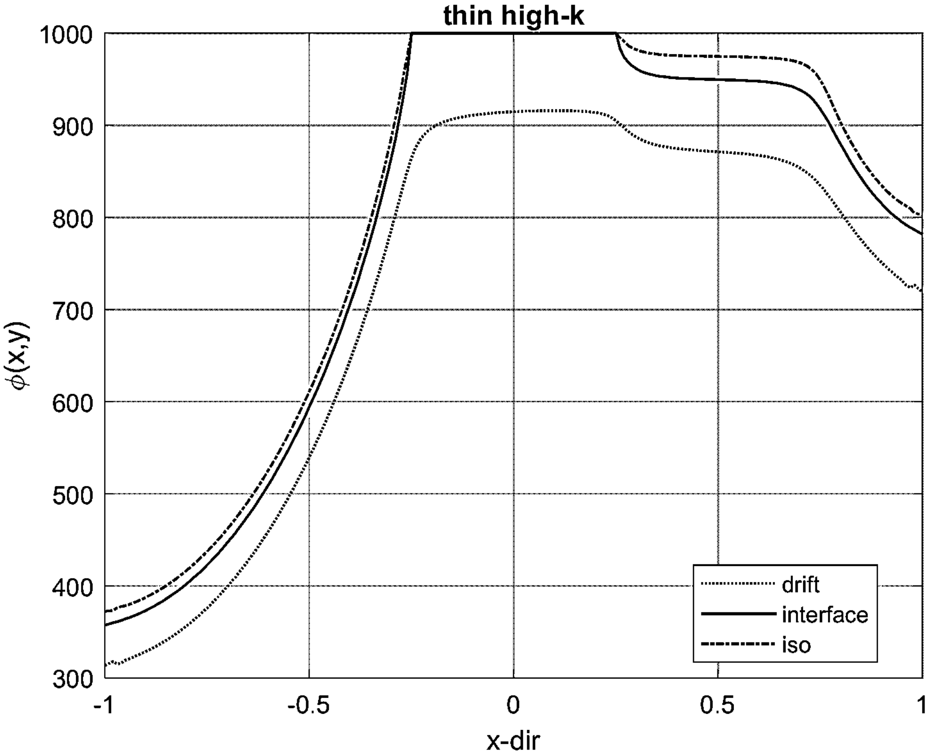

Quantitative values for the potential energy in the vicinity of the drift layer horizontal interface in contact with the metal contact and isolation layer were calculated. Plotted in FIGS. 87 and 88 are the cases of a thin FP having an isolation material of low-k and high-k, respectively. The potential is at a maximum at the metal interface and slightly lower in the vicinity of the contact but positioned slightly below the interface. The lateral extent of the FP shows the potential is maintained for the case of high-k isolation material, whereas the potential drops off rapidly for a low-k isolation material.

Figure 89:
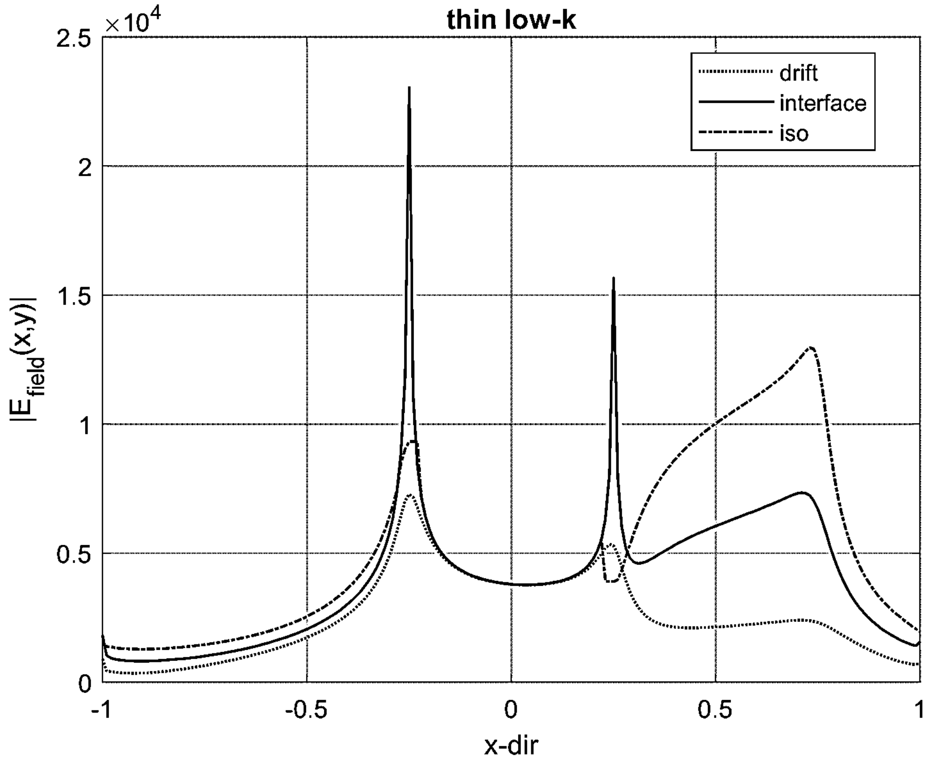
FIGS. 89 and 90 are plots of the spatial variation of the potential energy generated within the structure for three horizontal planes, namely, at the heterointerface, slightly above and below the heterointerface between the drift layer and isolation layer. The device structure is a thin field-plate/isolation layer/drift layer spacing, in accordance with some embodiments.
Figure 90:
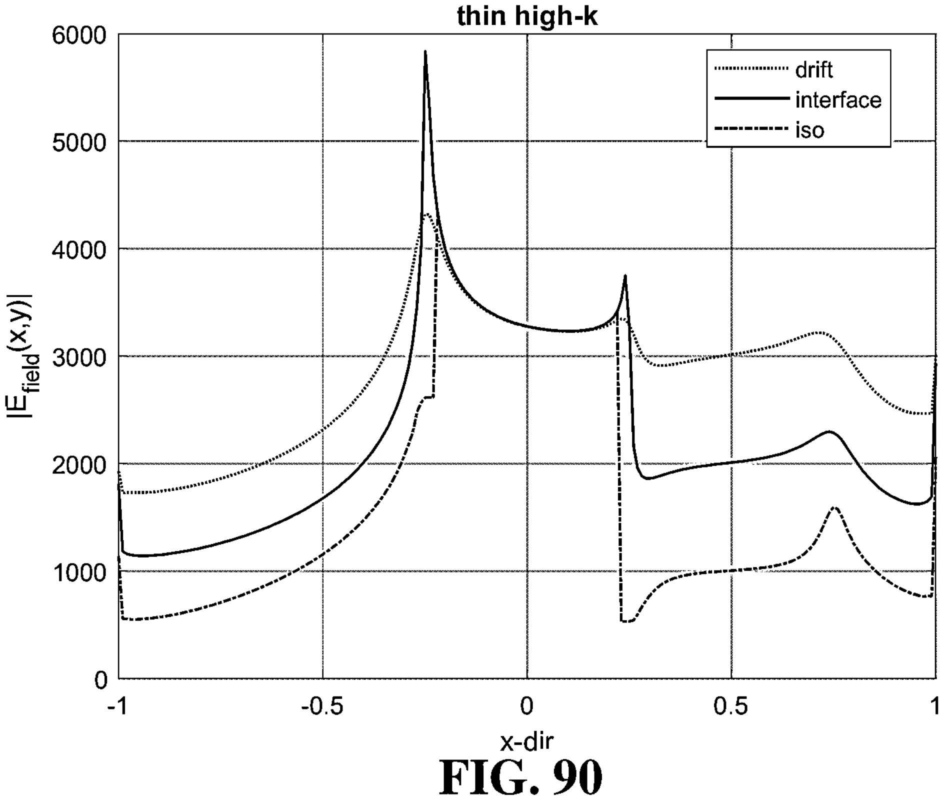

The spatial magnitude of the electric field in the vicinity of the interface is plotted in FIGS. 89 and 90 for the cases of a thin FP having an isolation material of low-k and high-k, respectively. The large peaks in the electric field located at the metal contact corners are evident as well as the effect of the lateral FP. The results show that the high-k isolation layer is effective in lowering the peak electric fields at the metal contact critical points.

Further analysis of the split FP structure enables direct comparison of the maximum electric-field generated at the interface between the drift layer and the metal contact.

Figure 91:
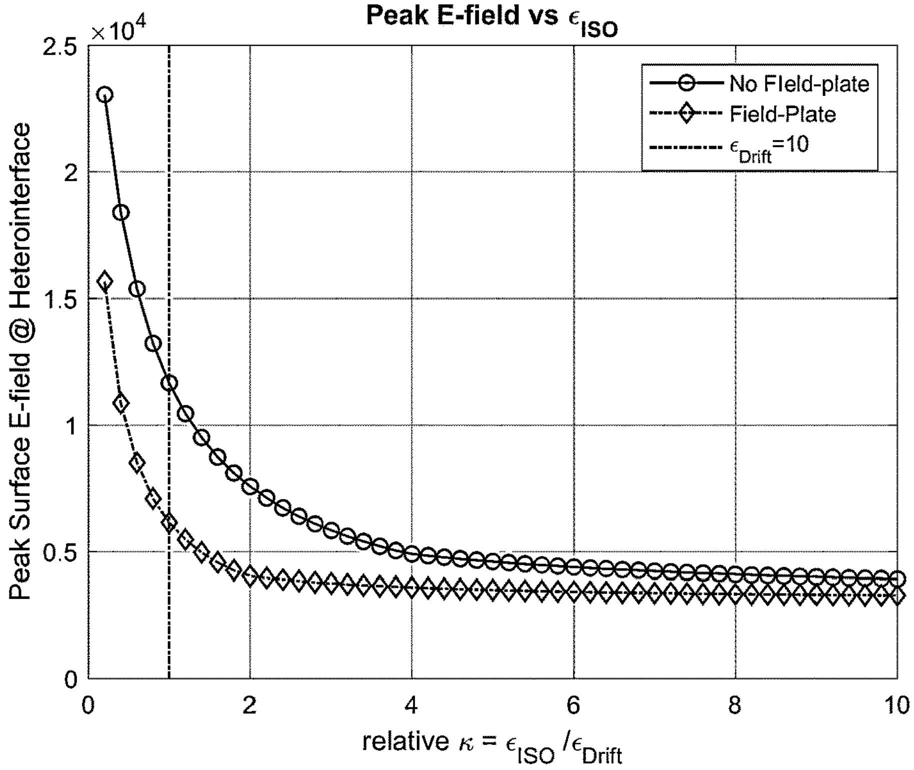
FIG. 91 is a plot of simulations investigating the effect of the isolation layer dielectric constant relative to the drift region dielectric constant applied to the case of a thin field-plate separation, in accordance with some embodiments. The top electrode structure comprises a right-hand side (rhs) with a field-plate, and the left-hand side (lhs) has no field-plate. The maximum electric field at the heterointerface between the drift layer and the top electrode (or isolation layer)\ is calculated for the rhs and lhs portions of the electrode as a function of the isolation layer dielectric constant.
Figure 92:
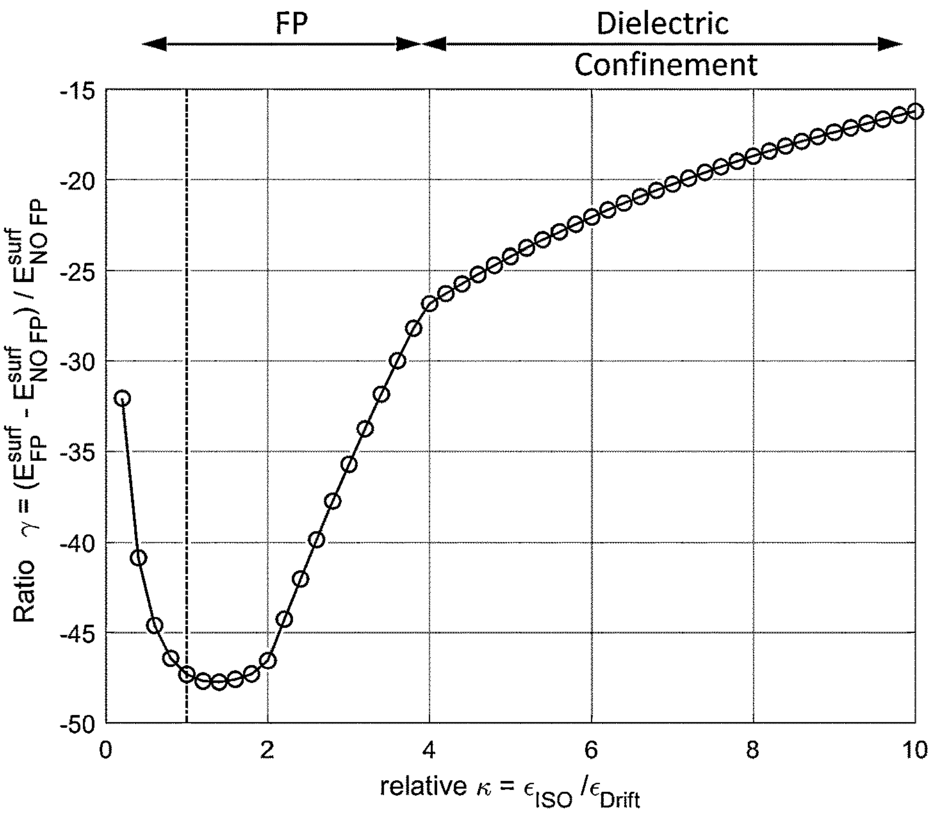
FIG. 92 is a plot resulting from the calculations in FIG. 91, showing the ratio Y of maximum electric field for the field-plate relative to no field-plate, in accordance with some embodiments.

FIGS. 91 and 92 are plots of the spatial variation of the magnitude of the electric field generated within the structure for three horizontal planes, namely, at the heterointerface, slightly above and below the heterointerface between the drift layer and isolation layer. The device structure is a thin field-plate/isolation layer/drift layer spacing.

FIG. 91 plots the maximum electric field within the structure at the drift layer and metal contact interface region for the case of 'no field-plate' and 'with field-plate', as a function of the dielectric constant used in the isolation material. The FP is shown to reduce the maximal electric field for all cases of the isolation layer dielectric constant, either lower or higher than the drift layer material. There are diminishing returns with the FP beyond $$\varepsilon_{ISO}/\varepsilon_{Drift} > 4,$$

wherein a simple metal-mesa contact along with a conformal high-k dielectric can in an alternative example provide superior performance. It is also possible to deposit a high-k isolation layer and then etch a region for defining a Schottky metal contact. FIG. 92 further investigates the ratio γ of maximum electric field with and without using a FP by defining:

$$\gamma = \frac{E_{FP}^{surf} - E_{no\,FP}^{surf}}{E_{no\,FP}^{surf}}$$

Maximum benefit of the FP is witnessed in FIG. 92 at the minimum of Ratio γ when the ratio of isolation layer to drift layer dielectric constant is in the range of about 0.5≤κ≤2.0. For this range, an ~45% reduction in maximum electric field is possible. For high-k isolation materials, i.e., κ>3.0, the utility of the FP is diminished as dielectric confinement and screening dominates and a simple metal mesa contact is efficient.

In various embodiments, the results of the above exploration of isolation layer materials and the effect of the FP may be taken into account when optimizing a diode design in accordance with the present disclosure.

Figure 93:
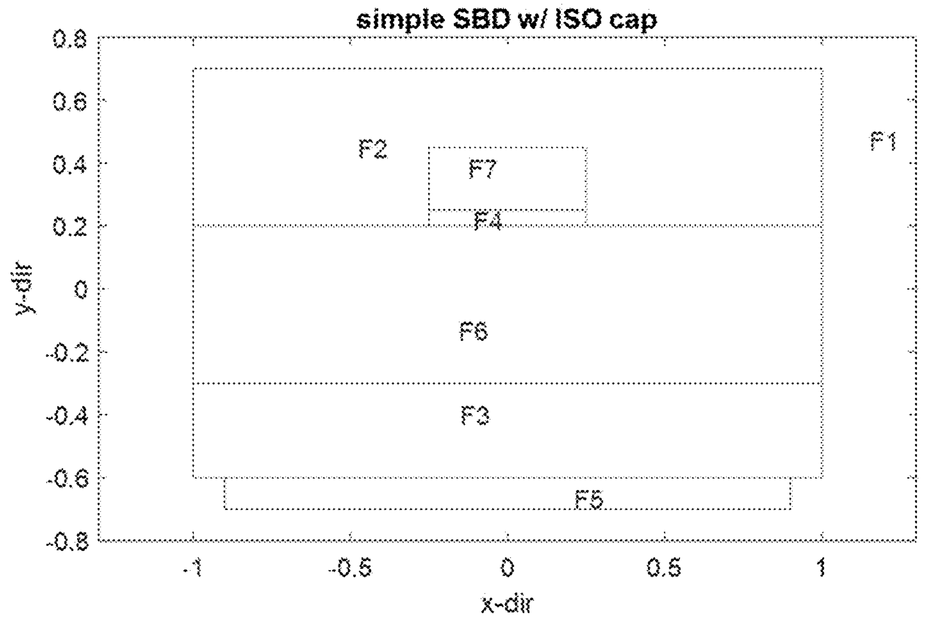
FIG. 93 shows the two-dimensional electrostatic model used for simulating the effect of the isolation layer dielectric constant for the case of a simple top metal mesa contact, in accordance with some embodiments.

FIG. 93 depicts the two-dimensional electrostatic model used for exploring a simple metal mesa Schottky contact embedded within an isolation materials of varying dielectric constants.

Figure 94:
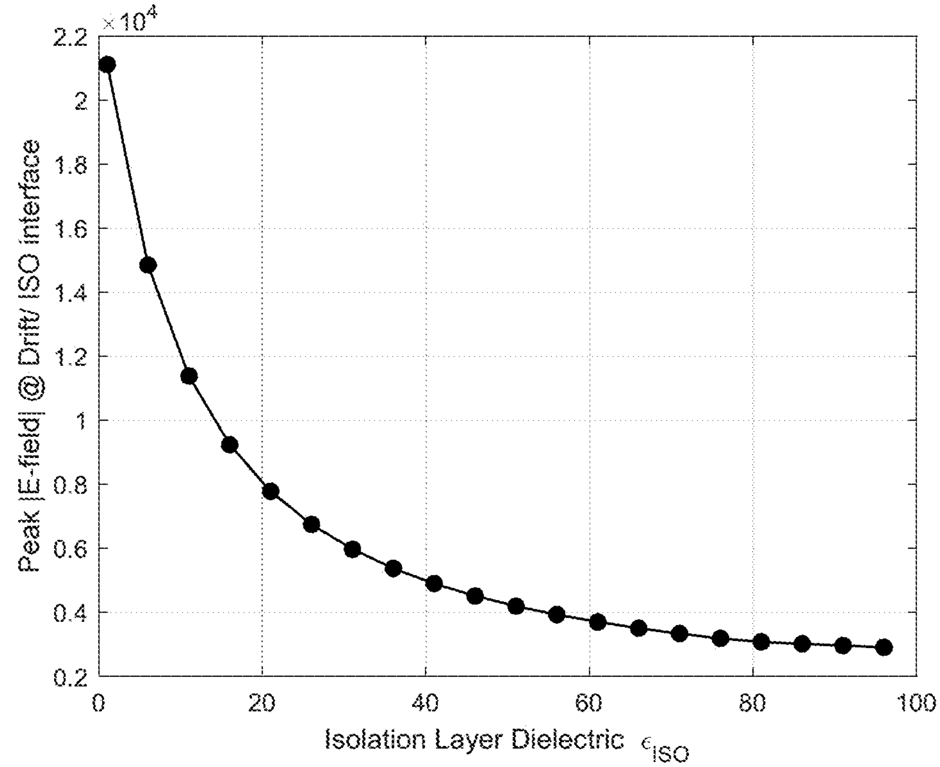

The resulting calculation for the maximal surface electric field strength at the drift and the metal/isolation layer interface is plotted in FIG. 94. An order of magnitude reduction in peak surface electric field can result by utilizing isolation layer materials selected from high dielectric constants. High dielectric materials that have the property of bandgaps greater than the drift region and dielectric constants well in excess of $Ga_2O_3$ can be found in rare-earth oxides, titanium oxide and the like. Of interest are rare-earth oxides which can be alloyed with aluminum to increase the effective bandgap while maintaining high dielectric constant.

Of note is nickel-oxide which exhibits a large dielectric constant by low bandgap energy.

Figure 95:
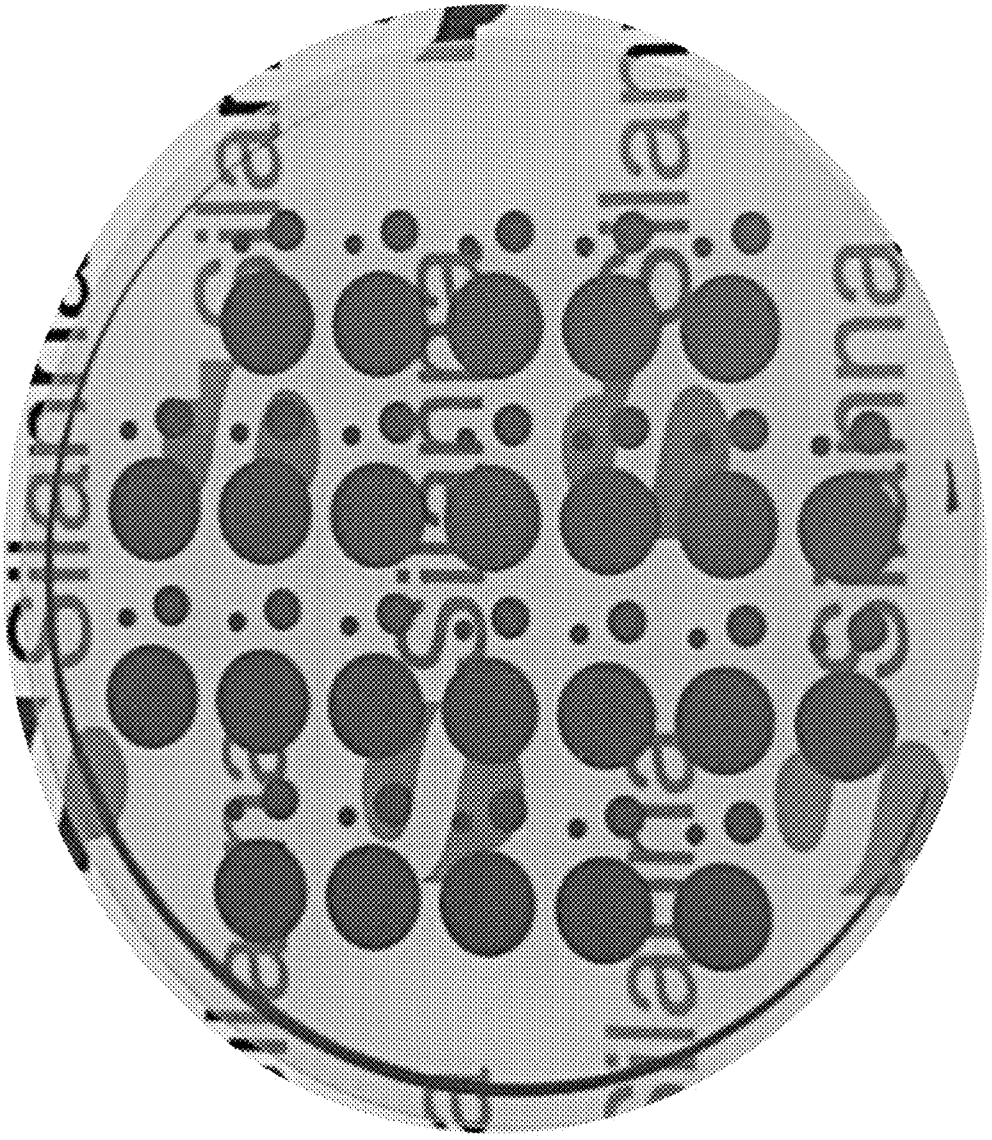

FIG. 95 shows a photograph of a partially completed Schottky barrier diode formed on a $Ga_2O_3$ epilayer deposited on a 4H—SiC substrate. The Schottky barrier metal is Ni, and a second metal of Al was used to thicken the contact. The rear ohmic contact was not processed, showing the transparency of the substrate.

In some embodiments, the structures and devices described herein include a "T-Channel" design, which can further improve the operating characteristics of the epitaxial oxide/Schottky metal devices described herein.

As discussed above, the dielectric constants of the materials incorporated into the device structure govern the electrostatic behavior of the device under high (or intense) electric fields. Furthermore, as described herein, the isolation layer surrounding the Schottky metal contact can be used to engineer the surface electric field at the oxide drift layer and metal interface. For example, high dielectric constant isolation layer materials can be used to minimize surface electric fields at the critical points of the Schottky metal contact.

Figure 96A:
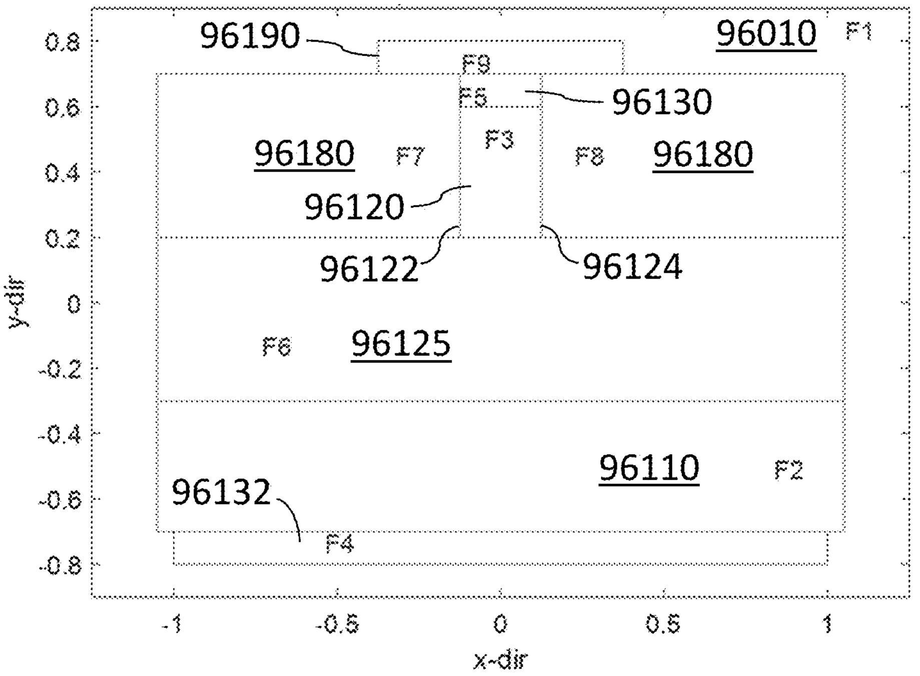

FIG. 96A shows an alternative device design referred to as a "T-Channel" design herein. A rear contact 96132 (F4) is made to a SiC substrate 96110 (F2) and an oxide semiconductor drift layer 96125 (F6) are shown. In the "T-Channel" design, an oxide semiconductor channel region 96120 (F3) with a Schottky metal layer 96130 (F5) is formed (e.g., by selective area etching) into a mesa structure. In some cases, oxide semiconductor drift layer 96125 has a higher doping density than oxide semiconductor channel region 96120. A high doping density of the oxide semiconductor drift layer 96125 can be advantageous, for example, to reduce the ON-resistance of the device. The doping density of the oxide semiconductor channel region 96120 can be tuned to create a Schottky junction with tunable characteristics (e.g., to have a desired depletion width). Therefore, the doping density of the oxide semiconductor channel region 96120 can be either higher or lower than that of the drift layer 96125, depending on the desired Schottky junction properties. Sidewall layer 96180 (F7 and F8) is formed around the mesa structure. Sidewall layer 96180 (F7 and F8) can surround the mesa structure. Sidewall layer 96180 (F7 and F8) can be in physical contact with one or more walls 96122 and 96124 of the mesa structure. The walls 96122 and 96124 of the mesa structure include interfaces of the oxide semiconductor channel region 96120 and the Schottky metal layer 96130. Field plate layer 96190 (F9) can be on a top surface of Schottky metal layer 96130, and extend laterally (i.e., in the x-direction) beyond the Schottky metal layer 96130 (and extend laterally beyond the mesa structure) such that it also is on a top surface of the sidewall layer 96180 (as shown in FIG. 2A). Schottky metal layer 96130 can comprise any suitable metal described herein, for example, any material of FIG. 11A (i.e., Cu, Te, Be, Rh, Co, C, N, Ni, Au, Ir, Pd, Pt, Se, or Os), or alloys of the metals in FIG. 11A.

For example, the mesa structure in FIG. 96A, including the oxide semiconductor channel region 96120 and the Schottky metal layer 96130, can have a circular cross-section, and the sidewall layer 96180 can surround the mesa structure in an annular shape (or wrap around the mesa structure). In such an example, wall 96122 and 96124 (or sidewalls) would be the same wall surrounding the cylindrical shaped mesa structure. In another example, the mesa structure can be rectangular shaped, and the sidewall layer 96180 can be shaped like a rectangular annulus surrounding the mesa structure. In such an example, the sidewall layer 96180 can be in physical contact with walls 96122 and 96124 as well as two other walls (not shown) of the rectangular prism shaped mesa structure.

In another example, the walls 96122 and 96124 (or sidewalls) can be tapered inwardly or outwardly from the top of the drift layer 96125. In another example, the taper may be curved so as to adopt a generally convex or concave profile. In another example, the taper smoothly varies towards the slope or tangent of the interface defined by the oxide semiconductor channel region 96120 and drift layer 96125. In yet another example, the taper smoothly varies towards the slope or tangent of the interface defined by the oxide semiconductor channel region 96120 and contact layer Schottky metal layer 96130.

In other examples, the shape of the oxide semiconductor channel region 96120 may be configured to extend longitudinally in the "z-direction" perpendicular to the view shown in FIG. 96A to enable the cross-sectional area of the channel to accommodate a predetermined current density.

Region 96010 (F1) in FIG. 96A represents air with a permittivity of air. The sidewall layer 96180 can have a dielectric constant greater than, equal to, or less than that of the oxide drift and channel regions. For example, oxide semiconductor regions 96125 and 96120 can be $Ga_2O_3$ and the sidewall dielectric can have a lower, equal, or higher dielectric constant than that of $Ga_2O_3$. In some embodiments, the sidewall layer 96180 dielectric material has a bandgap energy in excess of the drift and channel oxide materials so that it behaves as an insulator. In other cases, the sidewall layer 96180 dielectric material has a bandgap energy equal to or less than those of the drift and channel materials, and the sidewall layer 96180 dielectric material is semi-insulating or insulating.

In some cases, the oxide semiconductor channel region 96120 has a different doping density and/or material composition compared to those of the oxide semiconductor drift layer 96125. For example, the doping density of the oxide semiconductor channel region 96120 can be lower compared to that of the oxide semiconductor drift layer 96125. In another example, the composition of the oxide semiconductor channel region 96120 can be different than that of the oxide semiconductor drift layer 96125, such that the oxide semiconductor channel region 96120 has a lower, the same or higher bandgap compared to that of the oxide semiconductor drift layer 96125.

The oxide semiconductor drift layer 96125 and the oxide semiconductor channel region 96120 may be formed of the same semiconductor oxide material or different oxide materials. In some cases, the oxide semiconductor drift layer 96125 is formed of an oxide semiconductor material with the same composition and crystal symmetry as those of an oxide semiconductor material forming oxide semiconductor channel region 96120. In other cases, the oxide semiconductor drift layer 96125 is formed of an oxide semiconductor material with a different composition and/or crystal symmetry as those of an oxide semiconductor material forming oxide semiconductor channel region 96120. In an example, the oxide semiconductor drift layer 96125 may be formed of a material chosen to provide a structural matching region between the substrate 96110 and the oxide semiconductor channel region 96120. The oxide semiconductor drift layer 96125 and the oxide semiconductor channel region 96120 also may be formed of materials with the same or different bandgaps. For example, the oxide semiconductor drift layer 96125 can have a bandgap that is larger or smaller than that of the oxide semiconductor channel region 96120. In some cases, the oxide semiconductor drift layer 96125 and the oxide semiconductor channel region 96120 have a conduction band offset that does not substantially block the movement of electrons from the oxide semiconductor drift layer 96125 to the oxide semiconductor channel region 96120 or vice-versa. In some cases, the oxide semiconductor drift layer 96125 and the oxide semiconductor channel region 96120 have a valence band offset that does not substantially block the movement of holes from the oxide semiconductor drift layer 96125 to the oxide semiconductor channel region 96120 or vice-versa. In general, the bandgap of any region (including the channel region) of a structure or device described in the present disclosure may be modified by a suitable change in composition of the material. For example, for a ternary material such as $(Al_xGa_{1-x})_2O_3$ the bandgap can be varied by changing the molar fraction x from $Al_2O_3$ to $Ga_2O_3$. In practice, there can be limits on the composition range possible, while maintaining high quality (i.e., low defect) materials. In the example of $(Al_xGa_{1-x})_2O_3$, $x<0.35$ is the limit, and it can be difficult to obtain high quality single phase $(Al_xGa_{1-x})_2O_3$ on a $Ga_2O_3$ bulk layer with $x>0.35$.

For example, a oxide semiconductor drift layer 96125, comprising a semiconductor oxide material of the form of $Mg_xZn_yNi_z(Al_p,Ga_{1-p})O_q$ (or another oxide semiconductor material described herein) can be formed between an SiC substrate 96110 and the oxide semiconductor channel region 96120, where the oxide semiconductor channel region 96120 comprises $Ga_2O_3$ or compositionally graded $Al_xGa_{1-x}O_3$ in some examples. Another example of a semiconductor oxide material is of the form of a silicon oxy-carbide $Si_xC_yO_z$, which can be comprised in the oxide semiconductor drift layer 96125 and can be formed between an SiC substrate 96110 and the oxide semiconductor channel region 96120, where the oxide semiconductor channel region 96120 comprises $Ga_2O_3$ or compositionally graded $Al_xGa_{1-x}O_3$ in some examples. Yet another example of a semiconductor oxide material is of the form of a silicon oxy-nitride $Si_xN_yO_z$ which can be comprised in the oxide semiconductor drift layer 96125 and can be formed between an SiC substrate 96110 and the oxide semiconductor channel region 96120, where the oxide semiconductor channel region 96120 comprises $Ga_2O_3$ or compositionally graded $Al_xGa_{1-x}O_3$ in some examples. Another example of an oxide semiconductor drift layer 96125 is one comprising a material of the form of a silicon-germanium-carbide $Si_xGe_yC_z$ such that the oxide semiconductor drift layer 96125 can be used to manage the interfacial strain formed between an SiC substrate 96110 and the oxide semiconductor channel region 96120, where the oxide semiconductor channel region 96120 comprises $Ga_2O_3$ or compositionally graded $Al_xGa_{1-x}O_3$ in some examples.

In some cases, the oxide semiconductor channel region 96120 may have a doping concentration between that of the substrate 96110 doping concentration and oxide semiconductor channel region 96120 with a discrete change in doping concentration between the substrate 96110 and the oxide semiconductor drift layer 96125, and between the oxide semiconductor drift layer 96125 and the oxide semiconductor channel region 96120. In an example, the substrate 96110 may be $n^+$ doped (i.e., having a doping concentration of from $10^{19}$ to $10^{20}$ $cm^{-3}$), the oxide semiconductor drift layer 96125 may be n doped (i.e., having a doping concentration of approximately $10^{18}$ $cm^{-3}$, or from $10^{17}$ $cm^{-3}$ to $10^{18}$ $cm^{-3}$) and the oxide semiconductor channel region 96120 may be $n^{--}$ doped (i.e., having a doping concentration from $10^{15}$ $cm^{-3}$ to $10^{17}$ $cm^{-3}$), where this configuration provides transition between a $n^+$ doped region to a $n^-$ doped region moving vertically upwards from the substrate 96110 to the oxide semiconductor channel region 96120. Similarly, a p-type device can be formed wherein the substrate 96110 is $p^+$ doped, the oxide semiconductor drift layer 96125 is $p^-$ doped, and the oxide semiconductor channel region 96120 is $p^{--}$ doped, where the layers have the doping concentrations described above of acceptors rather than donors.

In some cases, a doping density of the oxide semiconductor drift layer 96125 has a monotonic gradient in the z direction. For example, the doing density of the oxide semiconductor drift layer 96125 can start (closer to the substrate 96110) with a doping concentration near or below (i.e., less than) that of the substrate 96110, and end (farther from the substrate 96110) at a doping concentration approximately equal to that of the oxide semiconductor channel region 96120. In some cases, the oxide semiconductor drift layer 96125 has a doping concentration that monotonically varies starting at a doping concentration that is either approximately equal to that of the substrate 96110, or is between that of the substrate 96110 and a oxide semiconductor channel region 96120 doping concentration, and ending at a doping concentration that is either approximately equal to that of the oxide semiconductor channel region 96120 or is between the substrate 96110 doping concentration and oxide semiconductor channel region 96120 doping concentration. In an example, the oxide semiconductor drift layer 96125 doping concentration may match the substrate 96110 doping concentration at the interface between the oxide semiconductor drift layer 96125 and the layer below (e.g., substrate 96110) and then continuously change to match the oxide semiconductor channel region 96120 doping concentration at the interface between the oxide semiconductor drift layer 96125 and the oxide semiconductor channel region 96120. In an example, the change in the oxide semiconductor drift layer 96125 doping concentration may be substantially linear as a function of vertical height z. In some cases, the oxide semiconductor drift layer 96125 doping concentration may change continuously (i.e., without significant step changes, and monotonically, or non-linearly, for example) as a function of vertical height z. In some cases, the oxide semiconductor drift layer 96125 doping concentration may change in a stepwise manner as a function of vertical height z.

In other examples, the doping density of the oxide semiconductor channel region 96120 may be higher or the same as that of the oxide semiconductor drift layer 96125, and the composition of the oxide semiconductor channel region 96120 can be different than that of the oxide semiconductor drift layer 96125, such that the oxide semiconductor channel region 96120 has a lower, the same or higher bandgap compared to that of the oxide semiconductor drift layer 96125. In some embodiments, there is no substantial (or minimal) barriers to the flow of electrons between the rear contact 96132 and the oxide semiconductor channel region 96120. In other words, in some cases electrons may freely flow from the rear contact 96132 to the oxide semiconductor channel region 96120. Therefore, in some cases, the bandgap of the drift region 96125 is the same as or smaller than that of the oxide semiconductor channel region 96120. In other cases, the bandgap of the drift region 96125 is larger than that of the oxide semiconductor channel region 96120, and there is no substantial (or a minimal) barrier to the flow of electrons from the drift region 96125 to the oxide semiconductor channel region 96120, due to a band alignment with no substantial (or a minimal) conduction band offset between the materials.

FIGS. 96B-96H show modeled (or calculated) spatial electric fields within devices having structures like that shown in FIG. 96A where the sidewall material 96180 has various dielectric constants with respect to the oxide semiconductor of the drift and channel layers. Specifically, FIGS. 96B-96H show the results of applying a potential of −1000V to the lower electrode and +1000V to the upper field-plate for sidewall layer 96180 material dielectric constant of $2.5 \leq \varepsilon_{sw} \leq 300$. The modeled devices therefore cover a range of sidewall layer 96180 materials, ranging from a low-k dielectric to a high-k dielectric.

Figure 96B:
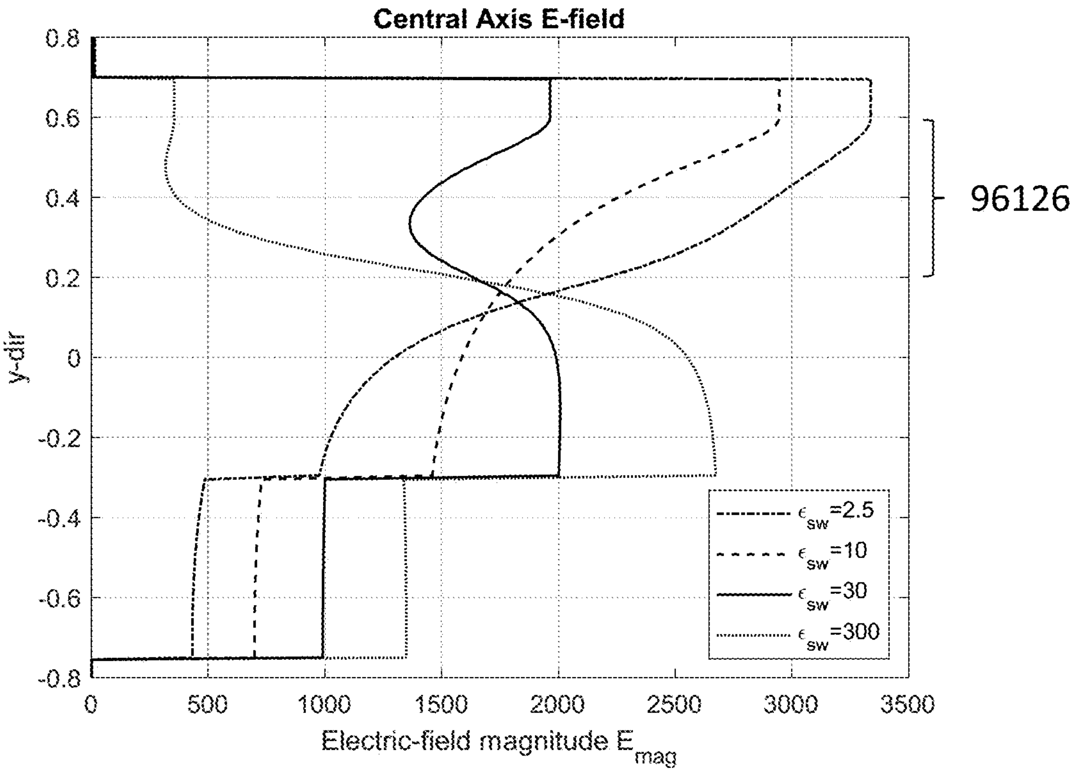

FIG. 96B shows the calculated (i.e., modeled) electric field magnitude along a vertical centerline positioned at x=0 in the structure shown in FIG. 96A. FIG. 96B also shows the channel region 96126 (from y=0.2 to y=0.6) along the vertical centerline (x=0). As the sidewall layer 96180 dielectric constant $\varepsilon_{sw}$ is varied from low-k to high-k relative to the $Ga_2O_3$ channel, the electric field shows some unique attributes. For the case of $\varepsilon_{sw}=2.5$ (e.g., approximately the dielectric constant of $Al_2O_3$) the electric field is maximal at the Schottky metal interface with the channel. For the case of $\varepsilon_{sw}=\varepsilon_{channel}=10$, the electric field is still maximal at the Schottky metal interface with the channel. For the case of $\varepsilon_{sw}=30$ the electric field has a minimum within the channel, and for the case of $\varepsilon_{sw}=300$ the situation is inverted, and the electric field is minimum at the Schottky metal interface with the channel.

Figure 96C:
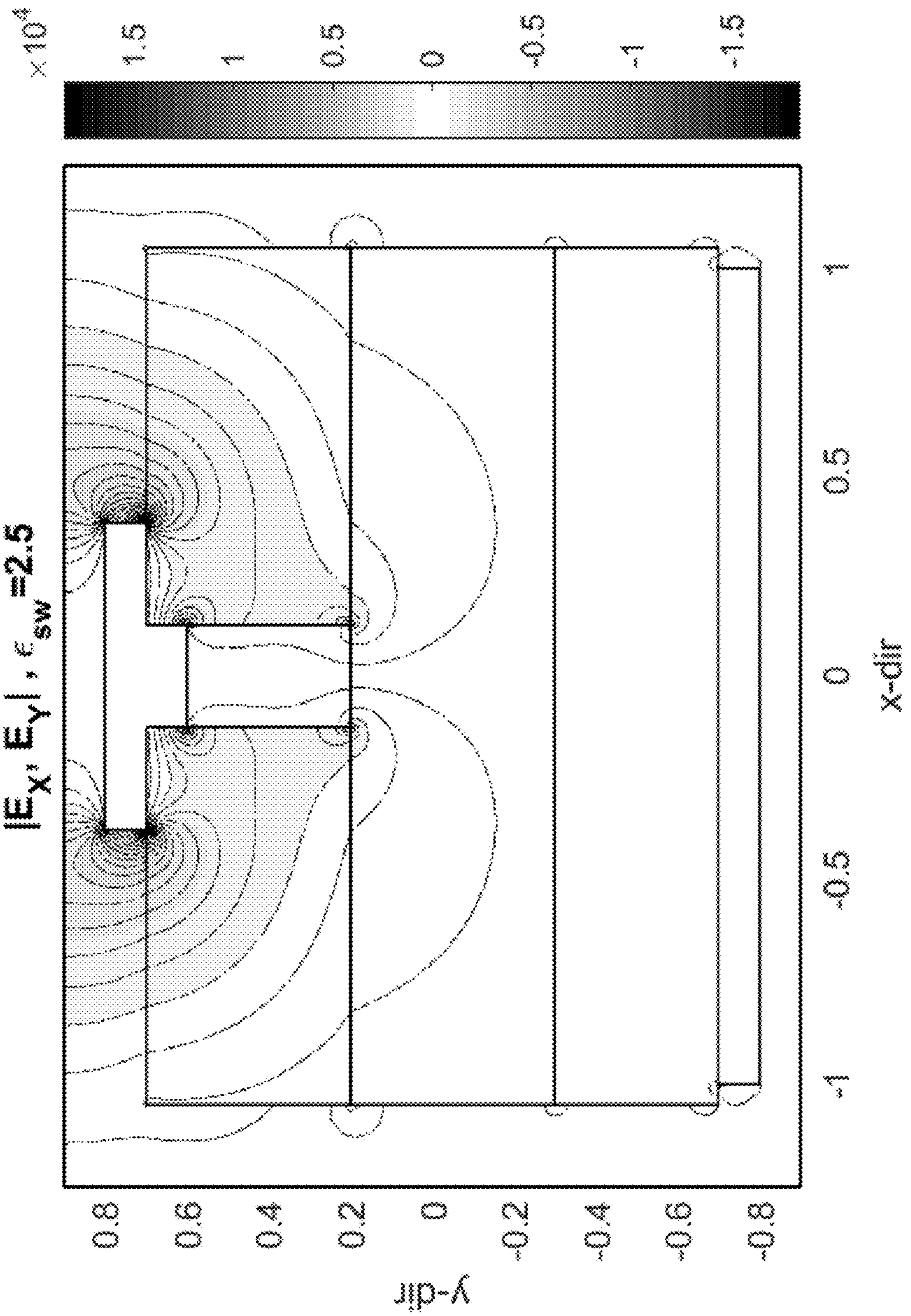
Figure 96D:
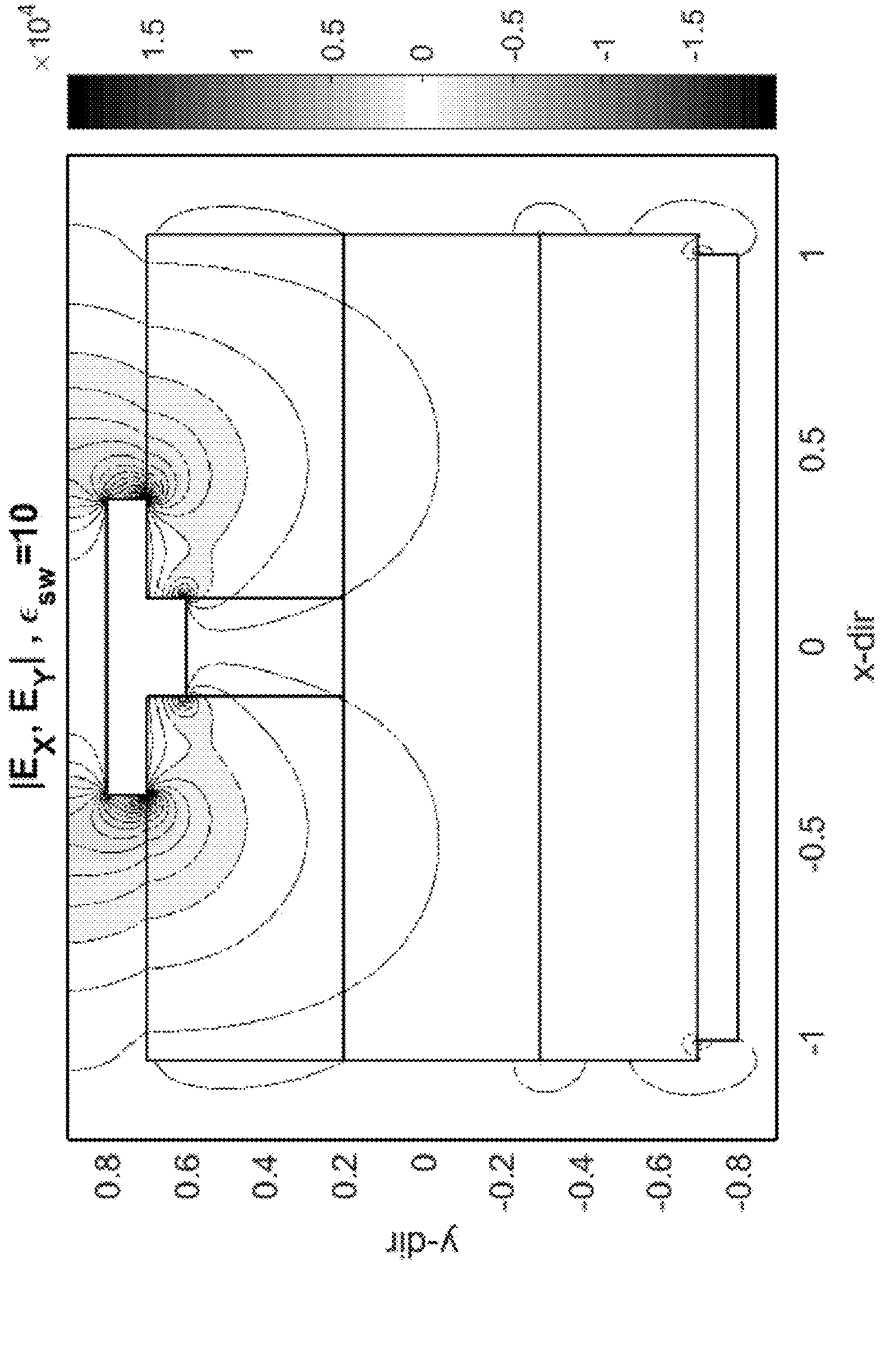
Figure 96E:
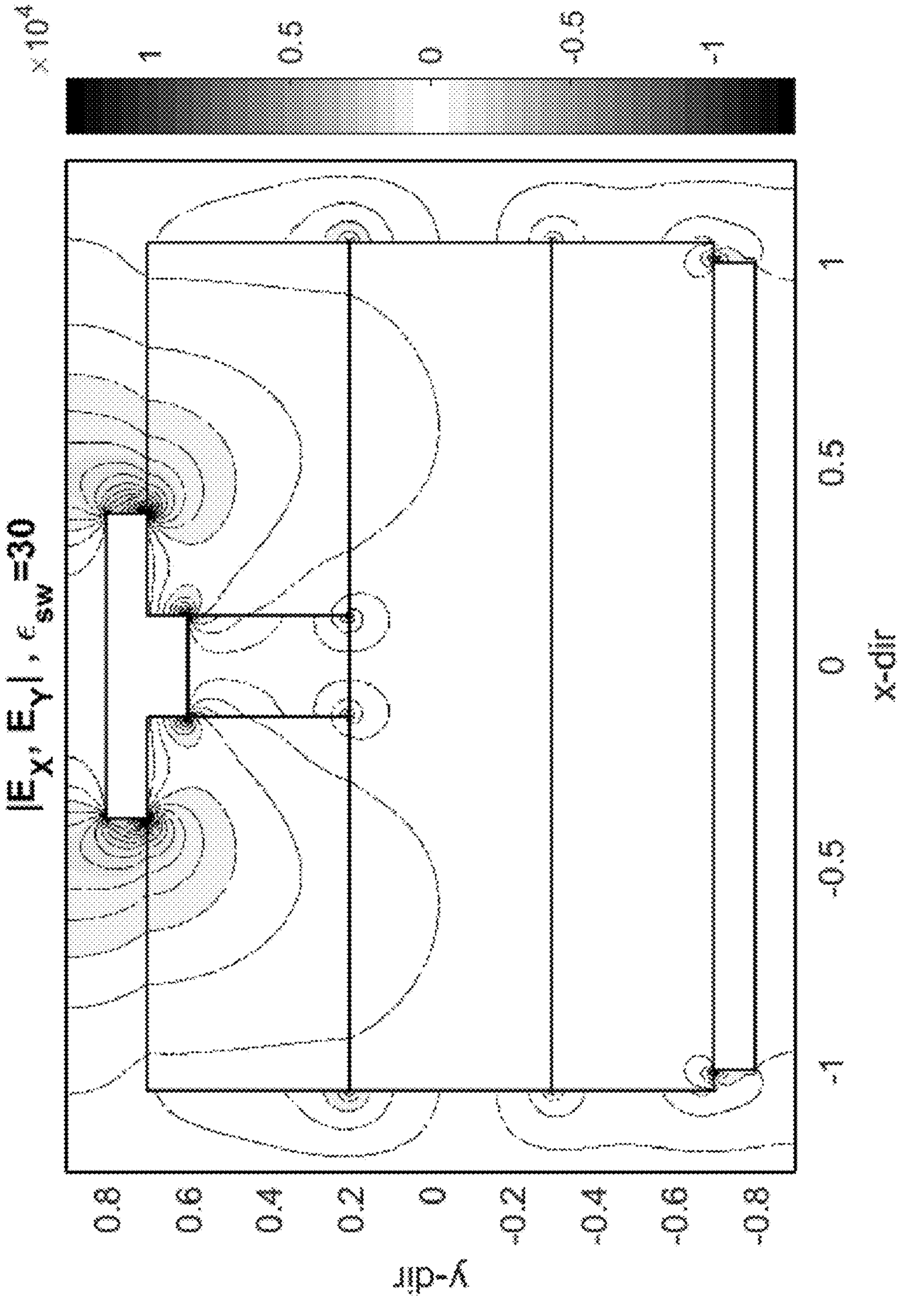
Figure 96F:
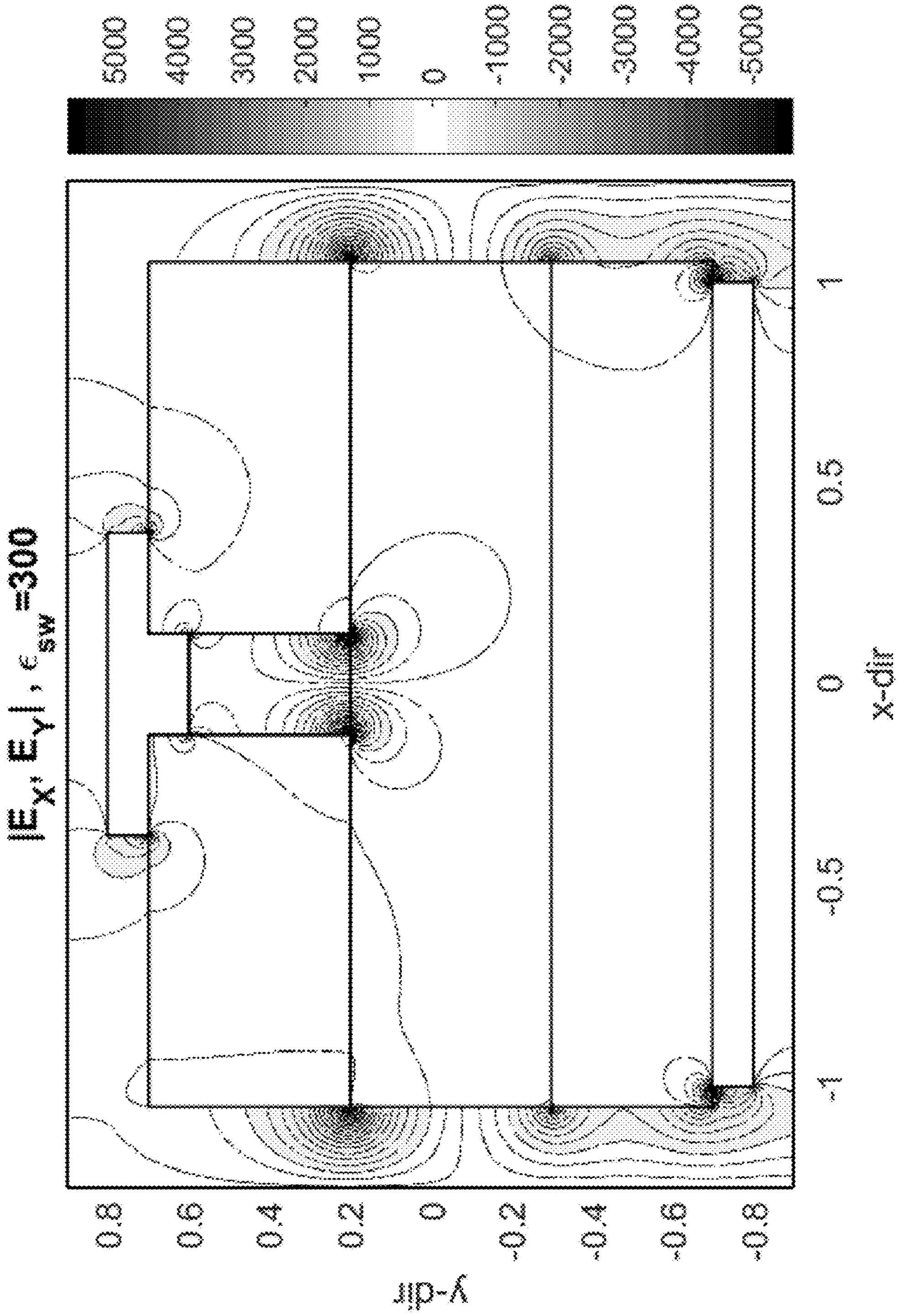

FIGS. 96C-96F show the contour plots of the electric field for each of the cases plotted in FIG. 96B. FIG. 96C shows the case of $\varepsilon_{sw}=2.5$, FIG. 96D shows the case of $\varepsilon_{sw}=10$, FIG. 96E shows the case of $\varepsilon_{sw}=30$, and FIG. 96F shows the case of $\varepsilon_{sw}=300$.

Figure 96G:
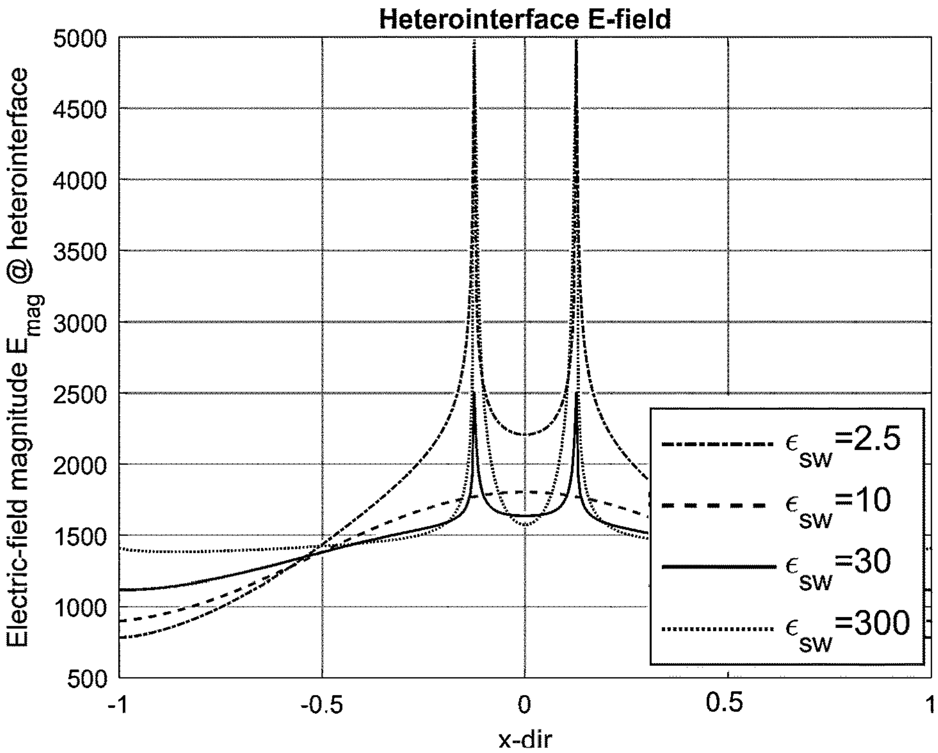
Figure 96H:
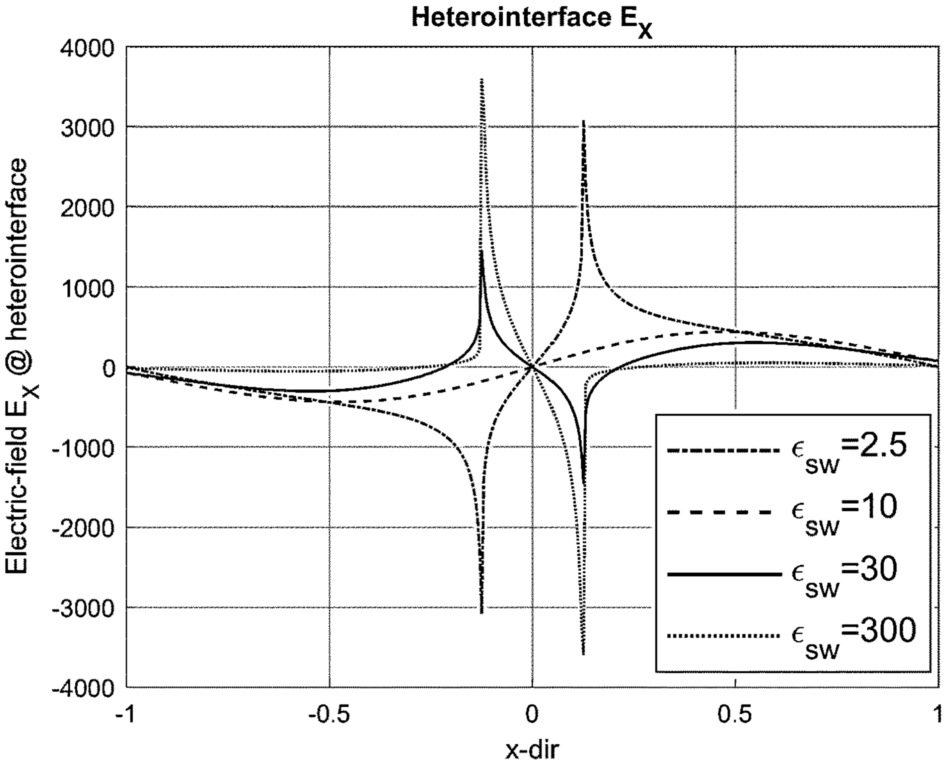

FIGS. 96G and 96H respectively plot the electric field magnitude and the x-component of the electric field at the hetero-dielectric interface (i.e., at y=0.2 in FIG. 96A) for the values of dielectric constants in FIG. 96A. Extracting the electric field components at the hetero-dielectric interface further illustrates the effect of sidewall dielectric constant on the device behavior.

The electric field results shown in FIGS. 96C-96H therefore show that selecting the value of the sidewall dielectric constant can be used control the maximum electric field at the hetero-dielectric interface and alleviate some of the occurrences of high peak electric fields observed in some other devices described herein (e.g., without a "T-channel" design). Furthermore, moving (or remoting) the Schottky barrier contact away from the surface of the channel regions, using the oxide channel region of the "T-channel" design can be used to dramatically reduce the peak electric fields at the surface of the channel regions (i.e., at the hetero-dielectric interface) in epitaxial oxide/Schottky devices.

Additionally, the "T-channel" device design shown in FIG. 96A and described herein can also be combined with any of the other device layer configurations and geometries described herein. For example, a device with a transition layer, such as those shown in FIGS. 4-7, could also incorporate a "T-channel" design by adding a transition layer between SiC substrate 96110 and oxide semiconductor drift layer 96125 of FIG. 96A. In another example, an intermediate layer can be added between the oxide semiconductor channel region 96120 and the Schottky metal layer 96130 as described herein, for example in FIGS. 13-17 and the associate description. In another example, a guard ring, such as shown in FIGS. 39D-39G, can be added surrounding the mesa structure. As one skilled in the art would appreciate, the features of many of the devices described herein can be combined with the "T-channel" design, including by not limited to those shown in FIGS. 20, 28-30, 40, 45, 48, 78A, and 79-80.

Figure 97:
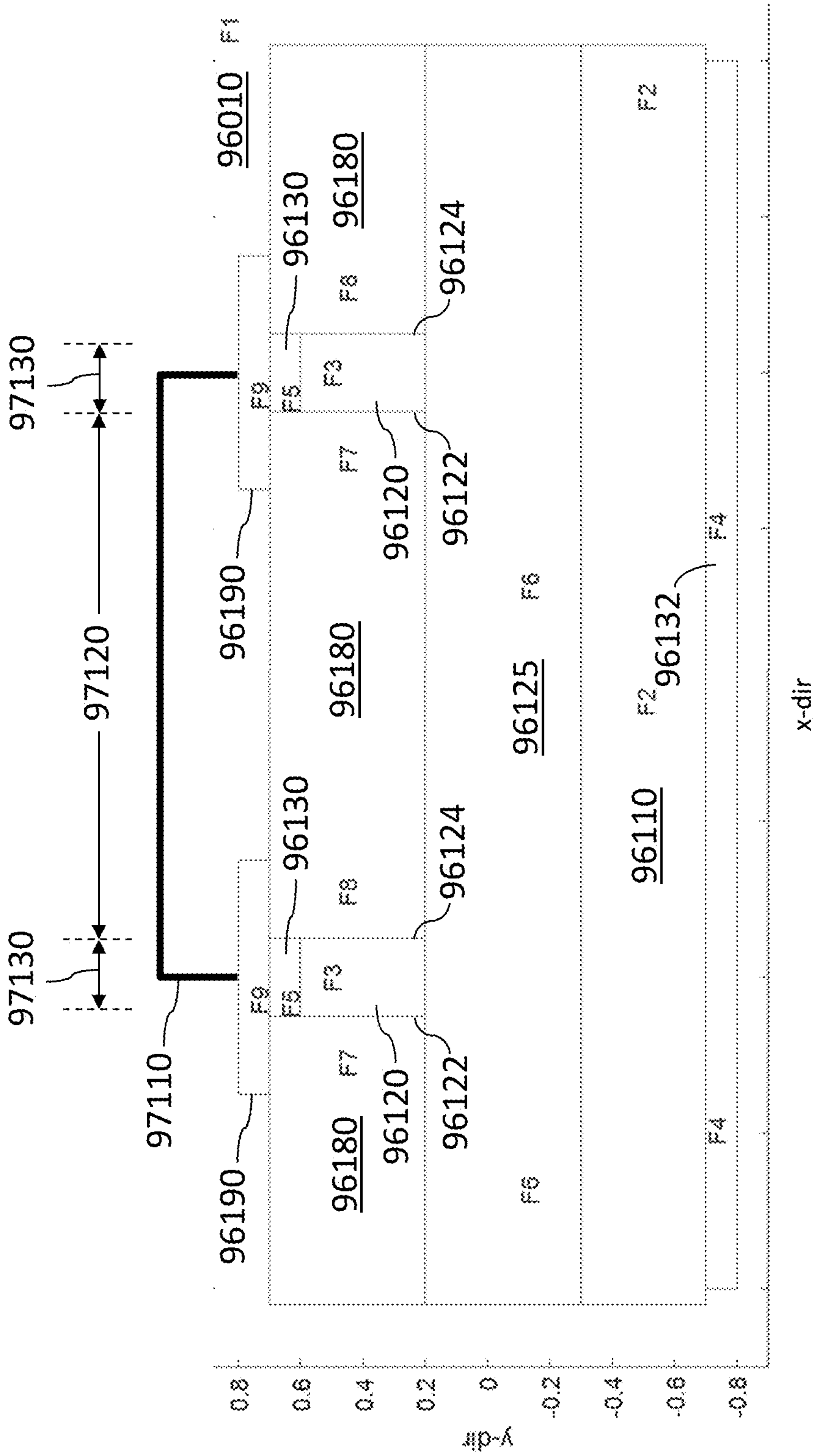

FIG. 97 shows an example device configuration, wherein the device configuration shown in FIG. 96A is repeated "(i.e., a plurality of the devices placed side by side)" to form an array of devices on a common SiC substrate 96110. In some cases, the top contacts (Schottky metal layer 96130 and optionally, field plate layer 96190) can be interconnected using an electrical interconnect schematically shown by interconnect 97110. Interconnect 97110 can be a metal layer, metal traces, or wire bonded wires coupling the field plate layers 96190 to one another. For example, interconnect 97110 can be a blanket metal layer covering the field plate layers 96190. In other cases, interconnect 97110 can be a metal layer that is patterned to electrically couple the field plate layers 96190. In some cases, the SiC substrate 96110 and the rear contact 96132 are shared by multiple devices in the array of devices. In some cases, the oxide semiconductor drift layer 96125 is shared by multiple devices in the array of devices, and the devices are separated by individual mesa structures including the oxide semiconductor channel region 96120 and the Schottky metal layer 96130, as shown in FIG. 97.

FIG. 97 shows two devices on a common SiC substrate 96110, however, in other cases, from 2 to 1000 devices can be formed on a common SiC substrate 96110 (e.g., in a rectangular array, hexagonal array, or any other arrangement of multiple mesa structures). Such configurations including arrays of devices can be advantageous. For example, the current-carrying capacity can be increased by multiplexing a number of parallel connected devices on a common SiC substrate 96110. A trade-off (or optimization) of epitaxial area consumed, maximum vertical current capacity, and/or thermal heating effects is possible by partitioning vertical current across a number of parallel interconnected devices. In some cases, a distance 97120 (e.g., a minimum distance) between the devices, shown as a distance from a wall (or sidewall) of one mesa to a wall (or sidewall) of an adjacent mesa, is tuned (or optimized) to balance the epitaxial area consumed, maximum vertical current capacity, and/or thermal heating effects. In some cases, a width 97130 of the mesa (or oxide semiconductor channel region 96120) in the x-direction, and a width of the mesa (or oxide semiconductor channel region 96120) in the z-direction (out of the plane of the page of FIG. 97), are tuned (or optimized) to balance the epitaxial area consumed, maximum vertical current capacity, and/or thermal heating effects. In some cases, minimum distance 97120 between the devices, width 97130 of the mesa (or oxide semiconductor channel region 96120) in the x-direction, and/or a width of the mesa (or oxide semiconductor channel region 96120) in the z-direction (out of the plane of the page of FIG. 97), are tuned (or optimized) to balance the epitaxial area consumed, maximum vertical current capacity, and/or thermal heating effects.

Figure 98A:
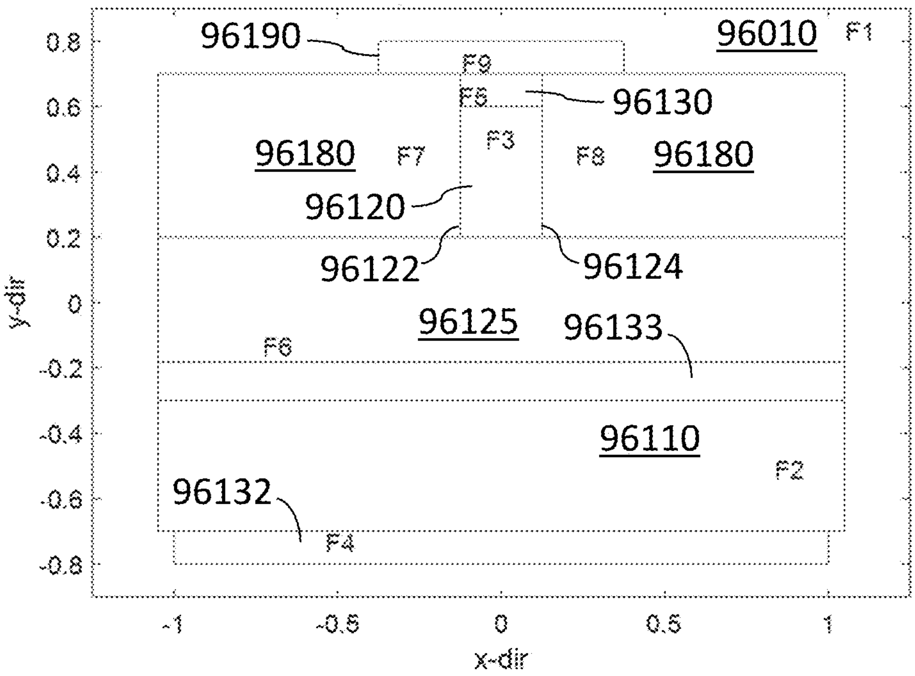
Figure 98B:
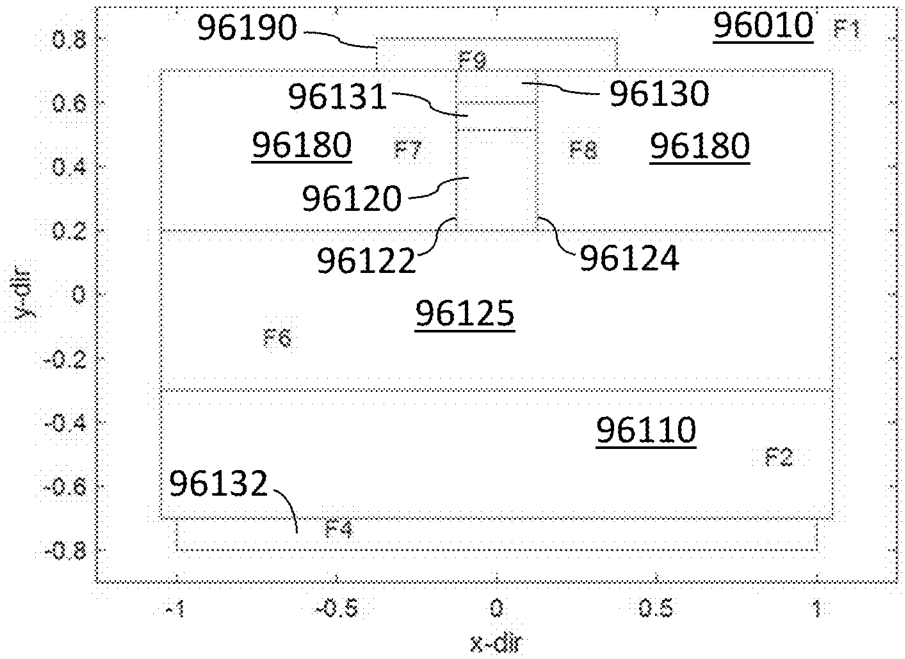
Figure 98C:
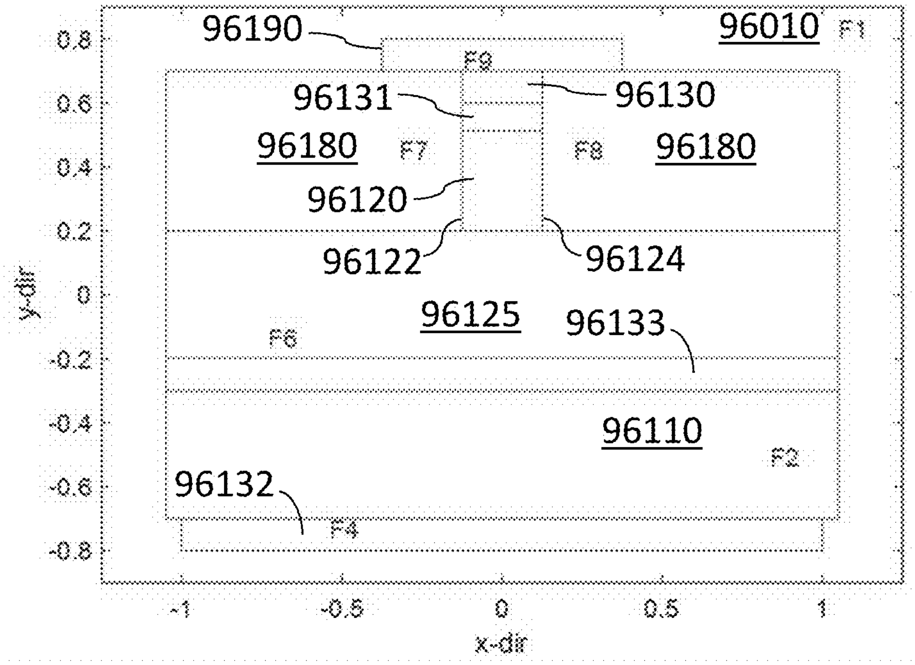

FIGS. 98A, 98B and 98C show examples of devices with a "T-Channel" design as described with respect to FIG. 96A, and additionally with a transition layer 96133, an intermediate layer 96131, or both. These structures can be advantageous, since they can combine the advantages of the "T-Channel" device designs with advantages of the devices designs with transition layers and/or intermediate layers described herein. For example, the transition layer 96133 can impact the electronic and structural properties of the semiconductor diode device, while the intermediate layer 96131 can alter the Schottky barrier properties and impact the electronic properties of the semiconductor diode device such as the turn-on voltage and/or the reverse breakdown voltage. The intermediate layer 96131 and the transition layer 96133 can each be a single layer, or can include multiple layers of materials such as in a superlattice layer or a chirp layer.

FIG. 98A shows an example of a device with a "T-Channel" design as described with respect to FIG. 96A, and additionally with a transition layer 96133 between the substrate layer 96110 and the oxide semiconductor drift layer 96125. Transition layer 96133 is similar to transition layer 160 in FIGS. 4-7 and 8B, and can have the same properties as described with respect to transition layer 160 in FIGS. 4-7 and 8B. Transition layer 96133 can have properties of any of the transition layers described herein. For example, the transition layer 96133 can provide an intermediate level of doping between the substrate 96110 and oxide semiconductor drift layer 96125 and/or manage interfacial strain, and can thereby impact the electronic and structural properties of the semiconductor diode device, as described further herein.

Transition layer 96133 may be formed of a semiconductor oxide material, and the oxide semiconductor drift layer 96125 and the oxide semiconductor channel region 96120 may be formed of the same semiconductor oxide material or different oxide materials as the transition layer 96133. In an example, the transition layer 96133 may be formed of a material chosen to provide a structural matching region between the substrate 96110 and the oxide semiconductor drift layer 96125. For example, a transition layer 96133, comprising a semiconductor oxide material of the form of $Mg_xZn_yNi_z(Al_p,Ga_{1-p})O_q$ (or another oxide semiconductor material described herein) can be formed between an SiC substrate 96110 and the oxide semiconductor drift layer 96125, where the oxide semiconductor drift layer 96125 and/or the oxide semiconductor channel region 96120 comprises $Ga_2O_3$ or compositionally graded $Al_xGa_{1-x}O_3$ in some examples. Another example of a semiconductor oxide material is of the form of a silicon oxy-carbide $Si_xC_yO_z$, which can be comprised in the transition layer 96133 and can be formed between an SiC substrate 96110 and the oxide semiconductor drift layer 96125, where the oxide semiconductor drift layer 96125 and/or the oxide semiconductor channel region 96120 comprises $Ga_2O_3$ or compositionally graded $Al_xGa_{1-x}O_3$ in some examples. Yet another example of a semiconductor oxide material is of the form of a silicon oxy-nitride $Si_xN_yO_z$ which can be comprised in the transition layer 96133 and can be formed between an SiC substrate 96110 and the oxide semiconductor drift layer 96125, where the oxide semiconductor drift layer 96125 and/or the oxide semiconductor channel region 96120 comprises $Ga_2O_3$ or compositionally graded $Al_xGa_{1-x}O_3$ in some examples. Another example of a transition layer 96133 is one comprising a material of the form of a silicon-germanium-carbide $Si_xGe_yC_z$ such that the transition layer 96133 can be used to manage the interfacial strain formed between an SiC substrate 96110 and the oxide semiconductor drift layer 96125, where the oxide semiconductor drift layer 96125 and/or the oxide semiconductor channel region 96120 comprises $Ga_2O_3$ or compositionally graded $Al_xGa_{1-x}O_3$ in some examples.

In some cases, the transition layer 96133 may have a doping concentration between that of the substrate 96110 doping concentration and oxide semiconductor drift layer 96125 with a discrete change in doping concentration between the substrate 96110 and the transition layer 96133, and between the transition layer 96133 and the oxide semiconductor drift layer 96125. In an example, the substrate 96110 may be n+ doped (i.e., having a doping concentration of from $10^{19}$ to $10^{20}$ $cm^{-3}$), the transition layer 96133 and oxide semiconductor drift layer 96125 may both be n doped (i.e., having a doping concentration of approximately $10^{18}$ $cm^{-3}$, or from $10^{17}$ $cm^{-3}$ to $10^{18}$ $cm^{-3}$) and the oxide semiconductor channel region 96120 may be n" doped (i.e., having a doping concentration from $10^{15}$ $cm^{-3}$ to $10^{17}$ $cm^{-3}$), where this configuration provides a transition between a $n^+$ doped region to a $n^-$ doped region moving vertically upwards from the substrate 96110 to the oxide semiconductor channel region 96120. Similarly, a p-type device can be formed wherein the substrate 96110 is $p^+$ doped, the transition layer 96133 and the oxide semiconductor drift layer 96125 are both $p^-$ doped, and the oxide semiconductor channel region 96120 is $p^-$ doped, where the layers have the doping concentrations described above of acceptors rather than donors.

In some cases, the transition layer 96133 doping concentration has a monotonic gradient in the z direction, starting at a doping concentration below (i.e., less than) that of the substrate 96110, and ending at a doping concentration approximately equal to that of the oxide semiconductor drift layer 96125. In some cases, the transition layer 96133 doping concentration has a doping concentration that monotonically varies starting at a doping concentration that is either approximately equal to that of the substrate 96110 or is between the substrate 96110 doping concentration and the oxide semiconductor drift layer 96125 doping concentration, and ending at a doping concentration that is either approximately equal to that of the oxide semiconductor drift layer 96125 or is between the substrate 96110 doping concentration and the oxide semiconductor drift layer 96125 doping concentration. In an example, the transition layer 96133 doping concentration may match the substrate 96110 doping concentration at the interface between the substrate 96110 and the transition layer 96133 and then continuously change to match the oxide semiconductor drift layer 96125 doping concentration at the interface between the transition layer 96133 and the oxide semiconductor drift layer 96125. In an example, the change in the transition layer 96133 doping concentration may be substantially linear as a function of vertical height z. In some cases, the transition layer 96133 doping concentration may change continuously (i.e., without significant step changes, and monotonically, or non-linearly, for example) as a function of vertical height z. In some cases, the transition layer 96133 doping concentration may change in a stepwise manner as a function of vertical height z. Transition layer 96133 can have any of the attributes of transition layer 160 as described above (e.g., with respect to transition layer 160 in FIGS. 4-7).

FIG. 98B shows an example of a device with a "T-Channel" design as described with respect to FIG. 96A, and additionally with an intermediate layer 96131 between the Schottky metal layer 96130 and the oxide semiconductor channel region 96120. Intermediate layer 96131 is similar to intermediate layer 170 in FIG. 8A, and can have the same properties as described with respect to intermediate layer 170 in FIG. 8A. Intermediate layer 96131 can have properties of any of the intermediate layers described herein. For example, the intermediate layer 96131 can alter the Schottky barrier properties and can thereby impact the electronic properties of the semiconductor diode device such as the turn-on voltage and/or the reverse breakdown voltage, as described further herein.

FIG. 98C shows an example of a device with a "T-Channel" design as described with respect to FIG. 96A, and additionally with both transition layer 96133 and intermediate layer 96131.

Embodiments

Clause 1. A multilayered semiconductor diode device comprising: a substrate comprising silicon carbide (SiC); an epitaxial transition layer comprising a first semiconductor oxide material or SiC, wherein the epitaxial transition layer is on the substrate; an epitaxial drift layer comprising a second semiconductor oxide material, wherein the epitaxial drift layer is on the epitaxial transition layer; and a metal layer above the epitaxial drift layer, wherein the metal layer and the epitaxial drift layer form a Schottky barrier junction.

Clause 2. The multilayered semiconductor diode device of clause 1, wherein the metal layer is an epitaxial metal layer.

Clause 3. The multilayered semiconductor diode device of clause 1, wherein the epitaxial transition layer further comprises a lattice constant that varies in a vertical direction that is perpendicular to a top surface of the substrate.

Clause 4. The multilayered semiconductor diode device of clause 1, wherein the epitaxial transition layer further comprises a bandgap that varies in a vertical direction that is perpendicular to a top surface of the substrate.

Clause 5. The multilayered semiconductor diode device of clause 1, wherein the substrate comprises a first doping density, the epitaxial transition layer comprises a second doping density and the epitaxial drift layer comprises a third doping density, and wherein the first doping density is greater than the second doping density, and wherein the second doping density is greater than the third doping density.

Clause 6. The multilayered semiconductor diode device of clause 1, wherein the epitaxial transition layer further comprises a variable doping density that varies in a vertical direction that is perpendicular to a top surface of the substrate.

Clause 7. The multilayered semiconductor diode device of clause 1, further comprising an epitaxial intermediate layer between the epitaxial drift layer and the metal layer, wherein the epitaxial intermediate layer has a wider bandgap than the epitaxial drift layer, wherein the metal layer, the epitaxial intermediate layer, and the epitaxial drift layer form the Schottky barrier junction.

Clause 8. The multilayered semiconductor diode device of clause 1, further comprising an isolation layer on the epitaxial drift layer, and wherein the isolation layer has a dielectric constant greater than or equal to the epitaxial drift layer.

Clause 9. The multilayered semiconductor diode device of clause 1, wherein the first or the second semiconductor oxide material comprises $A_{2x}B_{1-x}O_{2x+1}$, wherein $0 \leq x \leq 1$, wherein A comprises Al, Ga, RE, Bi, B', or In, and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 10. The multilayered semiconductor diode device of clause 9, wherein x is 0.5 and the first or the second semiconductor oxide material comprises $A_2B_1O_4$.

Clause 11. The multilayered semiconductor diode device of clause 10, wherein the first or the second semiconductor oxide material comprises $Al_2Mg_1O_4$, $Ga_2Mg_1O_4$, $Al_2Zn_1O_4$, $Ga_2Zn_1O_4$, $Al_2Ni_1O_4$, $Ga_2Ni_1O_4$, or $RE_2Zn_1O_4$.

Clause 12. The multilayered semiconductor diode device of clause 1, wherein the first or the second semiconductor oxide material comprises $(A_yC_{1-y})_{2x}B_{1-x}O_{2x+1}$, wherein $0 \leq x \leq 1$, wherein $0 \leq y \leq 1$, wherein A and C comprise two of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 13. The multilayered semiconductor diode device of clause 12, wherein x is 1, and $0 \leq y \leq 1$, and the first or the second semiconductor oxide material comprises $(A_yC_{1-y})_2O_3$.

Clause 14. The multilayered semiconductor diode device of clause 13, wherein A is Al and C is Ga.

Clause 15. The multilayered semiconductor diode device of clause 1, wherein the first or the second semiconductor oxide material comprises $(A_yD_zC_{1-y-z})_{2x}B_{1-x}O_{2x+1}$, wherein $0 \leq x \leq 1$, wherein $0 \leq y \leq 1$, wherein $0 < z \leq 1$, wherein $y+z \leq 1$, wherein A, D and C comprise three of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 16. The multilayered semiconductor diode device of clause 15, wherein x is 0.5, wherein y is 0.9, wherein z is 0.05, and the first or the second semiconductor oxide material comprises $(A_{0.9}D_{0.05}C_{0.05})_{2x}B_1O_4$.

Clause 17. The multilayered semiconductor diode device of clause 16, wherein the first or the second semiconductor oxide material comprises $(Ga_{0.9}Al_{0.05}In_{0.05})_2Mg_1O_4$, $(Ga_{0.9}Al_{0.05}In_{0.05})_2Ni_1O_4$, $(B'_{0.05}Bi_{0.05}Ga_{0.9})_2Mg_1O_4$, $(RE_{0.05}In_{0.05}Ga_{0.9})_2Zn_1O_4$, and $(RE_{0.05}\,Ga_{0.9}Al_{0.05})_2Zn_1O_4$.

Clause 18. The multilayered semiconductor diode device of clause 1, wherein the first or the second semiconductor oxide material comprises $A_{2(1-x)}B_{xy}C_{x(1-y)}O_{3-2x}$, wherein $0 \leq x \leq 1$, wherein $0<y<1$, wherein A and C comprise two of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 19. The multilayered semiconductor diode device of clause 18, wherein x is 0.5, wherein y is 0.25, and the first or the second semiconductor oxide material comprises $A_2B_{0.25}C_{0.75}O_4$.

Clause 20. The multilayered semiconductor diode device of clause 19, wherein the first or the second semiconductor oxide material comprises $Ga_2Mg_{0.25}Zn_{0.75}O_4$, $Al_2Mg_{0.25}Zn_{0.75}O_4$, $Ga_2Mg_{0.25}Ni_{0.75}O_4$, and $Ga_2Zn_{0.25}Mg_{0.75}O_4$.

Clause 21. The multilayered semiconductor diode device of clause 1, wherein the first or the second semiconductor oxide material comprises $A_{2z(1-x)}D_{2(1-z)(1-x)}B_{xy}C_{x(1-y)}O_{3-2x}$, wherein $0 \leq x \leq 1$, wherein $0<y<1$, wherein $0 \leq z \leq 1$, wherein A and D comprise two of: Al; Ga; RE; Bi; B'; and In; and wherein B and C comprise two of: Zn; Mg; and Ni, where O is oxygen, Al is aluminum, Ga is gallium, RE is a rare-earth, Bi is bismuth, B' is boron, In is indium, Zn is zinc, Mg is magnesium, and Ni is nickel.

Clause 22. The multilayered semiconductor diode device of clause 21, wherein x is 0.5, wherein y is 0.5, wherein z is 0.5, and the first or the second semiconductor oxide material comprises $A_1D_1B_{0.5}C_{0.5}O_4$.

Clause 23. The multilayered semiconductor diode device of clause 22, wherein the first or the second semiconductor oxide material comprises $Al_1Ga_1Ni_{0.5}Mg_{0.5}O_4$, $In_1Ga_1Zn_{0.5}Mg_{0.5}O_4$, and $RE_1Al_1Zn_{0.5}Ni_{0.5}O_4$.

Clause 24. The multilayered semiconductor diode device of clause 1, wherein the first or the second semiconductor oxide material comprises $A_{2x}B_{1-x}O_{x+2}$, wherein $0 \leq x \leq 1$, wherein A comprises Al, Ga, RE, Bi, B', or In, and wherein B comprises Ge, Si, or Sn, where O is oxygen, Al is aluminum, Ga is gallium, RE is a rare-earth, Bi is bismuth, B' is boron, In is indium, Ge is germanium, Si is silicon, and Sn is tin.

Clause 25. The multilayered semiconductor diode device of clause 24, wherein x is 0.5 and the first or the second semiconductor oxide material comprises $A_2B_1O_5$, or x is 0.75 and the first or the second semiconductor oxide material comprises $A_6B_1O_{11}$.

Clause 26. The multilayered semiconductor diode device of clause 25, wherein the first or the second semiconductor oxide material comprises $Al_2Si_1O_5$, $Ga_2Ge_1O_5$, $Al_2Ge_1O_5$, $RE_2Sn_1O_5$, $B'_2Ge_1O_5$, $In_2Ge_1O_5$, $Al_6Ge_1O_{11}$, $RE_6Ge_1O_{11}$, or $B'\,6Si_1O_{11}$.

Clause 27. The multilayered semiconductor diode device of clause 1, wherein the first or the second semiconductor oxide material comprises $A_xB_{1-x}O_{2-x}$, wherein $0 \leq x \leq 1$, wherein A comprises Zn, Mg, or Ni, and wherein B comprises Ge, Si, or Sn, where O is oxygen, Zn is zinc, Mg is magnesium, Ni is nickel, Ge is germanium, Si is silicon, and Sn is tin.

Clause 28. The multilayered semiconductor diode device of clause 27, wherein x is ½ and the first or the second semiconductor oxide material comprises $A_1B_1O_3$, or x is ⅔ and the first or the second semiconductor oxide material comprises $A_2B_1O_4$.

Clause 29. The multilayered semiconductor diode device of clause 28, wherein the first or the second semiconductor oxide material comprises $Zn_1Si_1O_3$, $Zn_1Ge_1O_3$, $Ni_1Ge_1O_3$, $Mg_1Sn_1O_3$, $Mg_1Zn_1O_3$, $Ni_1Sn_1O_3$, $Zn_2Si_1O_4$, $Mg_2Ge_1O_4$, $Ni_2Ge_1O_4$, $Mg_2Sn_1O_4$, $Mg_2Si_1O_4$, or $Ni_2Si_1O_4$.

Clause 30. A method of forming a multilayered semiconductor diode device comprising: providing a substrate comprising silicon carbide (SiC); forming, on the substrate, an epitaxial transition layer comprising a first semiconductor oxide material or SiC; forming, on the epitaxial transition layer, an epitaxial drift layer comprising a second semiconductor oxide material; and forming a metal layer above the epitaxial drift layer, wherein the metal layer and the epitaxial drift layer form a Schottky barrier junction.

Clause 31. The method of clause 30, further comprising patterning the metal layer.

Clause 32. The method of clause 30, wherein the forming the metal layer comprises growing the metal layer on the epitaxial drift layer using an epitaxial growth technique.

Clause 33. The method of clause 30, wherein the substrate comprises a first doping density, the epitaxial transition layer comprises a second doping density, and the epitaxial drift layer comprises a third doping density, and wherein the first doping density is greater than the second doping density, and wherein the second doping density is greater than the third doping density.

Clause 34. The method of clause 30, wherein the epitaxial transition layer comprises a lattice constant that varies in a vertical direction that is perpendicular to a top surface of the substrate.

Clause 35. The method of clause 30, wherein the epitaxial transition layer comprises a bandgap that varies in a vertical direction that is perpendicular to a top surface of the substrate.

Clause 36. The method of clause 30, wherein the epitaxial transition layer comprises a doping density that varies in a vertical direction that is perpendicular to a top surface of the substrate.

Clause 37. The method of clause 30, further comprising forming an epitaxial intermediate layer between the epitaxial drift layer and the metal layer.

Clause 38. The method of clause 37, further comprising forming a guard ring on the epitaxial intermediate layer.

Clause 39. The method of clause 30, further comprising forming a second metal layer on the substrate.

Clause 40. The method of clause 30, further comprising forming passivation layer on the metal layer.

Clause 41. The method of clause 30, further comprising etching the epitaxial drift layer to form opposed intra-device field termination regions or opposed inter-device isolation regions.

Clause 42. The method of clause 30, wherein the first or the second semiconductor oxide material comprises $A_{2x}B_{1-x}O_{2x+1}$, wherein 0<<1, wherein A comprises Al, Ga, RE, Bi, B', or In, and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 43. The method of clause 42, wherein x is 0.5 and the first or the second semiconductor oxide material comprises $A_2B_1O_4$.

Clause 44. The method of clause 43, wherein the first or the second semiconductor oxide material comprises $Al_2Mg_1O_4$, $Ga_2Mg_1O_4$, $Al_2Zn_1O_4$, $Ga_2Zn_1O_4$, $Al_2Ni_1O_4$, $Ga_2Ni_1O_4$, or $RE_2Zn_1O_4$.

Clause 45. The method of clause 30, wherein the first or the second semiconductor oxide material comprises $(A_yC_{1-y})_{2x}B_{1-x}O_{2x+1}$, wherein 0<x≤1, wherein 0≤y≤1, wherein A and C comprise two of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 46. The method of clause 45, wherein x is 0.5, and y is 0.1, and the first or the second semiconductor oxide material comprises $(A_{0.1}C_{0.9})_2B_1O_4$.

Clause 47. The method of clause 46, wherein the first or the second semiconductor oxide material comprises $(Al_{0.1}Ga_{0.9})_2Mg_1O_4$, $(Al_{0.1}Ga_{0.9})_2Ni_1O_4$, $(Bi_{0.1}Ga_{0.9})_2Mg_1O_4$, $(RE_{0.1}Ga_{0.9})_2Zn_1O_4$, or $(RE_{0.1}Al_{0.9})_2Zn_1O_4$.

Clause 48. The method of clause 30, wherein the first or the second semiconductor oxide material comprises $(A_yD_zC_{1-y-z})$, $B_{1-x}O_{2x+1}$, wherein 0≤x≤1, wherein 0≤y≤1, wherein 0≤z≤1, wherein y+z≤1, wherein A, D and C comprise three of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 49. The method of clause 48, wherein x is 0.5, wherein y is 0.9, wherein z is 0.05, and the first or the second semiconductor oxide material comprises $(A_{0.9}D_{0.05}C_{0.05})_2B_1O_4$.

Clause 50. The method of clause 49, wherein the first or the second semiconductor oxide material comprises $(Ga_{0.9}Al_{0.05}In_{0.05})_2Mg_1O_4$, $(Ga_{0.9}Al_{0.05}In_{0.05})_2Ni_1O_4$, $(B'_{0.05}Bi_{0.05}Ga_{0.9})_2Mg_1O_4$, $(RE_{0.05}In_{0.05}Ga_{0.9})_2Zn_1O_4$, and $(RE_{0.05}Ga_{0.9}Al_{0.05})_2Zn_1O_4$.

Clause 51. The method of clause 30, wherein the first or the second semiconductor oxide material comprises $A_{2(1-x)}B_{xy}C_{x(1-y)}O_{3-2x}$, wherein 0<x≤1, wherein 0≤y≤1, wherein A and C comprise two of: Al; Ga; RE; Bi; B'; and In; and wherein B comprises Zn, Mg, or Ni, where O is oxygen, Al is aluminum, Ga is gallium, RE is a rare-earth, Bi is bismuth, B' is boron, In is indium, Zn is zinc, Mg is magnesium, and Ni is nickel.

Clause 52. The method of clause 51, wherein x is 0.5, wherein y is 0.25, and the first or the second semiconductor oxide material comprises $A_2B_{0.25}C_{0.75}O_4$.

Clause 53. The method of clause 52, wherein the first or the second semiconductor oxide material comprises $Ga_2Mg_{0.25}Zn_{0.75}O_4$, $Al_2Mg_{0.25}Zn_{0.75}O_4$, $Ga_2Mg_{0.25}Ni_{0.75}O_4$, and $Ga_2Zn_{0.25}Mg_{0.75}O_4$.

Clause 54. The method of clause 30, wherein the first or the second semiconductor oxide material comprises $A_{2z(1-x)}D_{2(1-z)(1-x)}B_{xy}C_{x(1-y)}O_{3-2x}$, wherein 0≤x≤1, wherein 0<y≤1, wherein 0≤z≤1, wherein A and D comprise two of: Al; Ga; RE; Bi; B'; and In; and wherein B and C comprise two of: Zn; Mg; and Ni, where O is oxygen, Al is aluminum, Ga is gallium, RE is a rare-earth, Bi is bismuth, B' is boron, In is indium, Zn is zinc, Mg is magnesium, and Ni is nickel.

Clause 55. The method of clause 54, wherein x is 0.5, wherein y is 0.5, wherein z is 0.5, and the first or the second semiconductor oxide material comprises $A_1D_1B_{0.5}C_{0.5}O_4$.

Clause 56. The method of clause 55, wherein the first or the second semiconductor oxide material comprises $Al_1Ga_1Ni_{0.5}Mg_{0.5}O_4$, $In_1Ga_1Zn_{0.5}Mg_{0.5}O_4$, and $RE_1Al_1Zn_{0.5}Ni_{0.5}O_4$.

Clause 57. The method of clause 30, wherein the first or the second semiconductor oxide material comprises $A_{2x}B_{1-x}O_{x+2}$, wherein 0≤x≤1, wherein A comprises Al, Ga, RE, Bi, B', or In, and wherein B comprises Ge, Si, or Sn, where O is oxygen, Al is aluminum, Ga is gallium, RE is a rare-earth, Bi is bismuth, B' is boron, In is indium, Ge is germanium, Si is silicon, and Sn is tin.

Clause 58. The method of clause 57, wherein x is 0.5 or 0.75, and the first or the second semiconductor oxide material respectively comprises $A_2B_1O_5$ or $A_6B_1O_{11}$.

Clause 59. The method of clause 58, wherein the first or the second semiconductor oxide material comprises $Al_2Si_1O_5$, $Ga_2Ge_1O_5$, $Al_2Ge_1O_5$, $RE_2Sn_1O_5$, B' $2Ge_1O_5$, $In_2Ge_1O_5$, $Al_6Ge_1O_{11}$, $RE_6Ge_1O_{11}$, or $B'_6Si_1O_{11}$.

Clause 60. The method of clause 30, wherein the first or the second semiconductor oxide material comprises $A_xB_{1-x}O_{2-x}$, wherein 0≤x≤1, wherein A comprises Zn, Mg, or Ni, and wherein B comprises Ge, Si, or Sn, where O is oxygen, Zn is zinc, Mg is magnesium, Ni is nickel, Ge is germanium, Si is silicon, and Sn is tin.

Clause 61. The method of clause 60, wherein x is ½ or ⅔, and the first or the second semiconductor oxide material respectively comprises $A_1B_1O_3$ or $A_2B_1O_4$.

Clause 62. The method of clause 61, wherein the first or the second semiconductor oxide material comprises $Zn_1Si_1O_3$, $Zn_1Ge_1O_3$, $Ni_1Ge_1O_3$, $Mg_1Sn_1O_3$, $Mg_1Zn_1O_3$, $Ni_1Sn_1O_3$, $Zn_2Si_1O_4$, $Mg_2Ge_1O_4$, $Ni_2Ge_1O_4$, $Mg_2Sn_1O_4$, $Mg_2Si_1O_4$, or $Ni_2Si_1O_4$.

Clause 63. A multilayered semiconductor diode device comprising: a substrate comprising silicon carbide (SiC); an epitaxial drift layer comprising a first semiconductor oxide material, wherein the epitaxial drift layer is on the substrate; an epitaxial channel layer comprising a second semiconductor oxide material, wherein the epitaxial channel layer is on the epitaxial drift layer; a Schottky metal layer above the epitaxial channel layer, wherein the Schottky metal layer and the epitaxial channel layer form a Schottky barrier junction, and wherein the epitaxial channel layer and the Schottky metal layer are formed into a first mesa structure; and a sidewall layer comprising a dielectric material, wherein the sidewall layer is on the epitaxial drift layer and contacts a wall of the first mesa structure.

Clause 64. The multilayered semiconductor diode device of clause 63, wherein the Schottky metal layer is an epitaxial metal layer.

Clause 65. The multilayered semiconductor diode device of clause 63, wherein the dielectric material comprises a dielectric constant that is greater than a dielectric constant of the epitaxial channel layer.

Clause 66. The multilayered semiconductor diode device of clause 63, wherein the first semiconductor oxide material has a doping density between those of the substrate and the second semiconductor oxide material.

Clause 67. The multilayered semiconductor diode device of clause 63, wherein the first semiconductor oxide material and the second semiconductor oxide material are configured such that there is no substantial barrier to a flow of electrons from the first semiconductor oxide material to the second semiconductor oxide material.

Clause 68. The multilayered semiconductor diode device of clause 63, further comprising an epitaxial transition layer comprising a third semiconductor oxide material or SiC, wherein the epitaxial transition layer is between the substrate and the epitaxial drift layer.

Clause 69. The multilayered semiconductor diode device of clause 68, wherein the first semiconductor oxide material has substantially the same composition and crystal symmetry as the second semiconductor oxide material.

Clause 70. The multilayered semiconductor diode device of clause 68, wherein the epitaxial transition layer further comprises a lattice constant that is different than a lattice constant of the substrate.

Clause 71. The multilayered semiconductor diode device of clause 68, wherein the epitaxial transition layer further comprises a bandgap that is different than a bandgap of the substrate.

Clause 72. The multilayered semiconductor diode device of clause 68, wherein the substrate comprises a first doping density, the epitaxial transition layer comprises a second doping density and the epitaxial drift layer comprises a third doping density, and wherein the first doping density is greater than the second doping density, and wherein the second doping density is greater than the third doping density.

Clause 73. The multilayered semiconductor diode device of clause 68, wherein the epitaxial transition layer further comprises a variable doping density that varies in a vertical direction that is perpendicular to a top surface of the substrate.

Clause 74. The multilayered semiconductor diode device of clause 63, further comprising an epitaxial intermediate layer between the epitaxial channel layer and the Schottky metal layer, wherein the epitaxial intermediate layer has a wider bandgap than the epitaxial channel layer, wherein the Schottky metal layer, the epitaxial intermediate layer, and the epitaxial channel layer form the Schottky barrier junction.

Clause 75. The multilayered semiconductor diode device of clause 63, further comprising an epitaxial intermediate layer between the epitaxial channel layer and the Schottky metal layer, wherein the epitaxial intermediate layer has a wider bandgap than the epitaxial channel layer, wherein the Schottky metal layer, the epitaxial intermediate layer, and the epitaxial channel layer form the Schottky barrier junction.

Clause 76. The multilayered semiconductor diode device of clause 63, wherein the first or the second semiconductor oxide material comprises $A_{2x}B_{1-x}O_{2x+1}$, wherein $0 \le x \le 1$, wherein A comprises Al, Ga, RE, Bi, B', or In, wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

Clause 77. The multilayered semiconductor diode device of clause 76, wherein x is 0.5 and the first or the second semiconductor oxide material comprises $A_2B_1O_4$.

Clause 78. The multilayered semiconductor diode device of clause 77, wherein the first or the second semiconductor oxide material comprises $Al_2Mg_1O_4$, $Ga_2Mg_1O_4$, $Al_2Zn_1O_4$, $Ga_2Zn_1O_4$, $Al_2Ni_1O_4$, $Ga_2Ni_1O_4$, or $RE_2Zn_1O_4$.

Clause 79. The multilayered semiconductor diode device of clause 63, wherein the first or the second semiconductor oxide material comprises $(A_yC_{1-y})_{2x}B_{1-x}O_{2x+1}$, wherein $0 \le x \le 1$, wherein $0 \le y \le 1$, wherein A and C comprise two of: Al; Ga; RE; Bi; B'; and In; wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

Clause 80. The multilayered semiconductor diode device of clause 79, wherein x is 1, and, and the first or the second semiconductor oxide material comprises $(A_yC_{1-y})_2O_3$.

Clause 81. The multilayered semiconductor diode device of clause 80, wherein A is Al and C is Ga.

Clause 82. The multilayered semiconductor diode device of clause 63, wherein the first or the second semiconductor oxide material comprises $(A_yD_zC_{1-y-z})_{2x}B_{1-x}O_{2x+1}$, wherein $0<x<1$, wherein $0<y<1$, wherein $0<z \le 1$, wherein $y+z \le 1$, wherein A, D and C comprise three of: Al; Ga; RE; Bi; B'; and In; wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

Clause 83. The multilayered semiconductor diode device of clause 82, wherein x is 0.5, wherein y is 0.9, wherein z is 0.05, and the first or the second semiconductor oxide material comprises $(A_{0.9}D_{0.05}C_{0.05})_{2x}B_1O_4$.

Clause 84. The multilayered semiconductor diode device of clause 83, wherein the first or the second semiconductor oxide material comprises $(Ga_{0.9}Al_{0.05}In_{0.05})_2Mg_1O_4$, $(Ga_{0.9}Al_{0.05}In_{0.05})_2Ni_1O_4$, $(B'0.05\ Bi_{0.05}Ga_{0.9})_2Mg_1O_4$, $(RE_{0.05}\ In_{0.05}\ Ga_{0.9})_2Zn_1O_4$, and $(RE_{0.05}\ Ga_{0.9}Al_{0.05})_2Zn_1O_4$.

Clause 85. The multilayered semiconductor diode device of clause 63, wherein the first or the second semiconductor oxide material comprises $A_{2(1-x)}B_{xy}C_{x(1-y)}O_{3-2x}$, wherein $0<x<1$, wherein $0 \le y \le 1$, wherein A and C comprise two of: Al; Ga; RE; Bi; B'; and In; wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

Clause 86. The multilayered semiconductor diode device of clause 85, wherein x is 0.5, wherein y is 0.25, and the first or the second semiconductor oxide material comprises $A_2B_{0.25}C_{0.75}O_4$.

Clause 87. The multilayered semiconductor diode device of clause 86, wherein the first or the second semiconductor oxide material comprises $Ga_2Mg_{0.25}Zn_{0.75}O_4$, $Al_2Mg_{0.25}Zn_{0.75}O_4$, $Ga_2Mg_{0.25}Ni_{0.75}O_4$, and $Ga_2Zn_{0.25}Mg_{0.75}O_4$.

Clause 88. The multilayered semiconductor diode device of clause 63, wherein the first or the second semiconductor oxide material comprises $A_{2z(1-x)}D_{2(1-z)(1-x)}B_{xy}C_{x(1-y)}O_{3-2x}$, wherein $0 \le x \le 1$, wherein $0 \le y \le 1$, wherein $0 \le z \le 1$, wherein A and D comprise two of: Al; Ga; RE; Bi; B'; and In; wherein B and C comprise two of: Zn; Mg; and Ni, wherein O is oxygen, Al is aluminum, Ga is gallium, RE is a rare-earth, Bi is bismuth, B' is boron, In is indium, Zn is zinc, Mg is magnesium, and Ni is nickel.

Clause 89. The multilayered semiconductor diode device of clause 88, wherein x is 0.5, wherein y is 0.5, wherein z is 0.5, and the first or the second semiconductor oxide material comprises $A_1D_1B_{0.5}C_{0.5}O_4$.

Clause 90. The multilayered semiconductor diode device of clause 89, wherein the first or the second semiconductor oxide material comprises $Al_1Ga_1Ni_{0.5}Mg_{0.5}O_4$, $In_1Ga_1Zn_{0.5}Mg_{0.5}O_4$, and $RE_1Al_1Zn_{0.5}Ni_{0.5}O_4$.

Clause 91. The multilayered semiconductor diode device of clause 63, wherein the first or the second semiconductor oxide material comprises $A_{2x}B_{1-x}O_{x+2}$, wherein $0 \le x \le 1$, wherein A comprises Al, Ga, RE, Bi, B', or In, wherein B comprises Ge, Si, or Sn, wherein O is oxygen, Al is aluminum, Ga is gallium, RE is a rare-earth, Bi is bismuth, B' is boron, In is indium, Ge is germanium, Si is silicon, and Sn is tin.

Clause 92. The multilayered semiconductor diode device of clause 91, wherein x is 0.5 and the first or the second semiconductor oxide material comprises $A_2B_1O_5$, or x is 0.75 and the first or the second semiconductor oxide material comprises $A_6B_1O_{11}$.

Clause 93. The multilayered semiconductor diode device of clause 92, wherein the first or the second semiconductor oxide material comprises $Al_2Si_1O_5$, $Ga_2Ge_1O_5$, $Al_2Ge_1O_5$, $RE_2Sn_1O_5$, $B'_2Ge_1O_5$, $In_2Ge_1O_5$, $Al_6Ge_1O_{11}$, $RE_6Ge_1O_{11}$, or B' $6Si_1O_{11}$.

Clause 94. The multilayered semiconductor diode device of clause 63, wherein the first or the second semiconductor oxide material comprises $A_xB_{1-x}O_{2-x}$, wherein $0 \leq x \leq 1$, wherein A comprises Zn, Mg, or Ni, wherein B comprises Ge, Si, or Sn, wherein O is oxygen, Zn is zinc, Mg is magnesium, Ni is nickel, Ge is germanium, Si is silicon, and Sn is tin.

Clause 95. The multilayered semiconductor diode device of clause 94, wherein x is ½ and the first or the second semiconductor oxide material comprises $A_1B_1O_3$, or x is ⅔ and the first or the second semiconductor oxide material comprises $A_2B_1O_4$.

Clause 96. The multilayered semiconductor diode device of clause 95, wherein the first or the second semiconductor oxide material comprises $Zn_1Si_1O_3$, $Zn_1Ge_1O_3$, $Ni_1Ge_1O_3$, $Mg_1Sn_1O_3$, $Mg_1Zn_1O_3$, $Ni_1Sn_1O_3$, $Zn_2Si_1O_4$, $Mg_2Ge_1O_4$, $Ni_2Ge_1O_4$, $Mg_2Sn_1O_4$, $Mg_2Si_1O_4$, or $Ni_2Si_1O_4$.

Clause 97. The multilayered semiconductor diode device of clause 63, further comprising a field plate on a top surface of the Schottky metal layer, wherein the field plate layer comprises a metal and extends laterally beyond the first mesa structure and onto a top surface of the sidewall layer.

Clause 98. The multilayered semiconductor diode device of clause 63, further comprising a second mesa structure and an interconnect, wherein: the first mesa structure comprises a first portion of the epitaxial channel layer and a first portion of the Schottky metal layer; the second mesa structure comprises a second portion of the epitaxial channel layer and a second portion of the Schottky metal layer; the sidewall layer further contacts a wall of the second mesa structure; and the first portion of the Schottky metal layer and the second portion of the Schottky metal layer are coupled with the interconnect.

Clause 99. The multilayered semiconductor diode device of clause 63, wherein the Schottky metal layer is selected from a metal of FIG. 11A.

Clause 100. A method of forming a multilayered semiconductor diode device comprising: providing a substrate comprising silicon carbide (SiC); forming, on the substrate, an epitaxial drift layer comprising a first semiconductor oxide material; forming, on the epitaxial drift layer, an epitaxial channel layer comprising a first semiconductor oxide material; forming a metal layer on the epitaxial drift layer, wherein the metal layer and the epitaxial drift layer form a Schottky barrier junction; etching the epitaxial channel layer and the metal layer to form a mesa structure; forming a sidewall layer comprising a dielectric material, wherein the sidewall layer is on the epitaxial drift layer and contacts a wall of the mesa structure.

In some cases, a single embodiment may, for succinctness and/or to assist in understanding the scope of the disclosure, combine multiple features. It is to be understood that in such a case, these multiple features may be provided separately (in separate embodiments), or in any other suitable combination. Alternatively, where separate features are described in separate embodiments, these separate features may be combined into a single embodiment unless otherwise stated or implied. This also applies to the claims which can be recombined in any combination. That is, a claim may be amended to include a feature defined in any other claim. Furthermore, a phrase referring to "at least one of" a list of items refers to any combination of those items, including single members. As an example, "at least one of: a, b, or c" is intended to cover: a, b, c, a-b, a-c, b-c, and a-b-c.

Reference has been made in detail to embodiments of the disclosed invention, one or more examples of which have been illustrated in the accompanying FIGURES. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only and is not intended to limit the invention.

What is claimed is:

1. A multilayered semiconductor diode device comprising:

a substrate comprising silicon carbide (SiC);

an epitaxial drift layer comprising a first semiconductor oxide material, wherein the epitaxial drift layer is on the substrate;

an epitaxial channel layer comprising a second semiconductor oxide material, wherein the epitaxial channel layer is on the epitaxial drift layer;

a Schottky metal layer above the epitaxial channel layer, wherein the Schottky metal layer and the epitaxial channel layer form a Schottky barrier junction, and wherein the epitaxial channel layer and the Schottky metal layer are formed into a first mesa structure; and a sidewall layer comprising a dielectric material, wherein the sidewall layer is on the epitaxial drift layer and contacts a wall of the first mesa structure.

2. The multilayered semiconductor diode device of claim 1, wherein the Schottky metal layer is an epitaxial metal layer.

3. The multilayered semiconductor diode device of claim 1, wherein the dielectric material comprises a dielectric constant that is greater than a dielectric constant of the epitaxial channel layer.

4. The multilayered semiconductor diode device of claim 1, wherein the first semiconductor oxide material has a doping density between those of the substrate and the second semiconductor oxide material.

5. The multilayered semiconductor diode device of claim 1, wherein the first semiconductor oxide material and the second semiconductor oxide material are configured such that there is no substantial barrier to a flow of electrons from the first semiconductor oxide material to the second semiconductor oxide material.

6. The multilayered semiconductor diode device of claim 1, further comprising an epitaxial transition layer comprising a third semiconductor oxide material or SiC, wherein the epitaxial transition layer is between the substrate and the epitaxial drift layer.

7. The multilayered semiconductor diode device of claim 6, wherein the first semiconductor oxide material has substantially the same composition and crystal symmetry as the second semiconductor oxide material.

8. The multilayered semiconductor diode device of claim 6, wherein the epitaxial transition layer further comprises a lattice constant that is different than a lattice constant of the substrate.

9. The multilayered semiconductor diode device of claim 6, wherein the epitaxial transition layer further comprises a bandgap that is different than a bandgap of the substrate.

10. The multilayered semiconductor diode device of claim 6, wherein the substrate comprises a first doping density, the epitaxial transition layer comprises a second doping density and the epitaxial drift layer comprises a third doping density, and wherein the first doping density is greater than the second doping density, and wherein the second doping density is greater than the third doping density.

11. The multilayered semiconductor diode device of claim 6, wherein the epitaxial transition layer further comprises a variable doping density that varies in a vertical direction that is perpendicular to a top surface of the substrate.

12. The multilayered semiconductor diode device of claim 1, further comprising an epitaxial intermediate layer between the epitaxial channel layer and the Schottky metal layer, wherein the epitaxial intermediate layer has a wider bandgap than the epitaxial channel layer, wherein the Schottky metal layer, the epitaxial intermediate layer, and the epitaxial channel layer form the Schottky barrier junction.

13. The multilayered semiconductor diode device of claim 1, further comprising an epitaxial intermediate layer between the epitaxial channel layer and the Schottky metal layer, wherein the epitaxial intermediate layer has a wider bandgap than the epitaxial channel layer, wherein the Schottky metal layer, the epitaxial intermediate layer, and the epitaxial channel layer form the Schottky barrier junction.

14. The multilayered semiconductor diode device of claim 1, wherein the first or the second semiconductor oxide material comprises $A_{2x}B_{1-x}O_{2x+1}$, wherein $0 \le x \le 1$, wherein A comprises Al, Ga, RE, Bi, B', or In, wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

15. The multilayered semiconductor diode device of claim 14, wherein x is 0.5 and the first or the second semiconductor oxide material comprises $A_2B_1O_4$.

16. The multilayered semiconductor diode device of claim 15, wherein the first or the second semiconductor oxide material comprises $Al_2Mg_1O_4$, $Ga_2Mg_1O_4$, $Al_2Zn_1O_4$, $Ga_2Zn_1O_4$, $Al_2Ni_1O_4$, $Ga_2Ni_1O_4$, or $RE_2Zn_1O_4$.

17. The multilayered semiconductor diode device of claim 1, wherein the first or the second semiconductor oxide material comprises $(A_yC_{1-y})_{2x}B_{1-x}O_{2x+1}$, wherein $0 \le x \le 1$, wherein $0 \le y \le 1$, wherein A and C comprise two of: Al; Ga; RE; Bi; B'; and In;

wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

18. The multilayered semiconductor diode device of claim 17, wherein x is 1, and $0 \le y \le 1$, and the first or the second semiconductor oxide material comprises $(A_yC_{1-y})_2O_3$.

19. The multilayered semiconductor diode device of claim 18, wherein A is Al and C is Ga.

20. The multilayered semiconductor diode device of claim 1, wherein the first or the second semiconductor oxide material comprises $(A_yD_zC_{1-y-z})_{2x}B_{1-x}O_{2x+1}$, wherein $0 \le x \le 1$, wherein $0 < y \le 1$, wherein $0 \le z \le 1$, wherein $y+z \le 1$, wherein A, D and C comprise three of: Al; Ga; RE; Bi; B'; and In;

wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

21. The multilayered semiconductor diode device of claim 20, wherein x is 0.5, wherein y is 0.9, wherein z is 0.05, and the first or the second semiconductor oxide material comprises $(A_{0.9}D_{0.05}C_{0.05})_2B_1O_4$.

22. The multilayered semiconductor diode device of claim 21, wherein the first or the second semiconductor oxide material comprises $(Ga_{0.9}Al_{0.05}In_{0.05})_2Mg_1O_4$, $(Ga_{0.9}Al_{0.05}In_{0.05})_2Ni_1O_4$, $(B'_{0.05}Bi_{0.05}Ga_{0.9})_2Mg_1O_4$, $(RE_{0.05}In_{0.05}Ga_{0.9})_2Zn_1O_4$, and $(RE_{0.05}Ga_{0.9}Al_{0.05})_2Zn_1O_4$.

23. The multilayered semiconductor diode device of claim 1, wherein the first or the second semiconductor oxide material comprises $A_{2(1-x)}B_{xy}C_{x(1-y)}O_{3-2x}$, wherein $0 \le x \le 1$, wherein $0 \le y \le 1$, wherein A and C comprise two of: Al; Ga; RE; Bi; B'; and In;

wherein B comprises Zn, Mg, or Ni, wherein O is oxygen, Al is aluminum, Ga is gallium, RE is a rare-earth, Bi is bismuth, B' is boron, In is indium, Zn is zinc, Mg is magnesium, and Ni is nickel.

24. The multilayered semiconductor diode device of claim 23, wherein x is 0.5, wherein y is 0.25, and the first or the second semiconductor oxide material comprises $A_2B_{0.25}C_{0.75}O_4$.

25. The multilayered semiconductor diode device of claim 24, wherein the first or the second semiconductor oxide material comprises $Ga_2Mg_{0.25}Zn_{0.75}O_4$, $Al_2Mg_{0.25}Zn_{0.75}O_4$, $Ga_2Mg_{0.25}$ $Ni_{0.75}O_4$, and $Ga_2Zn_{0.25}Mg_{0.75}O_4$.

26. The multilayered semiconductor diode device of claim 1, wherein the first or the second semiconductor oxide material comprises $A_{2z(1-x)}D_{2(1-z)(1-x)}B_{xy}C_{x(1-y)}O_{3-2x}$, wherein $0 \le x \le 1$, wherein $0 \le y \le 1$, wherein $0 \le z \le 1$, wherein A and D comprise two of: Al; Ga; RE; Bi; B'; and In;

wherein B and C comprise two of: Zn; Mg; and Ni, wherein O is oxygen, Al is aluminum, Ga is gallium, RE is a rare-earth, Bi is bismuth, B' is boron, In is indium, Zn is zinc, Mg is magnesium, and Ni is nickel.

27. The multilayered semiconductor diode device of claim 26, wherein x is 0.5, wherein y is 0.5, wherein z is 0.5, and the first or the second semiconductor oxide material comprises $A_1D_1B_{0.5}C_{0.5}O_4$.

28. The multilayered semiconductor diode device of claim 27, wherein the first or the second semiconductor oxide material comprises $Al_1Ga_1Ni_{0.5}Mg_{0.5}O_4$, $In_1Ga_1Zn_{0.5}Mg_{0.5}O_4$, and $RE_1Al_1Zn_{0.5}Ni_{0.5}O_4$.

29. The multilayered semiconductor diode device of claim 1, wherein the first or the second semiconductor oxide material comprises $A_{2x}B_{1-x}O_{x+2}$, wherein $0 \le x \le 1$, wherein A comprises Al, Ga, RE, Bi, B', or In, wherein B comprises Ge, Si, or Sn, wherein O is oxygen, Al is aluminum, Ga is gallium, RE is a rare-earth, Bi is bismuth, B' is boron, In is indium, Ge is germanium, Si is silicon, and Sn is tin.

30. The multilayered semiconductor diode device of claim 29, wherein x is 0.5 and the first or the second semiconductor oxide material comprises $A_2B_1O_5$, or x is 0.75 and the first or the second semiconductor oxide material comprises $A_6B_1O_{11}$.

31. The multilayered semiconductor diode device of claim 30, wherein the first or the second semiconductor oxide material comprises $Al_2Si_1O_5$, $Ga_2Ge_1O_5$, $Al_2Ge_1O_5$, $RE_2Sn_1O_5$, $B'_2Ge_1O_5$, $In_2Ge_1O_5$, $Al_6Ge_1O_{11}$, $RE_6Ge_1O_{11}$, or $B'_6Si_1O_{11}$.

32. The multilayered semiconductor diode device of claim 1, wherein the first or the second semiconductor oxide material comprises $A_xB_{1-x}O_{2-x}$, wherein $0<x\leq 1$, wherein A comprises Zn, Mg, or Ni, wherein B comprises Ge, Si, or Sn, wherein O is oxygen, Zn is zinc, Mg is magnesium, Ni is nickel, Ge is germanium, Si is silicon, and Sn is tin.

33. The multilayered semiconductor diode device of claim 32, wherein x is ½ and the first or the second semiconductor oxide material comprises $A_1B_1O_3$, or x is ⅔ and the first or the second semiconductor oxide material comprises $A_2B_1O_4$.

34. The multilayered semiconductor diode device of claim 33, wherein the first or the second semiconductor oxide material comprises $Zn_1Si_1O_3$, $Zn_1Ge_1O_3$, $Ni_1Ge_1O_3$, $Mg_1Sn_1O_3$, $Mg_1Zn_1O_3$, $Ni_1Sn_1O_3$, $Zn_2Si_1O_4$, $Mg_2Ge_1O_4$, $Ni_2Ge_1O_4$, $Mg_2Sn_1O_4$, $Mg_2Si_1O_4$, or $Ni_2Si_1O_4$.

35. The multilayered semiconductor diode device of claim 1, further comprising a field plate on a top surface of the Schottky metal layer, wherein the field plate layer comprises a metal and extends laterally beyond the first mesa structure and onto a top surface of the sidewall layer.

36. The multilayered semiconductor diode device of claim 1, further comprising a second mesa structure and an interconnect, wherein:

the first mesa structure comprises a first portion of the epitaxial channel layer and a first portion of the Schottky metal layer;

the second mesa structure comprises a second portion of the epitaxial channel layer and a second portion of the Schottky metal layer;

the sidewall layer further contacts a wall of the second mesa structure; and the first portion of the Schottky metal layer and the second portion of the Schottky metal layer are coupled with the interconnect.

37. The multilayered semiconductor diode device of claim 1, wherein the Schottky metal layer comprises a metal selected from a metal of FIG. 11A, or alloys thereof.

38. A method of forming a multilayered semiconductor diode device comprising:

providing a substrate comprising silicon carbide (SiC);

forming, on the substrate, an epitaxial drift layer comprising a first semiconductor oxide material;

forming, on the epitaxial drift layer, an epitaxial channel layer comprising a first semiconductor oxide material;

forming a metal layer on the epitaxial drift layer, wherein the metal layer and the epitaxial drift layer form a Schottky barrier junction;

etching the epitaxial channel layer and the metal layer to form a mesa structure;

forming a sidewall layer comprising a dielectric material, wherein the sidewall layer is on the epitaxial drift layer and contacts a wall of the mesa structure.

* * * * *